(12) United States Patent
Takahashi et al.

(10) Patent No.: US 8,232,634 B2
(45) Date of Patent: Jul. 31, 2012

(54) SEMICONDUCTOR DEVICE HAVING A PIN MOUNTED HEAT SINK

(75) Inventors: Noriyuki Takahashi, Nanae (JP); Mamoru Shishido, Nanae (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/299,666

(22) Filed: Nov. 18, 2011

(65) Prior Publication Data

US 2012/0061817 A1    Mar. 15, 2012

Related U.S. Application Data

(63) Continuation of application No. 13/049,109, filed on Mar. 16, 2011, now abandoned, which is a continuation of application No. 12/481,078, filed on Jun. 9, 2009, now Pat. No. 7,923,826.

(30) Foreign Application Priority Data

Jun. 12, 2008  (JP) ................................. 2008-154497
Jan. 15, 2009  (JP) ................................. 2009-006240

(51) Int. Cl.
*H01L 23/48* (2006.01)
*H01L 23/495* (2006.01)
*H01L 23/10* (2006.01)
*H01L 23/34* (2006.01)

(52) U.S. Cl. ........ 257/698; 257/675; 257/697; 257/706; 257/E23.011; 257/E23.022; 257/E23.024; 257/E23.036; 257/E23.051; 257/E23.067; 257/E23.068; 257/E23.101; 257/E23.105

(58) Field of Classification Search .................. 257/675, 257/697, 698, 706, E23.011, E23.022, E23.024, 257/E23.036, E23.051, E23.067, E23.068, 257/E23.101, E23.105

See application file for complete search history.

(56) References Cited

U.S. PATENT DOCUMENTS

| | | | |
|---|---|---|---|
| 5,025,347 A * | 6/1991 | Shindo et al. .................. 361/719 |
| 5,102,829 A * | 4/1992 | Cohn ................................. 29/837 |
| 5,105,259 A | 4/1992 | McShane et al. |
| 5,144,412 A * | 9/1992 | Chang et al. .................. 257/665 |
| 5,172,301 A | 12/1992 | Schneider |
| 5,475,261 A * | 12/1995 | Tanizawa ....................... 257/693 |
| 5,570,272 A | 10/1996 | Variot |
| 5,583,377 A | 12/1996 | Higgins, III |
| 5,644,163 A * | 7/1997 | Tsuji .............................. 257/706 |
| 5,739,581 A | 4/1998 | Chillara et al. |

(Continued)

FOREIGN PATENT DOCUMENTS

JP    2003-046027 A    2/2003

(Continued)

*Primary Examiner* — Ida M Soward
(74) *Attorney, Agent, or Firm* — Mattingly & Malur, PC

(57) ABSTRACT

A semiconductor chip is mounted on a heat sink disposed inside a through-hole of a wiring board, electrodes of the semiconductor chip and connecting terminals of the wiring board are connected by bonding wires, a sealing resin is formed to cover the semiconductor chip and the bonding wires, and solder balls are formed on the lower surface of the wiring board, thereby constituting the semiconductor device. The heat sink is thicker than the wiring board. The heat sink has a protruded portion protruding to outside from the side surface of the heat sink, the protruded portion is located on the upper surface of the wiring board outside the through-hole, and the lower surface of the protruded portion contacts to the upper surface of the wiring board. When the semiconductor device is manufactured, the heat sink is inserted from the upper surface side of the wiring board.

5 Claims, 95 Drawing Sheets

U.S. PATENT DOCUMENTS

| | | | |
|---|---|---|---|
| 5,793,613 A | 8/1998 | Poinelli et al. | |
| 6,156,980 A | 12/2000 | Peugh et al. | |
| 6,268,239 B1 | 7/2001 | Ikeda | |
| 6,271,581 B2 | 8/2001 | Huang et al. | |
| 6,462,413 B1 | 10/2002 | Polese et al. | |
| 6,538,303 B1 | 3/2003 | Kushino | |
| 6,755,229 B2 | 6/2004 | Kang et al. | |
| 6,861,747 B2 | 3/2005 | Miyazaki et al. | |
| 7,091,820 B2 * | 8/2006 | Fjelstad | 338/312 |
| 7,119,422 B2 | 10/2006 | Chin | |
| 7,138,667 B2 | 11/2006 | Barnett et al. | |
| 7,192,163 B2 | 3/2007 | Park | |
| 7,268,429 B2 | 9/2007 | Brandenburg et al. | |
| 7,394,665 B2 * | 7/2008 | Hamasaki et al. | 361/803 |
| 7,446,408 B2 | 11/2008 | Shim et al. | |
| 7,456,499 B2 | 11/2008 | Loh et al. | |
| 7,521,863 B2 | 4/2009 | Tanda | |
| 7,592,693 B2 * | 9/2009 | Murphy | 257/686 |
| 7,812,360 B2 | 10/2010 | Yano | |
| 7,821,020 B2 | 10/2010 | Park | |
| 7,851,999 B2 * | 12/2010 | Tanda | 313/512 |
| 7,893,546 B2 * | 2/2011 | Zhao et al. | 257/784 |
| 8,115,296 B2 * | 2/2012 | Bolken et al. | 257/692 |
| 2001/0044171 A1 * | 11/2001 | Mess | 438/127 |
| 2002/0053726 A1 * | 5/2002 | Mikubo et al. | 257/685 |
| 2002/0066954 A1 | 6/2002 | Huang et al. | |
| 2004/0264195 A1 | 12/2004 | Chang et al. | |
| 2006/0038282 A1 | 2/2006 | Lange | |

FOREIGN PATENT DOCUMENTS

| | | |
|---|---|---|
| JP | 2004-063830 A | 2/2004 |
| JP | 2004-296565 A | 10/2004 |
| WO | 02/084733 A1 | 10/2002 |

* cited by examiner

SEMICONDUCTOR DEVICE HAVING A PIN MOUNTED HEAT SINK

CROSS-REFERENCE TO RELATED APPLICATION

This is a continuation of U.S. patent application Ser. No. 13/049,109, filed Mar. 16, 2011, which is a continuation of U.S. patent application Ser. No. 12/481,078, filed Jun. 9, 2009, now U.S. Pat. No. 7,923,826, the contents of which are hereby incorporated by reference into this application.

The present application claims priority from Japanese Patent Application No. JP 2008-154497 filed on Jun. 12, 2008 and Japanese Patent Application No. JP 2009-6240 filed on Jan. 15, 2009, the contents of which are hereby incorporated by reference into this application.

TECHNICAL FIELD OF THE INVENTION

The present invention relates to a semiconductor device and a manufacturing method of the same, and more particularly to a technique effectively applied to a semiconductor package having improved heat dissipation properties and a manufacturing method of the same.

BACKGROUND OF THE INVENTION

A semiconductor device of a BGA package configuration is manufactured by mounting a semiconductor chip on a wiring board, electrically connecting electrodes of the semiconductor chip and connecting terminals of the wiring board by bonding wires, sealing the semiconductor chip and the bonding wires with resin, and connecting solder balls on a rear surface of the wiring board.

Japanese Patent Application Laid-Open Publication No. 2004-296565 (patent document 1) discloses a technique relating to the manufacturing method of a semiconductor element housing package, in which openings for cavities are bored in a panel-shaped resin substrate having a plurality of resin boards and heat sinks are formed and bonded so as to close the openings in the cavity periphery of one surface of the resin board.

Japanese Patent Application Laid-Open Publication No. 2003-46027 (patent document 2) discloses a technique, in which, in a heat dissipation BGA package having a metal heat sink bonded on one surface of a plastic circuit board having a notch space in its center part, the plastic circuit board and the heat sink are bonded by a fastening member and the plastic circuit board and at least an end part of the bonding surface of the heat sink are covered with adhesive resin.

Japanese Patent Application Laid-Open Publication No. 2004-63830 (patent document 3) discloses a technique, in which, in a heat dissipation BGA package having a metal heat sink bonded on one surface of a plastic circuit board, the plastic circuit board and the heat sink are bonded by a fastening member and the plastic circuit board and the heat sink are bonded by a flanged pin, and moreover, the flanged pin is press-fitted and its top end is accommodated inside the heat sink so as to be pressure-welded and bonded to the heat sink.

International Publication No. 2002/084733 (patent document 4) discloses a technique relating to a heat dissipation BGA package having a metal heat sink bonded on one surface of a plastic circuit board having a notch space in its center part, in which a fastening member for bonding the plastic circuit board and the heat sink is provided.

SUMMARY OF THE INVENTION

Studies by the inventors of the present invention have revealed the following facts.

With the improvement in performance of a semiconductor device, the calorific value of an incorporated semiconductor chip is also increased. This is because the driving power is also increased with the improvement in performance of a semiconductor chip (applied voltage value is also increased). Hence, it is desired to take heat dissipation measures for the heat generated in the semiconductor chip incorporated inside the semiconductor device.

As the heat dissipation measures, various means such as disposing thermal balls, installing a heat dissipation fin on a sealing body or providing a plane for the wiring board are possible. However, these means can dissipate only about 2.5 W at best. The cause thereof is that, for example, in the case of the thermal ball, there is a distance between a semiconductor device and a mounting board by the height of the ball, and the path through which the heat can pass through is provided only in the path corresponding to the diameter of the ball.

Hence, as disclosed in the patent document 1, it is considered to paste the heat sink to the wiring board so that the heat sink mounted with the semiconductor chip is exposed also from a mounting surface side of the wiring board (the surface opposite to the mounting board when the semiconductor device is mounted on the mounting board). However, it is found that, when the heat sink (0.5 mm) having a thickness larger than the board (0.2 mm) is pasted in consideration of heat dissipation properties, the heat sink falls off due to the weight of the heat sink itself. The falling off of the heat sink lowers the manufacturing yield of the semiconductor device.

Hence, as disclosed in the patent documents 2 to 4, it is possible to take measures for the falling off of the heat sink by inserting and caulking (interposing a dam-like member between an end part of the pin and the printed circuit board) a heat sink pin into the printed circuit board.

However, the studies conducted by the inventors have revealed that, if a metal member such as disclosed in the patent document 4 is interposed, the load in the pressing is directly transmitted to the wiring board, and therefore, a crack of the wiring board is not sufficiently suppressed.

An object of the present invention is to provide a technique capable of improving the heat dissipation properties of the semiconductor device.

Further, another object of the present invention is to provide a technique capable of improving the manufacturing yield of the semiconductor device.

The above and other objects and novel characteristics of the present invention will be apparent from the description of this specification and the accompanying drawings.

The typical ones of the inventions disclosed in this application will be briefly described as follows.

A semiconductor device according to a representative embodiment comprises: (a) a board having a first main surface and a second main surface opposite to the first main surface, the board including a through-hole reaching the second main surface from the first main surface, a plurality of first electrodes formed around the through-hole on the first main surface, a plurality of second electrodes formed around the through-hole on the second main surface, and a heat sink disposed inside the through-hole; (b) a semiconductor chip having a third main surface, on which a plurality of third electrodes are formed, and mounted on an upper surface of the heat sink; (c) a plurality of conductive wires electrically connecting the plurality of third electrodes of the semiconductor chip and the plurality of first electrodes of the board; (d) a sealing portion for sealing the semiconductor chip and the plurality of conductive wires; and (e) a plurality of external terminals formed on the plurality of second electrodes of the board, respectively. Also, a thickness of the heat sink is larger than a thickness of the board, the heat sink has a protruded portion protruding to outside from a side surface of the heat sink in a peripheral edge portion of the upper surface of the heat sink, the protruded portion is located on the first main surface of the board outside the through-hole, and a lower surface of the protruded portion contacts to the first main surface of the board.

Further, a manufacturing method of a semiconductor device according to a representative embodiment comprises: (a) a step of preparing a heat sink having a protruded portion protruding to outside from a side surface of the heat sink in a peripheral edge portion of an upper surface of the heat sink; (b) a step of preparing a board having a first main surface, a second main surface opposite to the first main surface, a through-hole reaching the second main surface from the first main surface, a plurality of first electrodes formed around the through-hole on the first main surface, and a plurality of second electrodes formed around the through-hole on the second main surface; (c) a step of disposing the heat sink inside the through-hole of the board so that the protruded portion is located on the first main surface of the board outside the through-hole and a lower surface of the protruded portion contacts to the first main surface of the board; (d) a step of mounting, on the upper surface of the heat sink, the semiconductor chip having a third main surface on which a plurality of third electrodes are formed; (e) a step of electrically connecting the plurality of third electrodes of the semiconductor chip and the plurality of first electrodes of the board through a plurality of conductive wires; (f) a step of sealing the semiconductor chip and the plurality of conductive wires by resin; and (g) a step of forming a plurality of external terminals on the plurality of second electrodes of the board, respectively. Also, the heat sink is inserted into the through-hole from a first main surface side of the board in the step (c).

Further, a manufacturing method of a semiconductor device according to another representative embodiment comprises: (a) a step of preparing a board having a first main surface, a second main surface opposite to the first main surface, a through-hole reaching the second main surface from the first main surface, a plurality of first electrodes formed around the through-hole on the first main surface, a plurality of second electrodes formed around the through-hole on the second main surface, and a heat sink disposed inside the through-hole; (b) a step of mounting, on an upper surface of the heat sink, a semiconductor chip having a third main surface on which a plurality of third electrodes are formed; (c) a step of electrically connecting the plurality of third electrodes of the semiconductor chip and the plurality of first electrodes of the board through a plurality of conductive wires; (d) a step of sealing the semiconductor chip and the plurality of conductive wires by resin; and (e) a step of forming a plurality of external terminals on the plurality of second electrodes of the board, respectively. Also, in the board prepared in the step (a), a thickness of the heat sink is larger than a thickness of the board, the heat sink has a protruded portion protruding to outside from a side surface of the heat sink in a peripheral edge portion of the upper surface of the heat sink, the protruded portion is located on the first main surface of the board outside the through-hole, and a lower surface of the protruded portion contacts to the first main surface of the board.

Further, a manufacturing method of a semiconductor device according to another representative embodiment comprises: (a) a step of preparing a frame in which a plurality of heat sinks are joined to a frame portion by a joining portion, respectively; (b) a step of preparing a board having a first main surface, a second main surface opposite to the first main surface, a plurality of through-holes reaching the second main surface from the first main surface, a plurality of first electrodes formed around each through-hole on the first main surface, and a plurality of second electrodes formed around each through-hole on the second main surface; (c) a step of mounting, on upper surfaces of the plurality of heat sinks of the frame, a plurality of semiconductor chips each having a third main surface on which a plurality of third electrodes are formed, respectively; (d) a step of disposing the frame on the first main surface of the board and inserting each heat sink into each through-hole of the board; (e) a step of electrically connecting the plurality of third electrodes of the plurality of semiconductor chips and the plurality of first electrodes of the board through a plurality of conductive wires; (f) a step of forming a sealing resin portion for sealing the plurality of semiconductor chips and the plurality of conductive wires on the first main surface of the board; (g) a step of forming a plurality of external terminals on the plurality of second electrodes of the boards, respectively; and (h) a step of cutting the board, the frame and the sealing resin portion on the first main surface of the board.

Further, a manufacturing method of a semiconductor device according to another representative embodiment comprises: (a) a step of preparing a frame in which a plurality of heat sinks are joined to a frame portion by a joining portion, respectively; (b) a step of preparing a plurality of boards each having a first main surface, a second main surface opposite to the first main surface, a through-hole reaching the second main surface from the first main surface, a plurality of first electrodes formed around the through-hole on the first main surface, and a plurality of second electrodes formed around the through-hole on the second main surface; (c) a step of mounting, on upper surfaces of the plurality of heat sinks of the frame, a plurality of semiconductor chips each having a third main surface on which a plurality of third electrodes are formed, respectively; (d) a step of fixing the frame and the plurality of boards from a first main surface side of each board so that each heat sink is inserted into the through-hole of each board; (e) a step of electrically connecting the plurality of third electrodes of each semiconductor chip and the plurality of first electrodes of each board through a plurality of conductive wires; (f) a step of forming a sealing resin portion on the first main surface of each board so that the semiconductor chip and the plurality of conductive wires thereon are sealed; (g) a step of forming a plurality of external terminals on the plurality of second electrodes of each board, respectively; and (h) a step of cutting the frame protruding from the sealing resin portion.

The effects obtained by typical embodiments of the inventions disclosed in this application will be briefly described below.

According to the exemplary embodiment, it is possible to improve the heat dissipation properties of the semiconductor device.

Further, it is possible to improve the manufacturing yield of the semiconductor device.

BRIEF DESCRIPTIONS OF THE DRAWINGS

DESCRIPTION OF THE PREFERRED EMBODIMENTS

Figure 1:
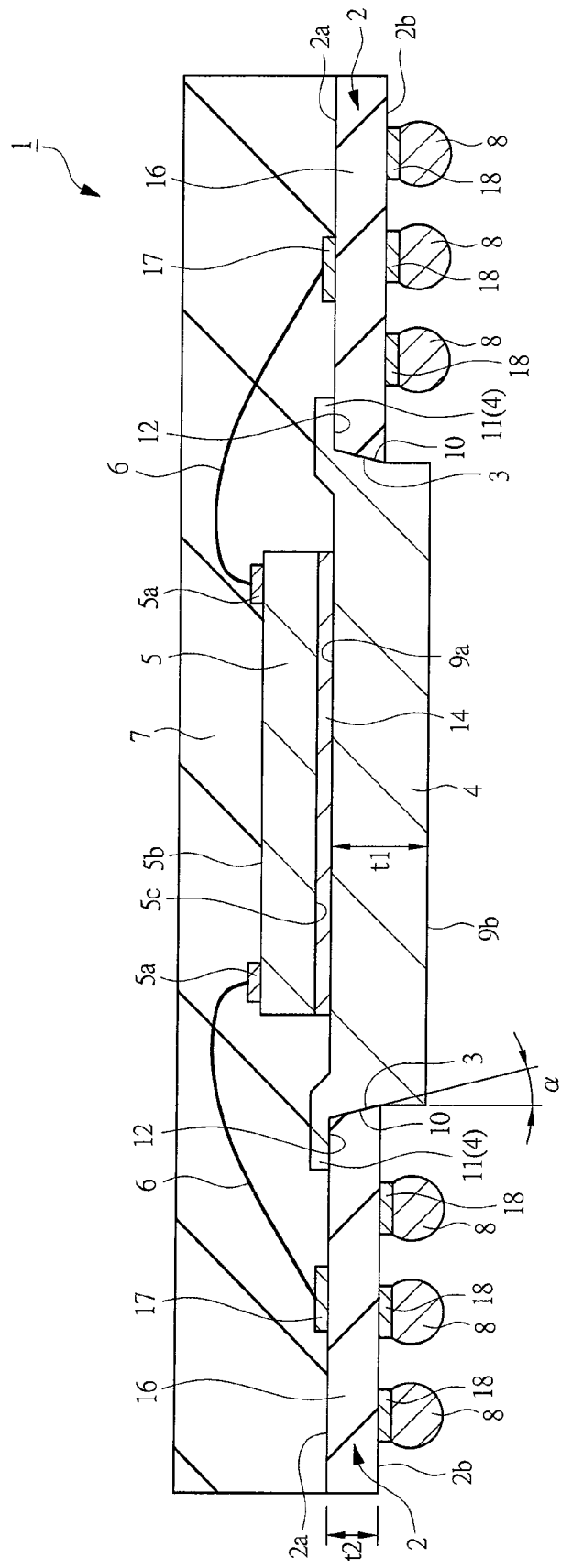
FIG. 1 is a cross-sectional view of a semiconductor device according to one embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference numbers throughout the drawings for describing the embodiments, and the repetitive description thereof will be omitted. Also, in the embodiments described below, descriptions of the same or similar components are not repeated in principle except the case where the descriptions are particularly necessary.

Also, in the drawings used in the embodiments, hatching is omitted even in a cross-sectional view and is used even in a plan view so as to make the drawings easy to see.

First Embodiment

A semiconductor device and a manufacturing method (manufacturing process) of the same according to one embodiment of the present invention will be described with reference to the drawings.

Figure 2:
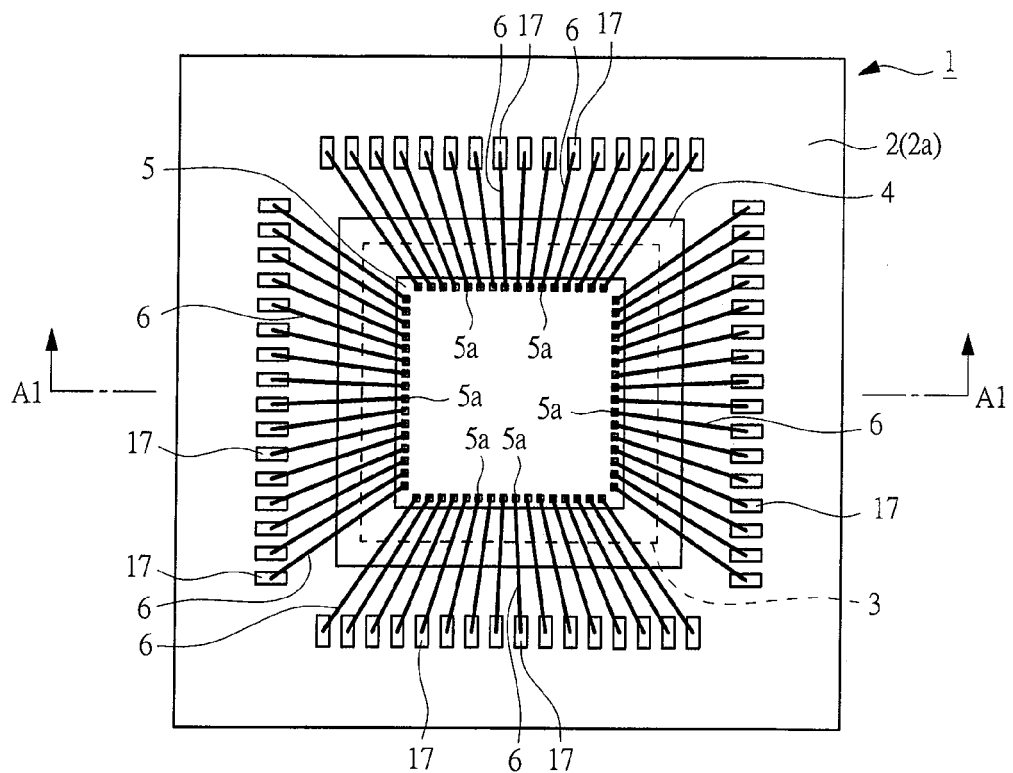
FIG. 2 is a perspective plan view of the semiconductor device of FIG. 1.
Figure 3:
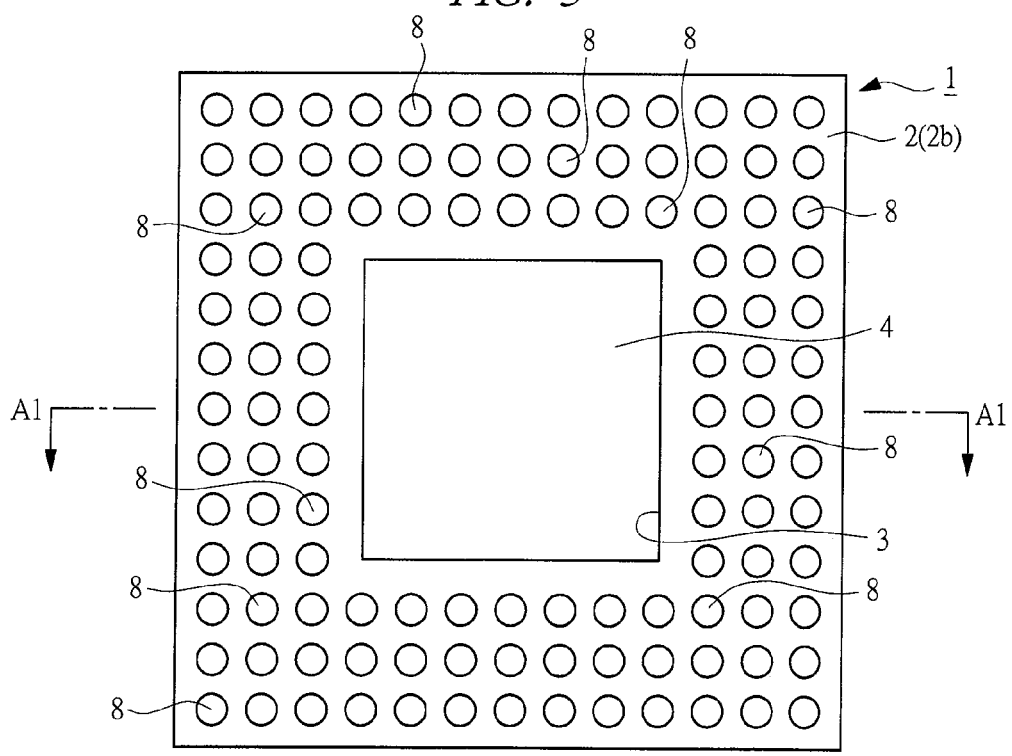
FIG. 3 is a lower surface view of the semiconductor device of FIG. 1.
Figure 4:
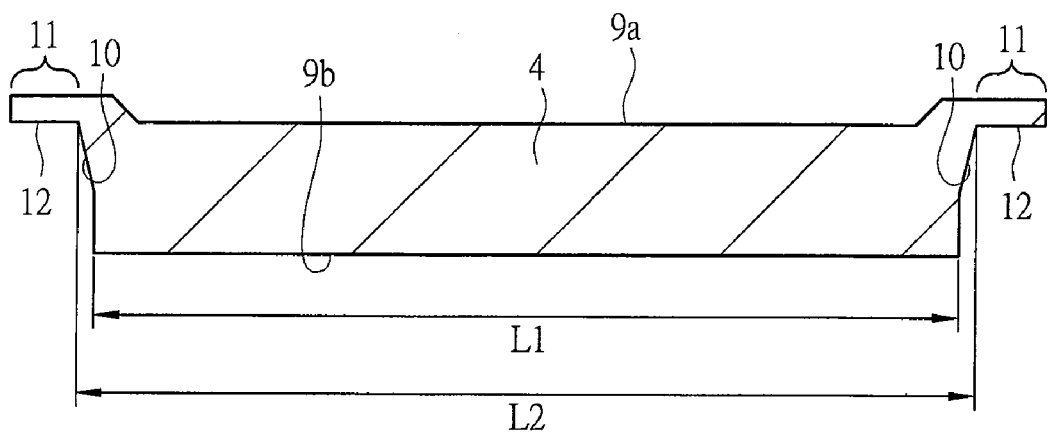
FIG. 4 is a cross-sectional view of a heat sink used in the semiconductor device of FIG. 1.
Figure 5:
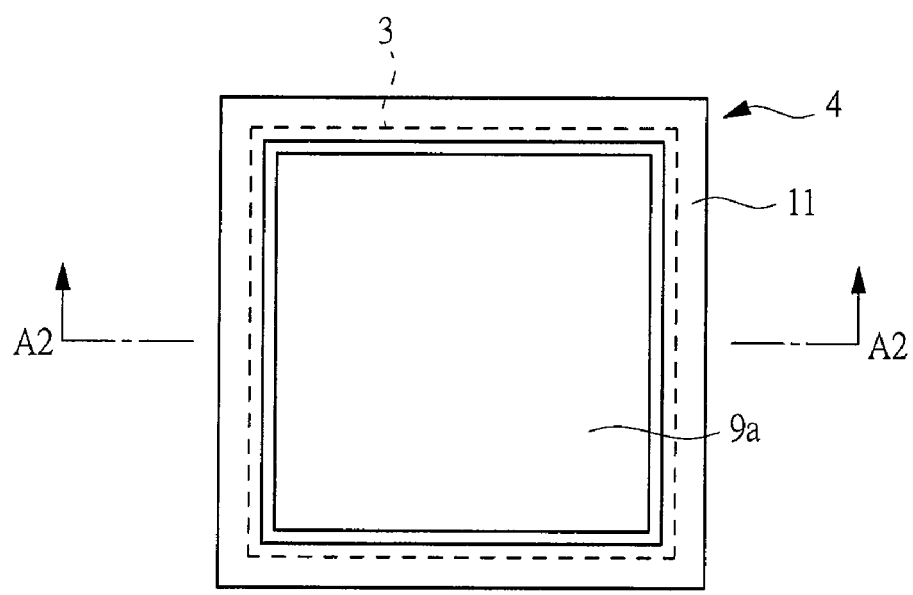
FIG. 5 is an upper surface view of the heat sink of FIG. 4.
Figure 6:
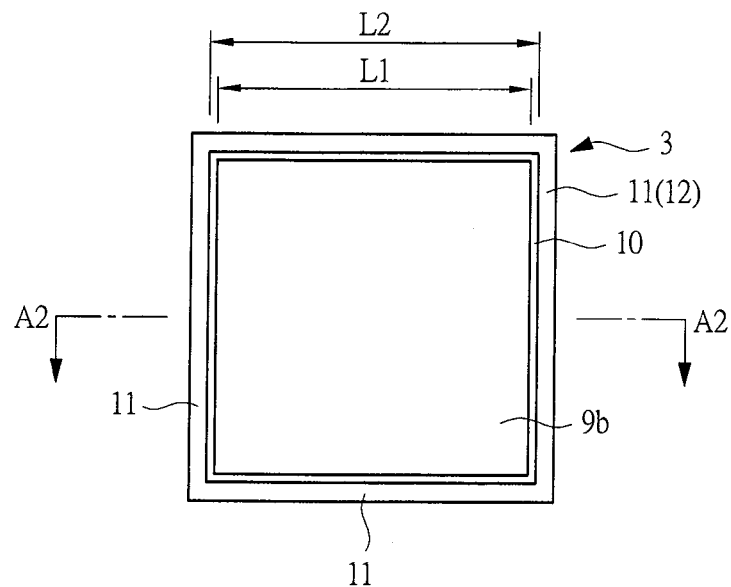
FIG. 6 is a lower surface view of the heat sink of FIG. 4.
Figure 7:
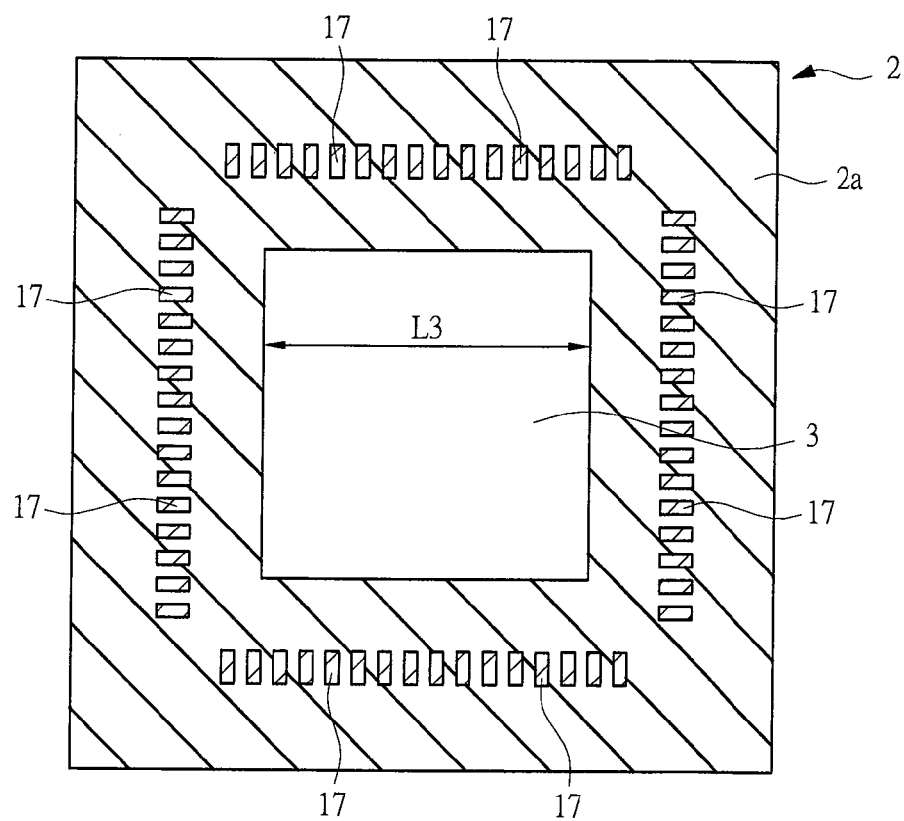
FIG. 7 is an upper surface view of a wiring board used in the semiconductor device of FIG. 1.

FIG. 1 is a cross-sectional view (side cross-sectional view) of a semiconductor device 1 according to one embodiment of the present invention, FIG. 2 is a perspective plan view (upper surface view) of the semiconductor device 1 when seen through a sealing resin 7, and FIG. 3 is a lower surface view (bottom view, rear view, plan view) of the semiconductor device 1. The cross-sections cut along the line A1-A1 of FIGS. 2 and 3 almost correspond to FIG. 1. Also, FIG. 4 is a cross-sectional view (side cross-sectional view) of a heat sink 4 used in the semiconductor device 1 of the present embodiment, FIG. 5 is an upper surface view (plan view) of the heat sink 4, and FIG. 6 is a lower surface view (plan view) of the heat sink 4. The cross-sections cut along the line A2-A2 of FIGS. 5 and 6 almost correspond to FIG. 4, but FIGS. 4 and 1 show the same cross-sectional positions. Further, FIG. 7 is an upper surface view (plan view) of a wiring board 2 used in the semiconductor device 1 of the present embodiment. Although FIG. 7 is a plan view, hatching is applied to the wiring board 2 and connecting terminals 17 of its upper surface 2a so as to make a position and a shape of a through-hole 3 in the wiring board 2 easily understood. In FIG. 2, the position of the through-hole 3 of the wiring board 2 which is invisible and concealed by the heat sink 4 even when the sealing resin 7 is seen through is shown by a dotted line for easy understanding.

The semiconductor device 1 of the present embodiment shown in FIGS. 1 to 3 is the semiconductor device of a resin-sealed semiconductor package configuration.

The semiconductor device 1 of the present embodiment includes the wiring board 2, the heat sink 4 disposed inside the through-hole 3 of the wiring board 2, a semiconductor chip 5 mounted on the heat sink 4, a plurality of bonding wires 6 electrically connecting a plurality of electrodes 5a of the semiconductor chip 5 and a plurality of connecting terminals 17 of the wiring board 2, a sealing resin 7 covering the upper surface 2a of the wiring board 2 including the semiconductor chip 5 and the bonding wires 6, and a plurality of solder balls 8 provided on the lower surface 2b of the wiring board 2.

The wiring board (board, package board, wiring board for package) 2 includes an upper surface (first main surface) 2a which is one main surface and a lower surface (rear surface, second main surface) 2b which is the main surface opposite to the upper surface 2a. The through-hole 3 reaching the lower surface 2b from the upper surface 2a of the wiring board 2 is provided in the vicinity of the center of the wiring board 2, and the heat sink 4 is disposed and fixed inside this through-hole 3.

The heat sink (Heat Spreader) 4 has an upper surface (front surface, main surface, chip supporting surface) 9a which is one main surface and a lower surface 9b which is a main surface opposite to the upper surface 9a, and the semiconductor chip 5 is mounted on the upper surface 9a of the heat sink 4. Consequently, the upper surface 9a of the heat sink 4 is a chip mounting surface (surface on which the semiconductor chip 5 is mounted). The chip mounting surface of the heat sink 4 is almost parallel to the upper surface 2a of the wiring board 2. A thickness t1 of the heat sink 4 is larger than a thickness t2 of the wiring board 2 (that is, t1>t2), and a lower part (including the lower surface 9b) of the heat sink 4 protrudes from the lower surface 2b of the wiring board 2. Here, the thickness t1 of the heat sink 4 corresponds to a dimension (distance) from the upper surface 9a (chip mounting surface) of the heat sink 4 to the lower surface 9b of the heat sink 4, and the thickness t2 of the wiring board 2 corresponds to the dimension (distance) from the upper surface 2a to the lower surface 2b of the wiring board 2. Also, the heat sink 4 can be taken also as a conductive portion (metal portion) for chip mounting.

The heat sink 4 thicker than the wiring board 2 is disposed inside the through-hole 3 of the wiring board 2, and the semiconductor chip 5 is disposed on this heat sink 4, thereby transmitting a heat generated in the semiconductor chip 5 at the time of using the semiconductor device 1 to the heat sink 4, so that the heat can be dissipated to the outside of the semiconductor device 1 from an exposed portion (lower surface 9b of the heat sink 4) of the heat sink 4. For the improvement of the heat dissipation properties, it is effective to make the thickness t1 of the heat sink 4 larger, and the heat dissipation properties of the semiconductor device 1 can be improved by making the thickness t1 of the heat sink 4 larger than the thickness t2 of the wiring board 2 (that is, t1>t2). For example, when the thickness t2 of the wiring board 2 is about 0.2 mm, the thickness t1 of the heat sink 4 can be made about 0.6 mm, or when the thickness t2 of the wiring board 2 is about 0.6 mm, the thickness t1 of the heat sink 4 can be made about 1.2 mm.

The heat sink 4 is a member for dissipating the heat generated in the semiconductor chip 5 and preferably has high heat conductivity, and it is necessary that the heat conductivity (heat conductivity coefficient) of the heat sink 4 is higher than at least the heat conductivity (heat conductivity coefficient) of the wiring board 2 and the sealing resin 7. Since conductive materials (particularly metal materials) are also high in heat conductivity, the heat sink 4 is preferably made of a conductive material and is more preferably formed of a metal material. It is more preferable that a metal material such as copper (Cu) or copper (Cu) alloy whose main component is copper (Cu) is used for the heat sink 4 because high heat conductivity of the heat sink 4 can be obtained and the processing (formation of the heat sink 4) is easy.

The trough-hole 3 of the wiring board 2 has, for example, a rectangular planar shape. In the heat sink 4, the cross-sectional shapes of a portion located inside the through hole 3 and a portion protruding downward from the lower surface 2b of the wiring board 2 (lower part of the heat sink 4) parallel to the upper surface 2a of the wiring board 2 are almost the same as the planar shape of the through-hole 3 of the wiring board 2. A side surface (side wall) 10 of the heat sink 4 contacts to (adheres to) an inner wall (side wall, side surface) of the through-hole 3 of the wiring board 2. Further, the lower surface 9b of the heat sink 4 also has almost the same planar shape as the planar shape of the through-hole 3 of the wiring board 2.

The heat sink 4 has a protruded portion (projecting portion, overhang portion, hook portion) 11 protruding to the outside (in the direction away from the center of the upper surface 9a) from the side surface 10 of the heat sink 4 (side surface 10 contacting to the inner wall of the through-hole 3 of the wiring board 2) in the peripheral edge portion (peripheral portion) of the upper surface 9a of the heat sink 4, and this protruded portion 11 is located on the upper surface 2a of the wiring board 2 outside the through-hole 3 and the lower surface of the protruded portion 11 contacts to the upper surface 2a of the wiring board 2. That is, the heat sink 4 has the protruded portion 11, which protrudes to the upper side of the upper surface 2a of the wiring board 2 from above the through-hole 3 and extends on the upper surface 2a of the wiring board 2, on the peripheral edge portion of the upper surface 9a of the heat sink 4, and this protruded portion 11 projects (overhung) on the upper surface 2a of the wiring board from the through-hole 3. This protruded portion 11 is integrally formed with the heat sink 4 and can be taken as a part of the heat sink 4.

Consequently, in the semiconductor device 1, when seen in a plane parallel to the upper surface 2a of the wiring board 2, the portions other than the protruded portions 11 of the heat sink 4 are located at a planarly overlapped position with the through-hole 3, and the protruded portions 11 only are located outside the through-hole 3 (at the position not planarly overlapped with the through-hole 3, that is, at the position overlapped with the wiring board 2). For easy understanding, a planar position of the through-hole 3 when the heat sink 4 is disposed inside the through-hole 3 of the wiring board 2 is shown by a dotted line in FIG. 5.

Although the details will be described later, the heat sink 4 is inserted and fixed into the through-hole 3 from the upper surface 2a side of the wiring board 2 before the sealing resin 7 is formed. If the heat sink 4 has no protruded portion 11 and the cross-sectional shape parallel to the upper surface 2a of the wiring board 2 is the same as the planar shape of the through-hole 3 in any part of the heat sink 4 unlike the present embodiment, the heat sink 4 is likely to fall off from the through-hole 3 of the wiring board 2 at the time of inserting the heat sink 4 into the through-hole 3 from the upper surface 2a side of the wiring board 2. In contrast to this, in the present embodiment, since the heat sink 4 is provided with the protruded portion 11, the protruded portion 11 of the heat sink 4 is caught on the upper surface 2a of the wiring board 2 at the time of inserting the heat sink 4 into the through-hole 3 from the upper surface 2a side of the wiring board 2, and therefore, it is possible to prevent the heat sink 4 from falling off from the through-hole 3 of the wiring board 2, and the heat sink 4 can be retained inside the through-hole 3 of the wiring board 2.

Since the protruded portion 11 of the heat sink 4 functions as a stopper for preventing the sink plate 4 from falling off from the through-hole 3 of the wiring board 2, it is necessary to provide the protruded portion 11 at least in a part of the peripheral edge portion (peripheral portion) of the upper surface 9a of the heat sink 4. Hence, if the protruded portion 11 is provided at least in a part of the peripheral edge portion of the upper surface 9a of the heat sink 4 though not in the entire peripheral edge portion of the upper surface 9a of the heat sink 4, it is possible to prevent the heat sink 4 from falling off from the through-hole 3 of the wiring board 2. However, if the protruded portion 11 (in a flange shape or in an overhang shape) is provided in the entire peripheral edge portion (peripheral portion) of the upper surface 9a of the heat sink 4 as shown in FIG. 6, the heat sink 4 can be stably disposed inside the through-hole 3 of the wiring board 2. Therefore, in the present embodiment, in the heat sink 4, the protruded portion 11 is provided at least in a part of the peripheral edge portion of the upper surface 9a of the heat sink 4, and more preferably provided in the entire peripheral edge portion (peripheral portion) of the upper surface 9a of the heat sink 4. When the protruded portion 11 is provided in the entire peripheral edge portion (peripheral portion) of the upper surface 9a of the heat sink 4, the protruded portion 11 is preferably formed in a flange shape or in an overhang shape in the heat sink 4.

Also, the side surface 10 of the heat sink 4 contacting to the inner wall of the through-hole 3 preferably has a tapered shape (is tapered). In other words, the part of the heat sink 4 located inside the through-hole 3 has a tapered cross-sectional shape (shape in cross-section vertical to the chip mounting surface of the heat sink 4). Hence, the dimension of the heat sink 4 of the portion except the protruded portion (dimension of the cross-section parallel to the upper surface 2a of the wiring board 2) is slightly larger on the upper side than on the lower side. More specifically, a dimension L2 of the upper part of the heat sink 4 (except the protruded portion 11) is slightly larger than a dimension L1 of the lower part of the heat sink 4 (that is, L2>L1).

Since the side surface 10 of the heat sink 4 contacting to the inner wall of the through-hole 3 has a tapered shape, this side surface 10 is not vertical to the chip mounting surface (upper surface 2a) of the heat sink 4, but is inclined by an angle α with respect to the vertical direction (here, α>0). That is, a vertical line of the side surface 10 of the heat sink 4 (line vertical to the side surface 10) is not parallel to the chip mounting surface (upper surface 2a) of the heat sink 4, but is inclined by an angle α with respect to the parallel direction. Also, since the chip mounting surface (upper surface 9a) of the heat sink 4 is almost parallel to the upper surface 2 of the wiring board 2, the side surface 10 of the heat sink 4 contacting to the inner wall of the through-hole 3 is not vertical to the upper surface 2a of the wiring board 2, but is inclined by the angle α with respect to the vertical direction. This inclined angle α of the side surface 10 of the heat sink 4 is preferably about 3 to 30°.

On the other hand, the inner wall of the through-hole 3 of the wiring board 2 before the heat sink 4 is inserted is almost vertical to the upper surface 2a of the wiring board 2. Further, a dimension L3 of the through-hole 3 of the wiring board 2 before the heat sink 4 is inserted is made the same or slightly larger than the dimension L1 of the lower part of the heat sink 4 (that is, L1≦L3), and is made smaller than the dimension L2 of the upper portion of the heat sink 4 (except the protruded portion 11) (that is, L3<L2). By this means, when the heat sink 4 is inserted into the through-hole 3 from the upper surface 2a side of the wiring board 2 at the time of manufacturing the semiconductor device 1, the heat sink 4 is pushed into the through-hole 3, and the heat sink 4 and the wiring board 2 can be caulked by the tapered shape of the side surface 10 of the heat sink 4, and the heat sink 4 can be fixed to the wiring board 2. More specifically, when the heat sink 4 is inserted into the through-hole 3 from the upper surface 2a side of the wiring board 2 at the time of manufacturing the semiconductor device 1, since the through-hole 3 of the wiring board is expanded in the lateral direction by the tapered shape of the side surface 10 of the heat sink 4, a force for causing the inner wall of the through-hole 3 of the wiring board 2 to be adhered and pushed to the side surface 10 of the heat sink 4 is operated by its reaction, so that the heat sink 4 can be fixed to the wiring board 2. Accordingly, since the heat sink 4 can be fixed to the wiring board 2 until the sealing resin 7 is formed, the manufacture of the semiconductor device 1 can be facilitated.

The semiconductor chip 5 has a rectangular (square) shape in a plane vertical to its thickness. For example, after various semiconductor elements or semiconductor integrated circuits and the like are formed on the main surface of a semiconductor substrate (semiconductor wafer) made of single-crystal silicon or the like, a rear surface grinding of the semiconductor substrate is performed as required, and then, the semiconductor substrate is separated into each semiconductor chip 5 by the dicing or the like. The semiconductor chip 5 has a front surface (main surface, upper surface, third main surface on the semiconductor element formation side) 5b and a rear surface (main surface, lower surface opposite to the main surface on the semiconductor element formation side) 5c which are opposed to each other, and it is mounted (disposed) on the upper surface 9a of the heat sink 4 so that the front surface 5b of the semiconductor chip 5 is directed upward, and the rear surface 5c of the semiconductor chip 5 is bonded and fixed to the upper surface 9a of the heat sink 4 through a bonding agent (die bond agent, bonding agent, adhesive) 14. The planar dimensions of the through-hole 3 of the wiring board 2 and the heat sink 4 are larger than the planar dimensions of the semiconductor chip 5, respectively, and the semiconductor chip 5 mounted on the heat sink 4 is disposed so as to be planarly enclosed in the through-hole 3 of the wiring board 2 and the heat sink 4. As the bonding agent 14, the bonding agent having high heat conductivity is preferably used, and for example, solder or a conductive paste material (the paste material preferable as a conductive paste material is silver paste) can be used. A plurality of electrodes (bonding pad, pad electrode, electrode pad, third electrode) 5a are formed on the front surface of the semiconductor chip 5, and the electrodes 5a are electrically connected to the semiconductor element or the semiconductor integrated circuit formed inside the semiconductor chip 5 or on the surface layer portion.

The wiring board 2 includes an insulating base material layer (insulating board, core material) 16 and a conductor layer (conductor pattern, conductor film pattern, wiring layer) formed on the upper surface and the lower surface of the base material layer 16. A board in which the conductor layer is formed on the upper surface and the lower surface of one insulating layer (base material layer 16) or a multilayer wiring board (multilayer board) in which a plurality of insulating layers (base material layers) and a plurality of conductor layers (wiring layers) are alternately formed (integrated) over multiple layers may be used as the wiring board 2, but the multilayer wiring board is more preferable. In FIG. 1, the illustration of the wiring layer inside the wiring board 2 (interlayer of the base material layer 16) is omitted. For example, a resin material (for example, a glass epoxy resin) and the like can be used as the base material layer 16 of the wiring board 4.

The conductor layers of the upper surface and the lower surface of the base material layer 16 are developed into certain patterns and can be formed by a conductive material such as a copper thin film formed by, for example, an electroplating method. A plurality of the connecting terminals (electrodes, bonding leads, bonding pads, pad electrodes, first electrodes) 17 and wirings connected thereto for connecting the bonding wires 6 are formed on the upper surface 2a of the wiring board 2 by the conductor layer of the upper surface of the base material layer 16, and a plurality of conductive lands (electrodes, land electrodes, pads, terminals, second electrodes) 18 for connecting the solder balls 8 are formed on the lower surface 2b of the wiring board 2 by the conductor layer of the lower surface of the base material layer 16. The plurality of connecting terminals 17 are disposed (formed) around the through-hole 3 on the upper surface 2a of the wiring board 2, and the plurality of lands 18 are disposed (formed) around the through-hole 3 on the lower surface 2b of the wiring board 2. Also, solder resist layers (not shown) can be formed according to need on the upper surface 2a and the lower surface 2b of the wiring board 2. In this case, on the upper surface 2a and the lower surface 2b of the wiring board 2, the connecting terminals 17 and the lands 18 are exposed from a solder resist layer, and other conductor layers are covered by the solder resist layer.

The wirings (wirings connected with the connecting terminals 17) of the upper surface 2a of the wiring board 2 and the lands 18 of the lower surface 2b are electrically connected through conductors and the like inside the unillustrated through-hole formed in (base material layer 16 of) the wiring board 2. The unillustrated through-holes for connecting the wirings and the lands 18 are sufficiently small in planar dimension (dimension in a planar surface parallel to the upper surface 2a and the lower surface 2b of the wiring board 2) as compared with the through-hole 3.

Consequently, the plurality of electrodes 5a of the semiconductor chip 5 are electrically connected to the plurality of connecting terminals 17 of the wiring board 2 through a plurality of bonding wires 6, and further electrically connected to the plurality of lands 18 of the lower surface 2b of the wiring board 2 through the wirings of the wiring board 2 (wirings connected with the connecting terminals 17) and the conductors inside the through-holes (not shown) and the like. The bonding wires (conductive wires) 6 are conductive wires (connecting members) and are made of, for example, thin metal wires such as gold wires.

The plurality of lands 18 are disposed in an array pattern in a region having no through-hole 3 (region having the base material layer 16 of the wiring board 2) on the lower surface 2b of the wiring board 2, and the solder ball (ball electrode, solder bump, bump electrode, protruded portion electrode) 8 is connected to each of the lands 18. Hence, in the region having no through-hole 3 (region having the base material layer 16 of the wiring board 2) on the lower surface 2b of the wiring board 2, the plurality of solder balls 8 are disposed in an array pattern as external terminals. The lower surface 2a of the wiring board 2 disposed with the solder balls 8 become the lower surface of the semiconductor device 1, and this becomes a mounting surface of the semiconductor device 1 (main surface of the side mounted on the mounting board). Consequently, the semiconductor device 1 of the present embodiment is a semiconductor device of a BGA (Ball Grid Array Package) configuration. The solder ball 8 is made of a solder material, and can function as a bump electrode (protruded portion electrode, solder bump) of the semiconductor device 1 and can function as the external terminal (terminal for external connection) of the semiconductor device 1. Hence, a plurality external terminals (solder balls 8 in this case) are formed on the plurality of lands 18 of the wiring board 2, respectively.

Since the thickness t1 of the heat sink 4 is thicker than the thickness t2 of the wiring board 2, the lower surface 9b of the heat sink 4 protrudes from the lower surface 2b of the wiring board 2, but the lower surface 9b of the heat sink 4 is located on the lower surface 2b side of the wiring board 2 compared with the position of the lower end of the solder ball 8 (end part opposite to the side connected to the land 18, that is, top end of the solder ball 18). More specifically, when the semiconductor device 1 is disposed on a flat surface, the lower end of the solder ball 8 contacts to the flat surface, but the lower surface 9b of the heat sink 4 does not contact thereto. In this manner, when the semiconductor device 1 is mounted on the mounting board, the heat sink 4 can be prevented from becoming a hindrance.

The plurality of electrodes 5a of the semiconductor chip 5 are electrically connected to the plurality of connecting terminals 17 of the wiring board 2 through the plurality of bonding wires 6, and further electrically connected to the plurality of lands 18 of the wiring board 2 and the plurality of solder balls 8 connected to the plurality of lands 18 through the wirings of the wiring board 2 and the conductors inside the through-holes (not shown) and the like.

The sealing resin (sealing resin portion, resin sealing portion, sealing portion, sealing body) 7 is made of, for example, a resin material such as a thermosetting resin material and can contain the filler and the like. For example, it is also possible to form the sealing resin 7 by using the epoxy resin containing the filler and the like. The sealing resin 7 is formed so as to cover the semiconductor chip 5 and the bonding wire 6 on the upper surface 2a of the wiring board and the upper surface 9a of the heat sink 4, and the semiconductor chip 5 and the bonding wire 6 are sealed and protected by the sealing resin 7.

Also, the sealing resin 7 is adhered (bonded) to the wiring board 2 and the heat sink 4, respectively, so that the wiring board 2, the heat sink 4 and the sealing resin 7 are coupled, and further the protruded portion 11 of the heat sink 4 is sandwiched by the sealing resin 7 and the wiring board 2, so that the coupling of the wiring board 2, the heat sink 4 and the sealing resin 7 is strengthened.

In this manner, the semiconductor device 1 of the present embodiment is a semiconductor device (semiconductor package) in which the semiconductor chip 5 is mounted on the heat sink 4 disposed inside the through-hole 3 of the wiring board 2. The solder balls 8 are bonded on the lower surface 2a below the wiring board 2 as external terminals, and the heat sink 4 is exposed from the lower surface 2a of the wiring board 2. The heat generated in the semiconductor chip 5 is transmitted to the heat sink 4 through the bonding agent 14, and can be dissipated to the outside of the semiconductor device 1 from the exposed portion of the heat sink 4 (lower portion of the heat sink 4) on the lower surface side (lower surface 2a of the wiring board 2) of the semiconductor device 1. Hence, the semiconductor device 1 of the present embodiment is a high heat-dissipation semiconductor device (semiconductor package).

Figure 8:
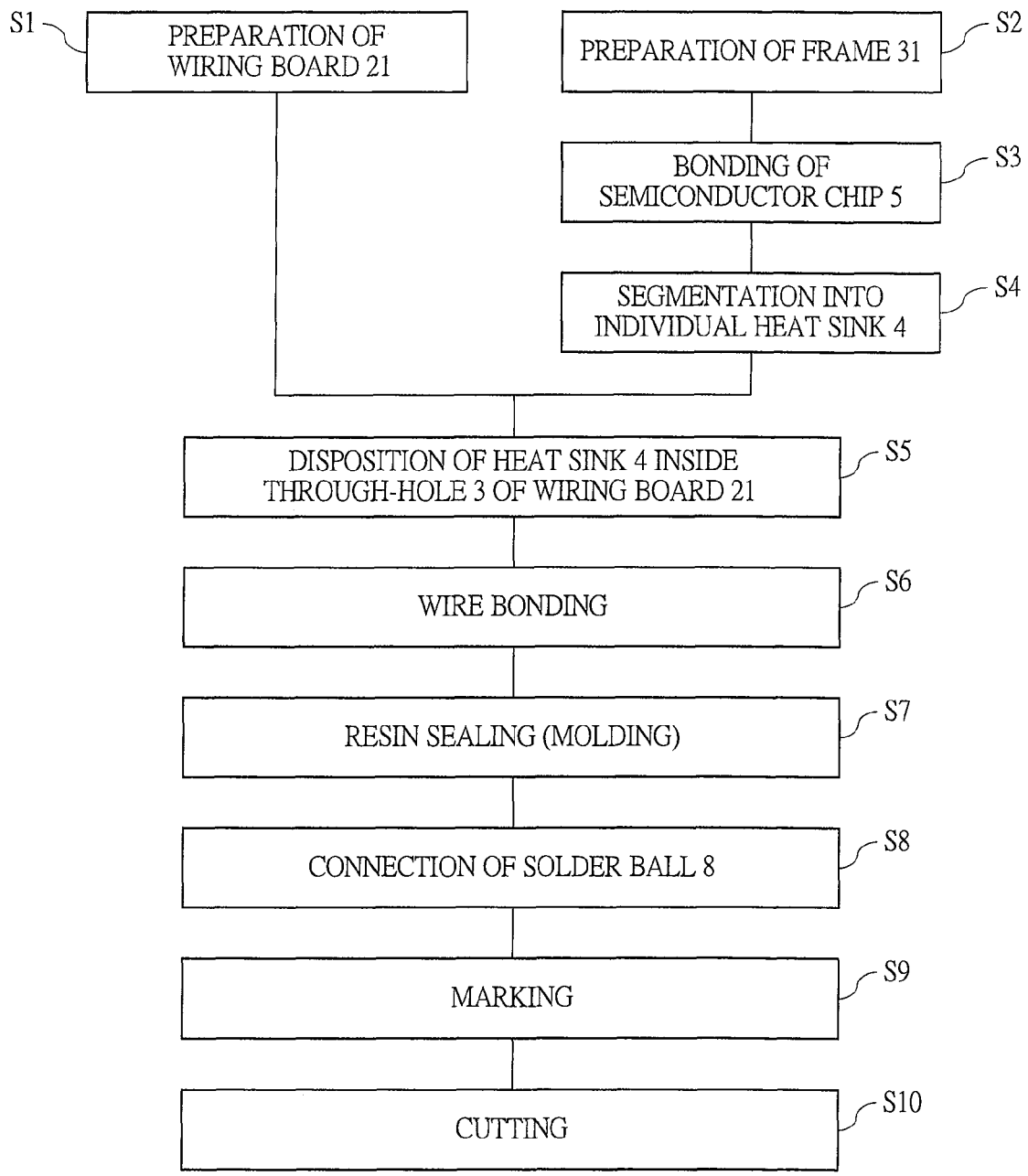
FIG. 8 is a process flowchart showing a manufacturing process of the semiconductor device according to one embodiment of the present invention.
Figure 15:
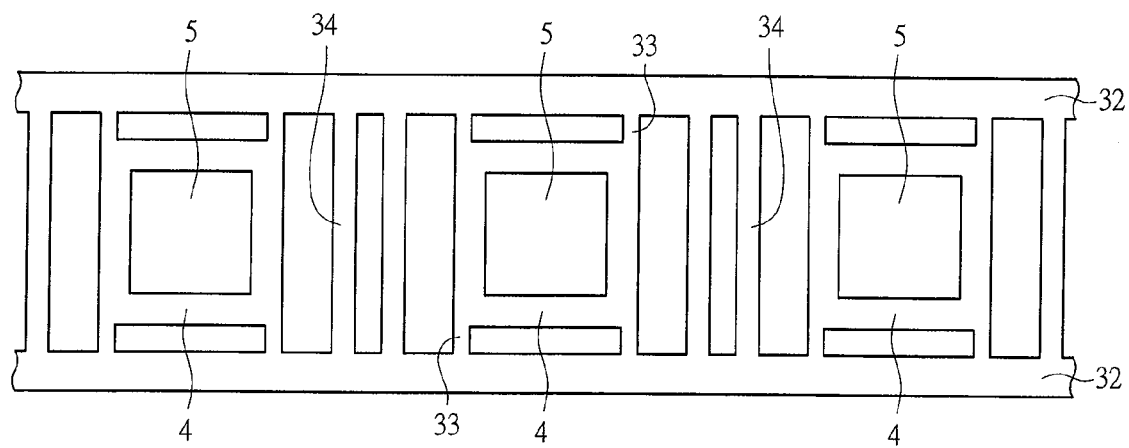
FIG. 15 is a plan view showing the manufacturing process of the semiconductor device subsequent to FIG. 13.
Figure 16:
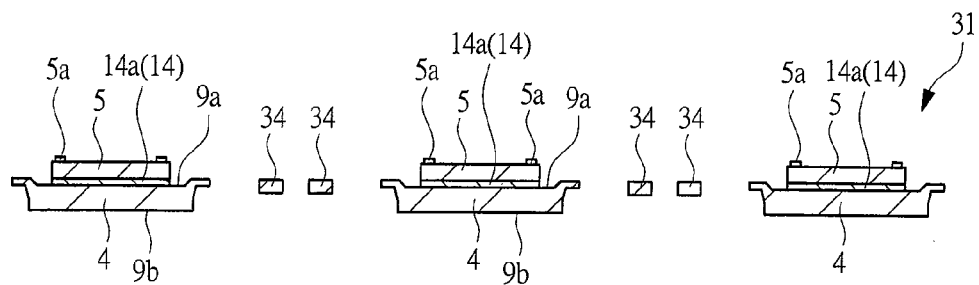
FIG. 16 is a cross-sectional view showing the same manufacturing process of the semiconductor device as FIG. 15.
Figure 17:
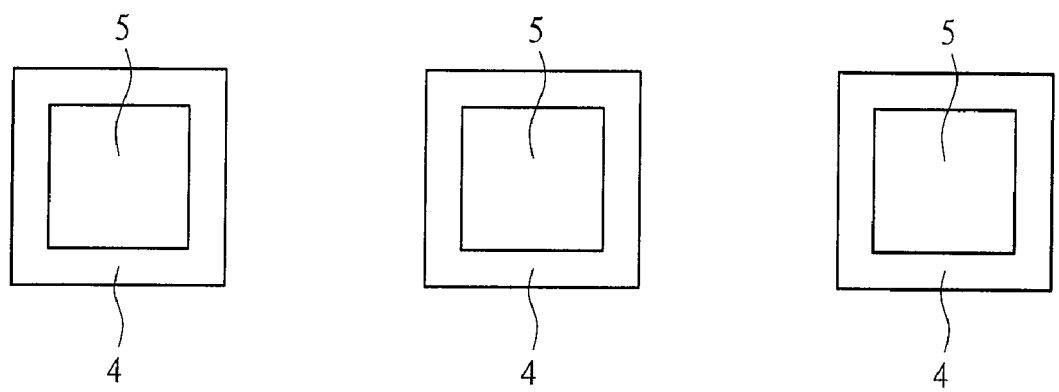
FIG. 17 is a plan view showing the manufacturing process of the semiconductor device subsequent to FIG. 15.
Figure 18:
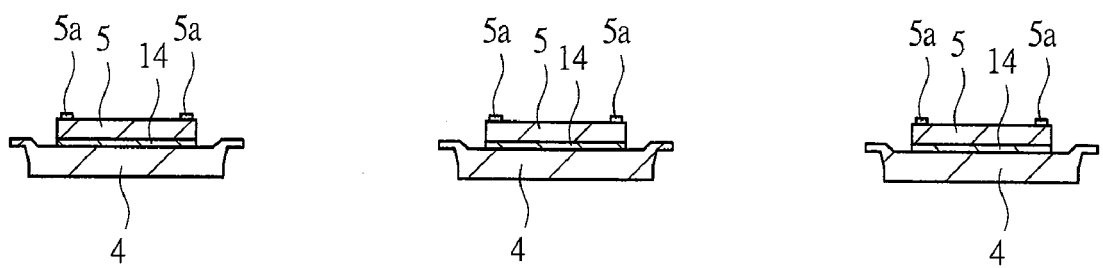
FIG. 18 is a cross-sectional view showing the same manufacturing process of the semiconductor device as FIG. 17.
Figure 25:
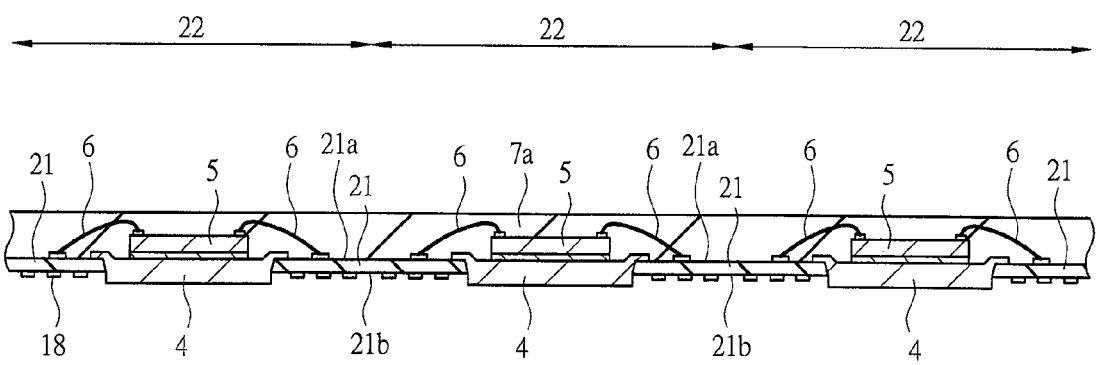
FIG. 25 is a cross-sectional view showing the manufacturing process of the semiconductor device subsequent to FIG. 24.
Figure 26:
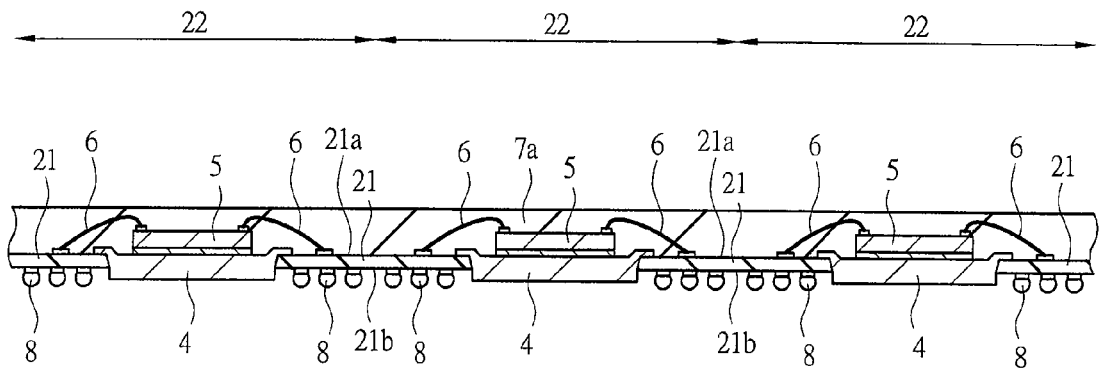
FIG. 26 is a cross-sectional view showing the manufacturing process of the semiconductor device subsequent to FIG. 25.

Next, the manufacturing method of the semiconductor device 1 of the present embodiment will be described with reference to the drawings. FIG. 8 is a process flowchart showing a manufacturing process of the semiconductor device 1 of the present invention. FIGS. 9 to 26 are plan views or cross-sectional views in the manufacturing process of the semiconductor device 1 of the present embodiment. Of FIGS. 9 to 26, FIGS. 9, 11, 13, 15, 17, 19 and 23 are plan views (upper surface views), and FIGS. 10, 12, 14, 16, 18, 20 to 22 and 24 to 26 are cross-sectional views. Note that FIG. 10 corresponds to the cross-sectional view cut along the line A3-A3 of FIG. 9, and FIG. 12 corresponds to the cross-sectional view cut along the line A4-A4 of FIG. 11. FIG. 14 shows a cross-section at the same position as FIG. 12, but corresponds to the same process stage as FIG. 13. FIG. 16 shows the cross-section of the same position as FIG. 12, but corresponds to the same process stage as FIG. 15. FIG. 18 shows the cross-section of the same position as FIG. 12, but corresponds to the same process stage as FIG. 17. FIG. 20 shows the cross-section of the same position as FIG. 10, but corresponds to the same process stage as FIG. 19. FIG. 24 shows the cross-section of the same position as FIG. 10, but corresponds to the same process stage as FIG. 23. FIG. 25 shows the cross-section of the same position as FIG. 10, but corresponds to the process stage later than FIG. 24. FIG. 26 shows the cross-section of the same position as FIG. 10, but corresponds to the process stage later than FIG. 25.

In the present embodiment, the case where the individual semiconductor devices 1 are manufactured by using a multi-cavity wiring board (wiring board base) 21 in which a plurality of wiring boards 2 are connected in a row or in an array pattern will be described.

Figure 9:
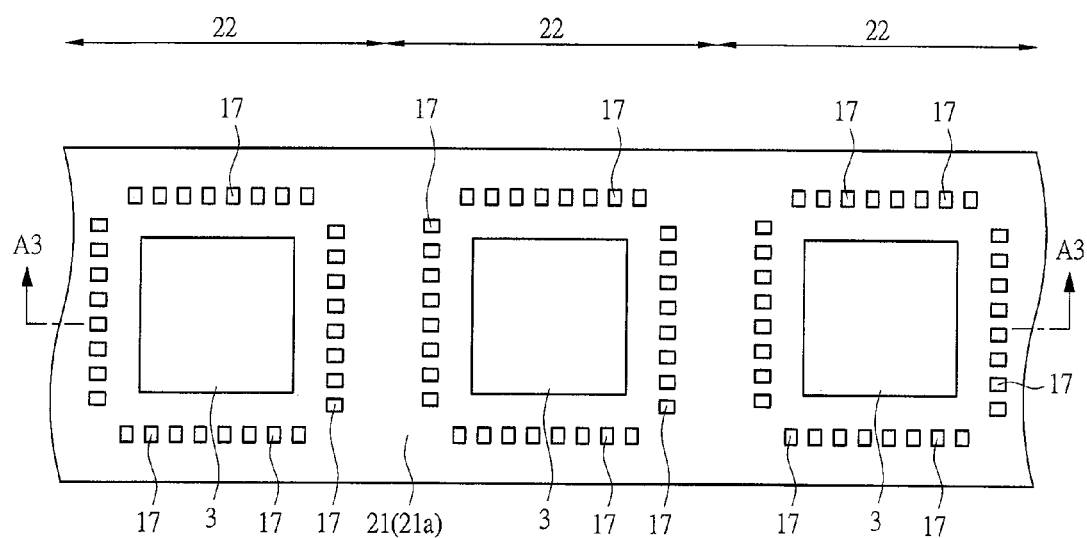
FIG. 9 is a plan view of the wiring board used in the manufacturing process of the semiconductor device according to one embodiment of the present invention.
Figure 10:
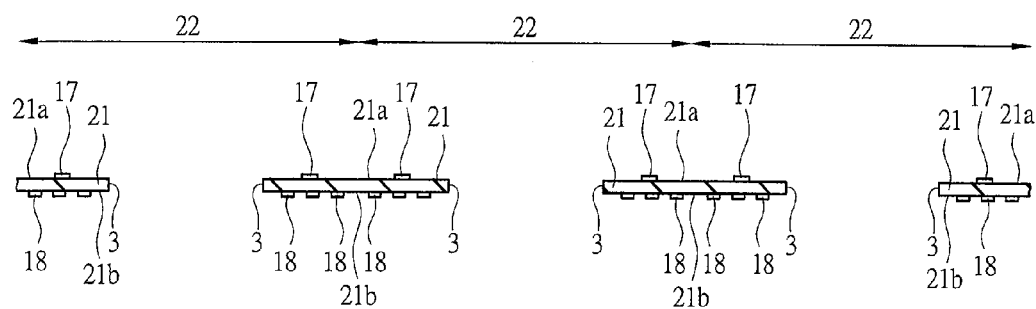
FIG. 10 is a cross-sectional view of the wiring board of FIG. 9.

First, as shown in FIGS. 9 and 10, a wiring board 21 is prepared (step S1). This wiring board 21 is a base of the wiring board 2, and the wiring board 21 is cut by a cutting process to be described later, and is separated into each semiconductor device region (board region, unit board region) 22, and this region corresponds to the wiring board 2 of the semiconductor device 1. The wiring board 21 has a structure in which a plurality of semiconductor device regions 22 from each of which one semiconductor device 1 is formed are disposed in a row or in a matrix pattern. Consequently, the through-hole 3 is formed in each of the semiconductor device regions 22 of the wiring board 21, the plurality of connecting terminals 17 and the wires connected thereto are formed in each of the semiconductor device regions 22 on an upper surface 21a of the wiring board 21 (surface to be the upper surface 2a of the wiring board 2 later, first main surface), and the plurality of lands 18 are formed in each of the semiconductor device regions 22 on a lower surface 21b of the wiring board 21 (surface to be the lower surface 2b of the wiring board 2 later, second main surface). Note that FIG. 9 (upper surface view of the wiring board 21) and FIG. 10 (cross-sectional view of the wiring board 21) show an example in which the plurality of semiconductor device regions 22 are disposed in a row to constitute the wiring board 21.

Figure 11:
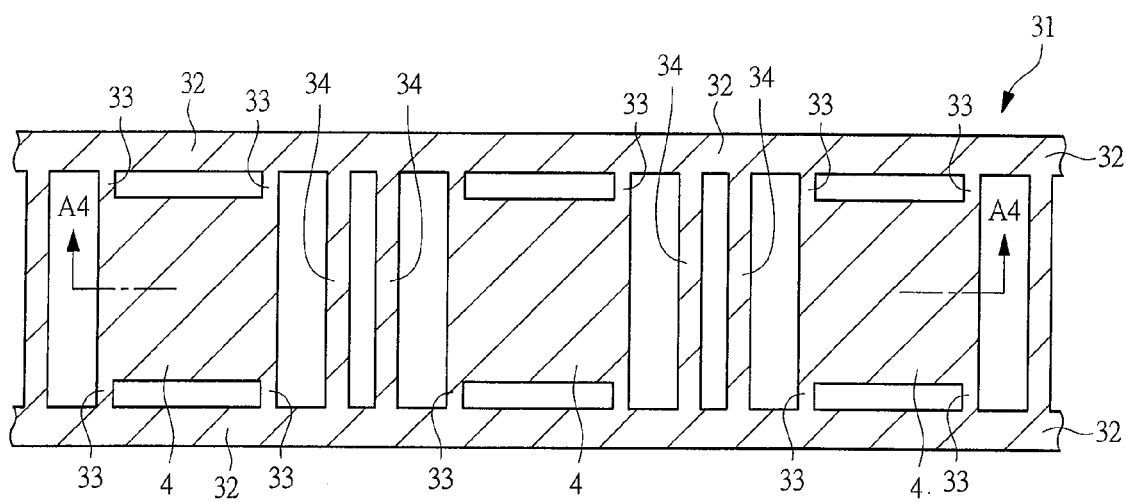
FIG. 11 is a plan view of a frame used in the manufacturing process of the semiconductor device according to one embodiment of the present invention.
Figure 12:
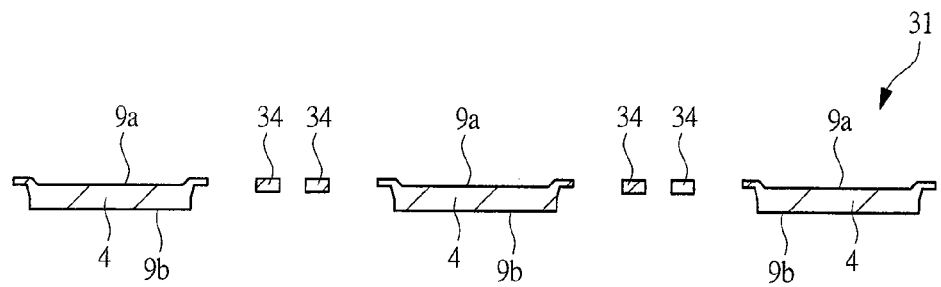
FIG. 12 is a cross-sectional view of the frame of FIG. 11.

Also, as shown in FIGS. 11 (upper surface view of a frame 31) and 12 (cross-sectional view of the frame 31), the frame 31 for the heat sink 4 is prepared (step S2). The frame 31 has a structure in which the plurality of heat sinks 4 are integrally joined to frame portions 32. More specifically, the plurality of heat sinks 4 are disposed at the predetermined intervals between the two frame portions 32 extending in the same direction, and the four corners of the upper part of each heat sink 4 are joined to the frame portion 32 through joining portions 33. The frame 31 can be formed by, for example, processing a copper plate and the like by a metal mold. In the frame 31, joining portions 34 for mutually joining the frame portions 32 are provided between the adjacent heat sinks 4 so as to reinforce the frame 31. If not required, the joining portion 34 can be omitted. In the frame 31, the heat sink 4, the frame portion 32, the joining portion 33, and the joining portion 34 are integrally formed from the same material.

Although FIG. 11 is a plan view, hatching is applied to the frame 31 so as to make the shape of the frame 31 easily understood. Also, although the heat sinks 4 appear to be separated from each other in FIG. 12, as evident from FIG. 11, the heat sinks 4 are coupled with each other through the coupling portions 33 and the frame portions 32 in reality.

Next, the semiconductor chip 5 is mounted and bonded on the upper surface 9a of each heat sink 4 of the frame 31 through the bonding agent 14 (step S3). The bonding process of the semiconductor chip 5 in the step S3 can be performed as follows.

Figure 13:
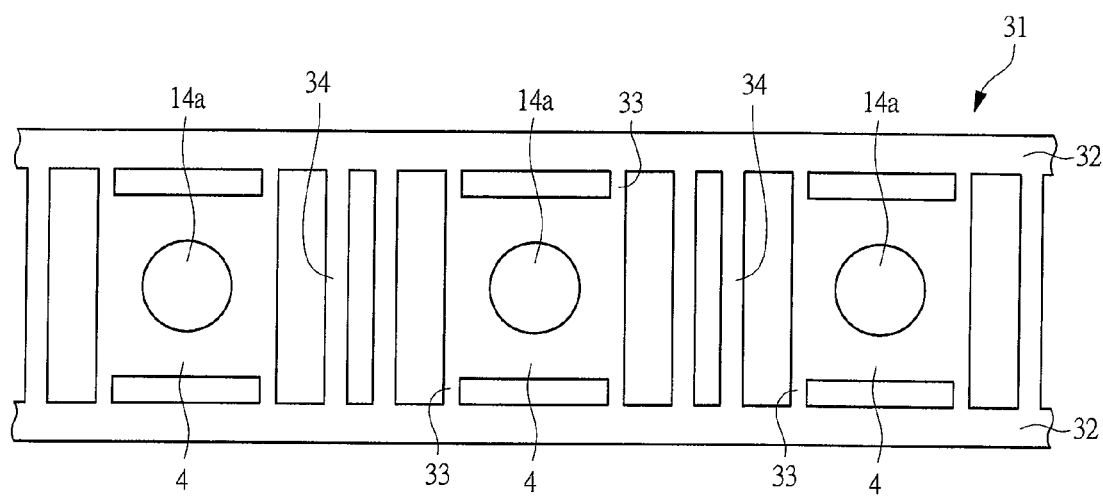
FIG. 13 is a plan view showing the manufacturing process of the semiconductor device according to one embodiment of the present invention.
Figure 14:
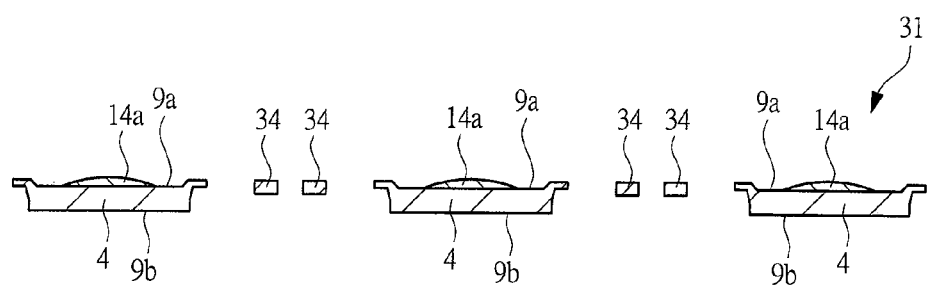
FIG. 14 is a cross-sectional view showing the same manufacturing process of the semiconductor device as FIG. 13.

That is, as shown in FIGS. 13 and 14, solder (first solder) 14a is coated on the upper surface 9a of each heat sink 4 of the frame 31. Then, the solder 14a on each heat sink 4 of the frame 31 is agitated as needed, and thereafter, the semiconductor chip 5 is mounted on the upper surface 9a of each heat sink 4 of the frame 31 through the solder 14a as shown in FIGS. 15 and 16. These processes, that is, the coating process of the solder 14a on each heat sink 4 of the frame 31, the agitating process of the solder 14a, and the mounting process of the semiconductor chip 5 onto the heat sink 4 are performed while heating the entire frame 31 including the heat sinks 4, and the frame 31 is cooled to the extent of the room temperature after the mounting process of the semiconductor chip 5 onto the heat sink 4. By this means, the solder 14a which is in a molten state at the time of mounting the semiconductor chip 5 is solidified, and the semiconductor chip 5 is bonded and fixed to the heat sink 4 by the solidified solder 14a. This solidified solder 14a serves as the bonding agent 14.

High melting point solder is preferably used for the solder 14a, and the solder (first solder) having a melting point higher than at least a melting point of the solder (second solder) used for the external terminal (solder ball 8 in this case) formed later on the land 18 is preferably used as the solder 14a. By this means, even when the solder ball 8 is melted in a connecting process of the solder ball 8 in the step S8 to be described later and a mounting process of the completed semiconductor device 1 (process of mounting the semiconductor device 1 on the wiring board 41 to be described later), the solder 14a (that is, the bonding agent 14 made of the solder 14a) for bonding the semiconductor chip 5 and the heat sink 4 can be prevented from being melted. Accordingly, the bonding reliability of the semiconductor chip 5 and the heat sink 4 can be enhanced, and the heat conductivity from the semiconductor chip 5 to the heat sink 4 can be improved, so that the heat dissipation of the semiconductor device 1 can be improved.

Next, each heat sink 4 mounted with the semiconductor chip 5 is cut and separated from the frame portion 32 of the frame 31 (step S4). More specifically, the joining portion 33 between the heat sink 4 and the frame portion 32 is cut, so that each heat sink 4 mounted with the semiconductor chip 5 is separated from the frame portion 32 of the frame 31. As shown in FIGS. 17 and 18, individual pieces of the heat sinks 4 each mounted with the semiconductor chip 5 are obtained.

Figure 19:
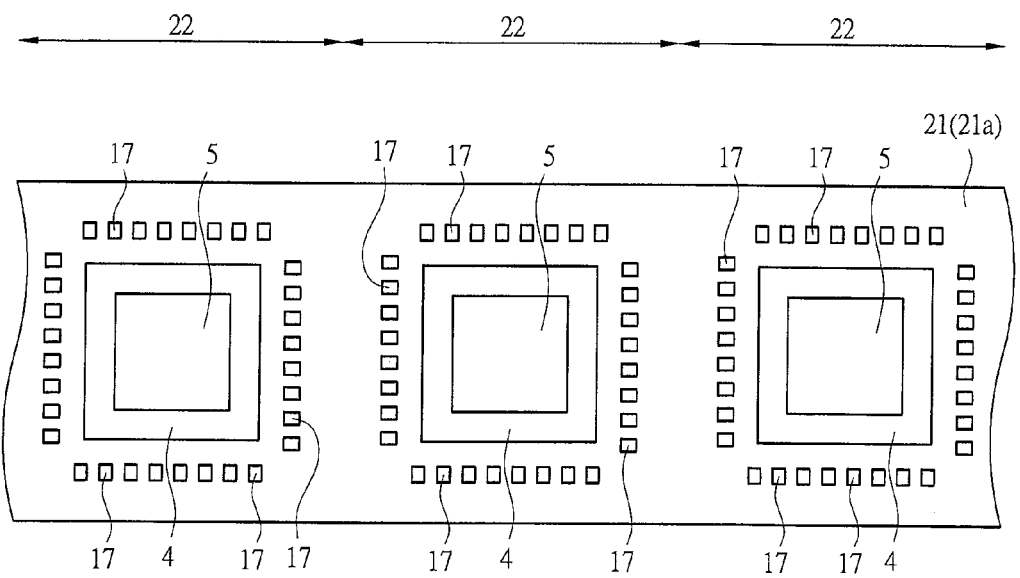
FIG. 19 is a plan view showing the manufacturing process of the semiconductor device subsequent to FIG. 17.
Figure 20:
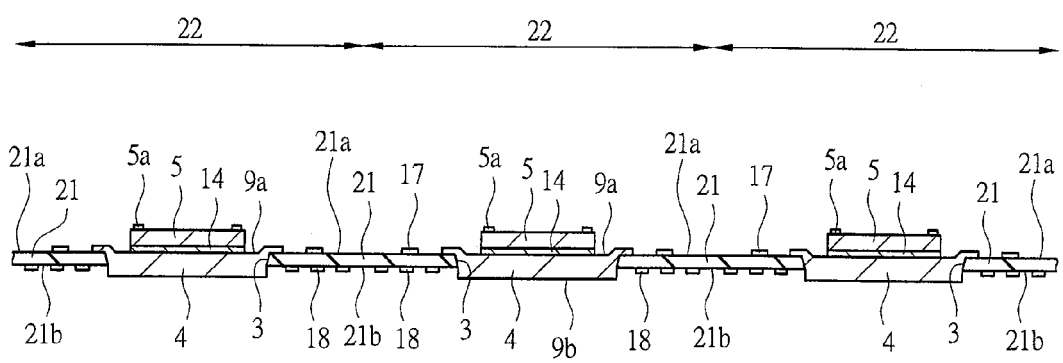
FIG. 20 is a cross-sectional view showing the same manufacturing process of the semiconductor device as FIG. 19.

Next, as shown in FIGS. 19 and 20, the heat sink 4 mounted with the semiconductor chip 5 is disposed inside the through-hole 3 of each semiconductor device region 22 of the wiring board 21, respectively (step S5). Before performing this step S5, it is necessary to prepare the wiring board 21 in the step S1. Hence, the preparation of the wiring board 21 in the step S1 can be also performed before step S2, simultaneously with the step S2, before the step S3 and after the step S2, simultaneously with the step S3, before the step S4 and after the step S3, simultaneously with the step S4 or before the step S5 and after the step S4.

The process of disposing the heat sink 4 inside the through-hole 3 of the wiring board 21 in the step S5 will be described in detail with reference to FIGS. 21 and 22. The cross-sectional views of FIGS. 21 and 22 show one semiconductor device region 22 of the wiring board 21.

Figure 21:
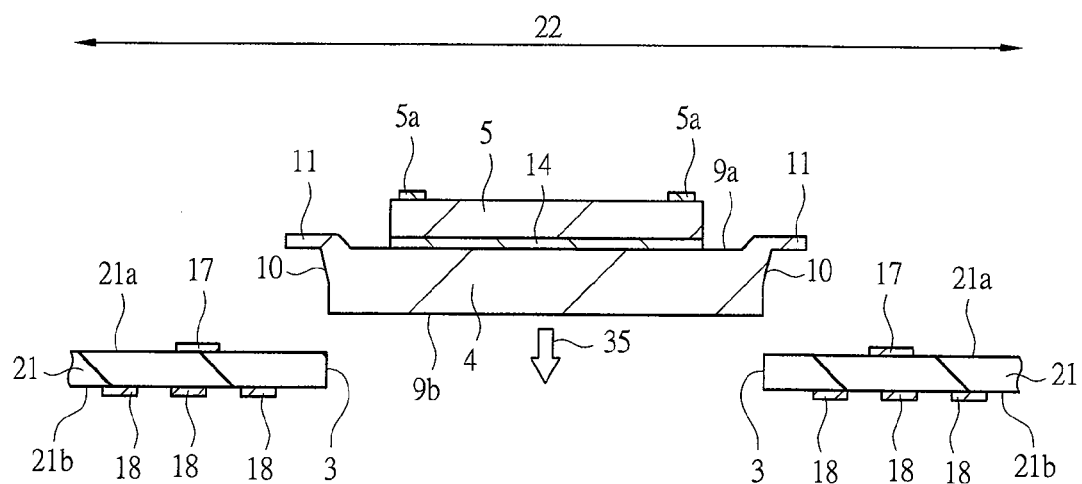
FIG. 21 is a cross-sectional view showing a process of disposing a heat sink inside a through-hole of a wiring board.
Figure 22:
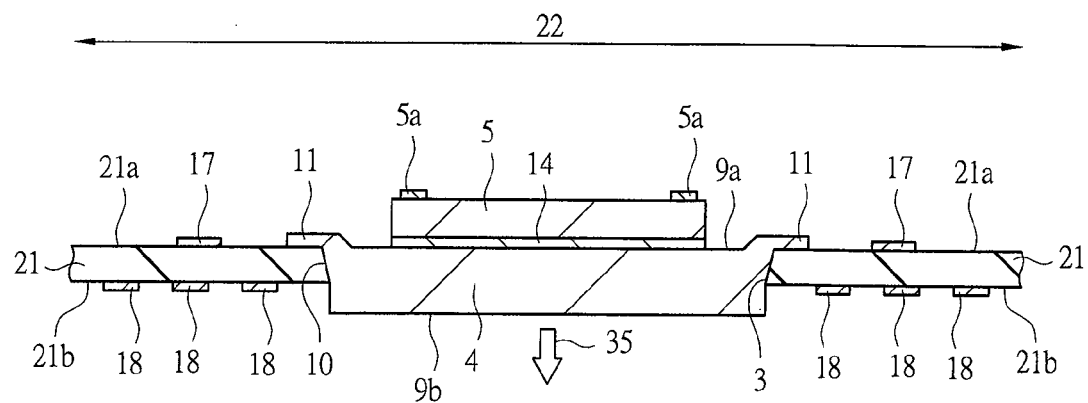
FIG. 22 is a cross-sectional view showing the process of disposing the heat sink inside the through-hole of the wiring board subsequent to FIG. 21.

In the step S5, as shown in FIG. 21, the heat sink 4 mounted with the semiconductor chip 5 is inserted (plugged) into the through-hole 3 of the wiring board 21 from the upper surface 21a side (side corresponding to the upper surface 2a of the wiring board 2) of the wiring board 21. More specifically, the heat sink 4 mounted with the semiconductor chip 5 is inserted into the through-hole 3 of the wiring board 21 in a direction 35 shown by an arrow mark of FIG. 21.

As described above, the heat sink 4 has the protruded portion 11 protruding to the outside (in the direction away from the center of the upper surface 9a) from the side surface of the heat sink 4 in the peripheral edge portion of the upper surface 9a of the heat sink 4, and in the step S5, the heat sink 4 is disposed inside the through-hole 3 of the wiring board 21 so that the protruded portion 11 is located on the upper surface 21a of the wiring board 21 outside the through-hole 3 and the lower surface of the protruded portion 11 contacts to the upper surface 21a of the wiring board 21.

If the heat sink 4 has no protruded portion 11 and any of the cross-section of the heat sink 4 (cross-section parallel to the upper surface 9a and the lower surface 9b of the heat sink 4) is the same as or smaller than the planar shape of the through-hole 3 of the wiring board 21 unlike the present embodiment, the heat sink 4 is likely to fall off from the through-hole 3 of the wiring board 21 at the time of inserting the heat sink 4 into the through-hole 3 from the upper surface 21a side of the wiring board 21.

In contrast to this, in the present embodiment, the heat sink 4 is provided with the protruded portion 11. Therefore, when the heat sink 4 is inserted into the through-hole 3 from the upper surface 21a side of the wiring board 21 as shown in FIG. 21, the protruded portion 11 of the heat sink 4 is caught on the upper surface 21a of the wiring board 21 as shown in FIG. 22. Since the protruded portion 11 functions as a stopper, it is possible to prevent the heat sink 4 from falling off from the through-hole 3 of the wiring board 21 in the direction 35. Accordingly, the heat sink 4 can be retained inside the through-hole 3 of the wiring board 21.

As described above, the side surface 10 of the heat sink 4 has a tapered shape. On the other hand, the inner wall of the through-hole 3 of the wiring board 21 before the heat sink 4 is inserted does not have the tapered shape, and is formed to be vertical to the upper surface 21a of the wiring board 21. By this means, by inserting the heat sink 4 into the through-hole 3 from the upper surface 21a side of the wiring board 21 as shown in FIGS. 21 and 22, the heat sink 4 and the wiring board 21 can be caulked by the tapered shape of the side surface 10 of the heat sink 4, so that the heat sink 4 can be fixed to the wiring board 21.

More specifically, when the heat sink 4 is inserted into the through-hole 3 from the upper surface 21a side of the wiring board 21 in the step S5, since the side surface 10 of the heat sink 4 contacts to the inner wall of the through-hole 3 and the inner wall of the through-hole 3 of the wiring board 21 is pushed and expanded in the lateral direction by the tapered shape of the side surface 10 of the heat sink 4, the side surface 10 of the heat sink 4 is fastened up by the inner wall of the through-hole 3 of the wiring board 21 by its reaction. In this manner, the heat sink 4 is fixed to the wiring board 21.

Therefore, as shown in FIG. 22, in a state in which the heat sink 4 is disposed (inserted) inside the through-hole 3 of the wiring board 21 in the step S5, the side surface 10 of the heat sink 4 contacts and adheres to the inner wall of the through-hole 3 of the wiring board 21, and is inclined with respect to the direction vertical to the upper surface 21a of the wiring board 21. This state is maintained in the manufactured semiconductor device 1.

Figure 23:
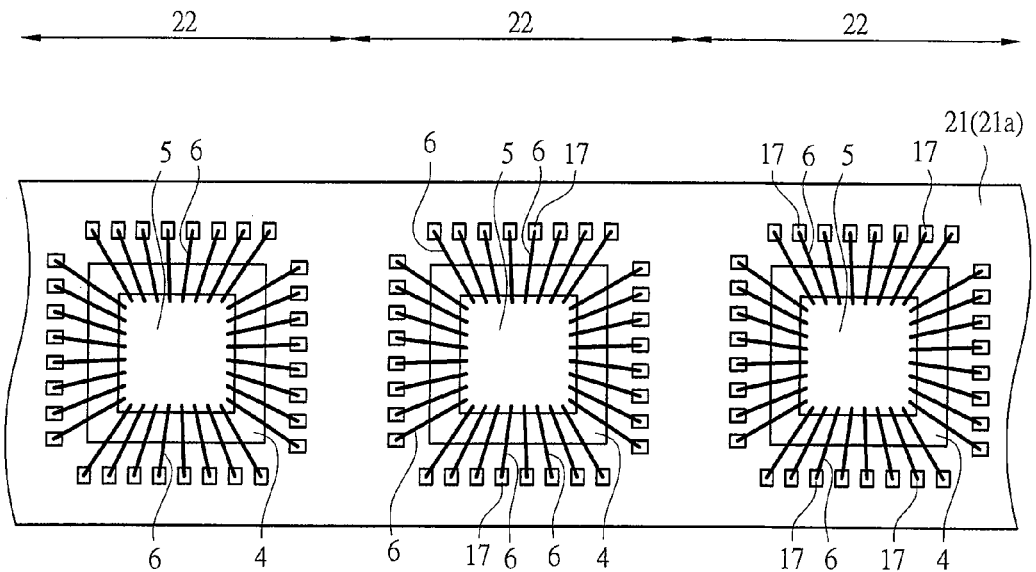
FIG. 23 is a plan view showing the manufacturing process of the semiconductor device subsequent to FIG. 19.
Figure 24:
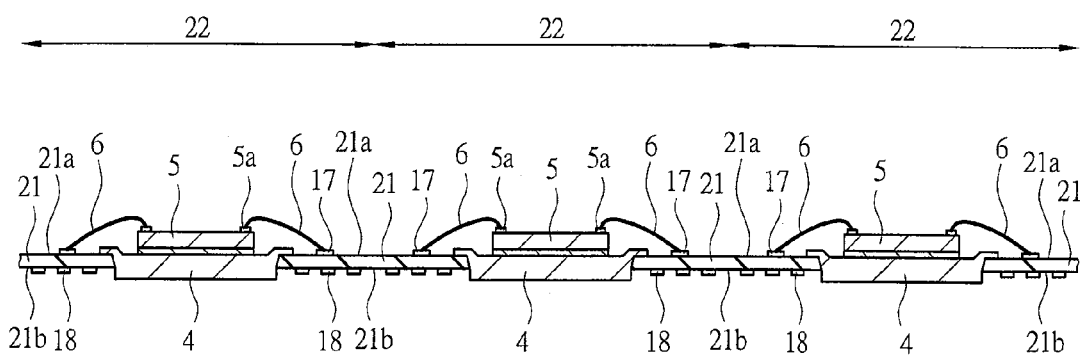
FIG. 24 is a cross-sectional view showing the same manufacturing process of the semiconductor device as FIG. 23.

Next, as shown in FIGS. 23 and 24, a wire bonding process is performed, so that each of the electrodes 5a of the semiconductor chip 5 and the connecting terminals 17 formed in the wiring board 21 corresponding to the electrodes are electrically connected through the bonding wires 6 (step S6). More specifically, a plurality of connecting terminals 17 of each semiconductor device region 22 of the upper surface 21a of the wiring board 21 and a plurality of electrodes 5a of the semiconductor chip 5 bonded on (mounted on) the heat sink 4 disposed inside the through-hole 3 of the semiconductor device region 22 are electrically connected through a plurality of bonding wires 6, respectively.

After the wire bonding process, as shown in FIG. 25, resin sealing by a molding process (for example, transfer molding process) is performed to form a sealing resin 7a (sealing portion), and the semiconductor chip 5 and the bonding wire 6 are sealed (resin-sealed) by the sealing resin 7a (step S7).

In FIG. 25, a collective sealing for collectively sealing the plurality of semiconductor device regions 22 of the upper surface 21a of the wiring board 21 by the sealing resin 7a is performed in the molding process in the step S7. More specifically, the sealing resin 7a is formed on the plurality of semiconductor device regions 22 of the upper surface 21a of the wiring board 21 so as to cover the semiconductor chips 5 and the bonding wires 6. In this case, the sealing resin 7a is formed so as to cover the plurality of semiconductor device regions 22 of the upper surface 21a of the wiring board 21. The sealing resin 7a is made of, for example, a resin material such as the thermosetting resin material and can contain the filler and the like. For example, it is also possible to form the sealing resin 7a by using the epoxy resin containing the filler and the like. For example, the sealing resin 7a can be formed by injecting the sealing resin material into a cavity of the metal mold disposed on the wiring board 21 and then heating and hardening this sealing resin material by heating.

After the heat sink 4 is disposed inside the through-hole 3 of the wiring board 21 in the step S5, a state in which the upper surface 21a of the wiring board 21 is directed upward without turning the wiring board 21 upside down is preferably maintained until the molding process in the step S7 is performed. More specifically, after disposing the heat sink 4 inside the through-hole 3 of the wiring board 21 in the step S5, the wiring board 21 has the upper surface 21a directed upward so that the lower surface 21b thereof is not directed upward until the molding process in the step S7 is performed. As a result, the falling off of the heat sink 4 from the through-hole 3 of the wiring board 21 before the sealing resin 7a is formed can be prevented more precisely. By forming the sealing resin 7a, the heat sink 4 and the wiring board 21 are solidly bonded by the sealing resin 7a, and therefore, after forming the sealing resin 7a, the wiring board 21 may be directed to any direction (lower surface 21b of the wiring board 21 may be directed upward).

Also, even when the side surface 10 of the heat sink 4 does not have the tapered shape (that is, when α=0), though the bonding power (fixing power) of the heat sink 4 and the wiring board 21 is weak, the heat sink 4 can stay inside the through-hole 3 of the wiring board 21 due to the presence of the protruded portion 11 if a state in which the wiring board 21 is not turned upside down and the upper surface 21a of the wiring board 21 is directed upward is maintained after the heat sink 4 is disposed inside the through-hole 3 of the wiring board 21 in the step S5 until the molding process in the step S7 is performed. Hence, even when the side surface 10 of the heat sink 4 does not have the tapered shape (that is, when α=0), it is possible to manufacture the semiconductor device 1 by inserting the heat sink 4 into the through-hole 3 from the upper surface 21a side of the wiring board 21. However, if the bonding power of the heat sink 4 and the wiring board 21 is weak, the heat sink 4 is likely to fall off from the wiring board 21 or to oscillate during the manufacturing process (steps S5 to S7) of the semiconductor device, and therefore, it is preferable to enhance the bonding power of the heat sink 4 and the wiring board 21 to some extent. Hence, in the present embodiment, as described above, the side surface 10 of the heat sink 4 is inclined so as to have the tapered shape, thereby caulking the heat sink 4 and the wiring board 21. By this means, the bonding power (fixing power) of the heat sink 4 and the wiring board 21 can be enhanced, and thus, the heat sink 4 can be fixed and stabilized in the wiring board 21. As a result, since it is possible to prevent the heat sink 4 from falling off from the wiring board 21 or oscillating during the manufacturing process of the semiconductor device (steps S5 to S7), the semiconductor device can be stably manufactured. Therefore, the manufacture of the semiconductor device is facilitated, and further, the manufacturing yield of the semiconductor device can be improved.

Next, as shown in FIG. 26, the solder balls 8 are connected (bonded) to the lands 18 of the lower surface 21b of the wiring board 21 (step 8). For example, after the lower surface 21b of the wiring board 21 is directed upward, the plurality of solder balls 8 are disposed on the plurality of lands 18 of the lower surface 21b of the wiring board 21 and are temporally fixed by a flux and the like, and then, a solder reflow process (reflow process, heat treatment) is performed to melt and solidify the solder again, so that the solder balls 8 and the lands 18 of the lower surface 21b of the wiring board can bonded and electrically connected to each other. Thereafter, a cleaning process is performed as needed, thereby removing the flux and the like adhered on the front surface of the solder balls 8. In this manner, in the step S8, the solder balls 8 as the external terminals of the semiconductor device 1 are formed on the lands 18 of the lower surface 21b of the wiring board 21.

The solder ball 8 bonded to the lower surface 21b of the wiring board 21 can be taken as a bump electrode (solder bump). Note that the case where the solder ball 8 as the external terminal of the semiconductor device 1 is bonded to the land 18 has been described in the present embodiment, but this is not restrictive, and for example, a bump electrode (solder bump) as the external terminal of the semiconductor device 1 can be also formed on the land 18 by supplying the solder onto the land 18 by a printing method and the like in place of the solder ball 8. For the material of the external terminal (here, solder ball 8) of the semiconductor device 1, any of lead-containing solder and lead-free solder not containing lead can be used, and the lead-free solder not containing lead is more preferably used.

Next, marking is performed as needed, and a mark such as a product number and the like is applied onto the front surface of the sealing resin 7a (step 9). For example, a laser mark for performing the marking by laser can be performed, and an ink mark for performing the marking by an ink can be also performed. Also, the connecting process of the solder ball 8 in the step S8 and the marking process in the step 9 can be interchanged in their order, so that the connecting process of the solder ball in the step S8 is performed after performing the marking process in the step S9. If not required, the marking process in the step S9 can be omitted.

Next, the wiring board 21 and the sealing resin 7a formed thereon are cut (diced) and separated (divided) into each semiconductor device region 22 (step S10). By performing the dicing and segmentation into individual pieces in this manner, the semiconductor device 1 as shown in FIGS. 1 to 3 can be manufactured. The wiring board 21 diced and separated (divided) into each semiconductor device region 22 corresponds to the wiring board 2, and the sealing resin 7a diced and separated (divided) into each semiconductor device region 22 corresponds to the sealing resin 7. Further, the upper surface 21a of the wiring board 21 becomes the upper surface 2a of the wiring board 2 and the lower surface 21b of the wiring board 21 becomes the lower surface 2b of the wiring board 2.

While FIGS. 25 and 26 show the case where a collective sealing is performed in the molding process in the step S7, it is also possible to perform an individual sealing (divided sealing) to seal each semiconductor device region 22 of the upper surface 21a of the wiring board 21 by the sealing resin 7 in the molding process in the step 7. The case where the individual sealing is performed will be described with reference to FIGS. 27 to 29.

Figure 27:
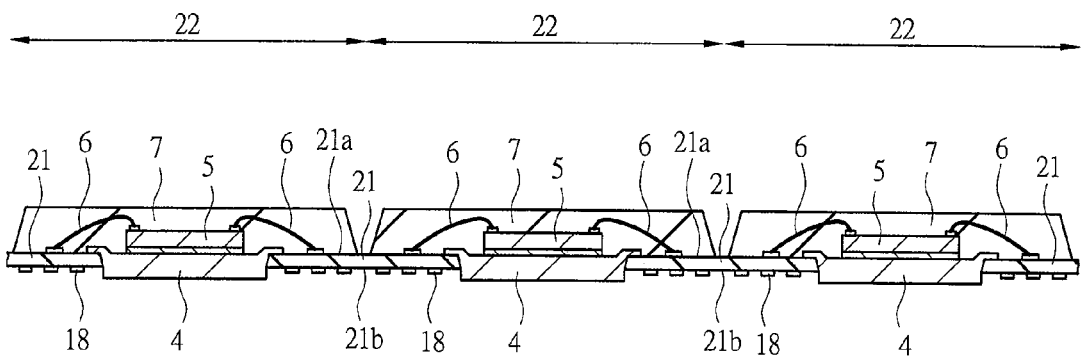
FIG. 27 is a cross-sectional view showing another manufacturing process of a semiconductor device according to one embodiment of the present invention.
Figure 28:
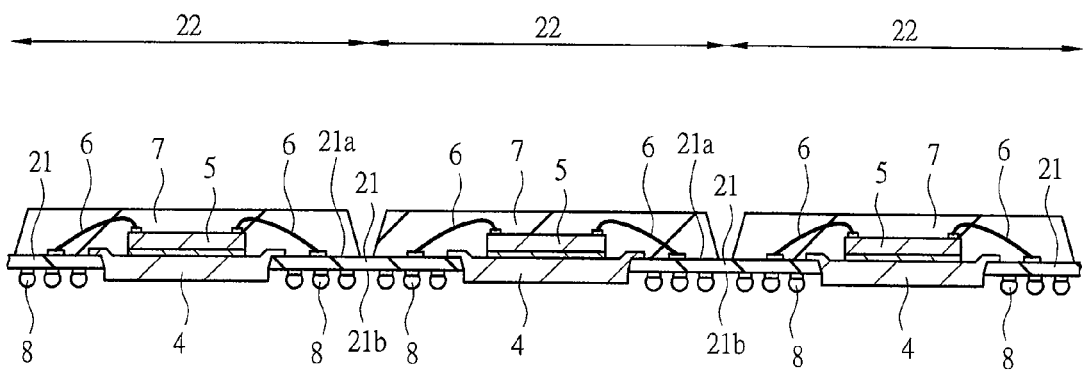
FIG. 28 is a cross-sectional view showing the manufacturing process of the semiconductor device subsequent to FIG. 27.
Figure 29:
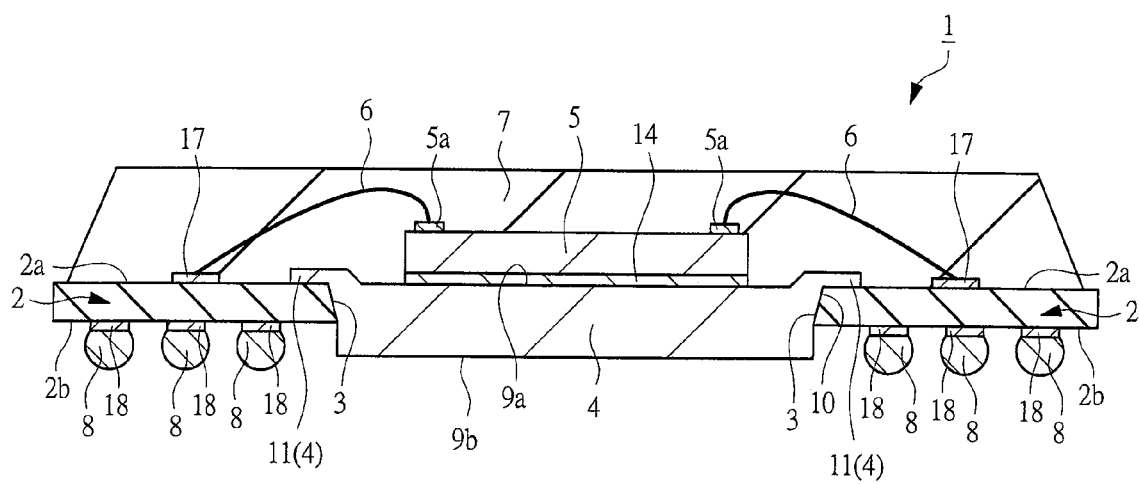
FIG. 29 is a cross-sectional view showing the semiconductor device manufactured in the process of FIG. 27 and FIG. 28.

FIGS. 27 and 28 are cross-sectional views in another manufacturing process of the semiconductor device 1 of the present embodiment, and they correspond to FIGS. 25 and 26, respectively. While FIGS. 25 and 26 show the cases where the collective sealing is performed in the molding process in the step S7, FIGS. 27 and 28 correspond to the case where the individual sealing for sealing each semiconductor device region 22 of the upper surface 21a of the wiring board 21 by the sealing resin 7 is performed in the molding process in the step S7. Also, FIG. 29 is a cross-sectional view (side cross-sectional view) of the semiconductor device 1 manufactured in the case where the individual sealing is performed in the molding process in the step S7 (case of FIGS. 27 and 28), and it corresponds to FIG. 1.

After the wire bonding process in the step S6, the molding process (resin sealing process) in the step S7 is performed, and the sealing resin 7 is formed so as to seal (resin-seal) the semiconductor chip 5 and the bonding wire 6 by the sealing resin 7 as shown in FIG. 27. At this time, as shown in FIG. 27, the individual sealing (divided sealing) for individually sealing each semiconductor device region 22 of the upper surface 21a of the wiring board 21 by the sealing resin 7 is performed. More specifically, the sealing resin 7 is formed so as to cover the semiconductor chip 5 and the bonding wire 6 on each semiconductor device region 22 of the upper surface 21a of the wiring board 21. In this case, the sealing resin 7 is formed for each semiconductor device region 22 of the upper surface 21a of the wiring board 21. The sealing resin 7 is made of, for example, a resin material such as the thermosetting resin material and can contain the filler and the like. For example, it is also possible to form the sealing resin 7 by using the epoxy resin containing the filler and the like. For example, the sealing resin 7 can be formed by injecting the sealing resin material into a cavity of the metal mold disposed on the wiring board 21 and then hardening this sealing resin material by heating.

Next, in the step S8, as shown in FIG. 28, the solder balls 8 are connected (bonded) to the lands 18 of the lower surface 21b of the wiring board 21. Since the connecting process of the solder balls 8 in the step S8 is the same as the case of performing the collective sealing (case of FIGS. 25 and 26), the description thereof will be omitted here.

Next, the marking in the step 9 is performed as needed, and a mark such as the product number and the like is applied onto the sealing resin 7. Since the marking process in the step S9 is the same as the case of performing the collective sealing (case of FIGS. 25 and 26), the description thereof will be omitted here.

Next, the cutting process in the step S10 is performed, and the wiring board 21 is cut (diced) and separated (divided) into each semiconductor device region 22. By performing the dicing and segmentation into individual pieces in this manner, the semiconductor device 1 as shown in FIG. 29 can be manufactured. The wiring board 21 diced and separated (divided) into each semiconductor device region 22 corresponds to the wiring board 2, and the upper surface 21a of the wiring board 21 becomes the upper surface 2a of the wiring board 2 and the lower surface 21b of the wiring board 21 becomes the lower surface 2b of the wiring board 2. Note that, when the collective sealing is performed in the step S7 (case of FIGS. 25 and 26), the wiring board 21 and the sealing resin 7a thereon are cut in the cutting process in the step S10, but when the individual sealing is performed in the step S7 (case of FIGS. 27 and 28), only the wiring board 21 is cut in the cutting process in the step S10 and the sealing resin 7 is not cut. Hence, the sealing resin 7 formed by the molding process in the step 7 is not cut and becomes the sealing resin 7 of the semiconductor device 1.

Since the semiconductor device 1 of FIG. 29 has almost the same structure as the semiconductor device 1 of FIG. 1 except that the sealing resin 7 is not formed on the peripheral edge portion of the upper surface 2a of the wiring board 2 and the sealing resin 7 is formed on the region other than the peripheral edge portion of the upper surface 2a of the wiring board 2, the description thereof will be omitted. The perspective plan view of the semiconductor device 1 of FIG. 29 is the same as that of FIG. 2, and the lower surface view thereof is the same as that of FIG. 3.

In the manufacturing process described with reference to FIGS. 8 to 28, after mounting the semiconductor chip 5 on the heat sink 4, the heat sink 4 mounted with the semiconductor chip 5 is disposed inside the through-hole 3 of the wiring board 21. As another manufacturing process of the semiconductor device 1, it is also possible to dispose the heat sink 4 inside the through-hole 3 of the wiring board 21 before mounting the semiconductor chip 5 on the heat sink 4, and then, mount the semiconductor chip 5 on the heat sink 4 disposed inside the through-hole 3 of the wiring board 21. This case will be described with reference to FIGS. 30 to 38.

Figure 30:
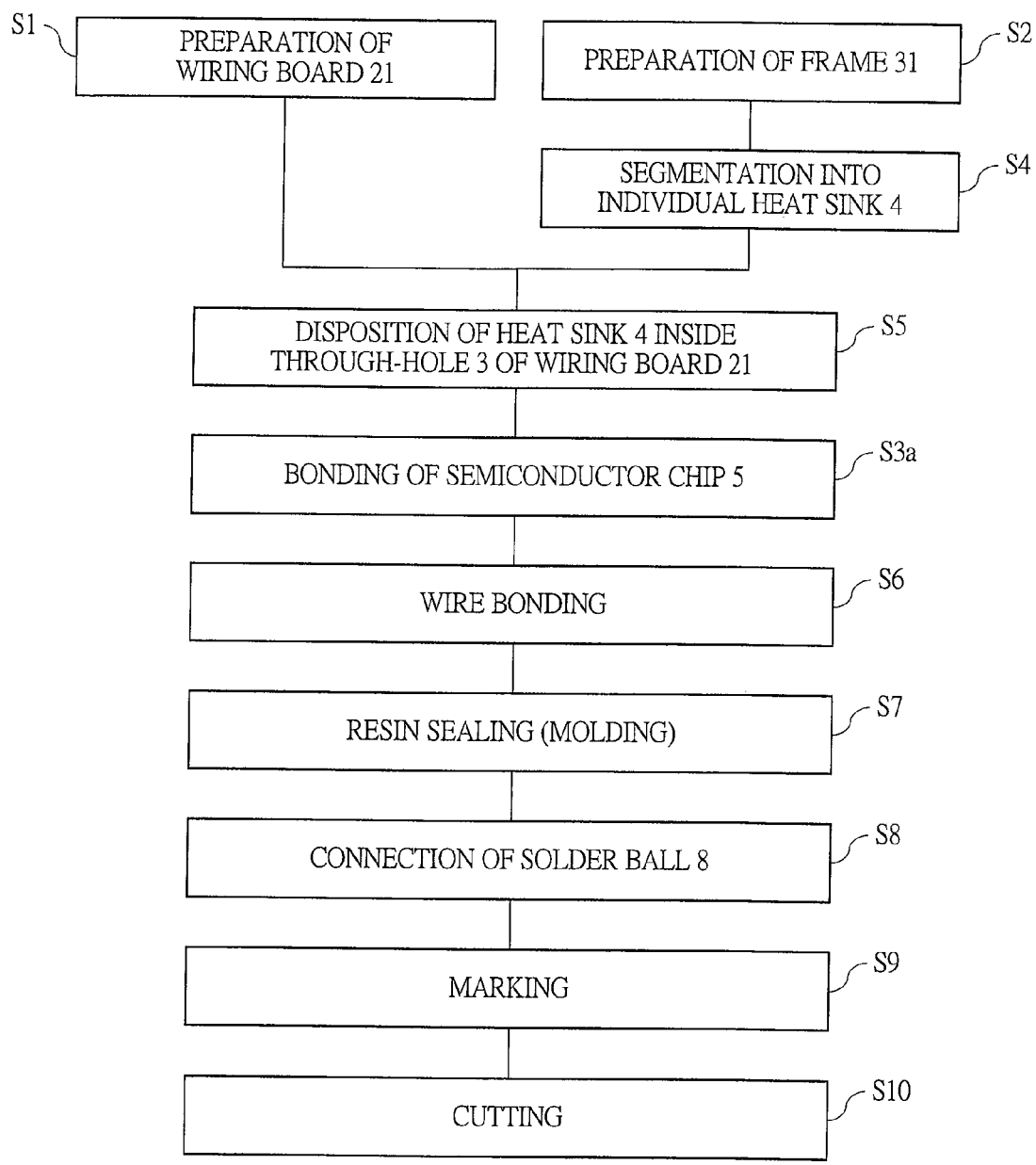
FIG. 30 is a process flowchart showing another manufacturing process of the semiconductor device according to one embodiment of the present invention.
Figure 31:
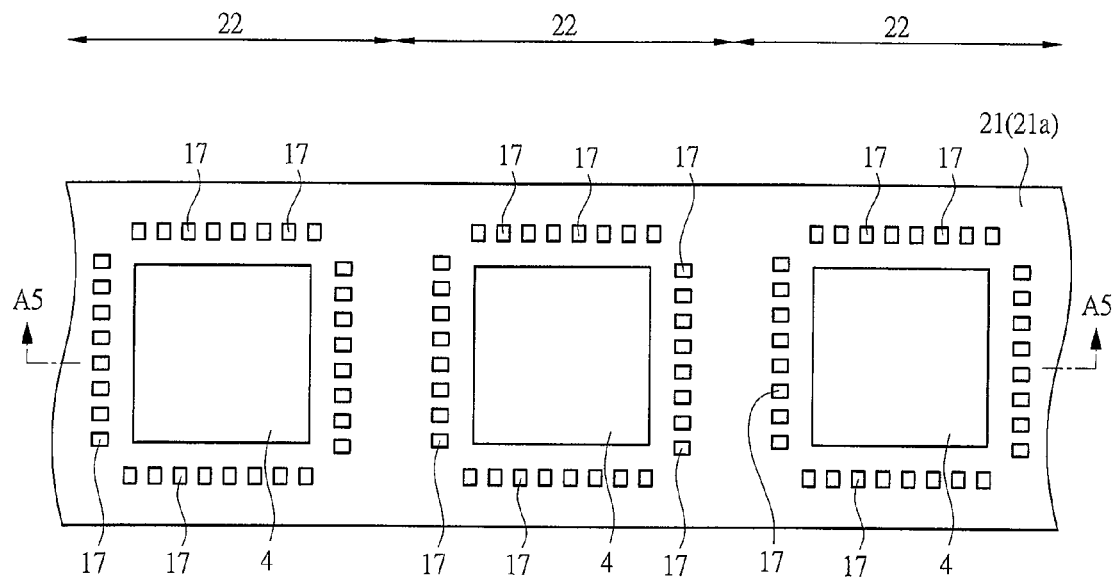
FIG. 31 is a plan view showing another manufacturing process of the semiconductor device according to one embodiment of the present invention.
Figure 37:
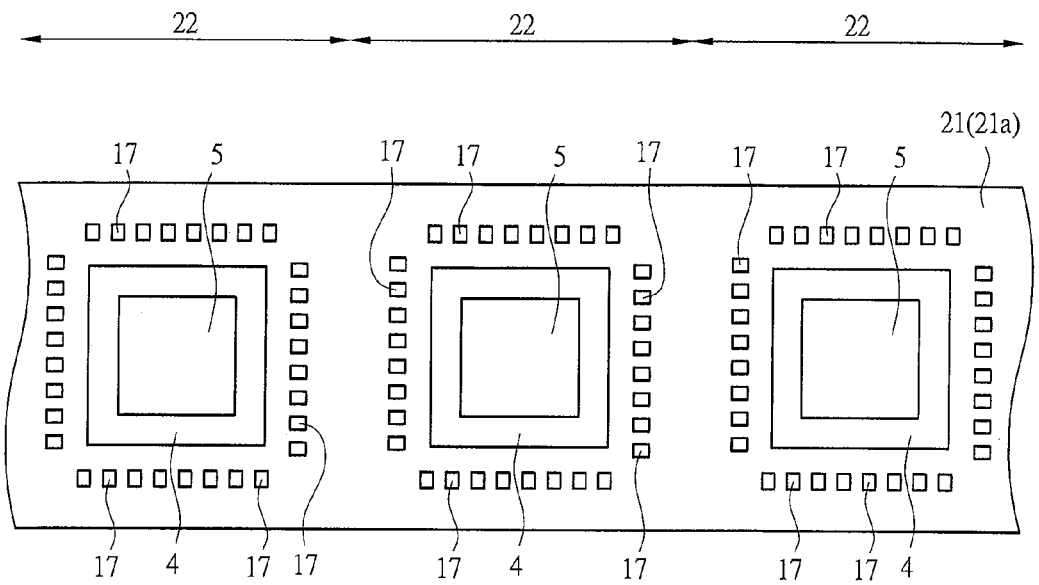
FIG. 37 is a plan view showing the manufacturing process of the semiconductor device subsequent to FIG. 35.
Figure 38:
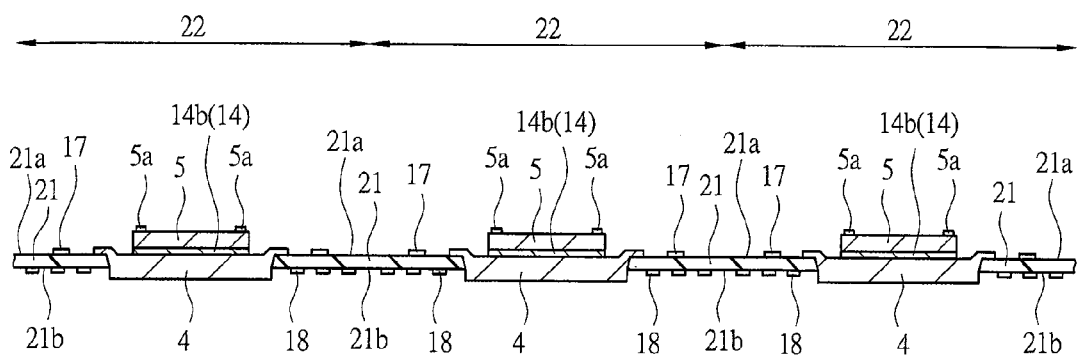
FIG. 38 is a cross-sectional view showing the same manufacturing process of the semiconductor device as FIG. 37.

FIG. 30 is a process flowchart showing another manufacturing process of the semiconductor device 1 of the present embodiment. FIGS. 31 to 38 are plan views or cross-sectional views in another manufacturing process of the semiconductor device 1 of the present embodiment. Of FIGS. 31 to 38, FIGS. 31, 35 and 37 are plan views, and FIGS. 32 to 34 and FIGS. 36 and 38 are cross-sectional views. Note that FIG. 32 corresponds to the cross-sectional view cut along the line A5-A5 of FIG. 31. The position of the line A5-A5 of FIG. 31 is the same as the position of A3-A3 of FIG. 9. FIG. 36 shows the cross-section of the same position as FIG. 32, but corresponds to the same process stage as FIG. 35. FIG. 38 shows the cross-section of the same position as FIG. 32, but corresponds to the same process stage as FIG. 37.

First, in the steps S1 and S2, the wiring board 21 and the frame 31 are prepared. It does not matter if the wiring board 21 is prepared first, the frame 31 is prepared first or the wiring board 21 and the frame 31 are prepared at the same time.

Figure 32:
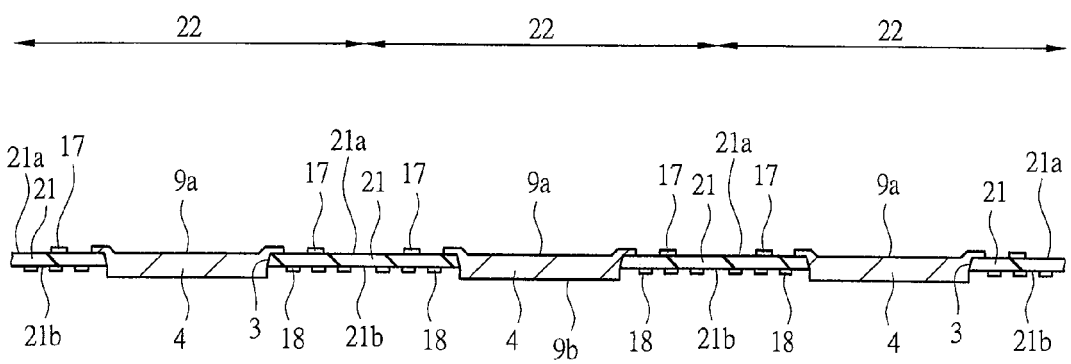
FIG. 32 is a cross-sectional view showing the same manufacturing process of the semiconductor device as FIG. 31.

Next, in the step S3, each heat sink 4 of the frame 31 is cut and separated from the frame portion 32 of the frame 31, and then, as shown in FIGS. 31 and 32, the heat sink 4 is disposed inside the through-hole 3 of each semiconductor device region 22 of the wiring board 21 in the step S5. In the manufacturing process described with reference to FIGS. 8 to 28, the heat sink 4 mounted with the semiconductor chip 5 is disposed inside the through-hole 3 of the wiring board 21, whereas the heat sink 4 not mounted with the semiconductor chip 5 is disposed inside the through-hole 3 of each semiconductor device region 22 of the wiring board 21 in FIGS. 31 and 32.

Figure 33:
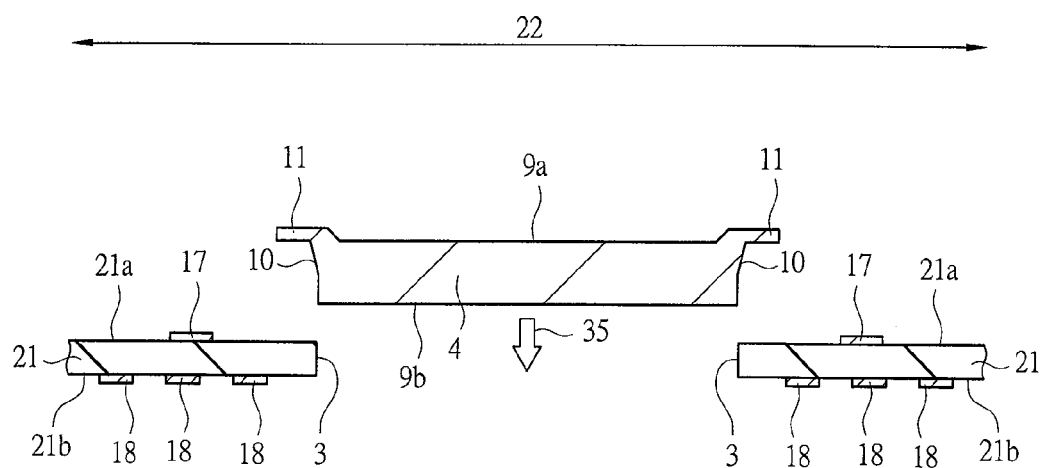
FIG. 33 is a cross-sectional view showing a process of disposing a heat sink inside a through-hole of a wiring board.
Figure 34:
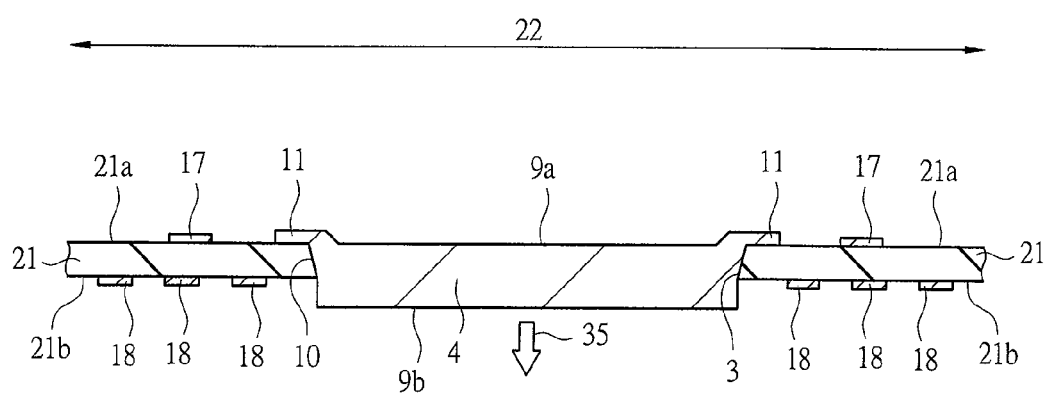
FIG. 34 is a cross-sectional view showing the process of disposing the heat sink inside the through-hole of the wiring board.

FIGS. 33 and 34 correspond to FIGS. 21 and 22, respectively, in which one semiconductor region 22 of the wiring board 21 is shown. In the step S5, as shown in FIG. 33, the heat sink 4 (heat sink 4 not mounted with the semiconductor chip 5) is inserted (plugged) into the through-hole 3 of wiring board 21 from the upper surface 21a side of the wiring board 21 (side corresponding to the upper surface 2a of the wiring board 2). More specifically, the heat sink 4 is inserted into the through-hole 3 of the wiring board 21 in the direction 35 shown by the arrow mark of FIG. 33 to achieve the state of FIG. 34.

Since the segmentation into the individual pieces of the heat sink 4 in the step S4 and the disposition of the heat sink 4 inside the through-hole 3 of the wiring board 21 in the step S5 are performed similarly to the manufacturing process described with reference to FIGS. 8 to 28 except that the semiconductor chip 5 is not mounted on the heat sink 4, the detailed description thereof will be omitted here.

After the heat sink 4 is disposed inside the through-hole 3 of each semiconductor device region 22 of the wiring board 21 in the step S4, the semiconductor chip 5 is mounted and bonded on the upper surface 9a of the heat sink 4 disposed inside the through-hole 3 of each semiconductor device region 22 of the wiring board 21 through the bonding agent 14 (step S3a). The bonding process of the semiconductor chip 5 in the step S3a can be performed as follows.

Figure 35:
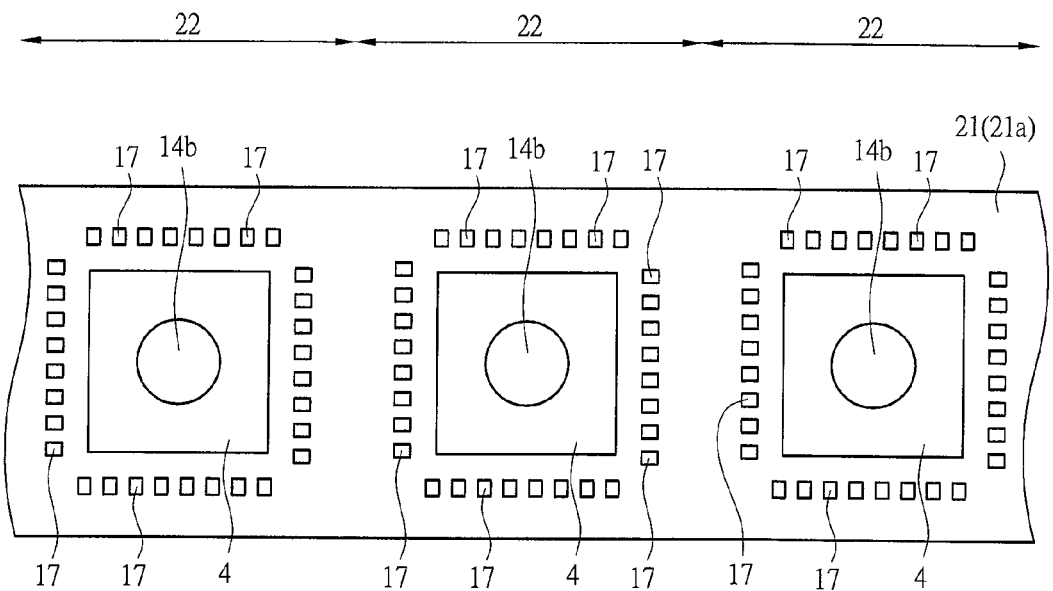
FIG. 35 is a plan view showing the manufacturing process of the semiconductor device subsequent to FIG. 31.
Figure 36:
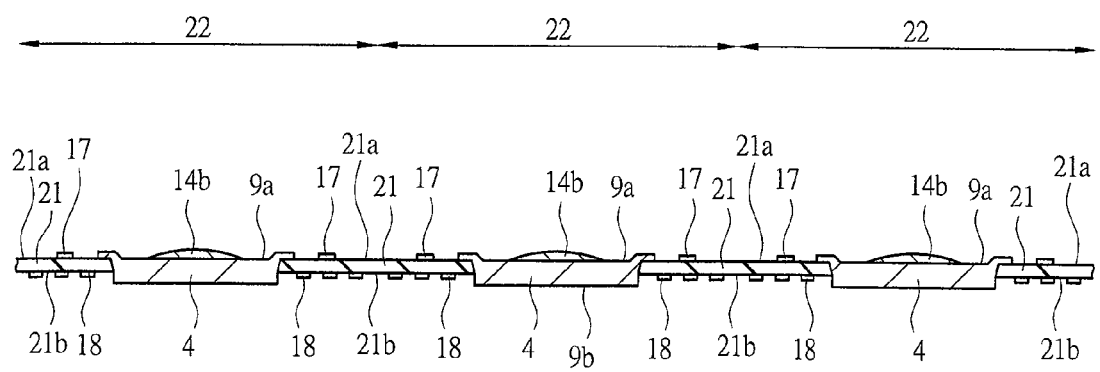
FIG. 36 is a cross-sectional view showing the same manufacturing process of the semiconductor device as FIG. 35.

That is, as shown in FIGS. 35 and 36, a conductive paste material, preferably silver paste 14b is coated on the upper surface 9a of the heat sink 4 disposed inside the through-hole 3 of each semiconductor device region 22 of the wiring board 21. Then, as shown in FIGS. 37 and 38, the semiconductor chip 5 is mounted on the upper surface 9a of the heat sink 4 disposed inside the through-hole 3 of each semiconductor device region of the wiring board 21 through the silver paste 14b. Thereafter, heat treatment and the like are performed so as to harden the silver paste 14b. By this means, the silver past 14b in a paste state at the time of mounting the semiconductor chip 5 is hardened, and the semiconductor chip 5 is boded and fixed to the heat sink 4 by the hardened silver paste 14b. This hardened silver paste 14b serves as the bonding agent 14.

The subsequent process is the same as the manufacturing process described with reference to FIGS. 23 to 28. More specifically, the wire bonding process in the step S6 is performed as shown in FIGS. 23 and 24, the resin sealing process in the step S7 is performed as shown in FIG. 25 or FIG. 27, the connecting process of the solder balls 8 in the step S9 is performed as shown in FIG. 26 or 28, the marking process in the step S9 is performed as needed, and the cutting process in the step S10 is performed. In this manner, the semiconductor device 1 as shown in FIG. 1 or FIG. 29 is manufactured.

The wiring board 21 composed of a resin board is low in durability to high temperature heat treatment as compared with the frame 31 (heat sink 4) made of a metal material. In the manufacturing process described with reference to FIG. 8, the semiconductor chip 5 is bonded on the heat sink 4 in the step S3 before disposing the heat sink 4 inside the through-hole 3 of the wiring board 21 in the step S5, and therefore, the wiring board 21 is not heated at the time of heat treatment of the bonding process of the semiconductor chip 5 in the step S3. Hence, the high temperature heat treatment can be performed for the heat treatment of the bonding process of the semiconductor chip 5 in the step S3 without regard to the heat resistance of the wiring board 21. Therefore, in the case where the high temperature heat treatment is performed for the heat treatment of the bonding process of the semiconductor chip 5 in the step S3, for example, when the semiconductor chip 5 is bonded on the heat sink 4 by using the solder 14a having a melting point higher than that of the solder (second solder) used for the external terminal (here, solder ball 8) formed on the land 18, it is preferable that the manufacturing process described with reference to FIG. 8 is applied because the wiring board 21 does not suffer from damages at the time of solder reflow in the bonding process of the semiconductor chip 5 in the step S3.

More specifically, the solder reflow temperature at the time of mounting the semiconductor device 1 when using the lead-free solder for the solder ball 8 (at the time of mounting the semiconductor to the wiring board 41 to be described later) is, for example, about 220° C., and the solder reflow temperature at the time of mounting the semiconductor device 1 when using the lead-containing solder for the solder ball 8 (at the time of mounting the semiconductor to the wiring board 41 to be described later) is, for example, about 180° C. On the other hand, the solder reflow temperature in the step S3 in which the high melting point solder is used for the solder 14a is preferably 350 to 400° C., but there is the possibility that the wiring board 21 cannot endure such a high temperature. In the manufacturing process described with reference to FIG. 8, the semiconductor chip 5 is bonded on the heat sink 4 in the step S3 before disposing the heat sink 4 inside the through-hole 3 of the wiring board 21 in the step S5, and therefore, there arises no problem of the durability of the wiring board 21 at the time of solder reflow.

Further, if the solder is used as the bonding agent 14, the heat conductivity of the bonding agent 14 is increased as compared with a case of using the silver paste, and therefore, the heat conductivity to the heat sink 4 from the semiconductor chip 5 is more increased, so that the heat dissipation of the semiconductor device 1 can be more improved.

On the other hand, since the semiconductor chip 5 is bonded on the heat sink 4 in the step S3a after disposing the heat sink 4 inside the through-hole 3 of the wiring board 21 in the step S5 in the manufacturing process described with reference to FIG. 30, the wiring board 21 is heated at the time of the heat treatment of the bonding process of the semiconductor chip 5 in the step S3a. Hence, when the manufacturing process described with reference to FIG. 30 is performed, it is preferable that the heat treatment at a very high temperature is not performed for the heat treatment of the bonding process of the semiconductor chip 5 in the step S3a, and the semiconductor chip 5 is preferably bonded on the heat sink 4 by using the silver paste 14b as described above because the wiring board 21 does not suffer from damages at the time of the heat treatment for hardening the bonding agent (silver paste 14b) in the bonding process of the semiconductor chip 5 in the step S3a.

Also, the case where the wiring board 21 and the heat sink 4 (frame 31) are separately prepared, and then, the heat sink 4 is disposed inside the through-hole 3 of the wiring board 21 in the step S5 has been described, but as another embodiment, the step S5 is performed on a board manufacturer side to prepare the wiring board 21 in a state where the heat sink 4 is already disposed inside the through-hole 3, and the wiring board 21 in this state is received from the board manufacturer to perform the subsequent process on the semiconductor device manufacturer side.

For the improvement of the heat dissipation properties of the semiconductor device, the thickness of the heat sink 4 mounted with the semiconductor chip 5 is preferably increased. However, the weight of the heat sink 4 becomes heavy as the thickness of the heat sink 4 is increased. Meanwhile, in the structure of the present embodiment, as described above, the heat sink 4 is inserted into the through-hole 3 from the upper surface 21a (upper surface 2a of the wiring board 2) side of the wiring board 21, the protruded portion 11 is located on the upper surface 21a of the wiring board 21, and the lower surface 12 of the protruded portion 11 contacts to the upper surface 21a of the wiring board 21, so that the protruded portion 11 supports the weight of the heat sink 4. Therefore, even if the thickness of the heat sink 4 is increased and the heat sink 4 becomes heavy, the heat sink 4 is firmly supported by the protruded portion 11, so that the heat sink 4 can be prevented from falling off from the wiring board 21. Consequently, the thickness of the heat sink 4 (thickness t1) can be increased and preferably can be made larger than the thickness of the wiring board 21 (that is, thickness t2 of the wiring board 2), and it is thus possible to improve the heat dissipation properties of the semiconductor device. The same thing is true in the following second, fourth, and fifth embodiments, but those operating similarly to the protruded portion 11 of the present embodiment are the protruded portion 11a in the following second embodiment and the joining portions 33a in the following fourth and fifth embodiments.

Also, since the resin sealing process is performed in a state where the protruded portion 11 is located on the upper surface 21a of the wiring board 21 and the lower surface 12 of the protruded portion 11 contacts to the upper surface 21a of the wiring board 21 for supporting the heat sink 4, this state (that is, a state where the protruded portion 11 is located on the upper surface 21a of the wiring board 21 and the lower surface 12 of the protruded portion 11 contacts to the upper surface 21a of the wiring board 21) is maintained even in the manufactured semiconductor device. The same thing is true in the following second, fourth, and fifth embodiments, but those operating similarly to the protruded portion 11 of the present embodiment are the protruded portion 11a in the following second embodiment and the joining portions 33a in the following fourth and fifth embodiments.

Since the weight of the heat sink 4 itself operates in the direction to fix the heat sink 4 to the wiring board 21, even if the fixing power of the heat sink 4 and the wiring board 21 by the tapered shape of the side surface 10 of the heat sink 4 is not so strong, the heat sink 4 can be fixed to the wiring board 21, and the process up to the resin sealing can be performed appropriately.

Also, since the heat sink 4 used in the present embodiment has a simple structure, the processing of the heat sink 4 (frame 31 connecting the heat sinks 4) is easy, and the manufacturing cost of the heat sink 4 (frame 31) can be reduced, so that the manufacturing cost of the semiconductor device can be reduced. Further, by inserting the heat sink 4 into the through-hole 3 from the upper surface 21a side of the wiring board 21, the heat sink 4 can be fixed to the wiring board 21 by the tapered shape of the heat sink 4, and therefore, the heat sink 4 can be fixed to the wiring board 21 by a simple operation, and the manufacturing process of the semiconductor device is facilitated.

Next, the mounting of the semiconductor device 1 will be described.

Figure 39:
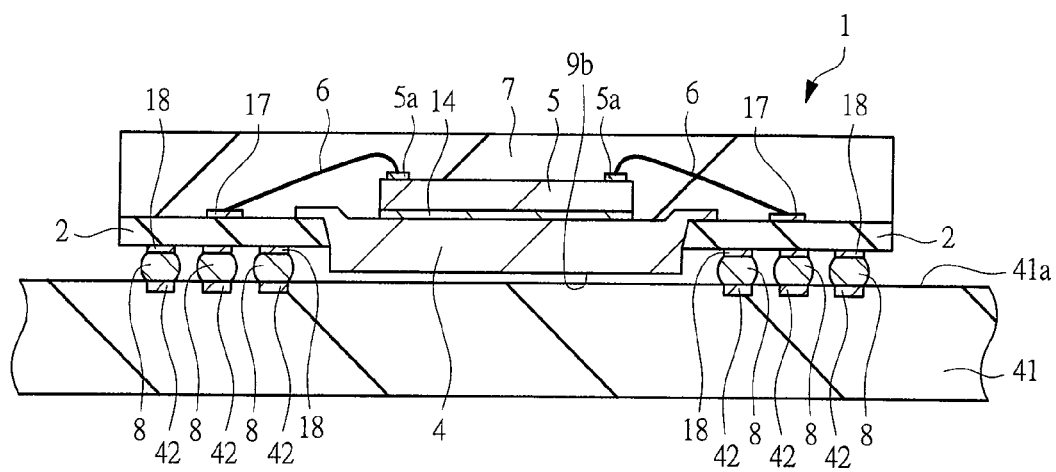
FIG. 39 is a cross-sectional view showing a state in which the semiconductor device according to one embodiment of the present invention is mounted on the wiring board.

FIG. 39 is a cross-sectional view (side cross-sectional view) showing a state in which the semiconductor device 1 of the present embodiment is mounted on a wiring board 41.

The wiring board (mounting board) 41 shown in FIG. 39 is a mounting board for mounting the semiconductor device 1, and an upper surface (front surface, main surface) 41a which is a mounting surface for mounting the semiconductor device 1 is provided with a plurality of board side terminals (terminals, electrodes, pad electrodes, conductive lands) 42 for connecting the plurality of solder balls 8 of the semiconductor device 1, respectively. Although FIG. 39 shows a cross-sectional structure of the wiring board 41 in a simplified manner, the wiring board 41 is preferably a multilayer wiring board 41 (multilayer board), in which a plurality of insulating layers (dielectric layers, insulating base material layers) and a plurality of wiring layers (conductive layers, conductive pattern layers) are stacked and integrated. The board side terminal 42 is a terminal for connecting the solder ball 8 (bump electrode) which is the external terminal of the semiconductor device 1, and the board side terminal 42 is disposed at the position opposite to (planarly overlapped with) the solder ball 8 when the semiconductor device 1 is mounted on the upper surface 41a of the wiring board 41.

For mounting the semiconductor device 1 on a wiring board 31, after the solder paste (this solder paste is integrated with the solder ball 8 by the solder reflow) is supplied to a plurality of board side terminals 42 of the wiring board 41 by a printing method or the like, the semiconductor device 1 is mounted (disposed) on the wiring board 41 so that the positions of the solder balls 8 of the semiconductor device 1 and the board side terminals 42 of the wiring board 41 are matched, and then, the solder reflow treatment is performed.

By this means, as shown in FIG. 39, the semiconductor device 1 is mounted (solder-mounted) on the wiring board 41 and the semiconductor device 1 is fixed to the wiring board 41, and at the same time, the plurality of solder balls 8 as the external terminals of the semiconductor device 1 are electrically connected to the plurality of board side terminals 42 of the wiring board 41, respectively. Therefore, a plurality of electrodes 5a of the semiconductor chip 5 in the semiconductor device 1 are electrically connected to the plurality of board side terminals 42 of the wiring board 41 through the plurality of bonding wires 6, the plurality of connecting terminals 17 and wires of the wiring board 2, the conductors and the lands 18 inside the through-holes (not shown) of the wiring board 2, and the plurality of solder balls 8. Further, electronic parts and the like other than the semiconductor device 1 can be also mounted as needed on the region other than mounting region of the semiconductor device 1 on the upper surface 41a of the wiring board 41. In the case of FIG. 39, the heat sink 4 of the semiconductor device 1 is not connected to the board side terminal of the wiring board 41.

When the heat sink 4 of the semiconductor device 1 is not connected to the board side terminal of the wiring board 41 as shown in FIG. 39, the heat generated in the semiconductor chip 5 of the semiconductor device 1 is dissipated into the atmosphere through the heat sink 4.

Figure 40:
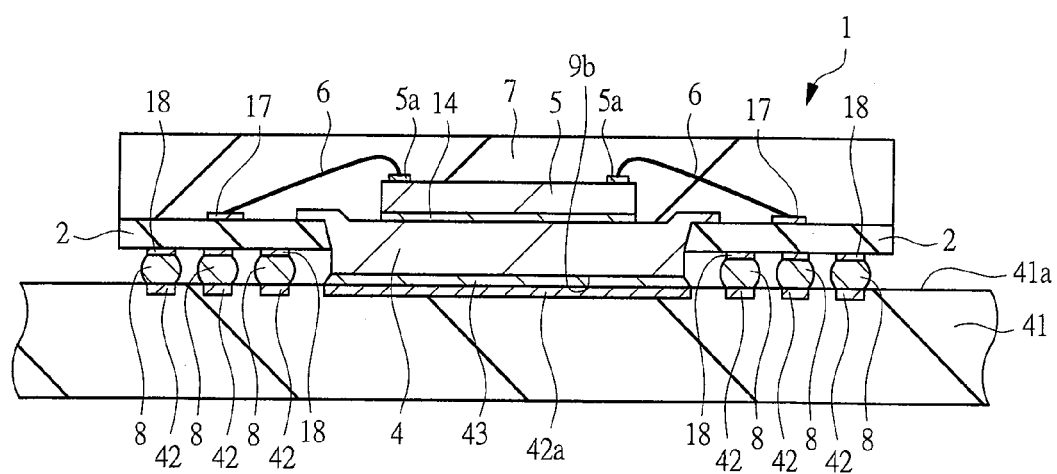
FIG. 40 is a cross-sectional view showing a state in which the semiconductor device according to one embodiment of the present invention is mounted on the wiring board.

As another mounting method of the semiconductor device 1, the heat sink 4 of the semiconductor device 1 can be connected to the board side terminal of the wiring board 41 at the time of mounting the semiconductor device 1 on the wiring board 41. FIG. 40 is a cross-sectional view (side cross-sectional view) of the case where the heat sink 4 of the semiconductor device 1 is connected to the board side terminal of the wiring board 41 at the time of mounting the semiconductor device 1 on the wiring board 41.

As compared with the case of FIG. 39, the wiring board 41 shown in FIG. 40 is further provided with a board side terminal (terminal, electrode) 42a for connecting the heat sink 4 of the semiconductor device 1 on the upper surface 41a. The board side terminal 42a is a terminal for connecting the heat sink 4 of the semiconductor device 1, and the board side terminal 42a is disposed at the position opposite to (planarly overlapped with) the heat sink 4 at the time of mounting the semiconductor device 1 on the upper surface 41a of the wiring board 41. The planar dimension of the board side terminal 42a for connecting the heat sink 4 is larger than the planar dimension of the board side terminal 42 for connecting the solder ball 8.

For mounting the semiconductor device 1 on the wiring board 41, after the solder paste is supplied on the plurality of board side terminals 42 and 42a of the wiring board 41 by the printing method or the like, the semiconductor device 1 is mounted (disposed) on the wiring board 41 so that the positions of the solder balls 8 of the semiconductor device 1 and the board side terminals 42 of the wiring board 41 are matched, and then, the solder reflow treatment is performed. The solder paste supplied on the board side terminal 42 is integrated with the solder ball 8 by the solder reflow, and the solder paste supplied on the board side terminal 42a is molten and solidified by the solder reflow to become solder 43.

By this means, as shown in FIG. 40, the semiconductor device 1 is mounted (solder-mounted) on the wiring board 41 and the semiconductor device 1 is fixed to the wiring board 41, and at the same time, the plurality of solder balls 8 as the external terminals of the semiconductor device 1 are electrically connected to the plurality of board side terminals 42 of the wiring board 41, respectively, and moreover, (lower surface 9b of) the heat sink 4 of the semiconductor device 1 is bonded and electrically connected to the board side terminal 42a of the wiring board 41 through the solder 43. The board side terminal 42 is preferably a ground terminal.

When the heat sink 4 of the semiconductor device 1 is connected to the board side terminal 42a of the wiring board 41 by the solder 43 as shown in FIG. 40, the heat generated in the semiconductor chip 5 of the semiconductor device 1 is dissipated to the wiring board 41 through the heat sink 4 and the solder 43. By connecting the heat sink 4 to the board side terminal 42a of the wiring board 41 by the solder 43, the heat dissipation properties of the semiconductor device 1 can be more improved.

Figure 41:
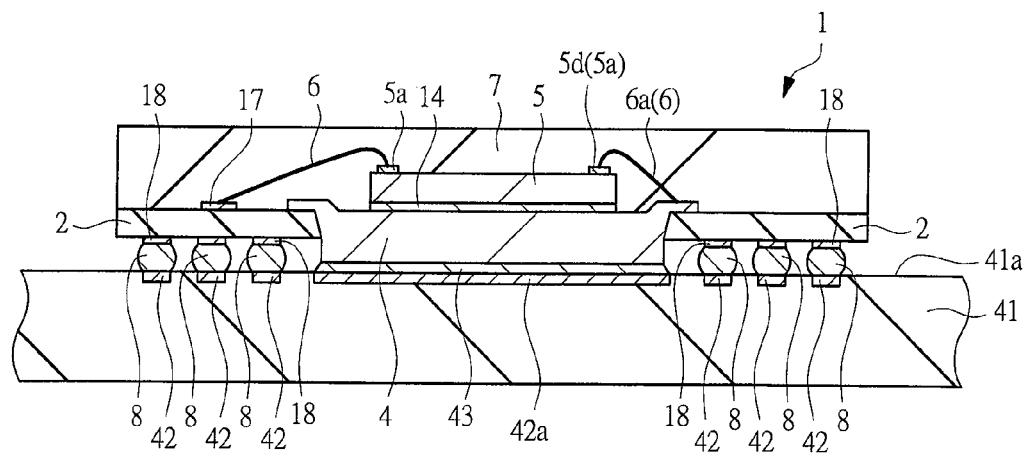
FIG. 41 is a cross-sectional view showing a state in which the semiconductor device according to one embodiment of the present invention is mounted on the wiring board.

FIG. 41 is another cross-sectional view (side cross-sectional view) showing a state in which the semiconductor device 1 is mounted on the wiring board 41. As shown in FIG. 41, the electrode 5d (preferably, the electrode for ground potential) of the plurality of electrodes 5a of the semiconductor chip 5 can be electrically connected to the heat sink 4 through the bonding wire 6a (bonding wire 6a of the bonding wires 6). In this case, by connecting the heat sink 4 of the semiconductor device 1 to the board side terminal 42a of the wiring board 41 by solder 42a at the time of mounting the semiconductor device 1 on the wiring board 41, the electrode 5d of the semiconductor chip 5 can be electrically connected to the board side terminal 42a of the wiring board 41 through the bonding wire 6a, the heat sink 4 and the solder 43. If a ground terminal is used as the board side terminal 42a of the wiring board 41, the ground potential can be supplied to the heat sink 4 and the electrode 5d of the semiconductor chip 5 from the board side terminal 42a of the wiring board 41 by mounting the semiconductor device 1 on the wiring board 41.

Figure 42:
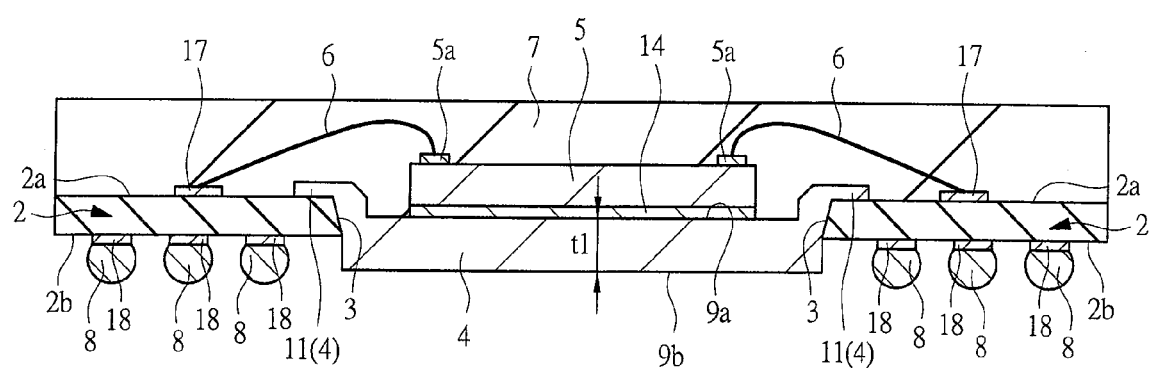
FIG. 42 is a cross-sectional view showing a modified example of the semiconductor device according to one embodiment of the present invention.

FIG. 42 is a cross-sectional view of another modified example of the semiconductor device 1 (semiconductor device of a modified example). In the semiconductor device 1 of FIGS. 1 to 3, the chip mounting surface (surface mounted with the semiconductor chip 5, upper surface 9a) of the heat sink 4 is located almost on the same plane as the upper surface 2a of the wiring board 2. In contrast to this, in the semiconductor device of FIG. 42 (modified example of the semiconductor device 1), the upper surface 9a of the heat sink 4 is recessed and the semiconductor chip 5 is mounted on the recessed surface, and thus, the chip mounting surface of the heat sink 4 (surface mounted with the semiconductor chip 5) is lower than the upper surface 2a of the wiring board 2. Therefore, as compared with the semiconductor device 1 of FIGS. 1 to 3, a height position of the upper surface of the semiconductor chip 5 is lowered and a height position of the top of the bonding wire 6 is lowered in the semiconductor device of FIG. 42 (modified example of the semiconductor device 1), so that the thickness of the sealing resin 7 can be reduced, and the semiconductor device can be made more thinner. This can be applied to the semiconductor devices of the following other modified examples and the semiconductor devices of the following second, fourth and fifth embodiments.

Figure 43:
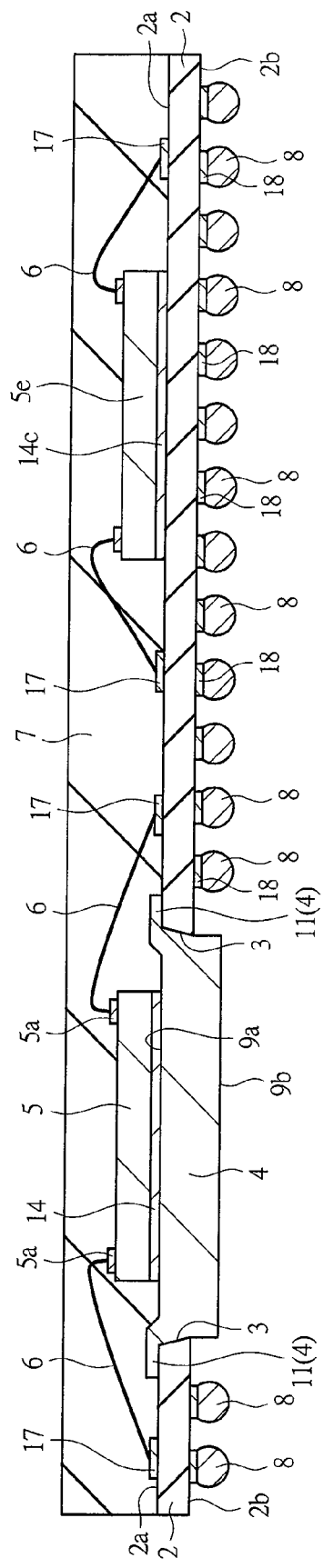
FIG. 43 is a cross-sectional view showing another modified example of the semiconductor device according to one embodiment of the present invention.
Figure 44:
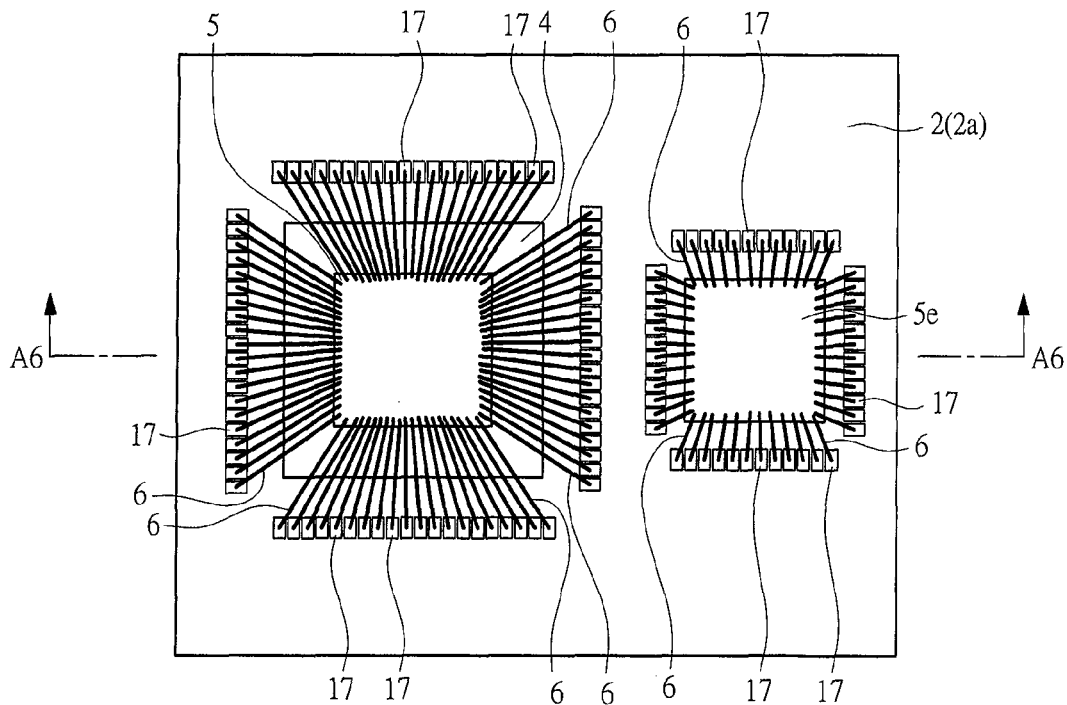
FIG. 44 is a perspective plan view of the semiconductor device of FIG. 43.
Figure 45:
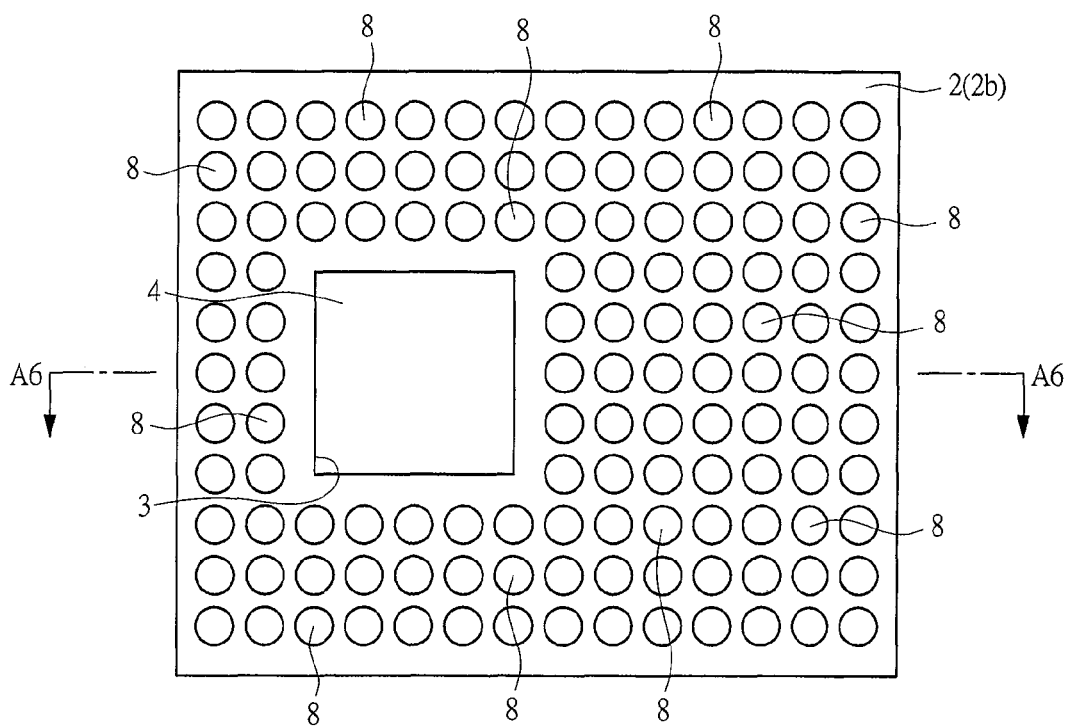
FIG. 45 is a lower surface view of the semiconductor device of FIG. 43.

FIGS. 43 to 45 are a cross-sectional view (side cross-sectional view), a perspective plan view (upper surface view) and a lower surface view (bottom view, rear surface view, plan view) of still another modified example of the semiconductor device 1 (semiconductor device of modified example). FIG. 44 shows a perspective plan view when the sealing resin 7 is seen through, and the cross-section cut along the line A6-A6 of FIG. 44 almost corresponds to the cross-sectional view of FIG. 43. FIG. 45 is a lower surface view.

In the semiconductor device 1 of FIGS. 1 to 3, the semiconductor chip contained inside the semiconductor device 1 is only one, and the one semiconductor chip 5 is mounted on the heat sink 4 disposed inside the through-hole 3 of the wiring board 2. In contrast to this, in the semiconductor device of FIGS. 43 to 45, a plurality of semiconductor chips (two chips in this case) are contained inside the semiconductor device, and one semiconductor chip 5 is mounted on the heat sink 4 disposed inside the through-hole 3 of the wiring board 2 and a semiconductor chip 5e other than the semiconductor chip 5 is mounted and bonded on the upper surface 2a of the wiring board 2 through a bonding agent 14c instead of on the heat sink 4.

More specifically, in the semiconductor device of FIGS. 43 to 45, the semiconductor chip 5e is mounted and bonded through the bonding agent 14c in the region not having the through-hole 3 on the upper surface 2a of the wiring board 2, and the electrodes on the upper surface of this semiconductor chip 5e are electrically connected to the connecting terminals 17 on the upper surface 2a of the wiring board 2 through the bonding wires 6, and the sealing resin 7 seals the semiconductor chips 5 and 5e and the bonding wires 6 connected to the electrodes thereof.

Figure 46:
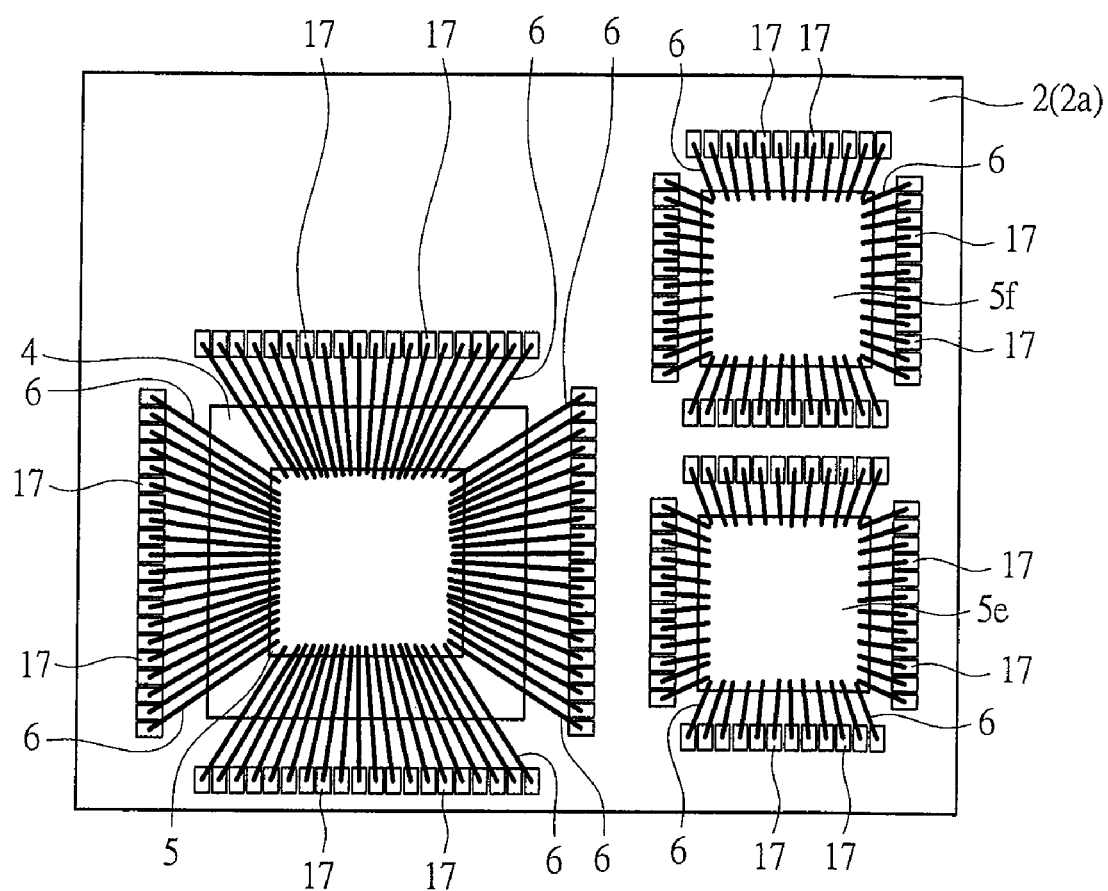
FIG. 46 is a perspective plan view showing still another modified example of the semiconductor device according to one embodiment of the present invention.

FIG. 46 is a perspective plan view (upper surface view) of still another modified example of the semiconductor device 1 (semiconductor device of the modified example), and a perspective plan view when the sealing resin 7 is seen through is shown.

In the semiconductor device of FIGS. 43 to 45, one semiconductor chip 5e is mounted and bonded through the bonding agent 14c in the region not having the through-hole 3 on the upper surface 2a of the wiring board 2. Meanwhile, in the semiconductor device of FIG. 46, still one more semiconductor chip 5f is mounted and bonded through the bonding agent in addition to the semiconductor chip 5e in the region not having the through-hole 3 on the upper surface 2a of the wiring board 2. The electrodes on the upper surface of this semiconductor chip 5f are electrically connected to the connecting terminals 17 of the upper surface 2a of the wiring board 2 through the bonding wires 6, and the sealing resin 7 seals the semiconductor chips 5, 5e and 5f and the bonding wires 6 connected to the electrodes thereof.

Figure 47:
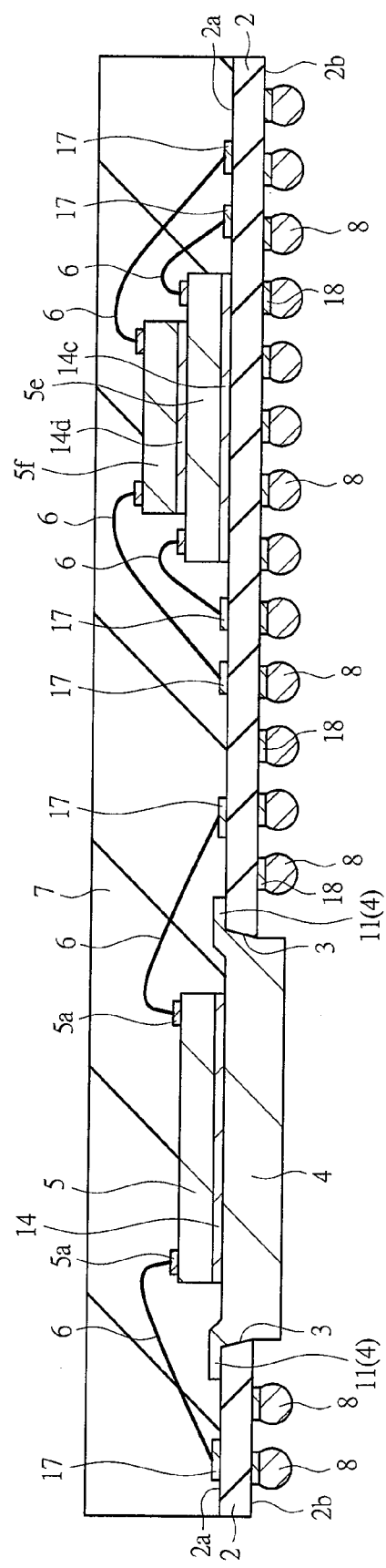
FIG. 47 is a cross-sectional view showing still another modified example of the semiconductor device according to one embodiment of the present invention.

FIG. 47 is a cross-sectional view (side cross-sectional view) of still another modified example of the semiconductor device 1 (semiconductor device of the modified example). In the semiconductor device of FIG. 46, the semiconductor chip 5e and the semiconductor chip 5f are disposed in the different regions on the upper surface 2a of the wiring board 2 so as not to be overlapped with each other, whereas the semiconductor chip 5f is stacked on the semiconductor chip 5e in the semiconductor device of FIG. 47. More specifically, in the semiconductor device of FIG. 47, the semiconductor chip 5e is mounted and bonded through the bonding agent 14c in the region not having the through-hole 3 on the upper surface 2a of the wiring board 2, and the semiconductor chip 5f is mounted and bonded through the bonding agent 14d on the upper surface of this semiconductor chip 5e. The electrodes of the upper surface of the semiconductor chip 5e are electrically connected to the connecting terminals 17 of the upper surface 2a of the wiring board 2 through the bonding wires 6, and the electrodes of the upper surface of the semiconductor chip 5f are electrically connected to the connecting terminals 17 of the upper surface 2a of the wiring board 2 through the bonding wires 5, and the sealing resin 7 seals the semiconductor chips 5, 5e and 5f and the bonding wires 6 connected to the electrodes thereof.

Further, the number of semiconductor chips disposed in the region not having the through-hole 3 on the upper surface 2a of the wiring board 2 may be three or more, and the number of stacked semiconductor chips may also be three or more.

As shown in the semiconductor device of FIGS. 43 to 45, the semiconductor device of FIG. 46 and the semiconductor device of FIG. 47, the number of semiconductor chips contained in the semiconductor device can be made plural. Since the heat generated in the semiconductor chip 5 mounted on the heat sink 4 can be dissipated by the heat sink 4, a large effect can be achieved if the semiconductor chip having a high calorific value is applied. Hence, when the number of the semiconductor chips contained in the semiconductor device is plural, the semiconductor chip having the highest calorific value of the chips (here, the semiconductor chip 5) is preferably mounted on the heat sink 4. Then, of the plurality of semiconductor chips contained in the semiconductor device, the semiconductor chips (here, the semiconductor chips 5e and 5f) having the calorific value lower than the semiconductor chip 5 mounted on the heat sink 4 (semiconductor chip having the highest calorific value) are disposed on the upper surface 2a of the wiring board 2 (region not having the through-hole 3). By this means, while restraining the number of heat sinks 4 to the minimum, the heat generated in the semiconductor chip having a high calorific value can be dissipated to the outside of the semiconductor device 1 from the heat sink 4, thereby being able to achieve both the reduction in the manufacturing cost of the semiconductor device and the improvement of the heat dissipation properties of the semiconductor device. This can be applied also to the semiconductor devices of the following embodiments.

Further, in the semiconductor device of FIGS. 43 to 45, the semiconductor device of FIG. 46 and the semiconductor device of FIG. 47, the semiconductor chips 5e and 5f can be made to be a memory chip having a volatile memory (for example, DRAM) or a non-volatile memory (for example, a flash memory) formed therein, and the semiconductor chip 5 can be made to be a control chip (microcomputer) having a control circuit for controlling (the memories of) the semiconductor chips 5e and 5f formed therein. In this case, the semiconductor device of FIGS. 43 to 45, the semiconductor device of FIG. 46 and the semiconductor device of FIG. 47 can be taken as SIP (System in Package) semiconductor devices, in which one system is constituted by mounting a plurality of semiconductor chips 5 and 5e or semiconductor chips 5, 5e and 5f provided with integrated circuits having different functions on the wiring board 2 including the heat sink 4, respectively. Since the control chip has a high calorific value as compared with the memory chip, the control chip liable to generate heat (here, the semiconductor chip 5) is mounted on the heat sink 4, thereby improving the heat dissipation properties, and the memory chips (here, the semiconductor chips 5e and 5f) are disposed on the upper surface 2a of the wiring board 2 (region not having the through-hole 3), thereby restraining the number of heat sinks 4 to the minimum and reducing the manufacturing cost of the semiconductor device.

Second Embodiment

Figure 48:
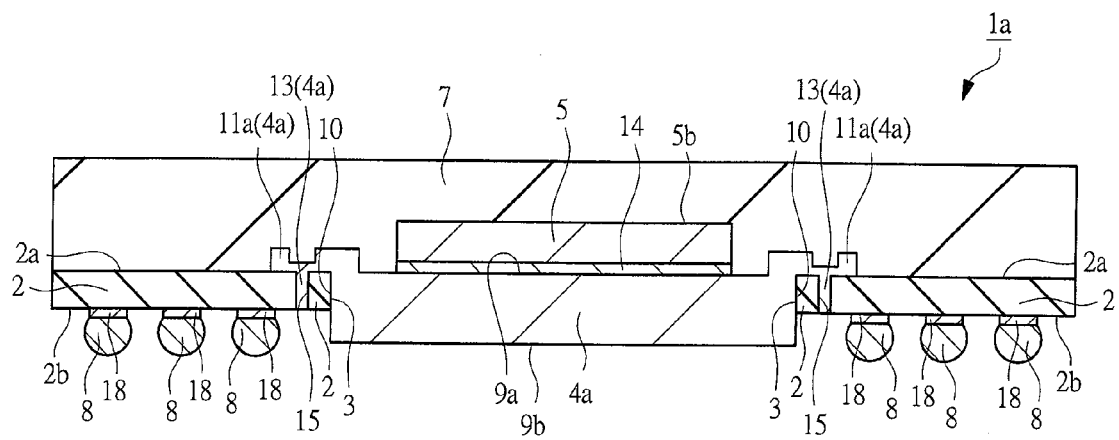
FIG. 48 is a cross-sectional view of a semiconductor device according to another embodiment of the present invention.
Figure 49:
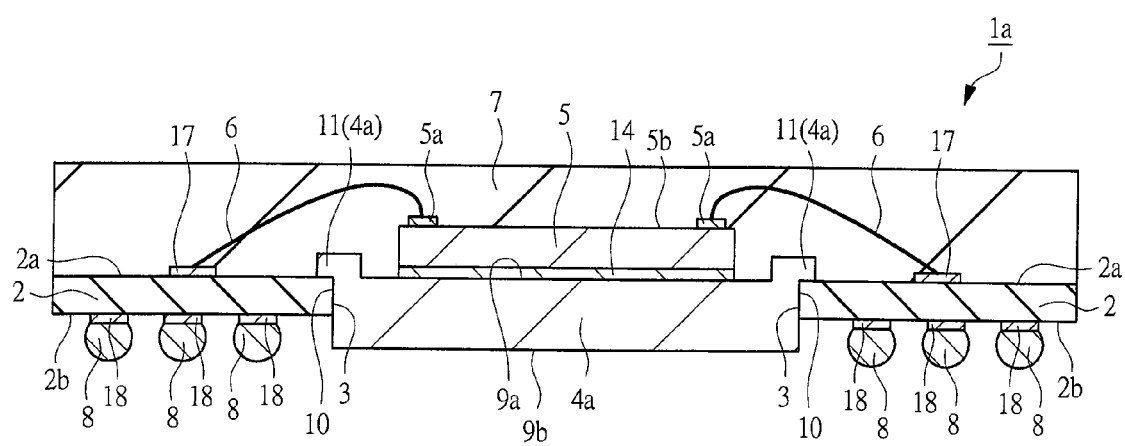
FIG. 49 is another cross-sectional view of the semiconductor device of FIG. 48.
Figure 50:
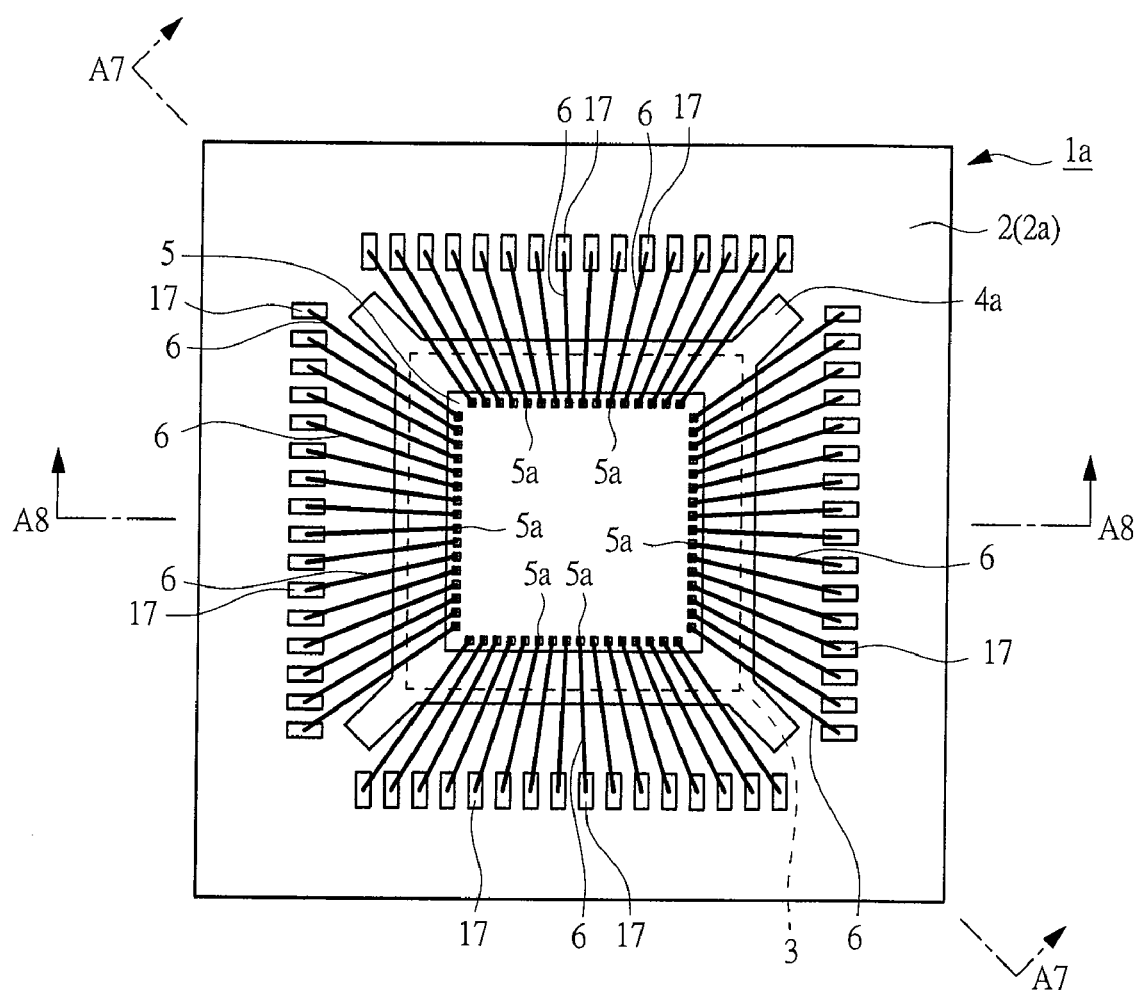
FIG. 50 is a perspective plan view of the semiconductor device of FIG. 48.
Figure 51:
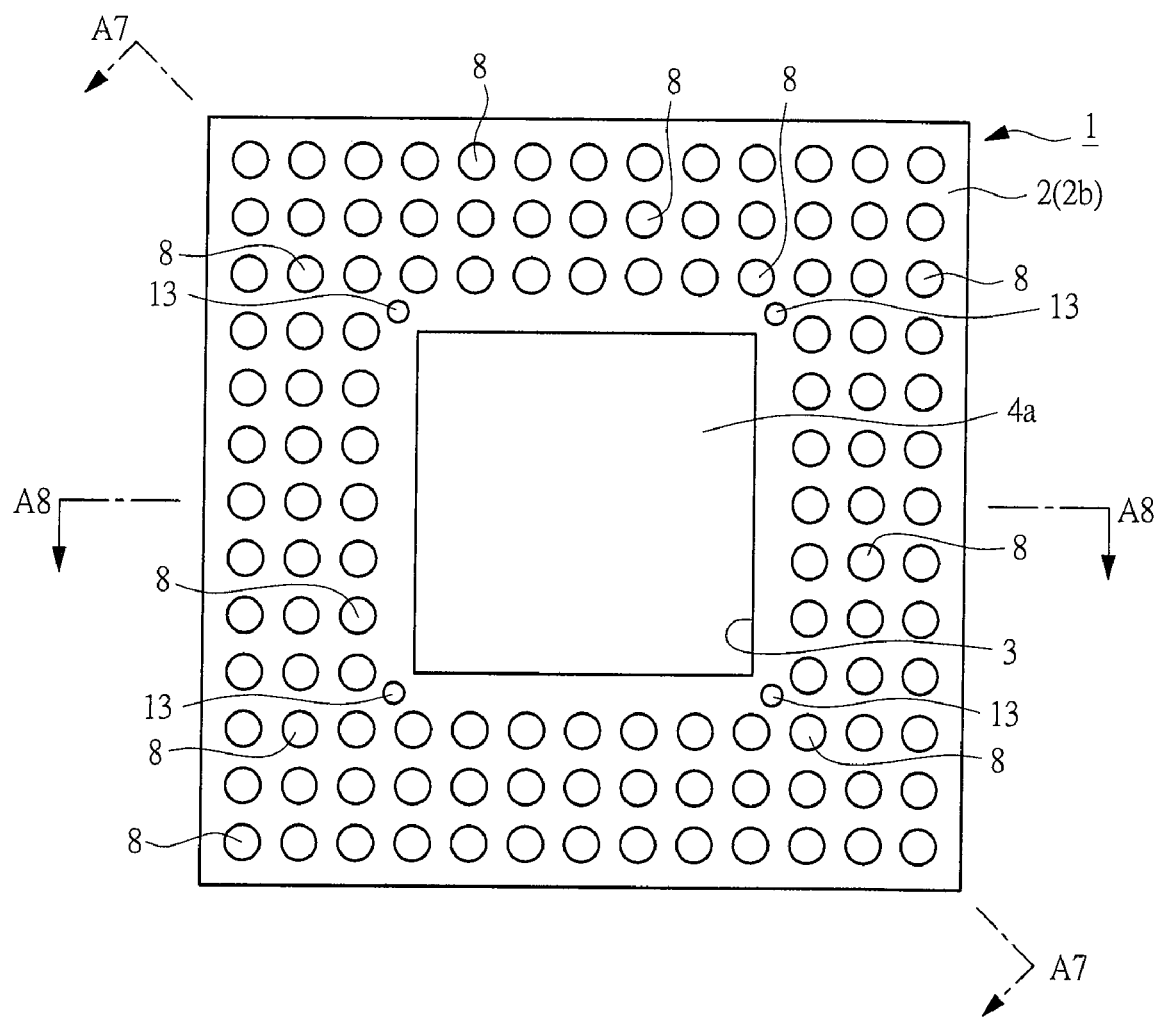
FIG. 51 is a lower surface view of the semiconductor device of FIG. 48
Figure 52:
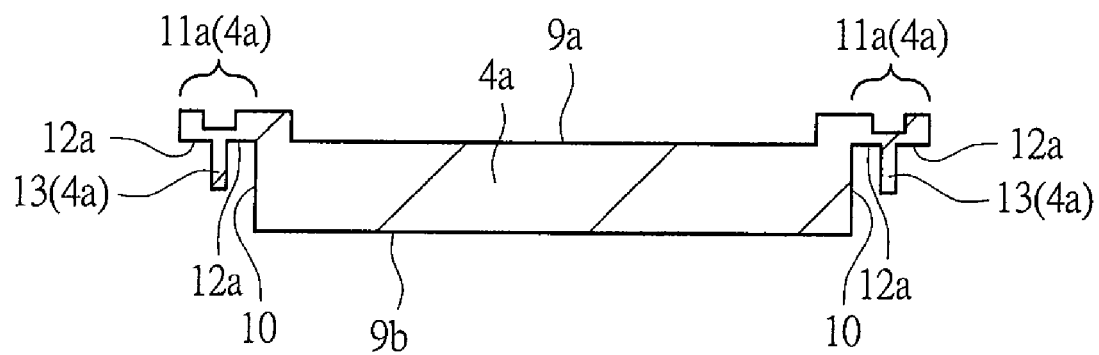
FIG. 52 is a cross-sectional view of a heat sink used in the semiconductor device of FIG. 48.
Figure 53:
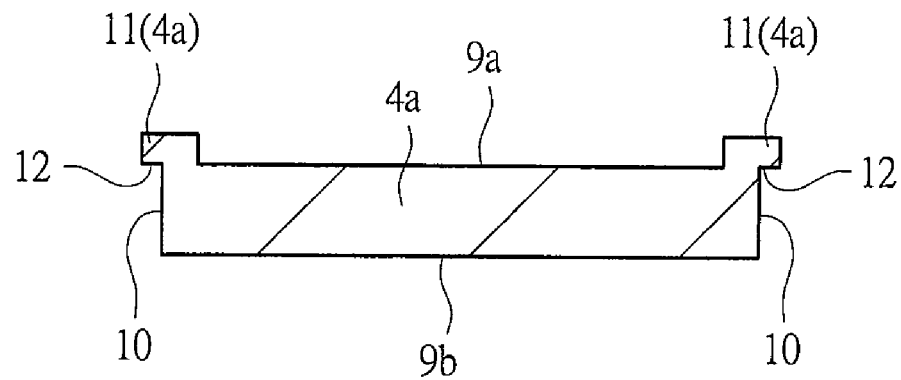
FIG. 53 is another cross-sectional view of the heat sink of FIG. 52.
Figure 54:
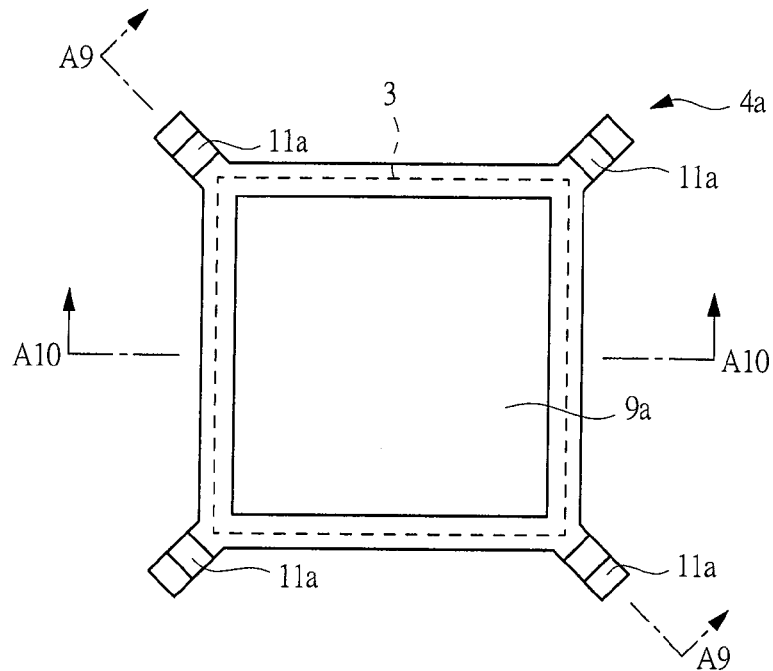
FIG. 54 is an upper surface view of the heat sink of FIG. 52.
Figure 55:
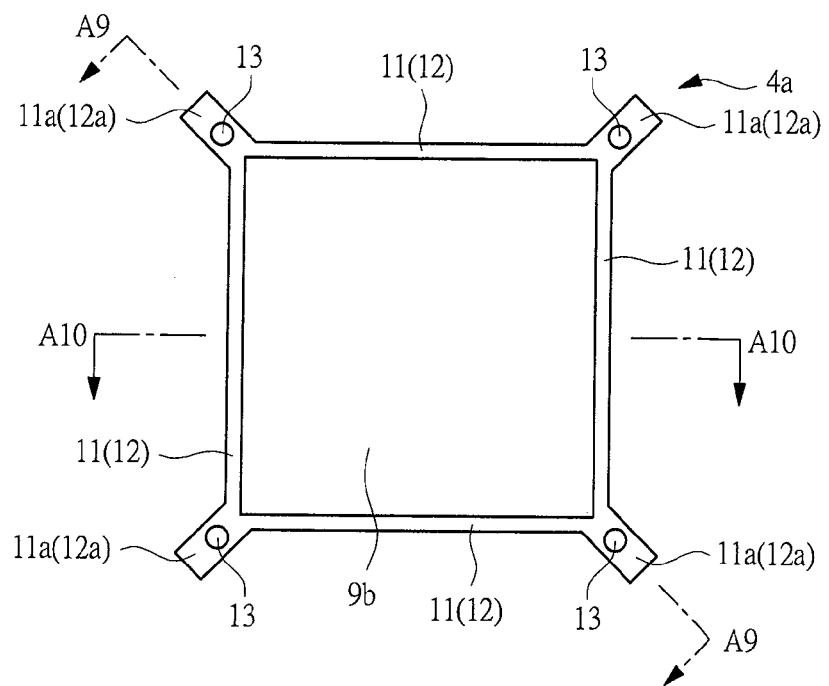
FIG. 55 is a lower surface view of the heat sink of FIG. 52.
Figure 56:
FIG. 56 is a cross-sectional view of a wiring board used in the semiconductor device of FIG. 48.
Figure 57:
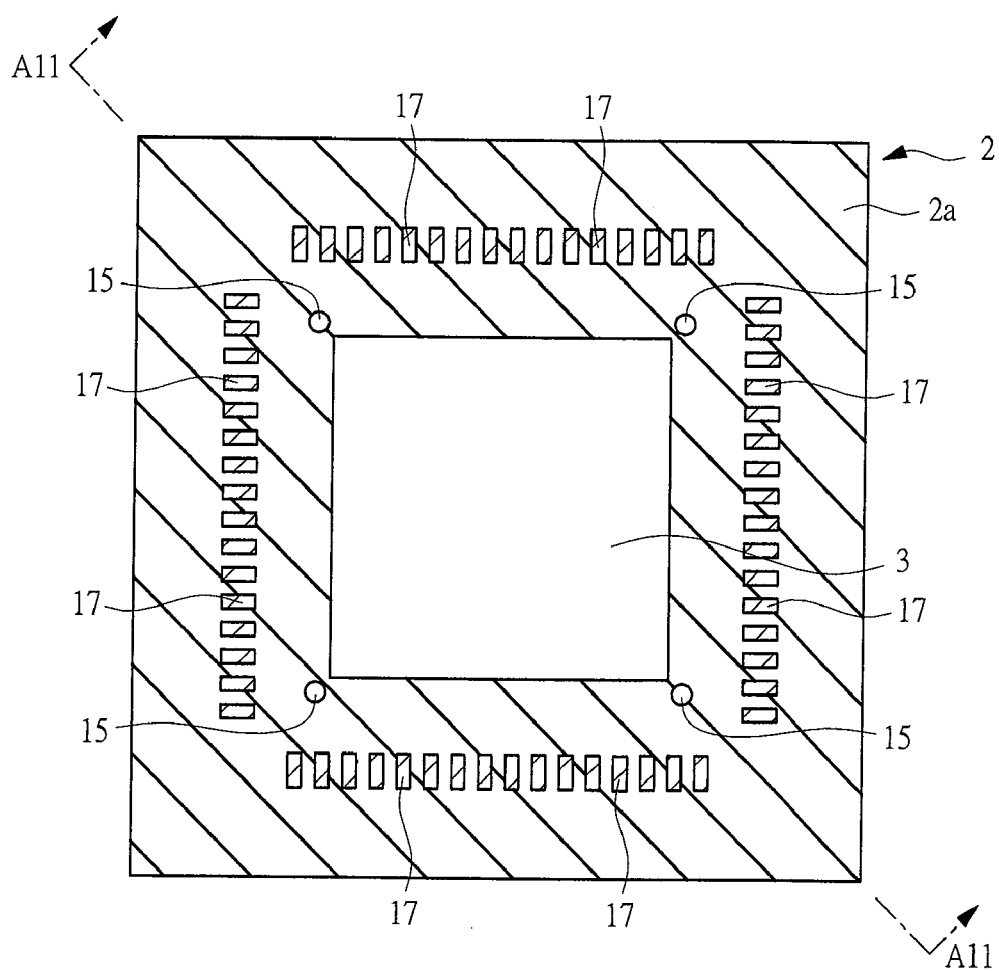
FIG. 57 is an upper surface view of the wiring board of FIG. 56.

FIGS. 48 and 49 are cross-sectional views (side cross-sectional views) of a semiconductor device 1a of the second embodiment, FIG. 50 is a perspective plan view (upper surface view) of the semiconductor device 1a when the sealing resin 7 is seen through, and FIG. 51 is a lower surface view (bottom view, rear surface view, plan view) of the semiconductor device 1a. A cross-section cut along the line A7-A7 of FIGS. 50 and 51 almost corresponds to FIG. 48, and the cross-section cut along the line A8-A8 of FIGS. 50 and 51 almost corresponds to FIG. 49. Also, FIGS. 52 and 53 are cross-sectional views (side cross-sectional views) of a heat sink 4a used in the semiconductor device 1a, FIG. 54 is an upper surface view (plan view) of the heat sink 4a used in the semiconductor device 1a, and FIG. 55 is a lower surface view (plan view) of the heat sink 4a used in the semiconductor device 1a. The cross-section cut along the line A9-A9 of FIGS. 54 and 55 corresponds to FIG. 52, and the cross-section cut along the line A10-A10 of FIGS. 54 and 55 corresponds to FIG. 53, but FIGS. 52 and 48 show the same cross-sectional positions and FIGS. 53 and 49 show the same cross-sectional positions. Further, FIG. 56 is a cross-sectional view (side cross-sectional view) of the wiring board 2 used for the semiconductor device 1a, and FIG. 57 is an upper surface view (plan view) of the wiring board 2 used for the semiconductor device 1a. The cross-section cut along the line A11-A11 of FIG. 57 corresponds to FIG. 56, but FIG. 56 and FIG. 48 show the same cross-sectional positions. Although FIG. 57 is a plan view, hatching is applied to the wiring board 2 and the connecting terminals 17 of its upper surface 2a so as to make a position and a shape of the through-hole 3 in the wiring board 2 easily understood. In FIG. 50, the position of the through-hole 3 of the wiring board 2 which is invisible and concealed by the heat sink 4a even when the sealing resin 7 is seen through is shown by a dotted line for easy understanding.

The semiconductor device 1a of the present embodiment has almost the same structure as the semiconductor device 1 of the first embodiment except for the shape of the heat sink 4a and the caulking method (fixing method) of the heat sink 4a to the wiring board 2, and therefore, the description thereof will be omitted, and the points different from the semiconductor device 1 of the first embodiment will be mainly described.

Also in the semiconductor device 1a of the present embodiment, the heat sink 4a is disposed inside the through-hole 3 of the wiring board 2 and the semiconductor chip 5 is mounted (bonded) on the upper surface 9a of the heat sink 4a through the bonding agent 14 like in the semiconductor device 1 of the first embodiment. The heat sink 4a corresponds to the heat sink 4 of the first embodiment and is made of the same material as that of the heat sink 4. While the side surface 10 of the heat sink 4 is tapered, the side surface 10 of the heat sink 4a (side surface 10 of the heat sink 4a contacting to the inner wall of the through-hole 3) of the present embodiment is not tapered. In a state in which the heat sink 4a is disposed inside the through-hole 3 of the wiring board 2, the side surface 10 of the heat sink 4a contacting to the inner wall of the through-hole 3 is almost vertical to the upper surface 2a of the wiring board 2 (that is, α=0, L1=L2). Also, the inner wall of the through-hole 3 of the wiring board 2 before inserting the heat sink 4a is vertical to the upper surface 2a of the wiring board 2. Hence, when the heat sink 4a is disposed inside the through-hole 3 of the wiring board 2, the inner wall of the through-hole 3 of the wiring board 2 contacts to the side surface 10 of the heat sink 4a, but the heat sink 4a cannot be caulked to the wiring board 2 by utilizing the side wall 10 of the heat sink 4a. Instead, in the present embodiment, in addition to the same protruded portion 11 as the first embodiment, the heat sink 4a is further provided with a protruded portion 11a and a pin portion (caulking portion, caulking pin portion, caulking pin, protruded portion, convex portion) 13 integrally connected to a lower surface 12a of the protruded portion 11a and disposed inside a hole portion 15 of the wiring board 2, and the heat sink 4a is caulked (fixed) to the wiring board 2 by this pin portion 13. More specifically, the structure of the heat sink 4a is the same as the heat sink 4 of the first embodiment except that the protruded portion 11a and the pin portion 13 are provided and the taper (inclination) of the side surface 10 is eliminated. The protruded portions 11 and 11a and the pin portion 13 are integrally formed with the heat sink 4a and can be taken as a part of the heat sink 4a.

In FIG. 52, a recess is formed on the upper surface of the protruded portion 11a above the pin portion 13, but this recess is formed as a result of the formation of the pin portion 13, and the recess may not be formed on the upper surface of the protruded portion 11a above the pin portion 13 depending on a forming method of the pin portion 13.

The wiring board 2 of the semiconductor device 1a of the present embodiment has the same structure as the wiring board 2 of the semiconductor device 1 of the first embodiment except that a hole portion 15 is provided in the vicinity of the through-hole 3. The hole portion 15 is a through-hole reaching a lower surface 2b from the upper surface 2a of the wiring board 2 and has sufficiently smaller planar dimensions as compared with the through-hole 3 for inserting a main portion of the heat sink 4a (portion except for the protruded portions 11 and 11a and the pin portion 13). The hole portion 15 is provided in the wiring board 2 in such a manner as to stay away from the connecting terminal 17 and the land 18. The pin portion 13 of the heat sink 4a is fixed inside the hole portion 15 of the wiring board 2.

The heat sink 4a has the protruded portion (projecting portion, overhang portion, hook portion) 11a protruding to the outside (in the direction away from the center of the upper surface 9a) from the side surface 10 of the heat sink 4a (side surface 10 contacting to the inner wall of the through-hole 3 of the wiring board 2) in the peripheral edge portion (peripheral portion) of the upper surface 9a of the heat sink 4a, and this protruded portion 11a is located on the upper surface 2a of the wiring board 2 outside the through-hole 3 and the lower surface of the protruded portion 11a contacts to the upper surface 2a of the wiring board 2. It is preferable to provide this protruded portion 11a at the corner portions of the rectangular (rectangular planar shaped) upper surface 9a of the heat sink 4 because the protruded portion 11a does not interfere with the disposition of the connecting terminal 17, and it is more preferable to provide the protruded portion 11a at the four corners of the rectangular upper surface 9a of the heat sink 4 because the coupling (caulking) of the heat sink 4 and the wiring board 2 is well-balanced.

More specifically, the heat sink 4a has the protruded portions 11 and 11a protruding to the upper surface 2a side of the wiring board 2 from above the through-hole 3 and extending on the upper surface 2a of the wiring board 2 on a peripheral edge portion of the upper surface 9a of the heat sink 4. The protruded portions 11 and 11a overhang (project) on the upper surface 2a of the wiring board 2 from above the through-hole 3, and the protruded portions 11a of the four corners of the upper surface 9a extend on the upper surface 2a of the wiring board 2 up to the position away from the through-hole 3 as compared with the protruded portions 11 other than the four corners of the upper surface 9a. In other words, in the heat sink 4a, the protruded portions 11a are provided at the four corners of the peripheral edge portion of the upper surface 9a of the heat sink 4, and the protruded portions 11 are provided on the peripheral edge portion of the upper surface 9a of the heat sink 4 other than the four corners thereof (except for the four corners having the protruded portions 11a) in a flange shape or in an overhang shape, and the protruded portion 11a extends on the upper surface 2a of the wiring board 2 up to the position away from the through-hole 3 as compared with the protruded portion 11 in order to be able to connect the pin portion 13.

The protruded portions 11 and 11a function as a stopper to prevent the heat sink 4a from falling off from the through-hole 3 of the wiring board 2. Hence, the protruded portions 11 and 11a are required to be provided at least on a part of the peripheral edge portion (peripheral portion) of the upper surface 9a of the heat sink 4a. Therefore, even if the protruded portions 11 and 11a are not provided on the entire peripheral edge portion of the upper surface 9a of the heat sink 4a, it is possible to prevent the heat sink 4a from falling off from the through-hole 3 of the wiring board 2 if the protruded portions 11 and 11a are provided on at least a part of the peripheral edge portion of the upper surface 9a of the heat sink 4a.

Also in the heat sink 4a of the present embodiment, the protruded portions 11 are provided (in a flange shape or in an overhang shape) on the entire peripheral edge portion (peripheral portion) of the upper surface 9a of the heat sink 4a like in the protruded portion 11 of the heat sink 4, and the heat sink 4a can be stably disposed inside the through-hole 3 of the wiring board 2. However, even when the protruded portions 11 are not present, the heat sink 4a can be prevented from falling off from the through-hole 3 of the wiring board 2 if the protruded portions 11a are present. Hence, it is also possible to provide only the protruded portion 11a by omitting the formation of the protruded portion 11 in the heat sink 4a.

In the heat sink 4a, the cross-sectional shapes of a portion located inside the through hole 3 and a portion protruding downward from the lower surface 2b of the wiring board 2 (lower part of the heat sink 4a) parallel to the upper surface 2a of the wiring board 2 are almost the same as the planar shape of the through-hole 3 of the wiring board 2, and a side surface (side wall) 10 of the heat sink 4a contacts to a side surface (side wall) of the through-hole 3 of the wiring board 2. Further, the lower surface 9b of the heat sink 4a also has almost the same planar shape as the planar shape of the through-hole 3 of the wiring board 2.

The protruded portions 11 and 11a of the heat sink 4a are projected (overhung) on the upper surface 2a of the wiring board 2 from the through-hole 3, and the lower surface 12 of the protruded portion 11 and the lower surface 12a of the protruded portion 11a contact to the upper surface 2a of the wiring board 2. Consequently, in the semiconductor device 1a, when seen in a plane parallel to the upper surface 2a of the wiring board 2, the portions other than the protruded portions 11 and 11a and the pin portions 13 of the heat sink 4 are located at a planarly overlapped position with the through-hole 3, and the protruded portions 11 and 11a and the pin portions 13 only are located outside the through-hole 3 (at the position not planarly overlapped with the through-hole 3, that is, at the position overlapped with the wiring board 2). For easy understanding, a planar position of the through-hole 3 when the heat sink 4 is disposed inside the through-hole 3 of the wiring board 2 is shown by a dotted line in FIG. 54.

Also in the present embodiment, the heat sink 4a is inserted and fixed into the through-hole 3 from the upper surface 2a (upper surface 21a) side of the wiring board 2 (wiring board 21) before the sealing resin 7 is formed like in the first embodiment. Since the heat sink 4a is provided with the protruded portion 11a (protruded portions 11a and 11 when the protruded portion 11 is provided), the protruded portion 11a (protruded portions 11a and 11 when the protruded portion 11 is provided) of the heat sink 4a is caught on the upper surface 2a of the wiring board 2 (upper surface 21a of the wiring board 21) at the time of inserting the heat sink 4a into the through-hole 3 from the upper surface 2a side of the wiring board 2 (upper surface 21a side of the wiring board 21), and therefore, it is possible to prevent the heat sink 4a from falling off from the through-hole 3, and the heat sink 4a can be retained inside the through-hole 3 of the wiring board 2 (wiring board 21).

Figure 58:
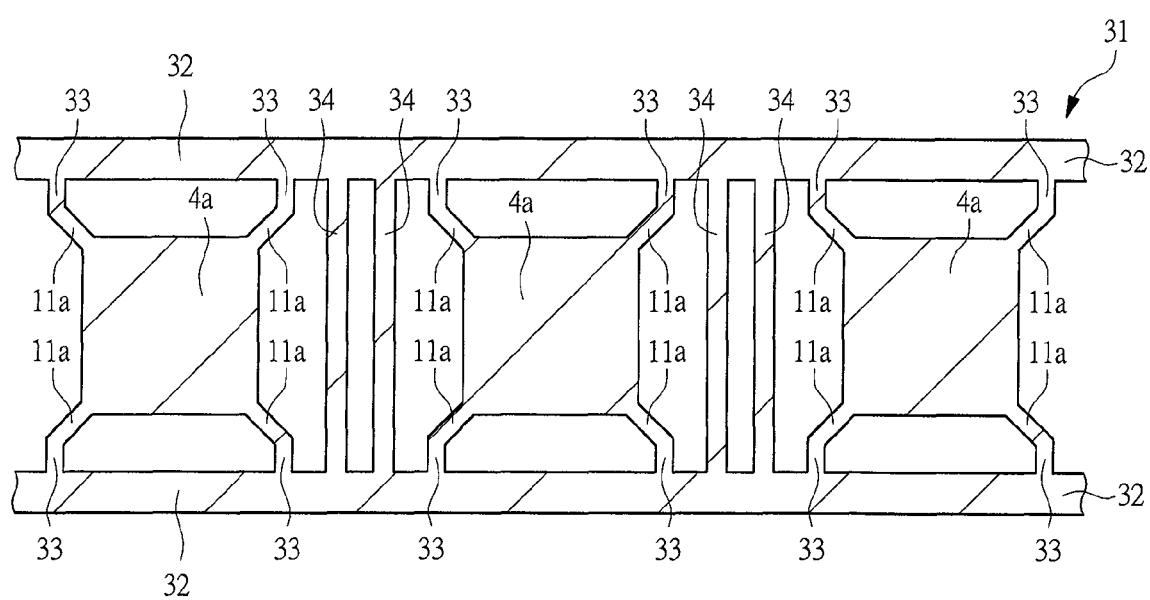
FIG. 58 is a plan view of a frame used for manufacturing the semiconductor device of FIG. 48.

FIG. 58 is a plan view (upper surface view) of a frame 31 used when the semiconductor device 1a of the present embodiment is manufactured, and it corresponds to FIG. 11 of the first embodiment. Although FIG. 58 is a plan view, hatching is applied to the frame 31 so as to make a shape of the frame 31 easily understood.

In the frame 31 used for manufacturing the semiconductor device 1a of the present embodiment, as shown in FIG. 58, a joining portion 33 for joining each heat sink 4a and a frame portion 32 is provided between the frame portion 32 and the protruded portion 11a of the heat sink 4a so as to join the protruded portion 11a of the heat sink 4a with the frame portion 32. By cutting the joining portion 33 of the frame 31 so as to leave the protruded portion 11a on the heat sink 4a side in the step S4 described above, individual pieces of the heat sink 4a having the protruded portion 11a (and protruded portion 11 when the protruded portion 11 is present) can be obtained.

The manufacturing process of the semiconductor device 1a of the present embodiment is the same as the manufacturing process of the semiconductor device 1 of the first embodiment except that a caulking method (fixing method) of the heat sink 4a to the wiring board 21 in the process of disposing the heat sink 4a inside the through-hole 3 of the wiring board 21 in the step S5 is different. Hence, the process of disposing the heat sink 4a inside the through-hole 3 of the wiring board 21 in the step S5 in the present embodiment will be described below.

Figure 59:
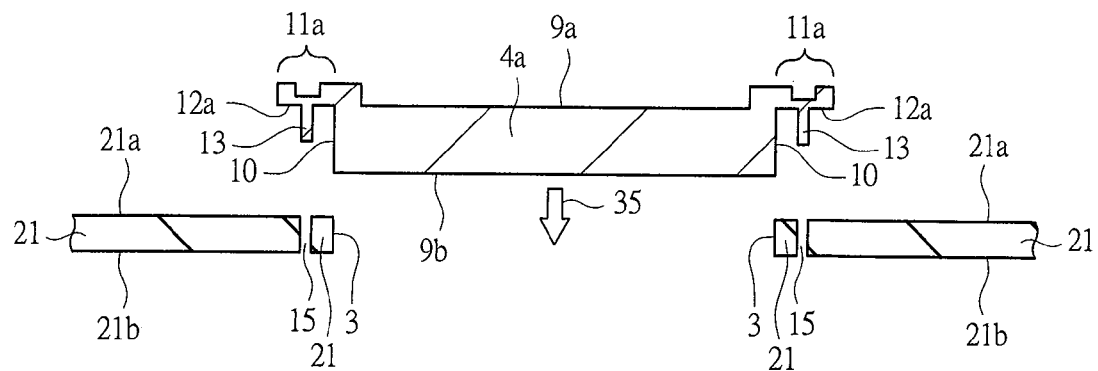
FIG. 59 is an explanatory drawing showing a process of disposing a heat sink inside a through-hole of a wiring board.
Figure 60:
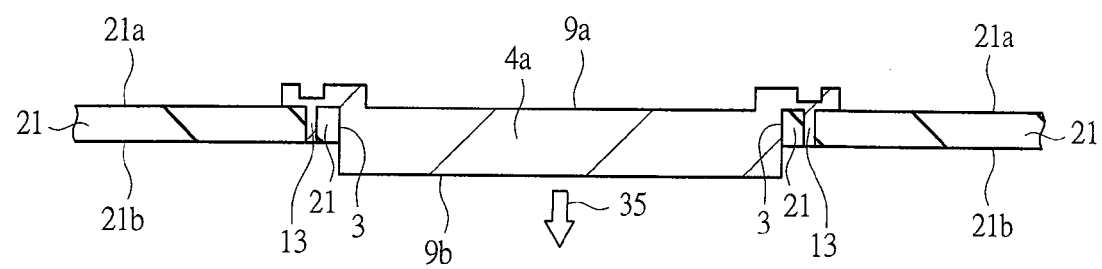
FIG. 60 is an explanatory drawing showing the process of disposing the heat sink inside the through-hole of the wiring board.

FIGS. 59 and 60 are explanatory drawings (cross-sectional views) of the process of disposing the heat sink 4a inside the through-hole 3 of the wiring board 21 in the step S5 in the manufacturing process of the semiconductor device 1a of the present embodiment, and they correspond to FIGS. 33 and 34 of the first embodiment. Note that, although the case where the heat sink 4a not mounted with the semiconductor chip 5 is disposed inside the through-hole 3 of the wiring board 21 like in the process described with reference to FIGS. 30 to 34 will be illustrated and described here, also in the present embodiment, the heat sink 4a mounted with the semiconductor chip 5 can be disposed inside the through-hole 3 of the wiring board 21 after mounting (bonding) the semiconductor chip 5 on the heat sink 4a like in the process described with reference to FIGS. 8 and 19 to 22.

As shown in FIG. 59, the wiring board 21 used for manufacturing the semiconductor device 1a of the present embodiment is provided with the hole portion 15 for inserting the pin portion 13 of the heat sink 4a, and has almost the same structure as the wiring board 21 of the first embodiment other than that. However, FIGS. 59 and 60 correspond to the cross-section cut along the line A7-A7 of FIG. 50, and the connecting terminal 17 does not appear in the figure, and the illustration of the land 18 is omitted for the simplification of the drawing.

Also in the present embodiment, the heat sink 4a is inserted (plugged) into the through-hole 3 of the wiring board 21 from the upper surface 21a side (side corresponding to the upper surface 2a of the wiring board 2) of the wiring board 21 in the process of disposing the heat sink 4a into the through-hole 3 of the wiring board 21 in the step S5 as shown in FIG. 59 like in the first embodiment. More specifically, the heat sink 4a is inserted into the through-hole 3 of the wiring board 21 in a direction 35 shown by an arrow mark of FIG. 59. At this time, the pin portion 13 provided on the lower surface 12a of the protruded portion 11a of the heat sink 4a is inserted into the hole portion 15 of the wiring board 21.

The through-hole 3 and the hole portion 15 of the wiring board 21 are disposed at the position so that the pin portion 13 of the heat sink 4a is inserted into the hole portion 15 of the wiring board 21 when the heat sink 4a is inserted into the through-hole 3 of the wiring board 21. Hence, in the step S5, the main body portion (portion except for the protruded portions 11 and 11a and the pin portion 13) of the heat sink 4a is inserted into the through-hole 3 of the wiring board 21, and at the same time, the pin portion 13 provided on the lower surface 12a of the protruded portion 11a of the heat sink 4a can be inserted into the hole portion 15 of the wiring board 21.

Since the heat sink 4a is provided with the protruded portion 11a (and protruded portion 11 when the protruded portion 11 is provided), when the heat sink 4a is inserted into the through-hole 3 from the upper surface 21a side of the wiring board 21 and the pin portion 13 is inserted into the hole portion 15 as shown in FIG. 59, the protruded portion 11a (and protruded portion 11 when the protruded portion 11 is provided) of the heat sink 4a is caught on the upper surface 21a of the wiring board 21 as shown in FIG. 60. This protruded portion 11a (and protruded portion 11 when the protruded portion 11 provided) functions as a stopper, so that the heat sink 4a can be prevented from falling off downward, that is, in the direction 35 from the through-hole 3 of the wiring board 21. Consequently, the heat sink 4a can be retained inside the through-hole 3 of the wiring board 21.

As described above, the heat sink 4a has the protruded portion 11a protruding to the outside (in the direction away from the center of the upper surface 9a) from the side surface of the heat sink 4a in the peripheral edge portion of the upper surface 9a of the heat sink 4a, and in the step S5, the main body portion and the pin portion 13 of the heat sink 4a are disposed inside the through-hole 3 and the hole 15 of the wiring board 21 so that this protruded portion 11a is located on the upper surface 21a of the wiring board 21 outside the through-hole 3 and the lower surface 12a of the protruded portion 11a contacts to the upper surface 21a of the wiring board 21.

In the first embodiment, the side surface 10 of the heat sink 4 is tapered, so that the portion of the heat sink 4 disposed inside the through-hole 3 is tightened up by the inner wall of the through-hole 3 of the wiring board 21, thereby caulking (fixing) the heat sink 4 to the wiring board 21. In contrast to this, in the present embodiment, the pin portion 13 provided on the lower surface 12a of the protruded portion 11a of the heat sink 4a is used to caulk (fix) the heat sink 4a to the wiring board 21. A technique for caulking (fixing) the heat sink 4a to the wiring board 21 by using the pin portion 13 of the heat sink 4a in the present embodiment will be described.

Figure 61A:
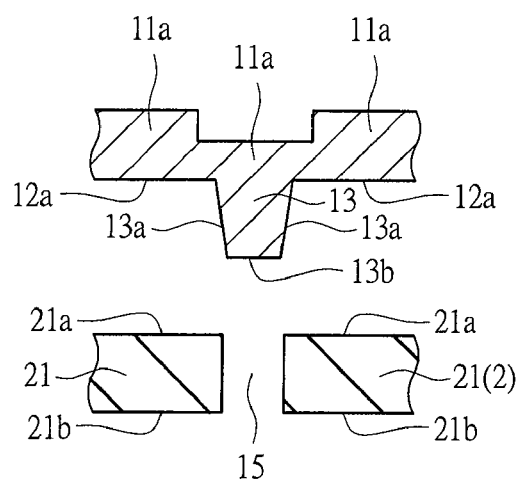
FIG. 61A is an explanatory drawing showing a technique of caulking (fixing) the heat sink to the wiring board.
Figure 61B:
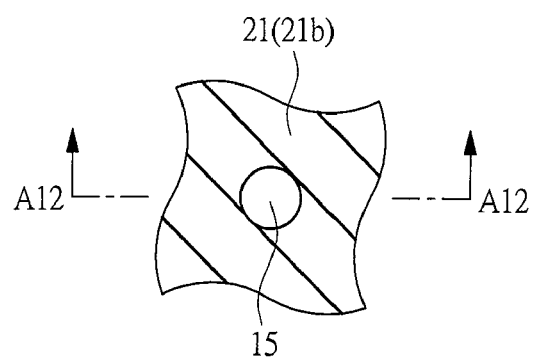
FIG. 61B is an explanatory drawing showing a technique of caulking (fixing) the heat sink to the wiring board.
Figure 62A:
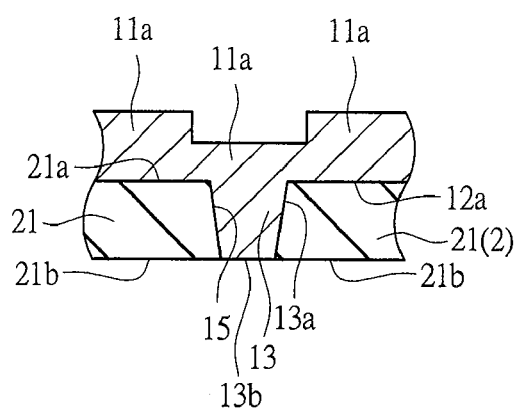
FIG. 62A is an explanatory drawing showing a technique of caulking (fixing) the heat sink to the wiring board.
Figure 62B:
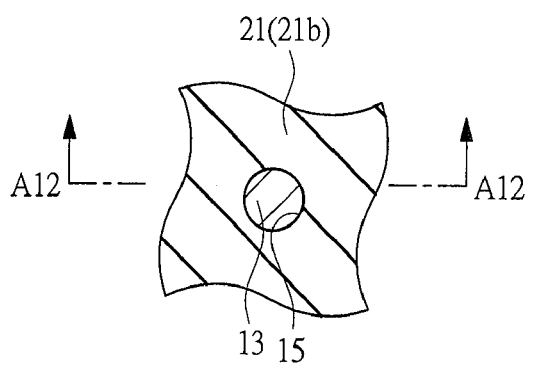
FIG. 62B is an explanatory drawing showing a technique of caulking (fixing) the heat sink to the wiring board.
Figure 63A:
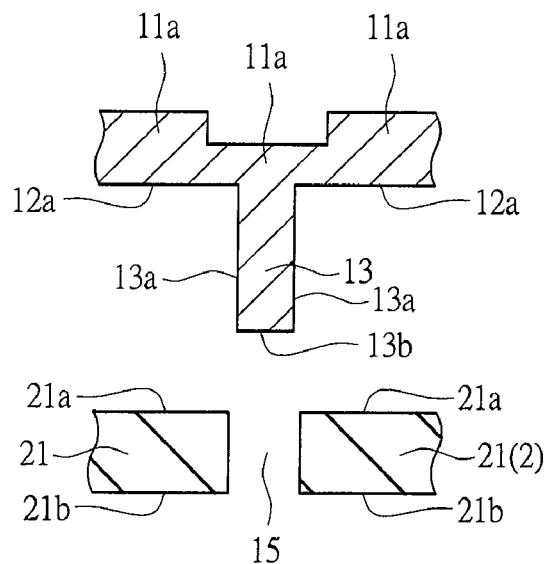
FIG. 63A is an explanatory drawing showing a technique of caulking (fixing) the heat sink to the wiring board.
Figure 63B:
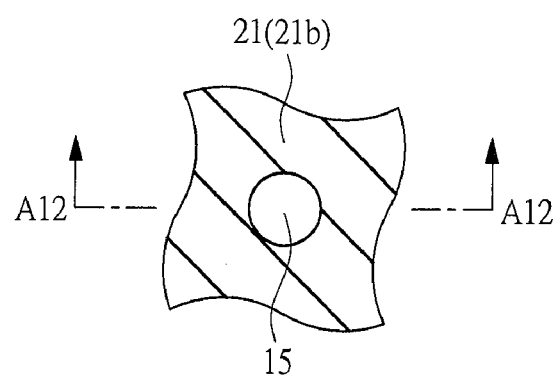
FIG. 63B is an explanatory drawing showing a technique of caulking (fixing) the heat sink to the wiring board.
Figure 64A:
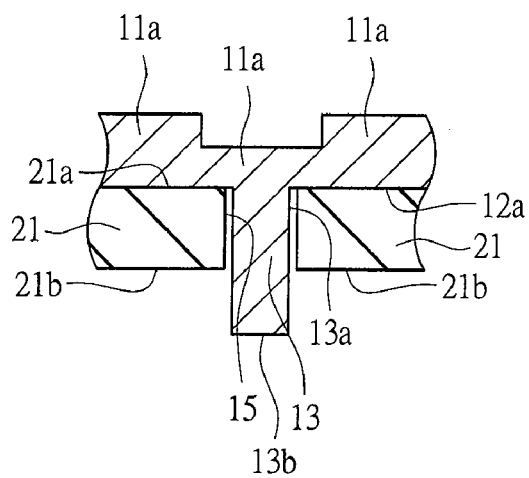
FIG. 64A is an explanatory drawing showing a technique of caulking (fixing) the heat sink to the wiring board.
Figure 64B:
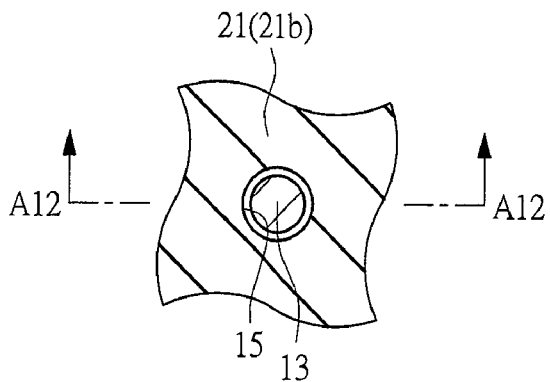
FIG. 64B is an explanatory drawing showing a technique of caulking (fixing) the heat sink to the wiring board.
Figure 65A:
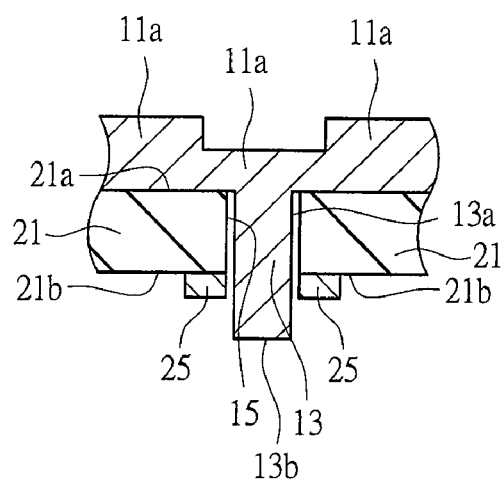
FIG. 65A is an explanatory drawing showing a technique of caulking (fixing) the heat sink to the wiring board.
Figure 65B:
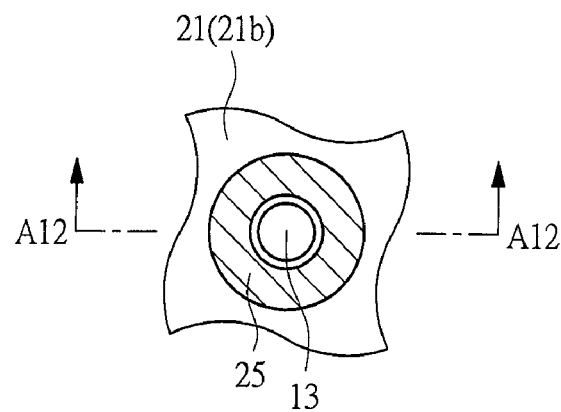
FIG. 65B is an explanatory drawing showing a technique of caulking (fixing) the heat sink to the wiring board.
Figure 66A:
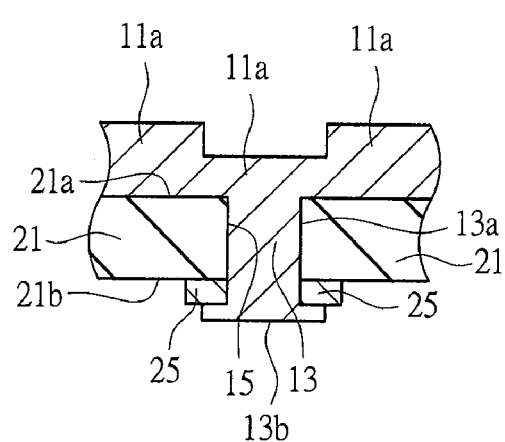
FIG. 66A is an explanatory drawing showing a technique of caulking (fixing) the heat sink to the wiring board.
Figure 66B:
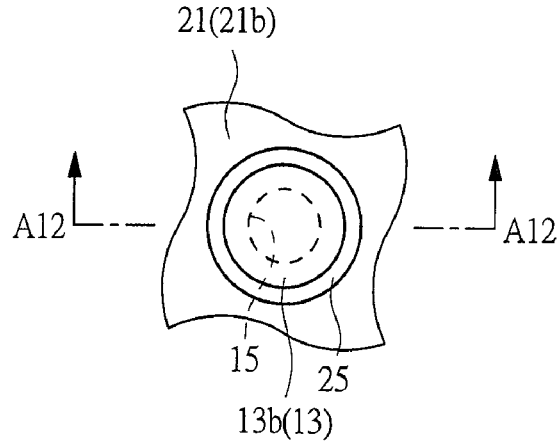
FIG. 66B is an explanatory drawing showing a technique of caulking (fixing) the heat sink to the wiring board.
Figure 67A:
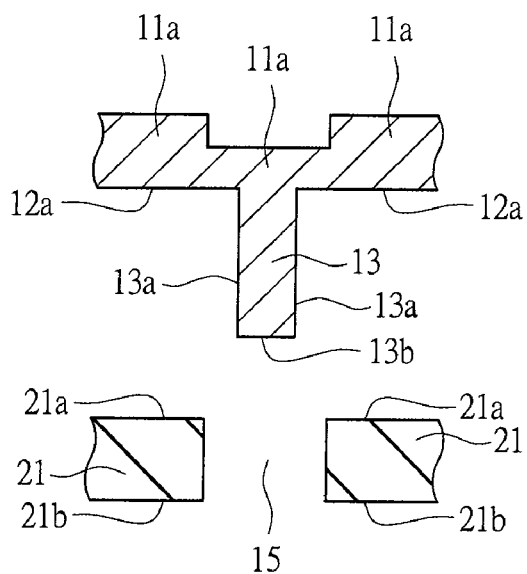
FIG. 67A is an explanatory drawing showing a technique of caulking (fixing) the heat sink to the wiring board.
Figure 67B:
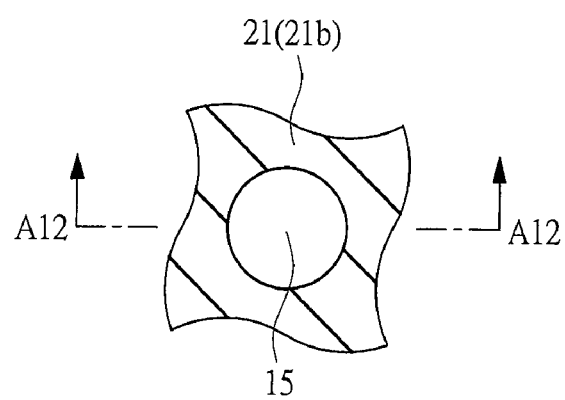
FIG. 67B is an explanatory drawing showing a technique of caulking (fixing) the heat sink to the wiring board.
Figure 68A:
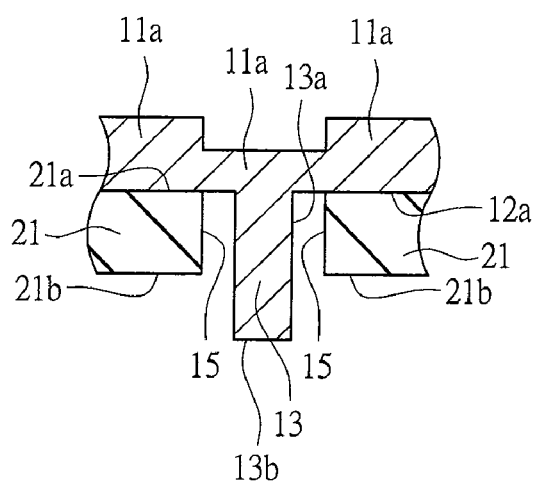
FIG. 68A is an explanatory drawing showing a technique of caulking (fixing) the heat sink to the wiring board.
Figure 68B:
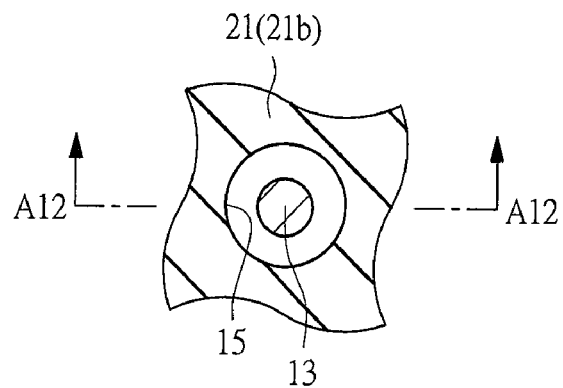
FIG. 68B is an explanatory drawing showing a technique of caulking (fixing) the heat sink to the wiring board.
Figure 69A:
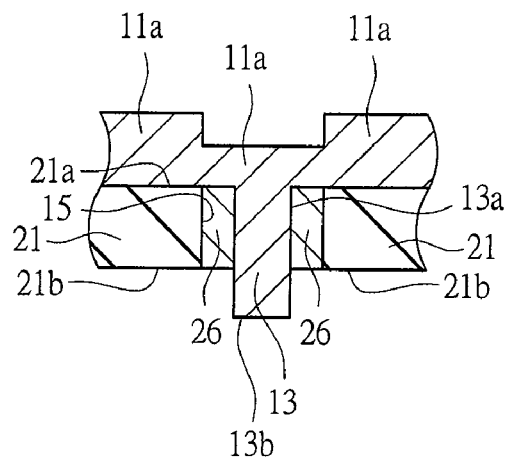
FIG. 69A is an explanatory drawing showing a technique of caulking (fixing) the heat sink to the wiring board.
Figure 69B:
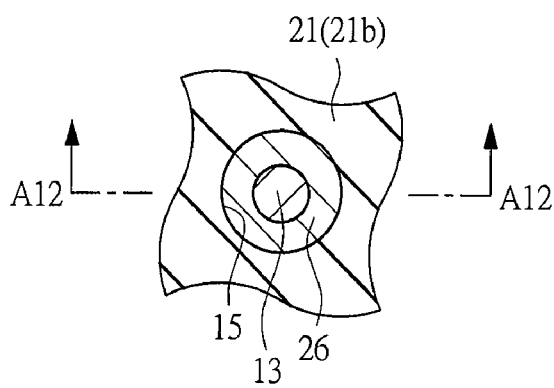
FIG. 69B is an explanatory drawing showing a technique of caulking (fixing) the heat sink to the wiring board.
Figure 70A:
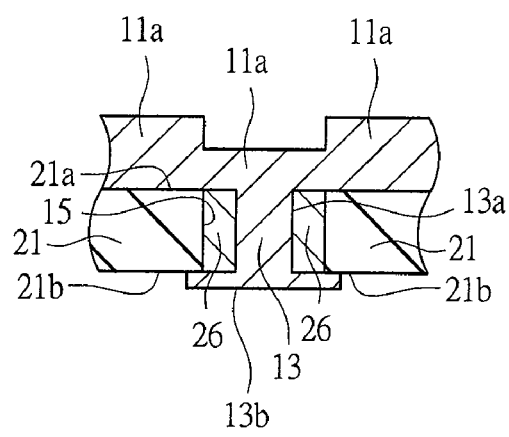
FIG. 70A is an explanatory drawing showing a technique of caulking (fixing) the heat sink to the wiring board.
Figure 70B:
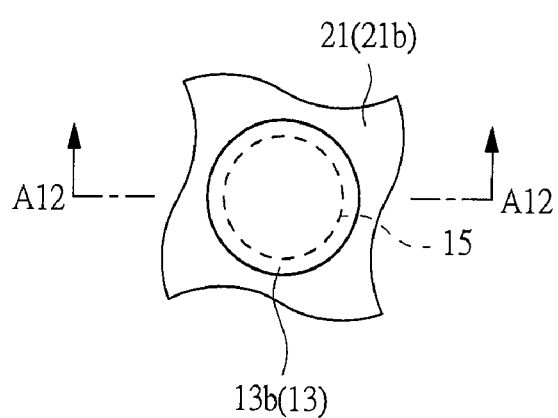
FIG. 70B is an explanatory drawing showing a technique of caulking (fixing) the heat sink to the wiring board.

FIGS. 61 and 62 are explanatory drawings showing a first technique for caulking (fixing) the heat sink 4a to the wiring board 21 by using the pin portion 13 of the heat sink 4a. FIGS. 63 to 66 are the explanatory drawings showing a second technique for caulking (fixing) the heat sink 4a to the wiring board 21 by using the pin portion 13 of the heat sink 4a. FIGS. 67 to 70 are the explanatory drawings showing a third technique for caulking (fixing) the heat sink 4a to the wiring board 21 by using the pin portion 13 of the heat sink 4a. In each of FIGS. 61 to 70, A and B are cross-sectional views and plan views of the same stage, but the plan view of B corresponds to the plan view (lower surface view) of the region in the vicinity of the hole portion 15 when the wiring board 21 is seen from the lower surface 21b side and the cross-section cut along the line A12-A12 of the plan view of B corresponds to the cross-sectional view of A. Although FIGS. 61B, 63B and 67B are plan views, hatching is applied to the wiring board 21 so as to make the figures easy to see. Also, although FIGS. 62B, 64B and 68B are plan views, hatching is applied to the wiring board 21 and the pin portions 13 of the heat sink 4a so as to make the figures easy to see. Further, although FIG. 65B is a plan view, hatching is applied to a washer or ring-shaped member 25 so as to make the figure easy to see. Also, in the plan view of FIG. 66B, the position of the hole portion 15 concealed by the bottom 13b of the crushed pin portion 13 is shown by a dotted line. Further, although FIG. 69B is a plan view, hatching is applied to the wiring board 21, the pin portion 13 of the heat sink 4a and a sleeve 26 so as to make the figure easy to see. Also, in the plan view of FIG. 70B, the position of the hole portion 15 concealed by the bottom 13b of the crushed pin portion 13 is shown by a dotted line.

In the present embodiment, the first technique for caulking (fixing) the heat sink 4a to the wiring board 21 by using the pin portion 13 of the heat sink 4a will be described with reference to FIGS. 61 and 62. FIG. 61 corresponds to a state of FIG. 59, and FIG. 62 corresponds to a state of FIG. 60.

The first technique is to form a side wall (side surface) 13a of the pin portion 13 of the heat sink 4a into a tapered shape as shown in FIGS. 61 and 62. In other words, the cross-sectional shape of the pin portion 13 of the heat sink 4a (shape of the cross-section vertical to the upper surface 21a of the wiring board 21 when the pin portion 13 of the heat sink 4a is inserted into the hole portion 15 of the wiring board 21) has a tapered shape. Hence, the dimension of the pin portion 13 is larger on the upper side (side near the lower surface 12a of the protruded portion 11a) than on the lower side. More specifically, the dimension of the pin portion 13 becomes thinner (smaller) as approaching a top end portion 13b and becomes thicker (larger) as approaching the protruded portion 11a. In other words, the pin portion 13 is tapered. On the other hand, as shown in FIG. 61, the inner wall of the hole portion 15 of the wiring board 21 before the pin portion 13 of the heat sink 4a is inserted has no tapered shape, and is kept almost vertical to the upper surface 21a of the wiring board 21. Then, the dimension of the hole portion 15 before the pin portion 13 is inserted is made the same as or slightly larger than the dimension of the top end portion 13b (top end opposite to the side connected to the lower surface 12a of the protruded portion 11a) of the pin portion 13, and moreover, is made smaller than the dimension of the upper portion (portion close to the lower surface 12a of the protruded portion 11a) of the pin portion 13.

The planar shape (shape in a plane parallel to the upper surface 21a of the wiring board 21) of the hole portion 15 of the wiring board 21 can be made, for example, circular, and the shape (cross-sectional shape) of the pin portion 13 in the cross-section parallel to the upper surface 21a of the wiring board 21 when the pin portion 13 of the heat sink 4a is inserted into the hole portion 15 of the wiring board 21 can be made the same shape as the through-hole 3, for example, the circular shape.

In the step S5, when the main body portion (portion except for the protruded portions 11 and 11a and the pin portion 13) of the heat sink 4a is inserted into the through-hole 3 of the wiring board 21 as shown in FIGS. 59 and 60, the pin portion 13 of the heat sink 4a is inserted (plugged) into the hole portion 15 of the wiring board 21 as shown in FIGS. 61 and 62, and the pin portion 13 and the wiring board 21 can be caulked (fixed) by the tapered shape of the side wall 13a of the pin portion 13. By this means, the heat sink 4a can be fixed to the wiring board 21.

More specifically, when the pin portion 13 of the heat sink 4a is inserted into the hole portion 15 in the step S5, the side wall 13a of the pin portion 13 contacts to the inner wall of the hole portion 15 of the wiring board 21, and the inner wall of the hole portion 15 of the wiring board 21 is expanded in a lateral direction by the tapered shape of the side wall 13a of the pin portion 13, and the side wall 13a of the pin portion 13 is tightened up by the inner wall of the hole portion 15 of the wiring board 21 by its reaction. By this means, the pin portion 13 can be caulked (fixed) to the wiring board 21, and the heat sink 4a is fixed to the wiring board 21.

As shown in FIG. 62, in a state in which the pin portion 13 of the heat sink 4a is disposed (inserted) inside the hole portion 15 of the wiring board 21 in the step S5, the side wall 13a of the pin portion 13 contacts and adheres to the inner wall of the hole portion 15 of the wiring board 21, and is inclined with respect to the direction vertical to the upper surface 21a of the wiring board 21, and this state is maintained even in the manufactured semiconductor device 1a.

By caulking (fixing) the heat sink 4a to the wiring board 21 by using the first technique described above, the heat sink 4a can be fixed to the wiring board 21, and in addition to this, the following advantages can be further obtained. That is, by inserting the pin portion 13 of the heat sink 4a into the hole portion 15 of the wiring board 21, the heat sink 4a can be fixed to the wiring board 21, and therefore, the process of disposing and fixing the heat sink 4a inside the through-hole 3 of the wiring board 21 can be easily performed in the step S5. Therefore, the manufacturing process of the semiconductor device can be simplified, and also, the manufacturing time of the semiconductor device can be reduced. The hole portion 15 into which the pin portion 13 of the heat sink 4a is inserted can be made smaller than the through-hole 3 into which the main portion of the heat sink 4a is inserted. When the hole of the wiring board 21 is expanded by the insertion of the tapered member into the hole of the wiring board 21, a stress is likely to occur in the wiring board 21, but in the present embodiment, the dimension of the hole portion 15 is made small (smaller than the through-hole 3), so that a place in which the stress occurs in the wiring board 21 can be restricted to the vicinity of the hole portion 15 and a load to the wiring board 21 can be reduced.

Next, in the present embodiment, a second technique for caulking (fixing) the heat sink 4a to the wiring board 21 by using the pin portion 13 of the heat sink 4a will be described with reference to FIGS. 63 to 66. FIG. 63 corresponds to a state of FIG. 59 and FIG. 64 corresponds to a state of FIG. 60. However, the operations (processes) of FIGS. 65 and 66 are sequentially performed after FIG. 64 in the second technique.

As shown in FIG. 63, different form the first technique, the second technique does not form the side wall 13a of the pin portion 13 of the heat sink 4a into a tapered shape. Hence, the dimension of the pin portion 13 is the same on the upper surface side and on the lower side (side near the lower surface 12a of the protruded portion 11a). Also in the second technique, the inner wall of the hole portion 15 of the wiring board 21 before the pin portion 13 of the heat sink 4a is inserted has no tapered shape, and is kept almost vertical with respect to the upper surface 21a of the wiring board 21 like in the first technique.

Further, the planar shape of the hole portion 15 of the wiring board 21 (shape in a plane parallel to the upper surface 21a of the wiring board 21) can be made, for example, circular, and the pin portion 13 can be made, for example, columnar. In any case, the dimension of the hole portion 15 before the pin portion 13 is inserted is made the same as or slightly larger than the dimension of the pin portion 13.

When the main body portion (portion except for the protruded portions 11 and 11a and the pin portion 13) of the heat sink 4a is inserted into the through-hole 3 of the wiring board 21 in the step S5 as shown in FIGS. 59 and 60, the pin portion 13 of the heat sink 4a is inserted into the hole portion 15 of the wiring board 21 as shown in FIGS. 63 and 64. Since the side wall 13a of the pin portion 13 has no tapered shape, the side wall 13a of the pin portion 13 is not tightened up by the inner wall of the hole portion 15 of the wiring board 21 at this stage. Further, in the second technique, the length of the pin portion 13 before being inserted into the hole portion 15 is made larger than the thickness of the wiring board 21, so that the top end portion 13b of the pin portion 13 protrudes from the lower surface 21b of the wiring board 21 as shown in FIG. 64 at the stage when the pin portion 13 of the heat sink 4a is inserted into the hole portion 15 of the wiring board 21.

After the pin portion 13 of the heat sink 4a is inserted into the hole portion 15 of the wiring board 21, a washer or ring-shaped member (washer, ring, buffer) 25 is fitted (installed) to the portion of the pin portion 13 protruding from the lower surface 21b of the wiring board 21 as shown in FIG. 65. More specifically, the washer or ring-shaped member 25 is disposed on the lower surface 21b of the wiring board 21 so that the top end portion 13b of the pin portion 13 penetrates through it. By this means, the portion of the pin portion 13 protruding from the lower surface 21b of the wiring board 21 is disposed inside the hole of the washer or ring-shaped member 25.

The washer or ring-shaped member 25 is preferably made of a metal material in view of necessity of the strength and the processing easiness. Further, it is more preferable to form the washer or ring-shaped member 25 from the same material as the heat sink 4a because the heat expansion coefficient of the pin portion 13 and that of the washer or ring-shaped member 25 become the same.

Further, in the second technique, the length of the pin portion 13 before being inserted into the hole portion 15 is made larger than the total thickness of the wiring board 21 and the washer or ring-shaped member 25, so that the top end portion 13b of the pin portion 13 protrudes from the washer or ring-shaped member 25 as shown in FIG. 65 at the stage where the washer or ring-shaped member 25 is fitted to the pin portion 13.

Then, as shown in FIG. 66, the portion of the pin portion 13 protruding from the lower surface 21a of the wiring board 21, here, the portion of the pin portion 13 protruding from the washer or ring-shaped member 25 because the washer or ring-shaped member 25 is disposed is crushed by a tool (not shown) and the like. More specifically, the top end portion 13b of the pin portion 13 is crushed by a tool (not shown) and the like. By this means, the pin portion 13 of the heat sink 4a and the wiring board 21 can be caulked (fixed), and the heat sink 4a can be fixed to the wiring board 21.

More specifically, since the top end portion 13b of the pin portion 13 is pressed (crushed), the pin portion 13 is expanded in the lateral direction inside the hole portion 15 of the wiring board 21, and the side wall 13a of the pin portion 13 contacts to (adheres to) the inner wall of the hole portion of the wiring board 21. Then, by the reaction of the expansion of the inner wall of the hole portion 15 of the wiring board 21 in the lateral direction due to the expansion of the pin portion 13 in the lateral direction, the side wall 13a of the pin portion 13 is tightened up by the inner wall of the hole portion 15 of the wiring board 21. By this means, the pin portion 13 of the heat sink 4a can be caulked (fixed) to the wiring board 21, and the heat sink 4a is fixed to the wiring board 21. In the second technique, the process up to here is performed by the step S5.

As described above, by the step S5, the heat sink 4a is disposed inside the through-hole 3 of the wiring board 21, and the pin portion 13 of the heat sink 4a is disposed (inserted) and caulked inside the hole portion 15 of the wiring board 21. At this stage, the side wall 13a of the pin portion 13 contacts and adheres to the inner wall of the hole portion 15 of the wiring board 21, and this state is maintained also in the manufactured semiconductor device 1a.

By caulking (fixing) the heat sink 4a to the wiring board 21 by using the second technique described above, the heat sink 4a can be fixed to the wiring board 21, and in addition to this, the following advantages can be further obtained. That is, after the pin portion 13 of the heat sink 4a is inserted into the hole portion 15 of the wiring board 21, the pin portion 13 is crushed so as to be able to fix the heat sink 4a to the wiring board 21, and therefore, the heat sink 4a can be more firmly fixed to the wiring board 21. Hence, it is possible to prevent the heat sink 4a from falling off from the through-hole 3 of the wiring board 21 more precisely in the manufacturing process of the semiconductor device (until the sealing resin 7 is formed). Further, the hole portion 15 into which the pin portion 13 of the heat sink 4a is inserted can be made smaller than the through-hole 3 into which the main portion of the heat sink 4a is inserted. Although there is the possibility that a stress causes in the wiring board 21 by crushing the pin portion 13 inserted into the hole portion 15 of the wiring board 21, a place in which the stress occurs in the wiring board 21 can be restricted to the vicinity of the hole portion by making the dimension of the hole portion 15 small, and a load to the wiring board 21 can be reduced. Further, when the top end portion 13b of the pin portion 13 is crushed by a tool (not shown) and the like, the washer or ring-shaped member 25 functions as a buffer, and therefore, a load applied to the wiring board 21 (region in the vicinity of the hole portion 15 of the lower surface 21b) can be reduced.

Next, in the present embodiment, a third technique for caulking (fixing) the heat sink 4a to the wiring board 21 by using the pin portion 13 of the heat sink 4a will be described with reference to FIGS. 67 to 70. FIG. 67 corresponds to a state of FIG. 59 and FIG. 68 corresponds to a state of FIG. 60. However, the operations (processes) of FIGS. 69 and 70 are sequentially performed after FIG. 68 in the third technique.

As shown in FIG. 67, the third technique does not form the side wall 13a of the pin portion 13 of the heat sink 4a into a tapered shape like in the second technique. Hence, the dimension of the pin portion 13 is the same on the lower side and on the upper side (side near the lower surface 12a of the protruded portion 11a). Further, also in the third technique, the inner wall of the hole portion 15 of the wiring board 21 before the pin portion 13 of the heat sink 4a is inserted does not have the tapered shape, and is kept almost vertical with respect to the upper surface 21a of the wiring board 21 like in the first and second techniques.

Also, the planar shape (shape in a plane parallel to the upper surface 21a of the wiring board 21) of the hole portion 15 of the wiring board 21 can be made, for example, circular, and the pin portion 13 can be made, for example, columnar. However, the dimension of the hole portion 15 before the pin portion 13 is inserted is made larger than the dimension of the pin portion 13 so that the sleeve 26 to be described later can be inserted.

When the main body portion (portion except for the protruded portions 11 and 11a and the pin portion 13) of the heat sink 4a is inserted into the through-hole 3 of the wiring board 21 in the step S5 as shown in FIGS. 59 and 60, the pin portion 13 of the heat sink 4a is inserted into the hole portion 15 of the wiring board 21 as shown in FIGS. 67 and 68. Since the side wall 13a of the pin portion 13 has no tapered shape, the side wall 13a of the pin portion 13 is not tightened up by the inner wall of the hole portion 15 of the wiring board 21 at this stage. Further, in the third technique, the length of the pin portion 13 before being inserted into the hole portion 15 is made larger than the thickness of the wiring board 21, so that the top end portion 13b of the pin portion 13 protrudes from the lower surface 21b of the wiring board 21 as shown in FIG. 68 at the stage when the pin portion 13 of the heat sink 4a is inserted into the hole portion 15 of the wiring board 21.

After the pin portion 13 of the heat sink 4a is inserted into the hole portion 15 of the wiring board 21, as shown in FIG. 69, the sleeve 26 is inserted from the lower surface 21b side of the wiring board 21 into the hole portion 15 in which the pin portion 13 has been inserted. The sleeve 26 is a tube-shaped or a cylindrical member. More specifically, while disposing (inserting) the pin portion 13 into the hole of the sleeve 26, the sleeve 26 is disposed inside the hole portion 15 of the wiring board 21. Therefore, the sleeve 26 is interposed between the inner wall of the hole portion 15 of the wiring board 21 and the side wall 13a of the pin portion 13. Hence, the external dimension of the sleeve 26 is made almost the same as or slightly smaller than the hole portion 15 of the wiring board 21, and the dimension of the hole of the sleeve 26 is made almost the same as or slightly larger than the pin portion 13.

The sleeve 26 is preferably made of the metal material in view of necessity of the strength and the processing easiness. Further, it is more preferable to form the sleeve 26 from the same material as the heat sink 4a because the heat expansion coefficient of the pin portion 13 and that of the sleeve 26 become the same.

Then, as shown in FIG. 70, the portion of the pin portion 13 protruding from the lower surface 21a of the wiring board 21, that is, the top end portion 13b of the pin portion 13 is crushed by a tool (not shown) and the like. By this means, the pin portion 13 of the heat sink 4a and the wiring board 21 can be caulked (fixed), and the heat sink 4a can be fixed to the wiring board 21.

More specifically, since the top end portion 13b of the pin portion 13 is crushed, the top end portion 13b of the pin portion 13 is expanded in the lateral direction outside the hole portion 15 of the wiring board 21 and the sleeve 26, and the wiring board 21 and the sleeve 26 are sandwiched by the top end portion 13b of the pin portion 13 expanded in the lateral direction and the protruded portion 11a, so that the heat sink 4a can be caulked (fixed) to the wiring board 21 and the heat sink 4a is fixed to the wiring board 21. In the third technique, the process up to here is performed by the step S5. Further, even if the top end portion 13b of the pin portion 13 is crushed, the sleeve 26 is interposed between the side wall of the pin portion 13 and the inner wall of the hole portion 15 inside the hole portion 15 of the wiring board 21, and the expansion of the pin portion 13 in the lateral direction is restricted by the sleeve 26, and since this sleeve 26 functions as a buffer, the application of a load to the inner wall of the hole portion 15 of the wiring board 21 can be prevented.

As described above, by the step S5, the heat sink 4a is disposed inside the through-hole 3 of the wiring board 21, and the pin portion 13 of the heat sink 4a is disposed (inserted) and caulked inside the hole portion 15 of the wiring board 21. At this stage, the sleeve 26 is interposed between the inner wall of the hole portion 15 and the side wall 13a of the pin portion 13 inside the hole portion 15 of the wiring board 21, and this state is maintained even in the manufactured semiconductor device 1a.

By caulking (fixing) the heat sink 4a to the wiring board 21 by using the third technique described above, the heat sink 4a can be fixed to the wiring board 21, and in addition to this, the following advantages can be further obtained. That is, after the pin portion 13 of the heat sink 4a is inserted into the hole portion 15 of the wiring board 21, the pin portion 13 is crushed so as to be able to fix the heat sink 4a to the wiring board 21, and therefore, the occurrence of the falling off of the heat sink 4a from the through-hole 3 of the wiring board 21 can be reduced. Further, even if the top end portion 13b of the pin portion 13 is crushed, the expansion of the pin portion 13 in the lateral direction is restricted by the sleeve 26 inside the hole portion 15 of the wiring board 21, and since this sleeve 26 functions as a buffer, the application of a load to the inner wall of the hole portion 15 of the wiring board 21 can be prevented. Therefore, it is possible to prevent the load from being applied to the wiring board 21.

Further, since the second and third techniques require the operations (processes) for crushing the top end portion 13b of the pin portion 13 after the disposition inside the through-hole 3 of the wiring board 21, if the manufacturing process described with reference to FIGS. 30 to 38 is applied, the top end portion 13b of the pin portion 13 can be crushed in a state in which the semiconductor chip 5 is not mounted on the heat sink 4a, and therefore, the operation for crushing the pin portion 13 can be easily performed.

Further, also in this second embodiment, the side surface of the heat sink 4a can be tapered like in the first embodiment. In this case, in addition to the fixing by the pin portion 13, the heat sink 4a can be fixed to the wiring board 21 by the tapered shape of the side surface 10 of the heat sink 4a, and therefore, a fixing power between the heat sink 4a and the wiring board 21 can be further strengthened and the stability of the manufacturing process can be further increased.

Figure 71:
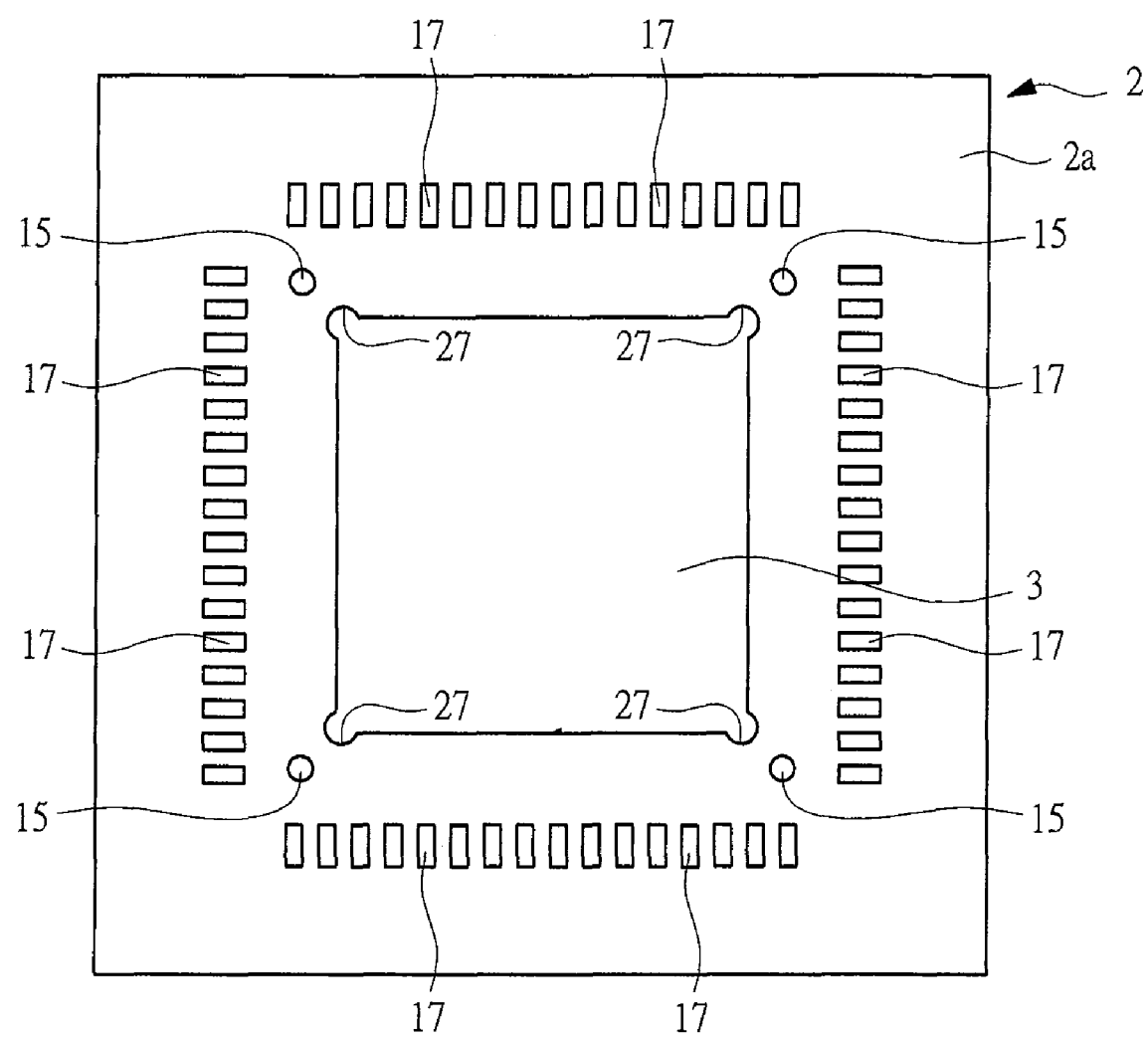
FIG. 71 is an upper surface view showing a modified example of the wiring board.

FIG. 71 is an upper surface view (plan view) showing a modified example of the wiring board 2 used for the semiconductor device 1a, and it corresponds to FIG. 57. In FIG. 71, no hatching is applied.

As shown in FIG. 71, in the wiring board 2 (that is, also in the wiring board 21), an angular portion of the through-hole 3 is eliminated so that the four corners can be made circular (to have a round shape). The same is true in the wiring board 2 of the semiconductor device 1 of the first embodiment. By this means, the load generated in the wiring board 21 (wiring board 2) by disposing (inserting) the heat sink 4 or 4a inside the through-hole 3 of the wiring board 21 (wiring board 2) can be dispersed, and the reliability of the wiring board 2 in the semiconductor devices 1 and 1a can be further improved.

Third Embodiment

Figure 72:
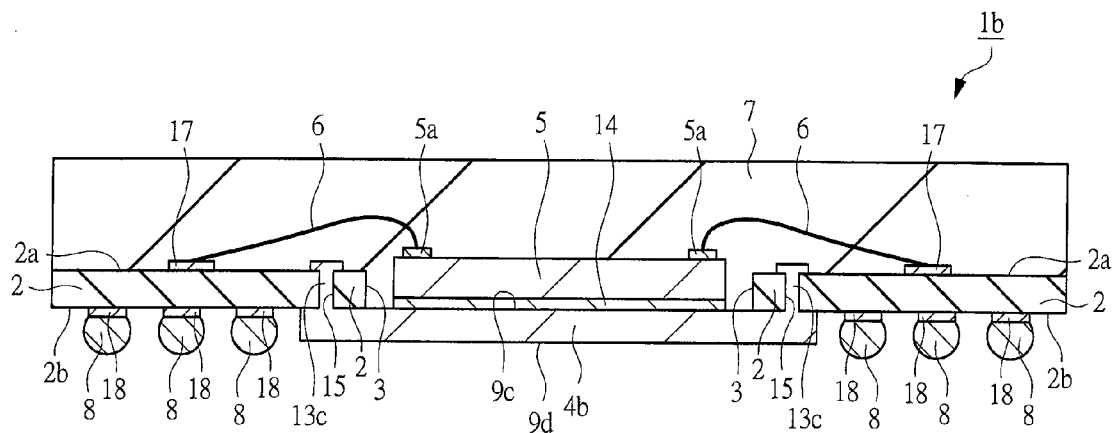
FIG. 72 is a cross-sectional view of a semiconductor device according to another embodiment of the present invention.

FIG. 72 is a cross-sectional view (side cross-sectional view) of a semiconductor device 1b of the third embodiment, and it corresponds to FIG. 1 of the first embodiment and FIG. 48 or FIG. 49 of the second embodiment.

As shown in FIG. 72, in the semiconductor device 1b of the present embodiment, a heat sink 4b is attached to a lower surface 2b side of the wiring board 2, and the semiconductor chip 5 is mounted on an upper surface 9c of the heat sink 4b exposed at the bottom of the through-hole 3 of the wiring board 2. More specifically, the heat sink 4b is not provided with a portion corresponding to the protruded portions 11 and 11a, and has a flat plate shape (flat plate shape whose planar shape is rectangular) having the upper surface 9c and the lower surface 9d, and a pin portion (caulking portion, pin portion for caulking, caulking pin, protruded portion, convex portion) 13c is integrally provided with the heat sink 4b in the vicinity of the peripheral edge portion of the upper surface 9c of the heat sink 4b. Further, the heat sink 4b is disposed on a lower surface 2b of the wiring board 2 so as to planarly enclose the through-hole 3 of the wiring board 2 and the pin portion 13c of the heat sink 4b is disposed inside the hole portion 15 of the wiring board 2, and the heat sink 4b is fixed to the wiring board 2 by this pin portion 13c. The structure of the semiconductor device 1b other than this is almost the same as the semiconductor devices 1 and 1a of the first and second embodiments, and therefore, the description thereof will be omitted here. Also, the material of the heat sink 4b is the same as those of the heat sinks 4 and 4a of the first and second embodiments.

The manufacturing process of the semiconductor device 1b of the present embodiment is the same as the manufacturing processes of the semiconductor devices 1 and 1a of the first and second embodiments except that the step S5 is different. Hence, the process performed in place of the step S5 (process of disposing the heat sink 4 inside the through-hole 3 of the wiring board 21) in the present embodiment will be described below. For convenience, the process performed in place of the step S5 (process of disposing the heat sink 4 inside the through-hole 3 of the wiring board 21) in the present embodiment will be referred to as step S5a or a process of fixing the heat sink 4b to the wiring board 2.

Figure 73:
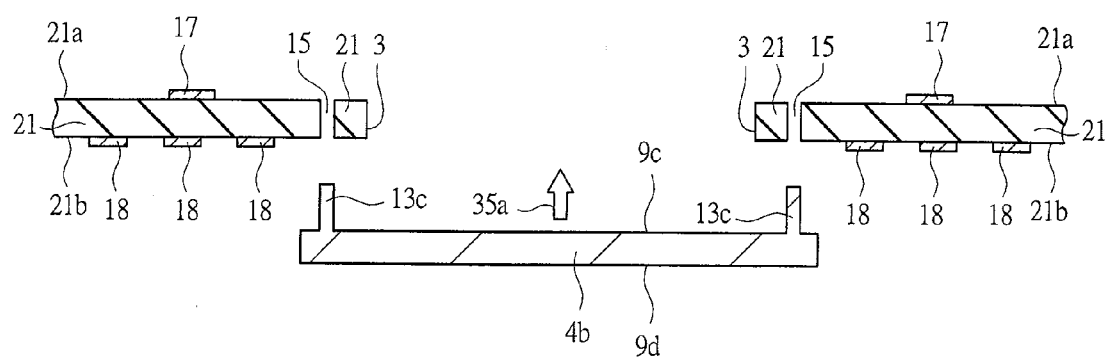
FIG. 73 is an explanatory drawing of a process of fixing the heat sink to the wiring board in the manufacturing process of the semiconductor device of FIG. 72.
Figure 74:
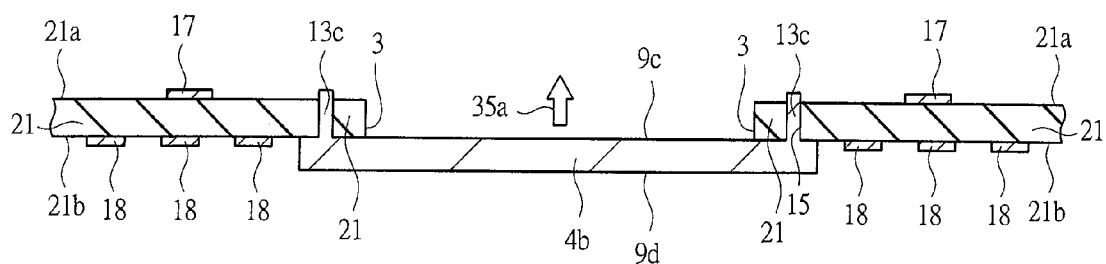
FIG. 74 is an explanatory drawing of the process of fixing the heat sink to the wiring board in the manufacturing process of the semiconductor device of FIG. 72.

FIGS. 73 and 74 are explanatory drawings (cross-sectional views) of the process of fixing the heat sink 4b to the wiring board 21 in the step S5 in the manufacturing process of the semiconductor device 1b of the present embodiment, and they correspond to FIGS. 59 and 60 of the second embodiment. Here, the case of fixing the heat sink 4b not mounted with the semiconductor chip 5 to the wiring board 21 like in the process described with reference to FIG. 30 to FIG. 34 will be described. However, also in the present embodiment, the heat sink 4b mounted with the semiconductor chip 5 can be fixed to the wiring board 21 like in the process described with reference to FIG. 8 and FIGS. 19 to 22.

Different from the first and second embodiments, in the present embodiment, the heat sink 4b is brought close to the wiring board 21 from the lower surface 21b side (side corresponding to the lower surface 2b of the wiring board 2) of the wiring board 21 in the process of fixing the heat sink 4b to the wiring board 21 in the step S5a performed as the step S5 as shown in FIG. 73. Then, as shown in FIG. 74, the pin portion 13c provided on the upper surface 9c of the heat sink 4b is inserted (plugged) into the hole portion 15 of the wiring board 21. More specifically, the pin portion 13c of the heat sink 4b is inserted into the hole portion 15 of the wiring board 21 in a direction 35a shown by arrow marks of FIGS. 73 and 74. Then, by using a fourth technique shown in FIGS. 75 to 78 to be described later or a fifth technique shown in FIGS. 79 to 82 to be described later, the heat sink 4b and the wiring board 21 are fixed. By this means, the heat sink 4b is attached and fixed to the lower surface 2b side of the wiring board 2, and the heat sink 4b planarly encloses the through-hole 3 of the wiring board 21, and the through-hole 3 of the wiring board 21 is blocked by the heat sink 4b on the lower surface 2b side of the wiring board 2.

A technique for fixing the heat sink 4b to the wiring board 21 (fourth and fifth techniques) by using the pin portion 13c of the heat sink 4b in the present embodiment will be described.

FIGS. 75 to 78 are explanatory drawings (cross-sectional views) showing the fourth technique for fixing (caulking) the heat sink 4b to the wiring board 21 by using the pin portion 13c of the heat sink 4b. FIGS. 79 to 82 are explanatory drawings (cross-sectional view) showing the fifth technique for fixing (caulking) the heat sink 4b to the wiring board 21 by using the pin portion 13c of the heat sink 4b. FIGS. 75 to 78 show the cross-section of the region in the vicinity of the hole portion 15 of the wiring board 21, and they correspond to FIGS. 63A, 64A, 65A and 66A of the second embodiment. FIGS. 79 to 82 show the cross-section of the region in the vicinity of the hole portion 15 of the wiring board 21, and they correspond to FIGS. 67A, 68A, 69A and 70A of the second embodiment.

In the present embodiment, the fourth technique for fixing the heat sink 4b to the wiring board 21 by using the pin portion 13c of the heat sink 4b will be described with reference to FIGS. 75 to 78. This fourth technique is the same as the second technique (technique shown in FIGS. 63 to 66) described in the second embodiment except that the inserting direction of the pin portion 13c into the hole portion 15 of the wiring board 21 is opposite.

The fourth technique used in the present embodiment is the same as the second technique (technique shown in FIGS. 63 to 66) of the second embodiment in the shapes and the dimensions of the pin portion 13c and the hole portion 15, and therefore, the description thereof will be omitted here.

Figure 75:
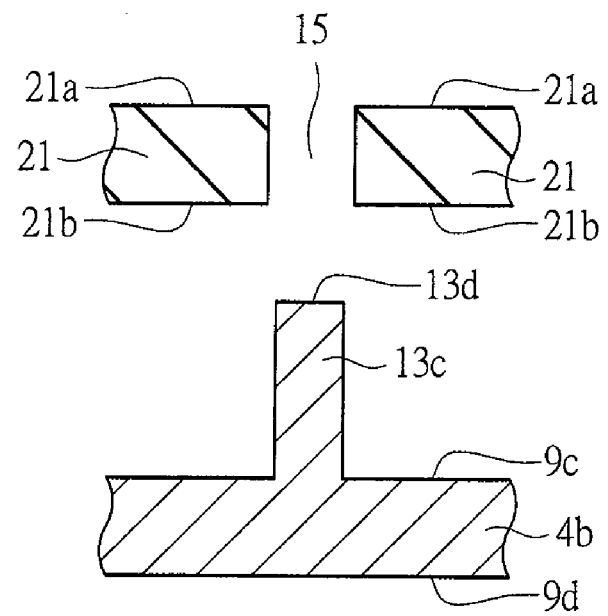
FIG. 75 is an explanatory drawing showing a technique of caulking (fixing) the heat sink to the wiring board.
Figure 76:
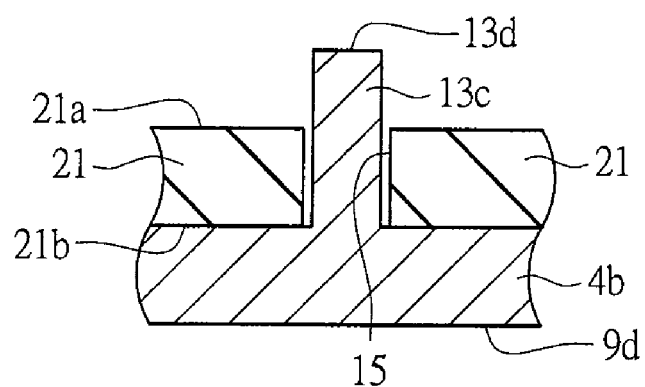
FIG. 76 is an explanatory drawing showing a technique of caulking (fixing) the heat sink to the wiring board.

In the step S5a, as shown in FIG. 75 corresponding to FIG. 73 and FIG. 76 corresponding to FIG. 74, respectively, the pin portion 13c of the heat sink 4b is inserted into the hole portion 15 of the wiring board 21 from the lower surface 21b side of the wiring board 21, and the upper surface 9c of the heat sink 4b is made to contact to the lower surface 21b (lower surface 21b in the peripheral region of the through-hole 3) of the wiring board 21. At this stage, as shown in FIG. 76, the top end portion 13d of the pin portion 13c protrudes from the upper surface 21a of the wiring board 21.

Figure 77:
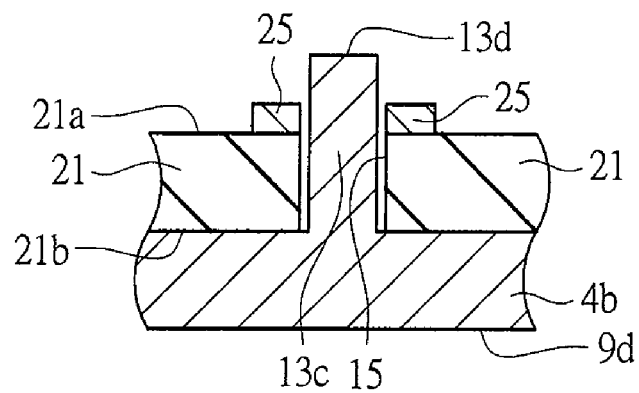
FIG. 77 is an explanatory drawing showing a technique of caulking (fixing) the heat sink to the wiring board.

After the pin portion 13c is inserted into the hole portion 15 of the wiring board 21, a washer or ring-shaped member 25 similar to the second embodiment is fitted (installed) to the portion of the pin portion 13c protruding from the upper surface 21a of the wiring board 21 as shown in FIG. 77. More specifically, the portion of the pin portion 13c protruding from the upper surface 21a of the wiring board 21 is disposed inside the hole of the washer or ring-shaped member 25. Further, in the fourth technique, a length of the pin portion 13c before being inserted into the hole portion 15 is made larger than the total thickness of the wiring board 21 and the washer or ring-shaped member 25. By this means, as shown in FIG. 77, at the stage in which the washer or ring-shaped member 25 is fitted into the pin portion 13c, the top end portion 13d of the pin portion 13c protrudes from the washer or ring-shaped member 25.

The washer or ring-shaped member 25 is preferably made of the metal material in view of necessity of the strength and the processing easiness. Further, it is preferable to form the washer or ring-shaped member 25 from the same material as the heat sink 4b because the heat expansion coefficient of the pin portion 13c and that of the washer or ring-shaped member 25 become the same.

Figure 78:
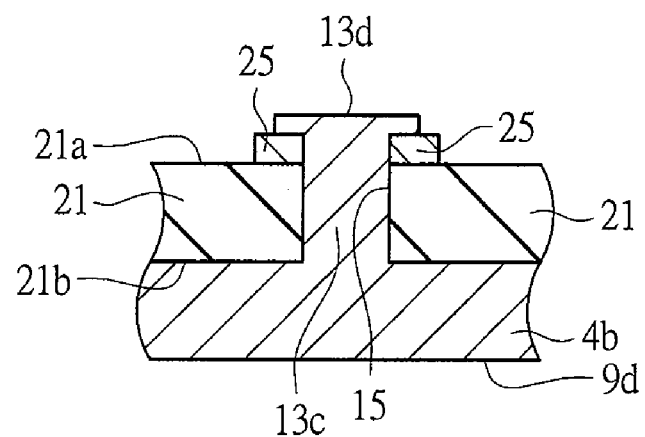
FIG. 78 is an explanatory drawing showing a technique of caulking (fixing) the heat sink to the wiring board.

Then, as shown in FIG. 78, the top end portion 13d of the pin portion 13c is crushed by a tool (not shown) and the like. By this means, the pin portion 13c of the heat sink 4b and the wiring board 21 can be caulked (fixed), and the heat sink 4b can be fixed to the wiring board 21.

More specifically, since the top end portion 13d of the pin portion 13c is pressed (crushed), the pin portion 13c is expanded in the lateral direction inside the hole portion 15 of the wiring board 21, and the side wall of the pin portion 13c contacts to (adhered to) the inner wall of the hole portion 15 of the wiring board 21. Then, by the reaction of the expansion of the inner wall of the hole portion 15 of the wiring board 21 in the lateral direction due to the expansion of the pin portion 13c in the lateral direction, the side wall of the pin portion 13c is tightened up by the inner wall of the hole portion 15 of the wiring board 21. By this means, the pin portion 13c of the heat sink 4b can be caulked (fixed) to the wiring board 21, and the heat sink 4b is fixed to the wiring board 21. In the fourth technique, the process up to here is performed by the step S5a corresponding to the step S5.

As described above, by the step S5a, the pin portion 13c of the heat sink 4b is disposed (inserted) and caulked inside the hole portion 15 of the wiring board 21. At this stage, the side wall of the pin portion 13c contacts and adheres to the inner wall of the hole portion 15 of the wiring board 21, and this state is maintained even in the manufactured semiconductor device 1b.

By caulking (fixing) the heat sink 4b to the wiring board 21 by using the fourth technique described above, the heat sink 4b can be fixed to the wiring board 21, and in addition to this, the following advantages can be further obtained. That is, after the pin portion 13c of the heat sink 4b is inserted into the hole portion 15 of the wiring board 21, the pin portion 13c is crushed so as to be able to fix the heat sink 4b to the wiring board 21, and therefore, the heat sink 4b can be firmly fixed to the wiring board 21. Further, when the top end portion 13d of the pin portion 13c is crushed by a tool (not shown) and the like, since the washer or ring-shaped member 25 functions as a buffer, a load applied to the wiring board 21 (region in the vicinity of the hole portion 15 of the lower surface 21b) can be reduced.

Next, in the present embodiment, the fifth technique for fixing the heat sink 4b to the wiring board 21 by using the pin portion 13c of the heat sink 4b will be described with reference to FIGS. 79 to 82. This fifth technique is the same as the third technique (technique shown in FIGS. 67 to 70) described in the second embodiment except that the inserting direction of the pin portion 13c to the hole portion 15 of the wiring board 21 is opposite.

The fifth technique used in the present embodiment is the same as the third technique (technique shown in FIGS. 67 to 70) of the second embodiment in the shapes and the dimensions of the pin portion 13c and the hole portion 15, and therefore, the description thereof will be omitted here.

Figure 79:
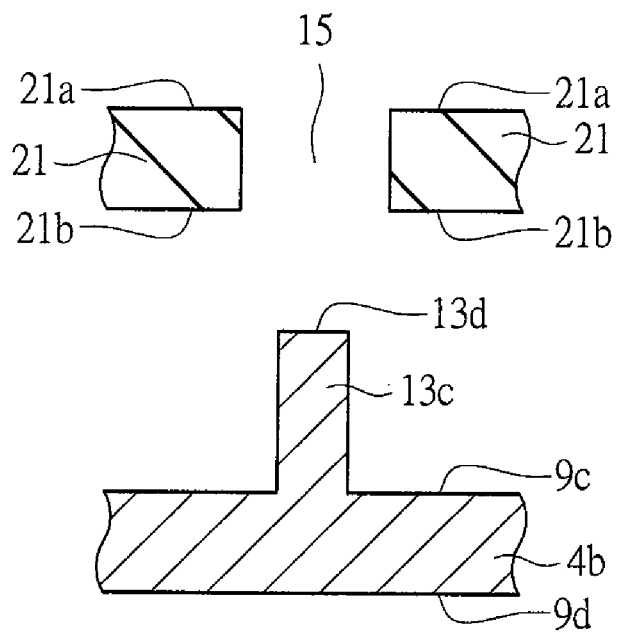
FIG. 79 is an explanatory drawing showing a technique of caulking (fixing) the heat sink to the wiring board.
Figure 80:
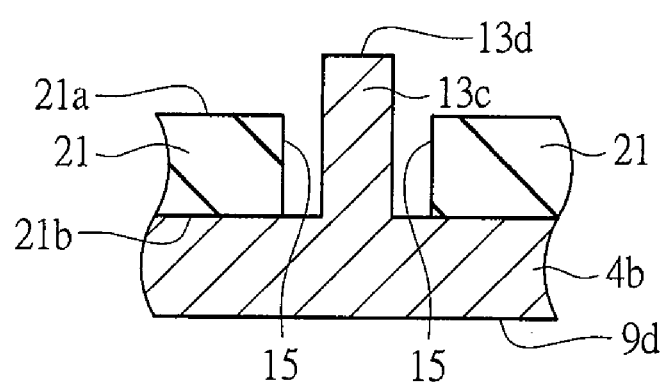
FIG. 80 is an explanatory drawing showing a technique of caulking (fixing) the heat sink to the wiring board.

In the step S5a, as shown in FIG. 79 corresponding to FIG. 73 and FIG. 80 corresponding to FIG. 74, the pin portion 13c of the heat sink 4b is inserted into the hole portion 15 of the wiring board 21 from the lower surface 21b side of the wiring board 21, and the lower surface 21b (lower surface 21b in the peripheral region of the through-hole 3) of the wiring board 21 is made to contact to the upper surface 9c of the heat sink 4b. At this stage, as shown in FIG. 80, the top end portion 13d of the pin portion 13c protrudes from the upper surface 21a of the wiring board 21.

Figure 81:
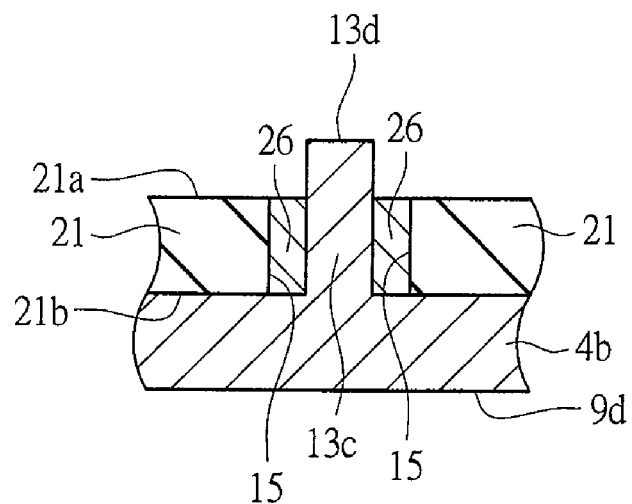
FIG. 81 is an explanatory drawing showing a technique of caulking (fixing) the heat sink to the wiring board.

After the pin portion 13c is inserted into the hole portion 15 of the wiring board 21, as shown in FIG. 81, the sleeve 26 similar to the second embodiment is inserted from the upper surface 21a side of the wiring board 21 into the hole portion 15 in which the pin portion 13c has been inserted. More specifically, while disposing (inserting) the pin portion 13c into the hole of the sleeve 26, the sleeve 26 is disposed inside the hole portion 15 of the wiring board 21. Therefore, the sleeve 26 is interposed between the inner wall of the hole portion 15 of the wiring board 21 and the side wall 13a of the pin portion 13c.

The sleeve 26 is preferably made of the metal material in view of necessity of the strength and the processing easiness. Further, it is more preferable to form the sleeve 26 from the same material as the heat sink 4b because the heat expansion coefficient of the pin portion 13c and that of the sleeve 26 become the same.

Figure 82:
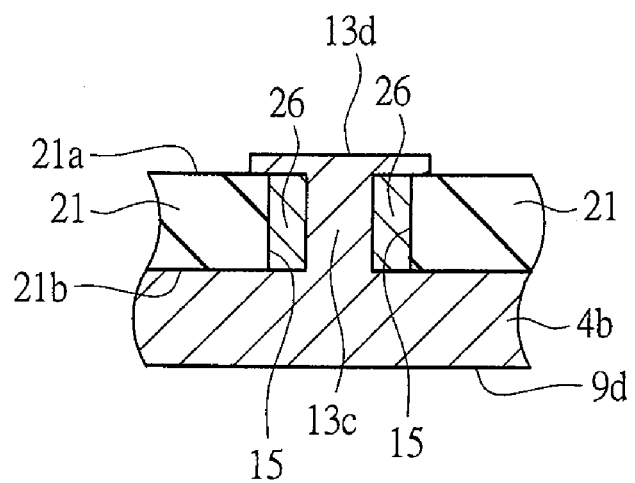
FIG. 82 is an explanatory drawing showing a technique of caulking (fixing) the heat sink to the wiring board.

Then, as shown in FIG. 82, the top end portion 13d of the pin portion 13c is crushed by a tool (not shown) and the like. By this means, the pin portion 13c of the heat sink 4b and the wiring board 21 can be caulked (fixed), and the heat sink 4b can be fixed to the wiring board 21.

More specifically, since the top end portion 13d of the pin portion 13c is crushed, the top end portion 13d of the pin portion 13c is expanded in the lateral direction outside the hole portion 15 of the wiring board 21 and the sleeve 26, and the wiring board 21 and the sleeve 26 are sandwiched by the top end portion 13d of the pin portion 13c expanded in the lateral direction and (the upper surface 9c of) the heat sink 4b, so that the heat sink 4b can be caulked (fixed) to the wiring board 21, and the heat sink 4b is fixed to the wiring board 21. In the fifth technique, the process up to here is performed by the step S5a.

As described above, by the step S5a, the pin portion 13c of the heat sink 4b is disposed (inserted) and caulked inside the hole portion 15 of the wiring board 21. At this stage, the sleeve 26 is interposed between the inner wall of the hole portion 15 and the side wall of the pin portion 13c inside the hole portion 15 of the wiring board 21, and this state is maintained even in the manufactured semiconductor device 1b.

By caulking (fixing) the heat sink 4b to the wiring board 21 by using the fifth technique described above, the heat sink 4b can be fixed to the wiring board 21, and in addition to this, the following advantages can be further obtained. That is, even if the top end portion 13d of the pin portion 13c is crushed, the expansion of the pin portion 13c in the lateral direction is restricted by the sleeve 26 inside the hole portion 15 of the wiring board 21, and since this sleeve 26 functions as a buffer, the application of a load to the inner wall of the hole portion 15 of the wiring board 21 can be prevented. Hence, the application of a load to the wiring board 21 can be prevented.

Figure 83:
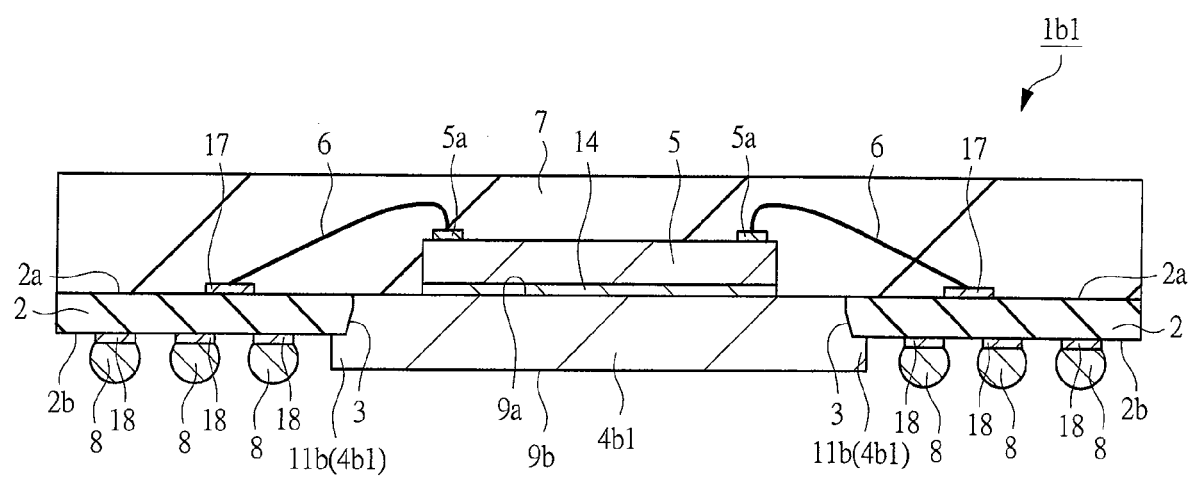
FIG. 83 is a cross-sectional view showing a modified example of the semiconductor device according to another embodiment of the present invention.
Figure 84:
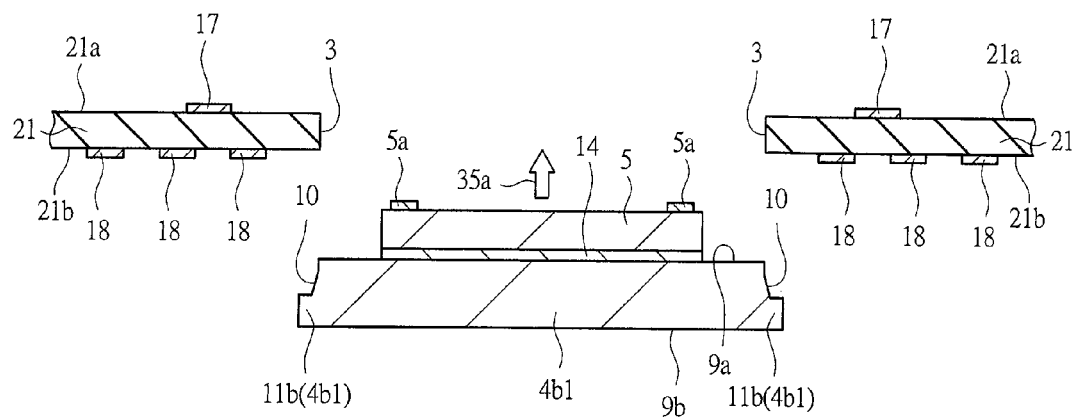
FIG. 84 is an explanatory drawing of a process of fixing the heat sink to the wiring board in the manufacturing process of the semiconductor device of FIG. 83.
Figure 85:
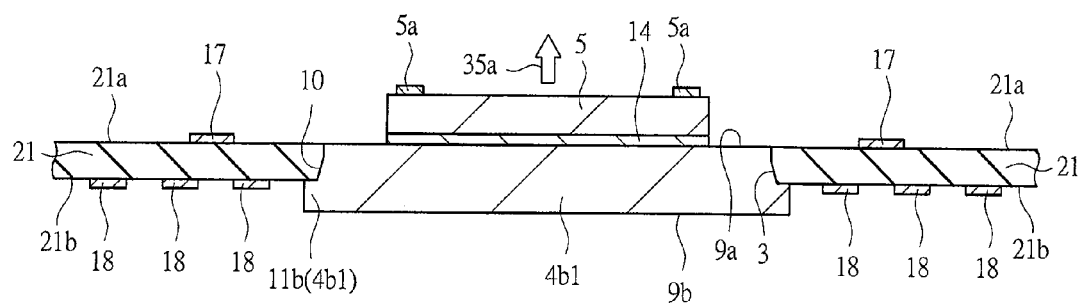
FIG. 85 is an explanatory drawing of a process of fixing the heat sink to the wiring board in the manufacturing process of the semiconductor device of FIG. 83.

FIG. 83 is a cross-sectional view (side cross-sectional view) of a semiconductor device 1b1 of an modified example of the third embodiment and FIGS. 84 and 85 are explanatory drawings (cross-sectional views) of the process of fixing a heat sink 4b1 to the wiring board 21 in the step S5a in the manufacturing process of the semiconductor device of FIG. 83, and they correspond to FIGS. 72 to 74, respectively. Also in the case of FIGS. 83 to 85, the heat sink 4b1 is fixed to the wiring board 21 from the lower surface 21b side of the wiring board 21 like in the case of FIGS. 72 to 82. However, in the case of FIGS. 72 to 82, a fixing technique uses the pin portion 13c of the heat sink 4b, whereas in the case of FIGS. 83 to 85, the fixing technique uses the tapered shape of the side surface 10 of the heat sink 4b1. Note that, although the case where the heat sink 4b1 mounted with the semiconductor chip 5 is fixed to the wiring board 21 in the step S5a will be illustrated and described in FIGS. 84 and 85, the heat sink 4b1 not mounted with the semiconductor chip 5 can also be fixed to the wiring board 21 in the step S5a as shown in FIGS. 73 and 74.

For the manufacture of the semiconductor device 1b1 shown in FIG. 83, the process of fixing the heat sink 4b1 to the wiring board 21 in the step S5a is performed as shown in FIGS. 84 and 85. More specifically, as shown in FIG. 84, the heat sink 4b1 mounted with the semiconductor chip 5 is brought close to the wiring board 21 from the lower surface 21b side (side corresponding to the lower surface 2b of the wiring board 2) of the wiring board 21. Then, as shown in FIG. 85, the heat sink 4b1 mounted with the semiconductor chip 5 is inserted (plugged) into the through-hole 3 of the wiring board 21 from the lower surface 21b side (side corresponding to the lower surface 2a of the wiring board 2) of the wiring board 21. That is, the heat sink 4b1 mounted with the semiconductor chip 5 is inserted into the through-hole 3 of the wiring board 21 in a direction 35a shown by the arrow marks of FIGS. 84 and 85.

Since the heat sink 4b1 does not have a protruded portion like the protruded portions 11 and 11a in the peripheral edge portion of the upper surface 9a of the heat sink 4b1, the heat sink 4b1 can be inserted into the through-hole 3 of the wiring board 21 from the lower surface 21b side of the wiring board 21. Further, the heat sink 4b1 is integrally provided with a protruded portion (projecting portion, overhang portion, hook portion) 11b protruding to the outside further than the side surface 10 of the heat sink 4b1 in the peripheral edge portion of the lower surface 9b of the heat sink 4b1, and this protruded portion 11b functions as a stopper when the heat sink 4b1 is inserted into the through-hole 3 of the wiring board 21 from the lower surface 21b side of the wiring board 21.

Further, the side surface 10 of the heat sink 4b1 has a tapered shape. However, the tapered shape of the side surface 10 of the heat sink 4b1 is reversed in direction with respect to the tapered shape of the side surface 10 of the heat sink 4 of the first embodiment, and the dimension of the heat sink 4b1 (dimension of the cross-section parallel to the upper surface 2a of the wiring board 2) is made slightly smaller on the upper side than on the lower side. On the other hand, the inner wall of the through-hole 3 of the wiring board 21 before the heat sink 4b1 is inserted does not have the tapered shape, and is kept almost vertical to the upper surface 21a of the wiring board 21.

Hence, by inserting the heat sink 4b1 into the through-hole 3 from the lower surface 21b side of the wiring board 21 as shown in FIGS. 84 and 85, the heat sink 4b1 and the wiring board 21 can be caulked by the tapered shape of the side surface 10 of the heat sink 4b1, and the heat sink 4b1 can be fixed to the wiring board 21. More specifically, when the heat sink 4b1 is inserted into the through-hole 3 from the lower surface 21b side of the wiring board 21 in the step S5a, the side surface 10 of the heat sink 4b1 contacts to the inner wall of the through-hole 3 of the wiring board 21, and the inner wall of the through-hole 3 of the wiring board 21 is expanded in the lateral direction by the tapered shape of the side surface 10 of the heat sink 4b1, so that the side surface 10 of the heat sink 4b1 is tightened up by the inner wall of the through-hole 3 of the wiring board 21 by its reaction, and the heat sink 4b1 is fixed to the wiring board 21. Since the protruded portion like the above-described protruded portion 11 is not present in the peripheral edge portion of the upper surface 9a of the heat sink 4b1, a stopper effect to the lower side (in the direction 35) of the protruded portion 11 is eliminated as compared with the first embodiment and an effect of preventing the heat sink from falling off is reduced, but the heat sink 4b1 can be retained to the wiring board 21 by the tightening up by the tapered shape of the side surface 10 of the heat sink 4b1.

Hence, as shown in FIG. 85, in a state in which the heat sink 4b1 is disposed (inserted) inside the through-hole 3 of the wiring board 21 in the step S5a, the side surface 10 of the heat sink 4b1 contacts and adheres to the inner wall of the through-hole 3 of the wiring board 21 and is inclined with respect to the direction vertical to the upper surface 21a of the wiring board 21, and this state is maintained even in the manufactured semiconductor device 1b1 as shown in FIG. 83.

Since the manufacturing process of the semiconductor device 1b1 of FIG. 83 is almost the same as the manufacturing process of the semiconductor device 1 of the first embodiment except that the step S5a as shown in FIGS. 84 and 85 is performed in place of the step S5 of the first embodiment, the description thereof will be omitted here. Since the heat sink 4b1 and the wiring board 21 are caulked and fixed by the tapered shape of the side surface 10 of the heat sink 4b1, the heat sink 4b1 can be retained (fixed) to the wiring board 21 until the resin sealing is performed in the step S7 after the step S5a.

In the manufactured semiconductor device 1b1 of FIG. 83, the heat sink 4b1 is disposed inside the through-hole 3 of the wiring board 2. However, since the portions equivalent to the protruded portions 11 and 11a are not present on the peripheral edge portion of the upper surface 9a of the heat sink 4b1, the heat sink 4b1 does not extend on the upper surface 2a of the wiring board 2. Also, although the protruded portion 11b is provided on the peripheral edge portion of the lower surface 9b of the heat sink 4b1, this protruded portion 11b is located on the lower surface 2b of the wiring board 2 outside the through-hole 3, and the upper surface of the protruded portion 11b contacts to the lower surface 2b of the wiring board 2. Hence, in the semiconductor device 1b1, when seen on the plane parallel to the upper surface 2a of the wiring board 2, the portion other than the protruded portion 11b of the heat sink 4b1 is located at the position planarly overlapped with the through-hole 3, and only the protruded portion 11b is located outside the through-hole 3 (position not planarly overlapped with the through-hole 3, that is, the position overlapped with the wiring board 2). Since the structure of the semiconductor device 1b1 other than this is almost the same as the semiconductor device 1 of the first embodiment, the description thereof will be omitted here. Also, the material of the heat sink 4b1 is the same as that of the heat sink 4 of the first embodiment.

In the semiconductor device 1b1 of FIG. 83, the connecting terminal 17 can be disposed close to the through-hole 3 (that is, the semiconductor chip 5 on the heat sink 4b1 disposed inside the through-hole 3) in the wiring board 21 (wiring board 2) because the portions corresponding to the protruded portions 11 and 11a are not present on the peripheral edge portion of the upper surface 9a of the heat sink 4b1. Hence, this is advantageous for the miniaturization (reduction in area) of the semiconductor device. Further, since the portions corresponding to the protruded portions 11 and 11a are not present on the peripheral edge portion of the upper surface 9a of the heat sink 4b1, the bonding wire 6 is less likely to contact to the heat sink 4b1.

FIGS. 72 to 82 of the third embodiment are similar to the second and third techniques described in the second embodiment in that the washer or ring-shaped member 25 or the sleeve 26 is used, and FIGS. 83 to 85 of the third embodiment are similar to the first embodiment in that the tapered shape of the side surface of the heat sink is used. However, as compared with the third embodiment, the first and second embodiments and the following fourth and fifth embodiments have still other advantages as follows.

That is, since the first and second embodiments and the following fourth and fifth embodiments have a structure provided with the heat sinks 4, 4a and 4c inside the through-hole 3 of the wiring board 21, the thickness of the heat sinks 4, 4a and 4c can be made large, and the heat dissipation properties of the semiconductor device can be more improved.

Further, when the heat sink 4b and 4b1 are fixed to the wiring board 21 from the lower surface 21b side of the wiring board 21 like in the third embodiment, the weight of the heat sink 4b and 4b1 (gravity working on the heat sink 4b and 4b1) operates so that the heat sink 4b and 4b1 fall off from the wiring board 21. Therefore, if a force to fix the heat sink 4b and the wiring board 21 by the pin portion 13c and a force to fix the heat sink 4b1 and the wiring board 21 by the tapered shape of the side surface 10 of the heat sink 4b1 are weak, the heat sinks 4b and 4b1 are likely to fall off (peel off) from the wiring board 21 in the manufacturing process of the semiconductor device, and this will lower the manufacturing yield of the semiconductor device.

In contrast to this, in the first and second embodiments and the following fourth and fifth embodiments, the heat sinks 4, 4a and 4c are disposed inside the through-hole 3 of the wiring board 21 from the upper surface 21a side of the wiring board 21, and the weight of the heat sinks 4, 4a and 4c (gravity working on the heat sinks 4, 4a and 4c) can be received by the protruded portions 11 and 11a of the heat sinks 4 and 4a or a joining portion 33a to be described later. More specifically, since the protruded portions 11 and 11a or the joining portion 33a to be described later are located on the upper surface 21a of the wiring board 21 so that the lower surfaces of the protruded portions 11 and 11a or the joining portion 33a to be described later contact to the upper surface 21a of the wiring board 21 in the first and second embodiments and the following fourth and fifth embodiments, the protruded portions 11 and 11a or the joining portion 33a to be described later support the weight of the heat sinks 4, 4a and 4c. Hence, in the first and second embodiments and the following fourth and fifth embodiments, even if the force for fixing the heat sinks 4, 4a and 4c to the wiring board 21 is not so much strong, it is possible to prevent the heat sinks 4, 4a and 4c from falling off from the wiring board 21 in the manufacturing process of the semiconductor device. Also, since the gravity working on the heat sinks 4, 4a and 4c rather operates so as to make the heat sinks 4, 4a and 4c less likely to fall off from the wiring board 21 in the first and second embodiments and the following fourth and fifth embodiments, it is not necessary to make the force for fixing the heat sinks 4, 4a and 4c to the wiring board 21 so large, and a load operating on the wiring board 21 by this fixing force can be reduced. In the following fourth and fifth embodiments, those corresponding to the wiring board 21 are wiring boards 21c, 21d and 2f.

Further, since the completed semiconductor device is mounted while directing the lower surface 2b of the wiring board 2 toward the mounting board (corresponding to the wiring board 41) side, the heat sinks 4, 4a, 4b, 4b1 and 4c are required to be surely fixed inside the through-hole 3 of the wiring board 2. Hence, if the reliability of the semiconductor device is taken into consideration, it is more preferable to insert the heat sinks 4, 4a and 4c into the through-hole 3 from the upper surface 21a side of the wiring board 21 like in the first and second embodiments and the fourth and fifth embodiments to be described later rather than fixing the heat sinks 4b and 4b1 to the wiring board 21 from the lower surface 21b side of the wiring board 21 like in the third embodiment. In the following fifth embodiment, that corresponding to the wiring board 2 is a wiring board 2f.

Fourth Embodiment

In the first and second embodiments, the individually segmented heat sinks 4 and 4a are disposed inside the through-hole 3 of the wiring board 21 to manufacture the semiconductor devices 1 and 1a. In the present embodiment, however, a resin sealing process is performed in a state in which a plurality of heat sinks 4c are joined, and then, the sealing body is individually segmented, thereby manufacturing the semiconductor device 1c.

Figure 86:
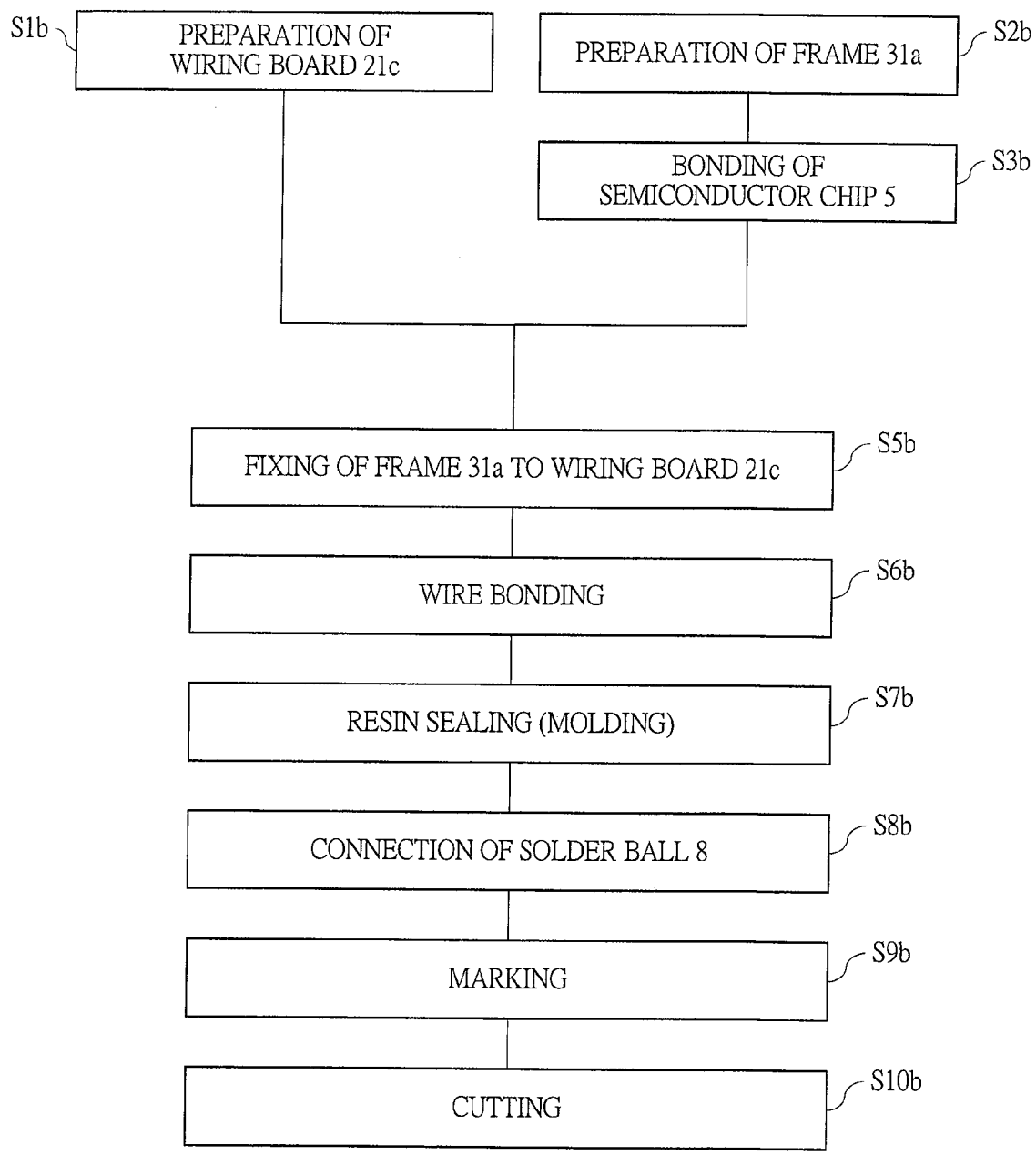
FIG. 86 is a process flowchart showing a manufacturing process of the semiconductor device according to another embodiment of the present invention.
Figure 87:
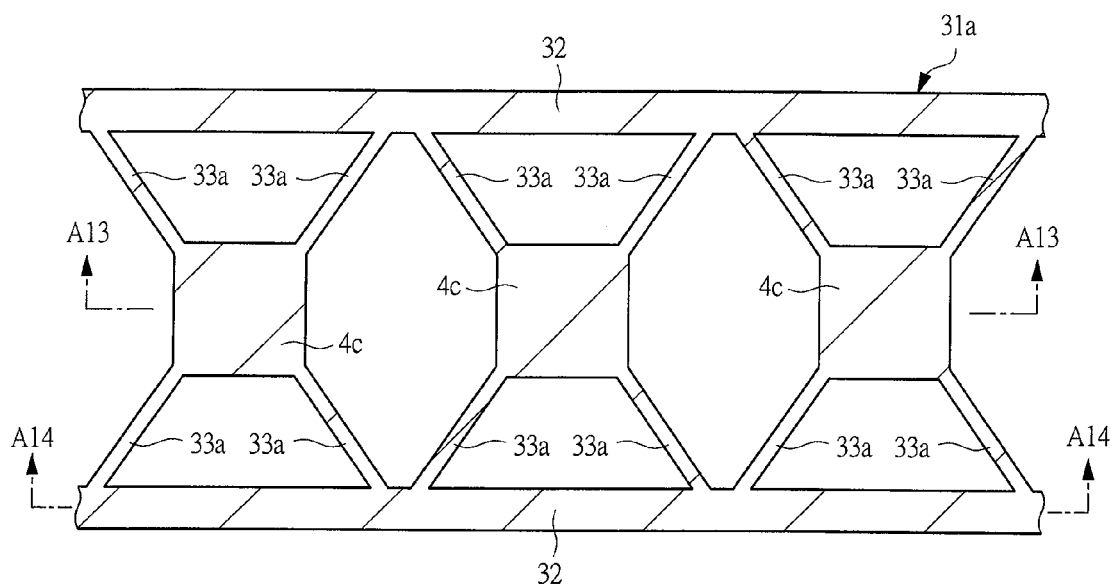
FIG. 87 is an upper surface view of a frame used in the manufacturing process of the semiconductor device according to another embodiment of the present invention.
Figure 88:
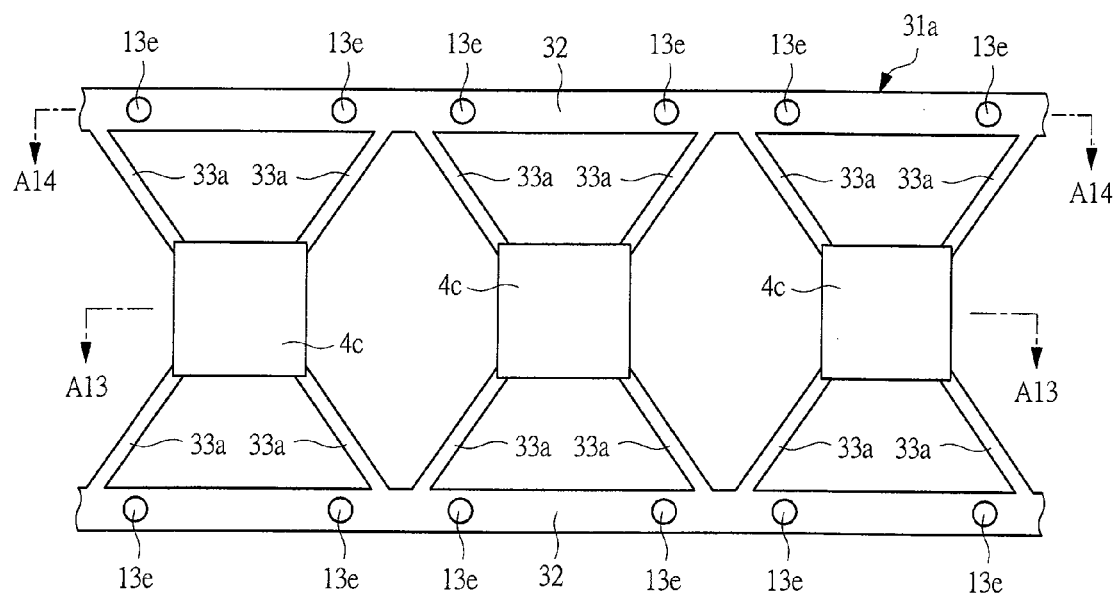
FIG. 88 is a lower surface view of the frame of FIG. 87.
Figure 89:
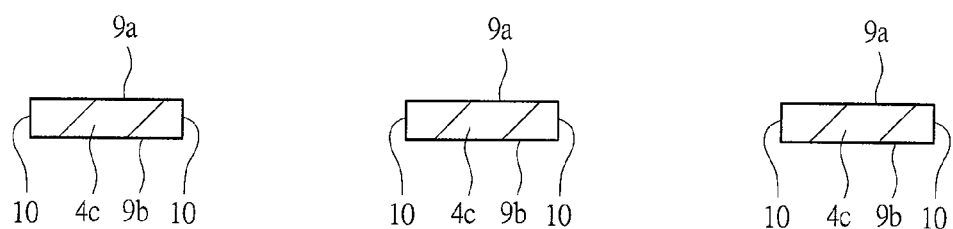
FIG. 89 is a cross-sectional view of the frame of FIG. 87.
Figure 90:
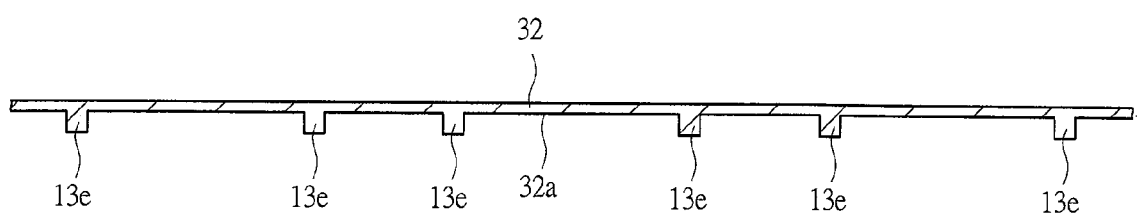
FIG. 90 is another cross-sectional view of the frame of FIG. 87.
Figure 91:
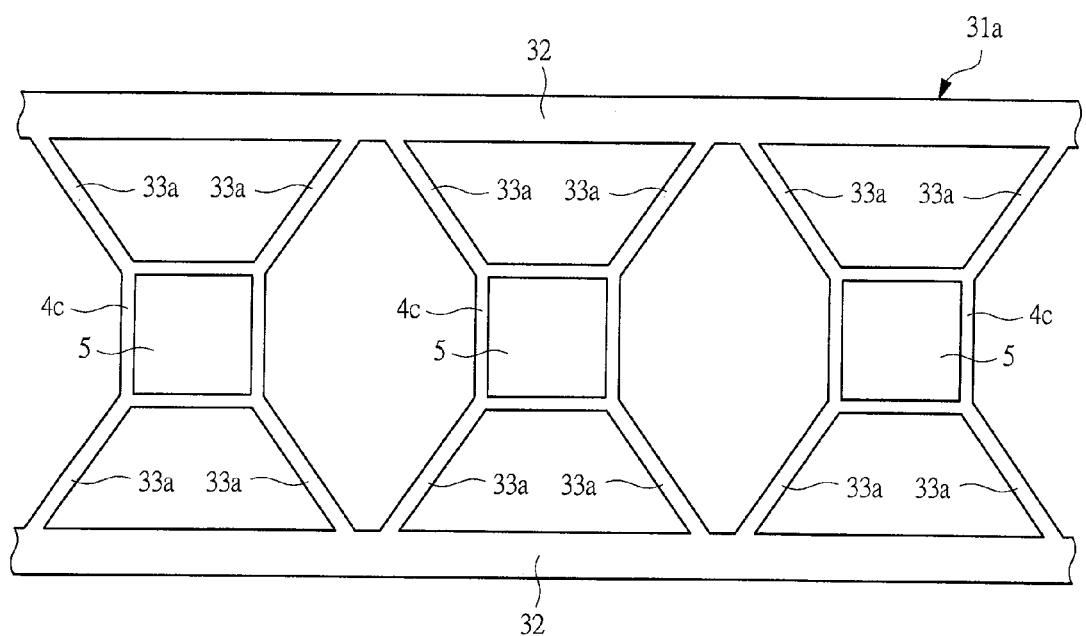
FIG. 91 is a plan view showing the manufacturing process of the semiconductor device according to another embodiment of the present invention.
Figure 92:
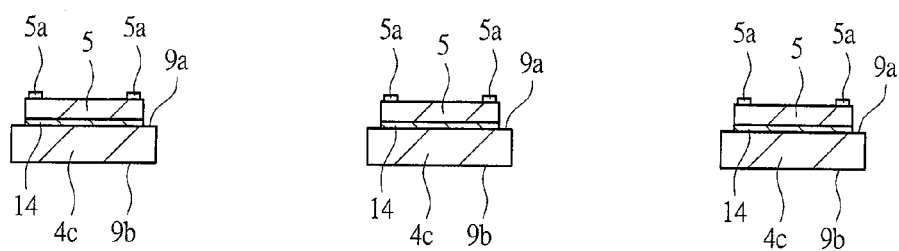
FIG. 92 is a cross-sectional view showing the same manufacturing process of the semiconductor device as FIG. 91.
Figure 93:
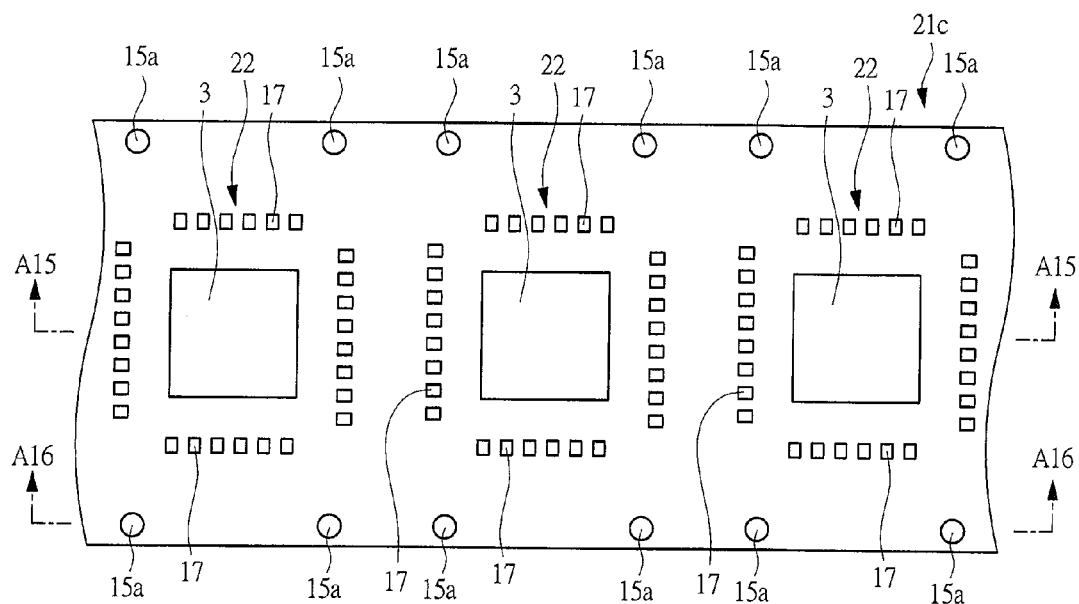
FIG. 93 is an upper surface view of the wiring board used in the manufacturing process of the semiconductor device according to another embodiment of the present invention.
Figure 94:
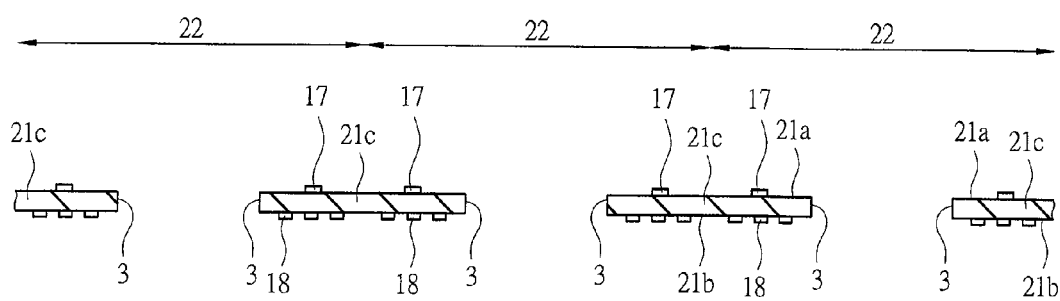
FIG. 94 is a cross-sectional view of the wiring board of FIG. 93.
Figure 95:
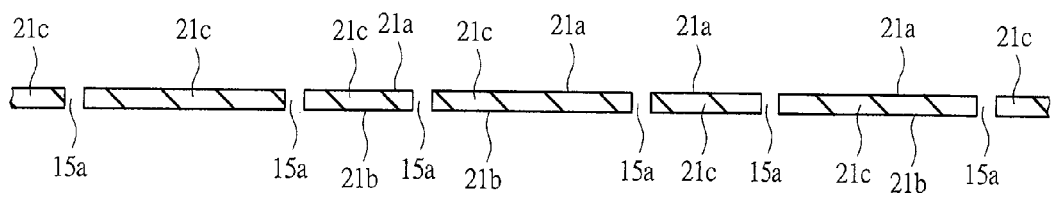
FIG. 95 is another cross-sectional view of the wiring board of FIG. 93.
Figure 96:
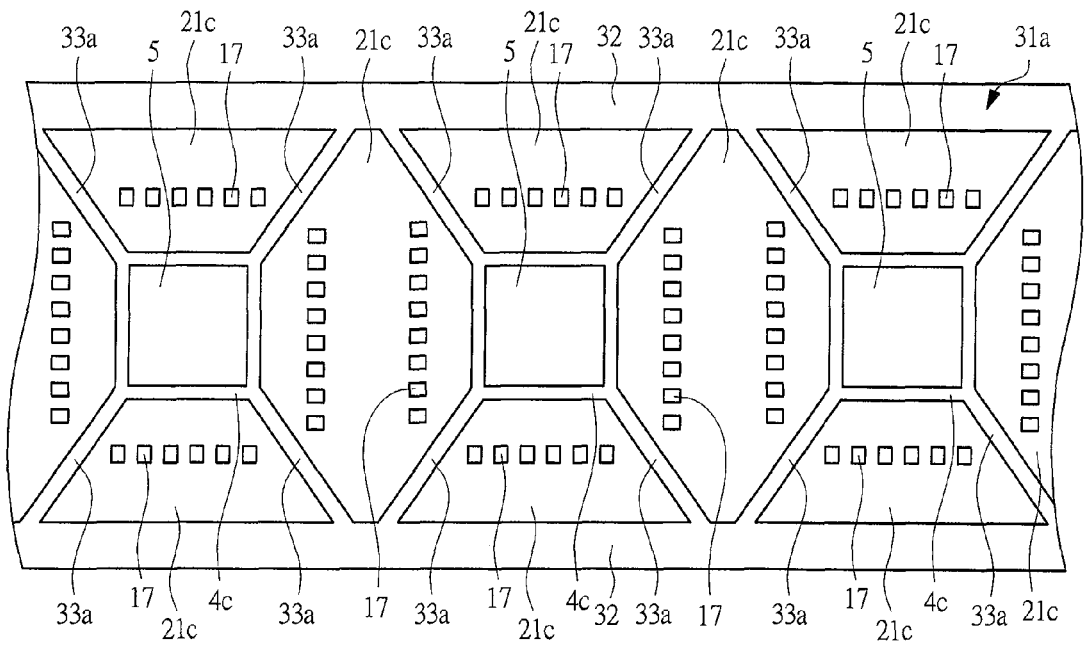
FIG. 96 is a plan view showing the manufacturing process of the semiconductor device subsequent to FIG. 91.
Figure 97:
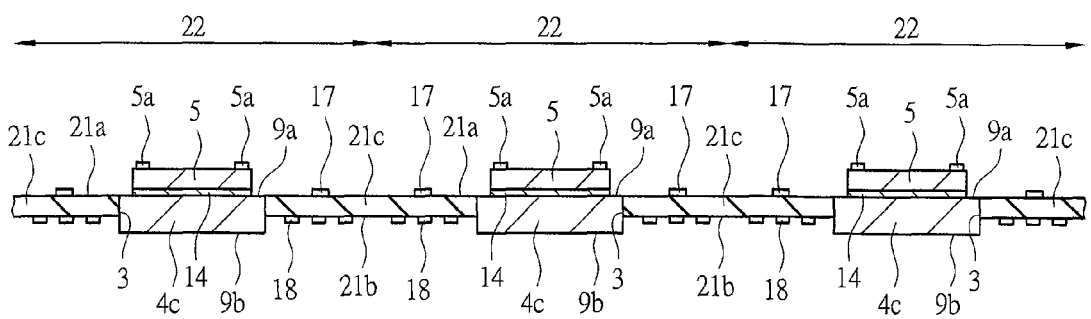
FIG. 97 is a cross-sectional view showing the same manufacturing process of the semiconductor device as FIG. 96.
Figure 98:
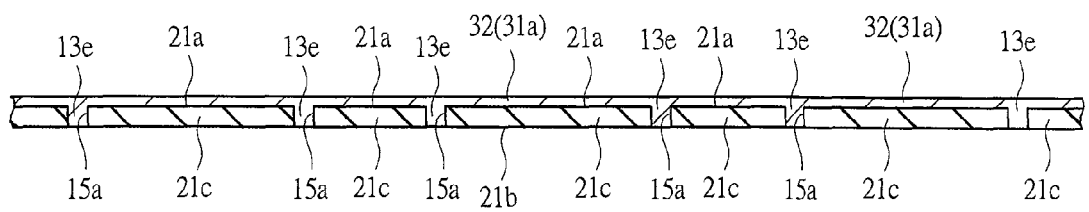
FIG. 98 is another cross-sectional view showing the same manufacturing process of the semiconductor device as FIG. 96.
Figure 99:
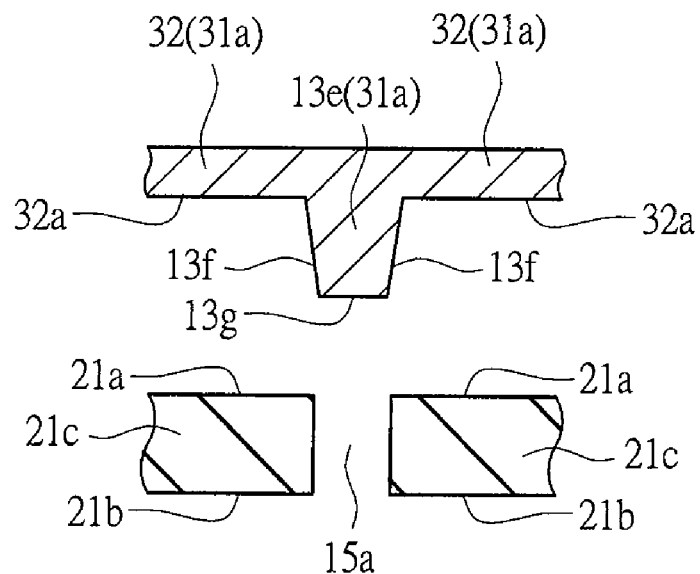
FIG. 99 is an explanatory drawing showing a technique of fixing the frame to the wiring board.
Figure 100:
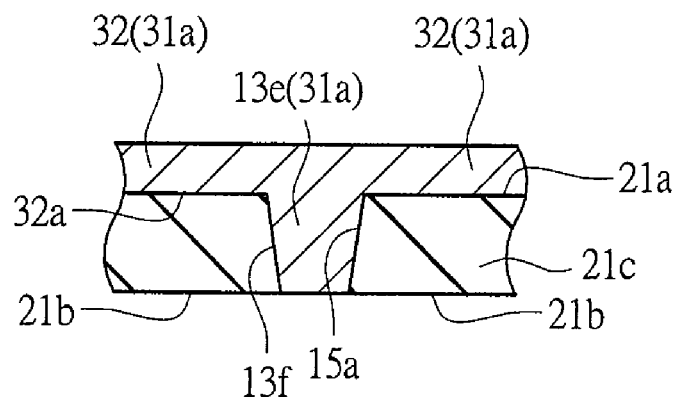
FIG. 100 is an explanatory drawing showing a technique of fixing the frame to the wiring board.
Figure 101:
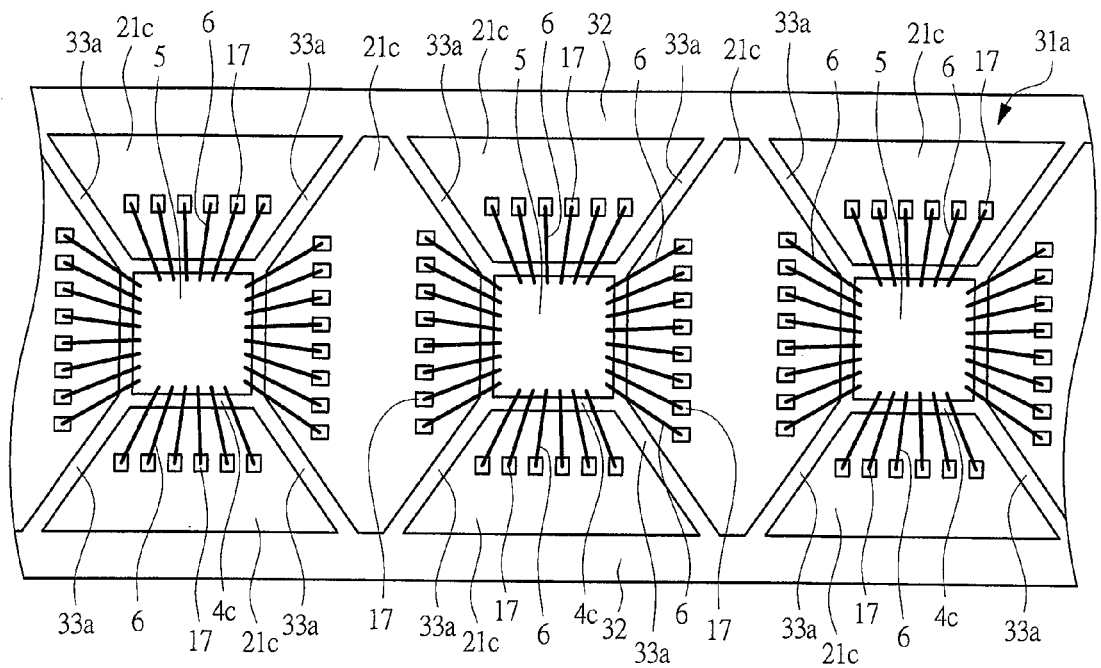
FIG. 101 is a plan view showing the manufacturing process of the semiconductor device subsequent to FIG. 96.
Figure 102:
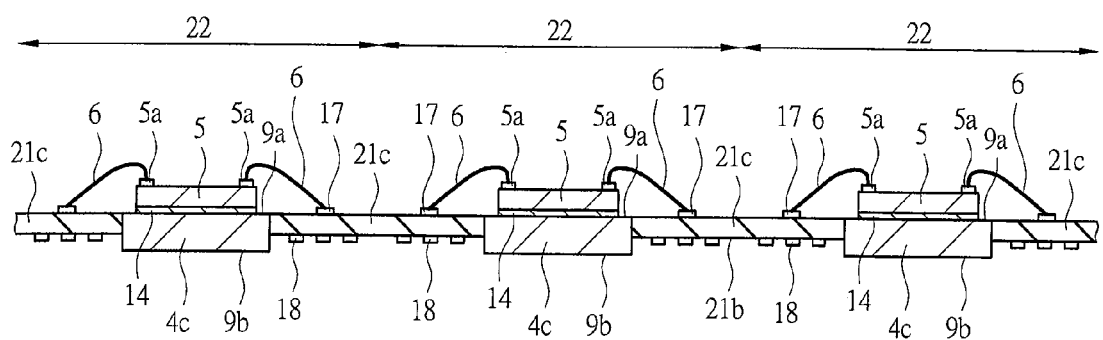
FIG. 102 is a cross-sectional view showing the same manufacturing process of the semiconductor device as FIG. 101.
Figure 103:
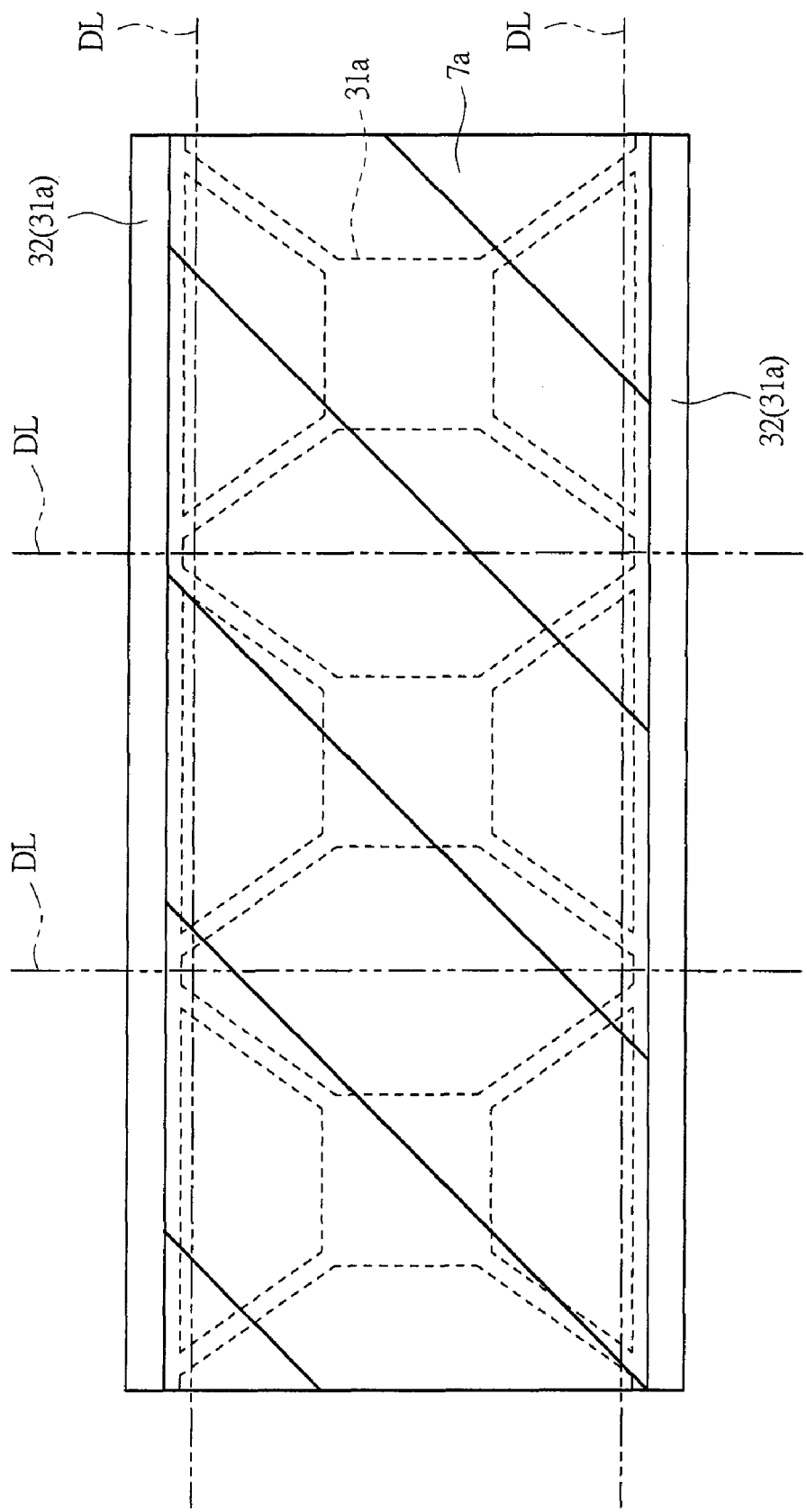
FIG. 103 is a plan view showing the manufacturing process of the semiconductor device subsequent to FIG. 101.
Figure 104:
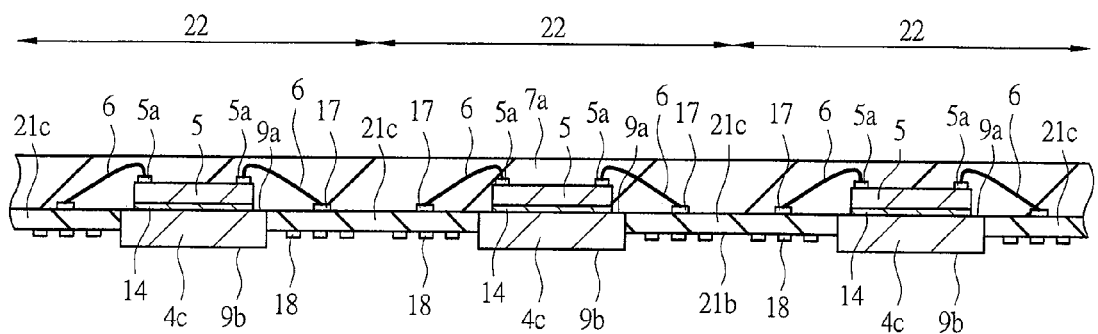
FIG. 104 is a cross-sectional view showing the same manufacturing process of the semiconductor device as FIG. 103.
Figure 105:
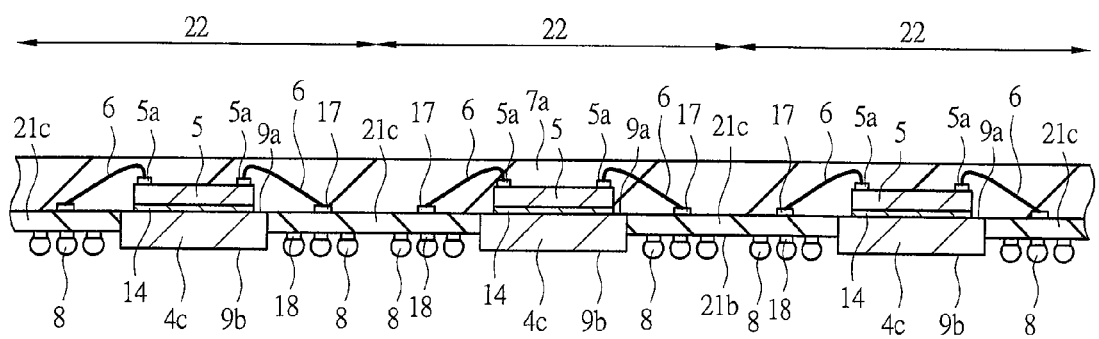
FIG. 105 is a cross-sectional view showing the manufacturing process of the semiconductor device subsequent to FIG. 104.

FIG. 86 is a process flowchart showing the manufacturing process of a semiconductor device of the present embodiment. FIG. 87 is an upper surface view (plan view) of a frame 31a used for the manufacture of the semiconductor device of the present embodiment, FIG. 88 is a lower surface view (plan view) of the frame 31a, and FIGS. 89 and 90 are cross-sectional views of the frame 31a. The cross-section cut along the line A13-A13 of FIGS. 87 and 88 corresponds to FIG. 89, and the cross-section cut along the line A14-A14 of FIGS. 87 and 88 corresponds to FIG. 90. Although FIG. 87 is a plan view, hatching is applied to the frame 31a so that the shape of the frame 31a is easily understood. Further, FIGS. 91 and 92 are a plan view (upper surface view) and a cross-sectional view in the manufacturing process of the semiconductor device of the present embodiment, and FIG. 91 shows a planar region corresponding to FIG. 87 and FIG. 92 shows the cross-section corresponding to FIG. 89. FIG. 93 is an upper surface view (plan view) of the wiring board 21c used for the manufacturing process of the semiconductor device of the present embodiment, and FIGS. 94 and 95 are cross-sectional views of the wiring board 21c. The cross-section cut along the line A15-A15 of FIG. 93 corresponds to FIG. 94, and the cross-section cut along the line A16-A16 of FIG. 93 corresponds to FIG. 95. Further, FIGS. 96 to 98 are a plan view (upper surface view) and cross-sectional views in the manufacturing process of the semiconductor device of the present embodiment, and FIG. 96 shows a planar region corresponding to FIGS. 87 and 93, FIG. 97 shows the cross-section corresponding to FIGS. 89 and 94, and FIG. 98 shows the cross-section corresponding to FIGS. 90 and 95. FIGS. 99 and 100 are explanatory drawings (cross-sectional views) showing a technique of fixing the frame 31a to the wiring board 21c by using a pin portion 13e of the frame 31a. Further, FIGS. 101 to 105 are plan views (upper surface views) and cross-sectional views in the manufacturing process of the semiconductor device of the present embodiment. FIGS. 101 and 102 show the same process stage, and FIG. 101 shows the planar region corresponding to FIG. 96 and FIG. 102 shows the cross-section corresponding to FIG. 97. FIGS. 103 and 104 show the same process stage, and FIG. 103 shows the planar region corresponding to FIG. 101 and FIG. 104 shows the cross-section corresponding to FIG. 102. FIG. 105 is a process stage subsequent to FIG. 104, and shows the cross-section corresponding to FIG. 104.

Figure 106:
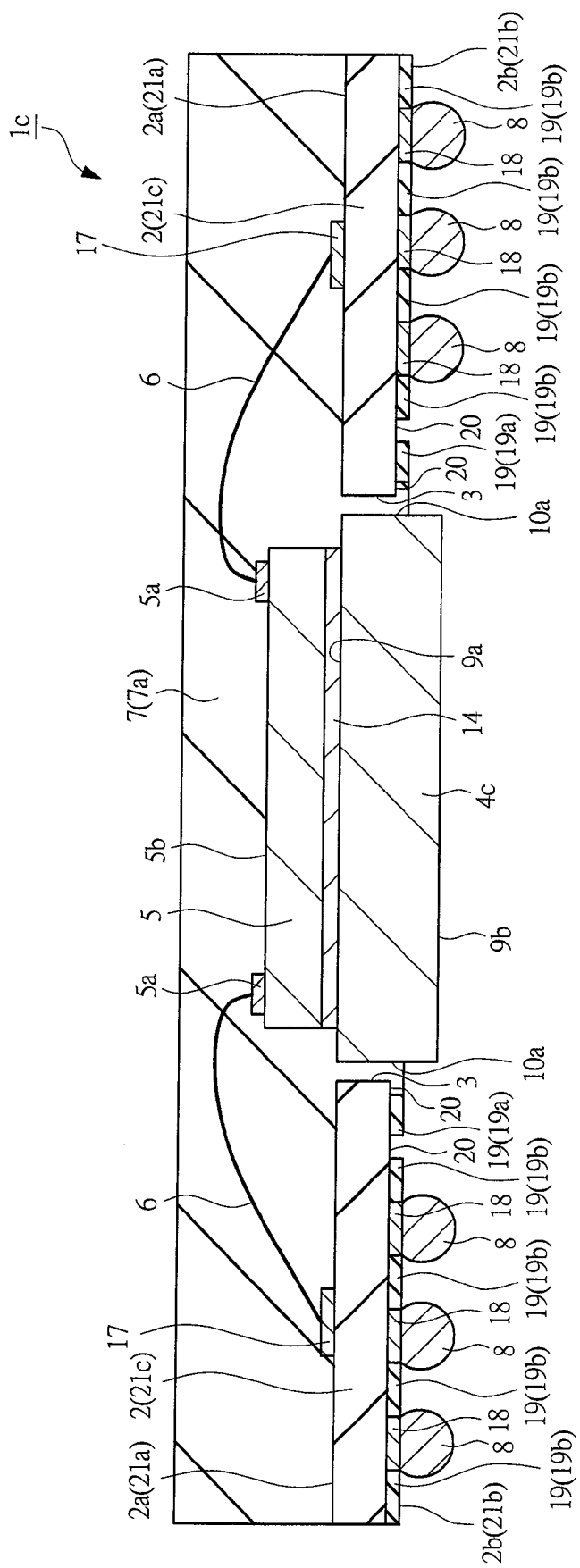
FIG. 106 is a cross-sectional view of a semiconductor device according to another embodiment of the present invention.
Figure 107:
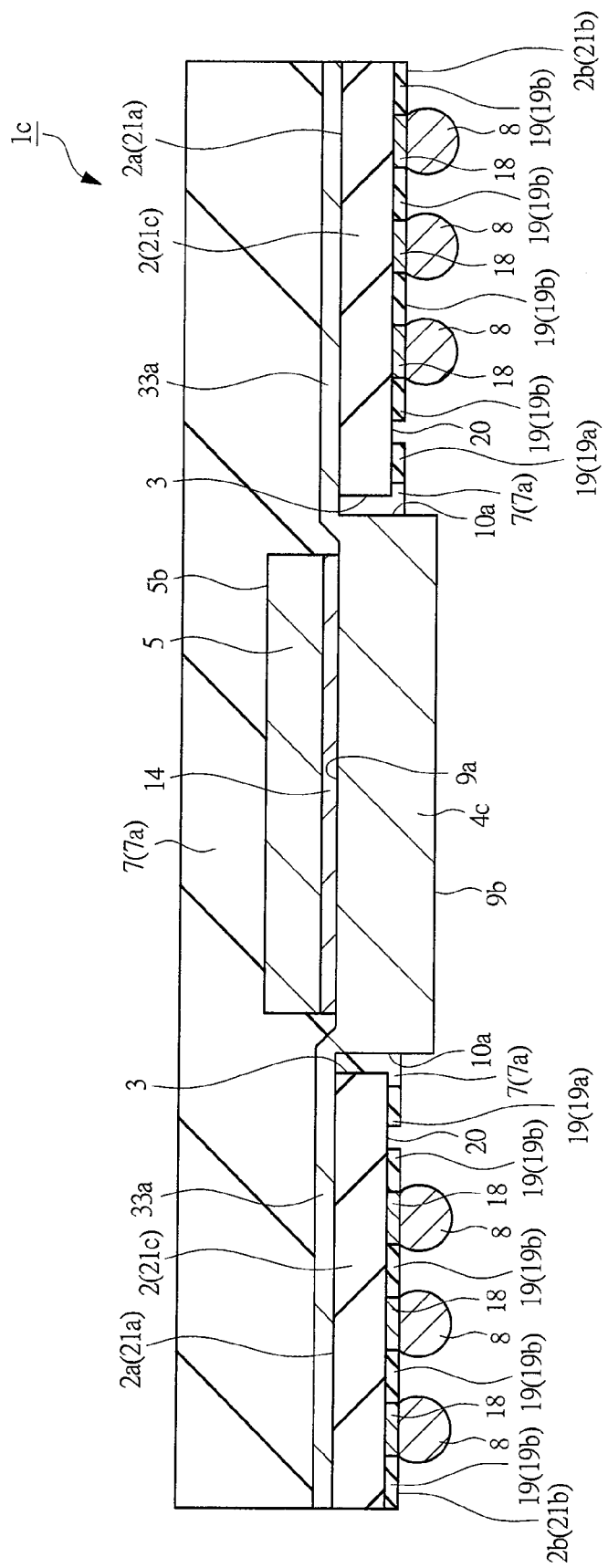
FIG. 107 is another cross-sectional view of the semiconductor device of FIG. 106.
Figure 108:
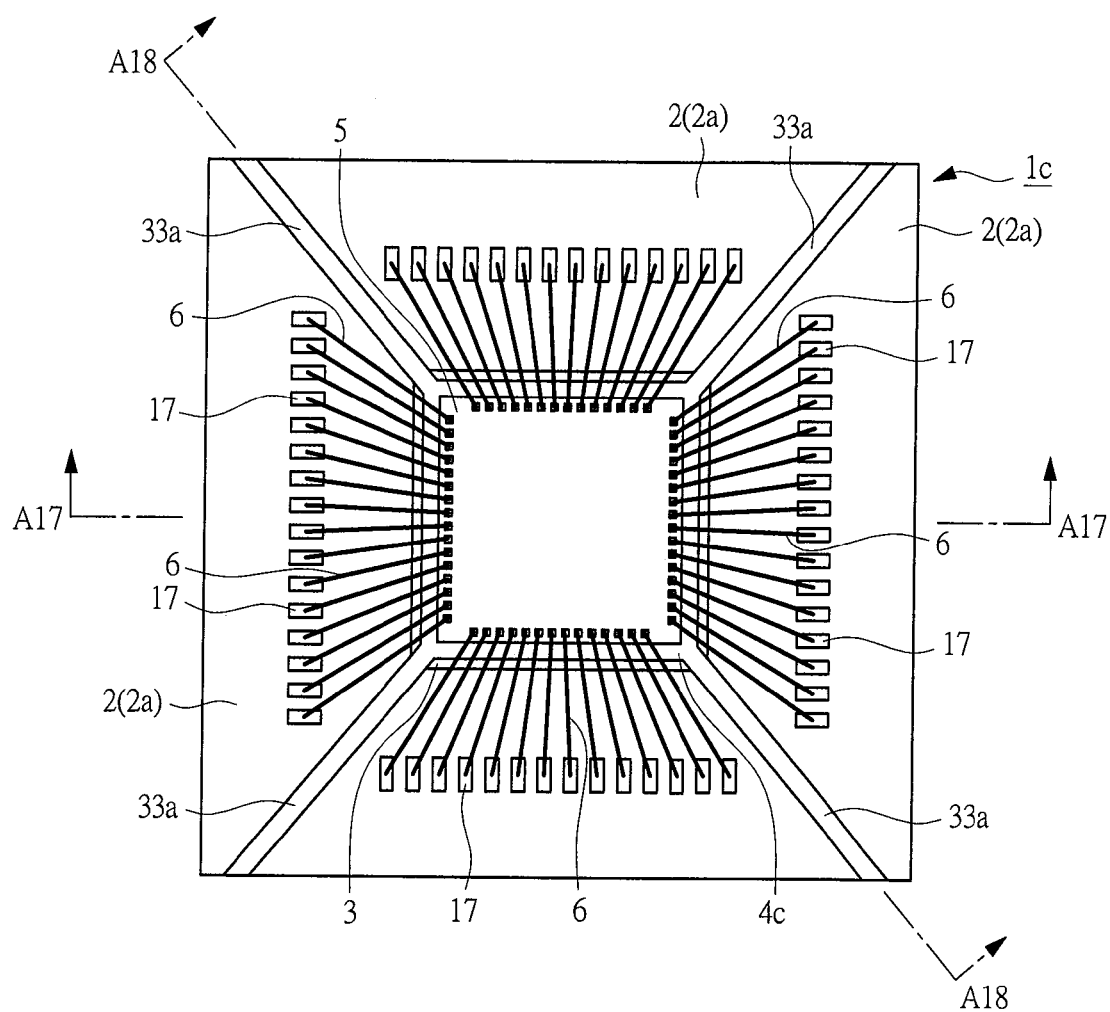
FIG. 108 is a perspective plan view of the semiconductor device of FIG. 106.
Figure 109:
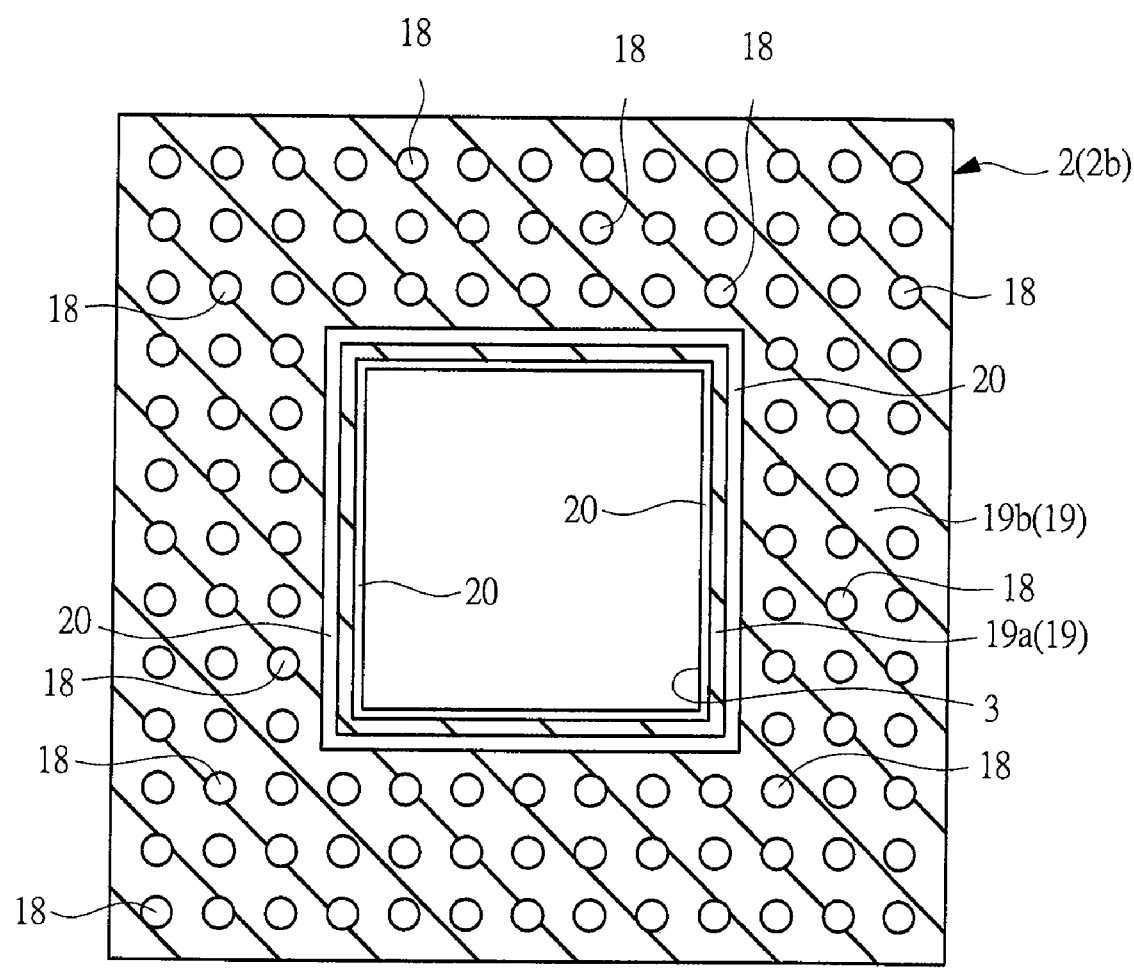
FIG. 109 is a lower surface view of the wiring board in the semiconductor device of FIG. 106.

Further, FIGS. 106 and 107 are cross-sectional views (side cross-sectional views) of the semiconductor device 1c of the present embodiment, and FIG. 108 is a perspective plan view (upper surface view) of the semiconductor device 1c when the sealing resin 7 is seen through. The cross-section cut along the line A17-A17 of FIG. 108 almost corresponds to FIG. 106, and the cross-section cut along the line A18-A18 of FIG. 108 almost corresponds to FIG. 107. Further, FIG. 109 is a lower surface view of the wiring board 2 in the semiconductor conductor device 1c. Although FIG. 109 is a plan view, hatching is applied to a solder resist layer 19 so that the planar shape (pattern) of the solder resist layer 19 on the lower surface 2b of the wiring board 2 is easily understood. Further, though FIG. 103 is a plan view, hatching is applied to the sealing resin 7a and the outer shape of the frame 31a located below the sealing resin 7a is shown by a dotted line for easy understanding. FIG. 103 shows a cutting position (cutting line, dicing line) DL of the cutting process in the step S10b by a two-dot chain line.

For the manufacture of the semiconductor device, the frame 31a in which a plurality of heat sinks 4c are joined as shown in FIGS. 87 to 90 is prepared (step S2b). The frame 31a has a structure in which a plurality of heat sinks 4c are integrally joined with the frame portion 32. More specifically, a plurality of heat sink 4c are disposed in a row at the predetermined intervals (preferably equal intervals) between the two frame portions 32 extending in parallel in the same direction at the predetermined interval, and each heat sink 4c is joined with the frame portion 32 through a joining portion (suspension lead) 33a. The joining portion 33a can be taken also as a suspension lead for suspending (retaining) the heat sink 4c for mounting the semiconductor chip 5 later on the frame portion 32.

The heat sink 4c corresponds to the heat sinks 4 and 4a of the first and second embodiments and is made of the same material as the heat sinks 4 and 4a. The heat sink 4c has the same structure as the heat sinks 4 and 4a of the first and second embodiments except that the protruded portions 11 and 11a and the pin portion 13 are not formed, the taper (inclination) of the side surface 10 of the heat sink 4c is eliminated, and the dimension of the heat sink 4c is made slightly smaller than the dimension of the through-hole 3 of the wiring board 21.

In the frame 31a, one end portion of each joining portion 33a is connected to the heat sink 4c, and the other end portion is connected to the frame portion 32. The joining portion 33a is connected to the upper portion of the heat sink 4c, and the joining portion 33a and the heat sink 4c are integrally formed, and therefore, the joining portion 33a extends until reaching the frame portion 32 in the peripheral edge portion of the upper surface 9a of the heat sink 4c so as to protrude outside from the side surface of the heat sink 4c. Therefore, the one obtained by adding the protruded portion 11a from which the pin portion 13c is omitted and the joining portion 33 integrally connected to the protruded portion 11a in the frame 31 of the second embodiment corresponds to the joining portion 33a in the frame 31a of the present embodiment. Further, it can be said that the one in which the protruded portion 11a provided with no pin portion 13c is extended until reaching the frame portion 32 in the second embodiment corresponds to the joining portion 33a in the frame 31a of the present embodiment.

Further, it is more preferable that the joining portion 33a is connected to each of the four corners of the upper surface 9a of the heat sink 4c as shown in FIGS. 87 and 88, and by this means, the heat sink 4c can be stably joined (retained) to the frame portion 32, and at the same time, when the frame 31a is fixed to the wiring board 21c later, the joining portion 33a and the connecting terminal 17b are less likely to overlap with each other. For the same reason, the extending direction of the joining portion 33a is preferably the diagonal direction of the upper surface 9a of the heat sink 4c.

As shown in FIGS. 88 and 90, the lower surface 32a of the frame portion 32 has pin portions (caulking portions, pin portions for caulking, caulking pins, protruded portions, convex portions) 13e integrally formed with the frame portion 32. As described later, the pin portion 13e is used for fixing the frame portion 32 and the wiring board 21. In the frame 31a, the heat sink 4c, the frame portion 32, the joining portion 33a, and the pin portion 13e are integrally formed of the same material. The frame 31a can be formed by, for example, processing a copper plate and the like by a metal mold. Although the heat sinks 4c appear to be separated from each other in the cross-sectional view of FIG. 89, as evident from FIGS. 87 and 88, the heat sinks 4c are mutually joined in reality through the joining portion 33a and the frame portion 32.

After the frame 31a is prepared, as shown in FIGS. 91 and 92, the semiconductor chip 5 is bonded on the upper surface 9a of each heat sink 4c of the frame 31a through the bonding agent 14 (step S3b). The bonding process of the semiconductor chip 5 in the step S3b can be performed in the same manner as the bonding process of the semiconductor chip 5 in the step S3 of the first embodiment, and therefore, the detailed description thereof will be omitted here.

Further, as shown in FIGS. 93 to 95, the wiring board 21c for the semiconductor device manufacture is prepared (step S1b). Although this wiring board 21c corresponds to the wiring boards 21 of the first and second embodiments, in the present embodiment, the wiring board 21c has a structure in which a plurality of semiconductor device regions 22 from each of which one semiconductor device 1 is formed are disposed (joined) in a row. The wiring board 21c is cut by a cutting process to be described later, and the one separated into each semiconductor device region (board region, unit board region) 22 corresponds to the wiring board 2 of the semiconductor device 1c to be described later. The structure of each semiconductor device region 22 in the wiring board 21c is almost the same as the structure of each semiconductor device region 22 of the wiring board 21 in the first embodiment, and the through-hole 3 is formed in each semiconductor device region 22 of the wiring board 21c, a plurality of connecting terminals 17 and the wirings connected thereto are formed in each of the semiconductor device regions 22 of the upper surface 21a of the wiring board 21c, and a plurality of lands 18 are formed in each of the semiconductor device regions 22 of the lower surface 21b of the wiring board 21.

Further, a plurality of hole portions 15a similar to the hole portion 15 of the second embodiment are formed in the wiring board 21c of the present embodiment, but the forming position of the hole portion 15a is different from that of the hole portion 15 of the second embodiment. More specifically, in the wiring board 21c of the present embodiment, the hole portion 15a is formed at the position planarly overlapped with the pin portion 13e provided on the lower surface 32a of the frame portion 32 when the frame 31a is fixed to the wiring board 21c in the step S5b to be described later. Consequently, the hole portion 15a is formed in the vicinity of the side end portion of the wiring board 21c. The hole portion 15a is a through-hole reaching the lower surface 21b from the upper surface 21a of the wiring board 21c, but the planar dimension of the hole portion 15a is sufficiently smaller as compared with the through-hole 3 for inserting the heat sink 4c.

Next, as shown in FIGS. 96 to 98, the frame 31a is fixed to the wiring board 21c (step S5b). It is necessary to prepare the wiring board 21c in the step S1b before performing this step S5b. Hence, the preparation of the wiring board 21c in the step S1b can be performed also before the step S2b, simultaneously with the step S2b, before the step S3b and after the step S2b, simultaneously with the step S3b or before the step S5b and after the step S3b.

In the first and second embodiments, each of the heat sinks 4 and 4a is separated from the frame 31 into individual pieces, and then, the heat sinks 4 and 4a are disposed inside each of the through-holes 3 of the wiring board 21. However, in the present embodiment, in the step S5b, the frame 31a in a state in which a plurality of heat sinks 4c are joined is fixed to the wiring board 21c.

More specifically, in the step S5b, the frame 31a is positioned and disposed on the upper surface 21a of the wiring board 21c and each heat sink 4c of the frame 31a is inserted (plugged) into each through-hole 3 of the wiring board 21c from the upper surface 21a side of the wiring board 21c, and at the same time, each pin portion 13e of the frame 31a is inserted (plugged) into each hole portion 15a of the wiring board 21c. The through-hole 3 and the hole portion 15a of the wiring board 21c are disposed at the position in which each pin portion 13e of the frame 31a is inserted into each hole portion 15a of the wiring board 21c when each heat sink 4c of the frame 31a is inserted into each through-hole 3 of the wiring board 21c.

In the frame 31a, each heat sink 4c is connected to the frame portion 32 through the joining portion 33a. Hence, when each heat sink 4c of the frame 31a is inserted into each through-hole 3 and each pin portion 13e of the frame 31a is inserted into each hole portion 15a from the upper surface 21a side of the wiring board 21c in the step S5b, the frame portion 32 and the joining portion 33a are overlapped with the upper surface 21a of the wiring board 21c as shown in FIGS. 96 to 98, and therefore, the heat sink 4c does not fall off downward from the through-hole 3 of the wiring board 21c. Consequently, the heat sink 4c can be retained inside the through-hole 3 of the wiring board 21c, each heat sink 4c of the frame 31a is disposed inside each through-hole 3 of the wiring board 21c, and the frame 31a is fixed to the wiring board 21c by the pin portion 13e of the frame 31a.

More specifically, each heat sink 4c in the frame 31a has the joining portion 33a which protrudes to the outside (in the direction away from the center of the upper surface 9a) from the side surface of each heat sink 4c on the peripheral edge portion of the upper surface 9a of each heat sink 4c, and in the step S5b, each heat sink 4c is disposed inside the through-hole 3 of the wiring board 21c so that this joining portion 33a is located on the upper surface 21a of the wiring board 21c outside the through-hole 3 and the lower surface of the joining portion 33a contacts to the upper surface 21a of the wiring board 21c.

Here, the frame 31a and the wiring board 21c are fixed by the same technique as the first technique of the second embodiment. More specifically, for fixing the frame 31a to the wiring board 21c, the pin portion 13e provided on the frame 31a is used.

FIGS. 99 and 100 are explanatory drawings (cross-sectional views) showing a technique for fixing (caulking) the frame 31a to the wiring board 21c by using the pin portion 13e of the frame 31a, and they correspond to FIGS. 61 and 62A of the second embodiment. FIGS. 99 and 100 show the cross-sectional views of the region in the vicinity of the hole portion 15a of the wiring board 21c.

The shape of the pin portion 13e of the frame 31a is the same as the shape of the pin portion 13 in the first technique of the second embodiment. More specifically, as shown in FIG. 99, the side wall (side surface) 13f of the pin portion 13e of the frame 31a is tapered. In other words, the cross-sectional shape (shape of the cross-section vertical to the lower surface 32a of the frame portion 32) of the pin portion 13e of the frame 31a has a tapered shape. Hence, the dimension of the pin portion 13e becomes thinner (smaller) as approaching a top end portion 13g and becomes thicker (larger) as approaching the frame portion 32. In other words, the pin portion 13e is tapered. On the other hand, as shown in FIG. 99, the inner wall of the hole portion 15a of the wiring board 21c before the pin portion 13e of the frame 31a is inserted has no tapered shape, and is kept almost vertical to the upper surface 21a of the wiring board 21c. Then, the dimension of the hole portion 15a before the pin portion 13e is inserted is made the same as or slightly larger than the dimension of the top end portion 13g of the pin portion 13e, and moreover, is made smaller than the dimension of a root portion (portion close to the frame 32) of the pin portion 13e.

In the step S5b, as shown in FIGS. 99 to 100, the pin portion 13e of the frame 31a is inserted (plugged) into the hole portion 15a of the wiring board 21c, and the pin portion 13e of the frame 31a and the wiring board 21c can be caulked (fixed) by the tapered shape of the pin portion 13e. By this means, the frame 31a can be fixed to the wiring board 21c.

More specifically, when the pin portion 13e of the frame 31a is inserted into the hole portion 15a of the wiring board 21c in the step S5b, the side wall 13f of the pin portion 13e contacts and adheres to the inner wall of the hole portion 15a of the wiring board 21c, and the inner wall of the hole portion 15a of the wiring board 21c is expanded in the lateral direction by the tapered shape of the side wall 13f of the pin portion 13e, and the side wall 13f of the pin portion 13e is tightened up by the inner wall of the hole portion 15a of the wiring board 21c by its reaction. By this means, the pin portion 13e of the frame 31a can be caulked (fixed) to the wiring board 21c, and the frame 31a can be fixed to the wiring board 21c.

Further, the step S3b (bonding process of the semiconductor chip 5) can be performed before the step S6b to be described later (wire bonding process) and after the step S5b (process of fixing the frame 31a to the wiring board 21c).

After the frame 31a is fixed to the wiring board 21c in the step S5b, as shown in FIGS. 101 and 102, the wire bonding process is performed, and each electrode 5d of the semiconductor chip 5 and the connecting terminal 17 formed in the wiring board 21c corresponding thereto are electrically connected through the bonding wire 6 (step S6b). More specifically, a plurality of connecting terminals 17 of each semiconductor device region 22 of the upper surface 21a of the wiring board 21c and a plurality of electrodes 5a of the semiconductor chip 5 bonded (mounted) on the heat sink 4c disposed inside the through-hole 3 of the semiconductor device region 22 are electrically connected through a plurality of bonding wires 6, respectively.

After the wire bonding process, as shown in FIGS. 103 and 104, the resin sealing by a molding process (for example, transfer molding process) is performed so as to form a sealing resin 7a (sealing portion), thereby sealing (resin-sealing) the semiconductor chip 5 and the bonding wire 6 by the sealing resin 7a (step S7b).

In the present embodiment, as shown in FIGS. 103 and 104, the collective sealing for collectively sealing the plurality of semiconductor device regions 22 of the upper surface 21a of the wiring board 21c by the sealing resin 7a is performed in the molding process in the step S7b. More specifically, the sealing resin 7a is formed so as to cover the semiconductor chip 5 and the bonding wire 6 on the plurality of semiconductor device regions 22 of the upper surface 21a of the wiring board 21c. In this case, the sealing resin 7a is formed to cover the plurality of semiconductor device regions 22 of the upper surface 21a of the wiring board 21c, and the frame 31a disposed on the upper surface 21a of the wiring board 21c is also covered (sealed) with the sealing resin 7a except for a part of the frame portion 32.

After the frame 31a is fixed to the wiring board 21c in the step S5b, a state in which the upper surface 21a of the wiring board 21c is directed upward without turning the wiring board 21c upside down is preferably maintained until the molding process in the step S7b is performed. More specifically, after fixing the frame 31a to the wiring board 21c in the step S5b, the wiring board 21c has the upper surface 21a directed upward so that the lower surface 21b thereof is not directed upward until the molding process in the step S7b is performed. As a result, the falling off of the frame 31a from the wiring board 21c before the sealing resin 7a is formed can be prevented more precisely. By forming the sealing resin 7a, the frame 31a and the wiring board 21c are solidly bonded by the sealing resin 7a, and therefore, after forming the sealing resin 7a, the wiring board 21c may be directed to any direction (lower surface 21b of the wiring board 21c may be directed upward).

Next, as shown in FIG. 105, the solder balls 8 are connected (bonded) to the lands 18 of the lower surface 21b of the wiring board 21c (step S8b). Then, marking is performed as needed and a mark such as a product number and the like is applied on the surface of the sealing resin 7a (step S9b). Since the connecting process of the solder balls 8 in the step S8b and the marking process in the step S9b can be performed in the same manner as the connecting process of the solder balls 8 in the step S8 and the marking process in the step S9 of the first embodiment, the detailed description thereof will be omitted here. The marking process in the step S9b may be performed after the connecting process of the solder balls 8 in the step S8b is performed, the connecting process of the solder balls 8 in the step S8b may be performed after the marking process in the step S9b is performed, or the marking process in the step S9b may be omitted if not required.

Next, the wiring board 21c and the sealing resin 7a formed thereon are cut (diced) and separated (divided) into each semiconductor device region 22 (step S10b). In the step S10b, the wiring board 21c, the frame 31a and the sealing resin 7a are cut along a cutting position (cutting line, dicing line) DL shown by the two-dot chain line in FIG. 103. In the present embodiment, the cutting process in the step S10b is performed by dicing.

By the cutting/segmentation into individual pieces performed in this manner, the semiconductor device 1c as shown in FIGS. 106 to 109 is manufactured. The wiring board 21c cut and separated (divided) into each semiconductor device region corresponds to the wiring board 2 of the semiconductor device 1c, and the sealing resin 7a cut and separated (divided) into each semiconductor device region 22 corresponds to the sealing resin 7 of the semiconductor device 1c.

In the present embodiment, since the sealing resin 7a is formed in a state in which the frame 31a is disposed (fixed) on the upper surface 21a of the wiring board 21c, when the wiring board 21c and the sealing resin 7a formed thereon are cut in the step S10b, the frame 31a is also cut. In this step S10b, as shown in FIG. 103, the wiring board 21c, the frame 31a and the sealing resin 7a thereon are cut so that the frame portion 32 is not contained in the semiconductor device 1c. More specifically, an excess region not contained in the semiconductor device region 22 is provided in advance at a side end portion of the wiring board 21c, so that the frame portion 32 is positioned on this excess region when the frame 31a is fixed to the wiring board 21c in the step S5b. Then, in the step S10b, the excess region of the wiring board 21c is cut and removed together with the frame portion 32 and the sealing resin 7a thereon. In this manner, the frame portion 32 is not contained in the semiconductor device 1c. Since the pin portion 13e of the frame 31a is provided in the frame portion 32 and the hole portion 15a of the wiring board 21c is provided in the excess region, the pin portion 13e and the hole portion 15a are not contained in the manufactured semiconductor device 1c.

The structure of the manufactured semiconductor device 1c will be described in relation to the difference from the semiconductor device 1a of the second embodiment.

The heat sink 4c has almost the same structure as the heat sinks 4 and 4a of the first and second embodiments except that the protruded portions 11 and 11a and the pin portion 13 are not formed, the taper (inclination) of the side surface 10 of the heat sink 4c is eliminated, and the dimension of the heat sink 4c is made slightly smaller than the dimension of the through-hole 3 of the wiring board 21 (wiring board 2). In the semiconductor device 1c of the present embodiment, the side surface (side wall) 10a of the heat sink 4c disposed inside the through-hole 3 of the wiring board 2 and the inner wall of the through-hole 3 of the wiring board 2 are slightly spaced apart, and a resin material constituting the sealing resin 7 is interposed (for example, with the thickness of about 50 to 100 μm) between the inner wall of the through-hole 3 of the wiring board 2 and the side surface (side wall) 10a of the heat sink 4c. The reason therefor is as follows.

In the first and second embodiments, after the heat sinks 4 and 4a are segmented into individual pieces, the individually segmented heat sinks 4 and 4a are inserted into each of the plurality of through-holes 3 of the wiring board 21 in the step S5. Hence, even if the dimension of these heat sinks 4 and 4a and the dimension of the through-hole 3 are matched, it is easy to dispose the heat sinks 4 and 4a inside each through-hole 3 of the wiring board 21. Hence, the side surfaces 10 of the heat sinks 4 and 4a contact to the inner wall of the through-hole 3, and it is possible to prevent the resin material from flowing between the side surfaces 10 of the heat sinks 4 and 4a and the inner wall of the through-hole 3 in the resin sealing process.

In contrast to this, in the present embodiment, the heat sink 4c is not segmented into individual pieces, and the heat sink 4c is inserted into each of the plurality of through-holes 3 of the wiring board 21c in a state in which the plurality of heat sinks 4c are joined by the joining portion 33a and the frame portion 32 in the step S5b. Hence, if the dimension of the heat sink 4c and the dimension of the through-hole 3 are matched, it is difficult to insert each of the plurality of heat sinks 4c joined to each other into the through-hole 3 of the wiring board 21c. Therefore, in the present embodiment, the dimension (planar dimension of the portion inserted into the through-hole 3) of the heat sink 4c is made slightly smaller than the dimension (planar dimension) of the through-hole 3.

By this means, even when the heat sink 4c is inserted into each of the plurality of through-holes 3 of the wiring board 21c in a state in which the plurality of heat sinks 4c are mutually joined, the heat sink 4c can be easily and precisely disposed (inserted) inside each through-hole 3 of the wiring board 21c.

Since the dimension of the heat sink 4c is slightly smaller than the dimension of the through-hole 3 in the present embodiment, the resin material constituting the sealing resin 7a flows between the inner wall of the through-hole 3 of the wiring board 21c and the side surface (side wall) 10a of the heat sink 4c in the molding process in the step S7b. As a result, the resin material constituting the sealing resin 7 is interposed between the inner wall of the through-hole 3 of the wiring board 21c (wiring board 2) and the side surface (side wall) 10a of the heat sink 4c, and therefore, the heat sink 4c is further firmly fixed. More specifically, in the molding process in the step S7b, a part of the sealing resin 7a is formed between the inner wall of the through-hole 3 of the wiring board 21c and the side surface (side wall) 10a of the heat sink 4c.

Further, in the molding process in the step S7b, a gap between the inner wall of the through-hole 3 of the wiring board 21c and the side surface (side wall) 10a of the heat sink 4c into which the resin material flows is a gap at most equivalent to an air vent of a resin sealing metal mold and is about 50 to 100 μm, and therefore, the filler of the resin material constituting the sealing resin 7a does not flow in this gap, but the liquid resin flows therein. Hence, in the semiconductor device 1c, the portion of the sealing resin 7 interposed between the inner wall of the though-hole 3 of the wiring board 2 and the side surface (side wall) 10a of the heat sink 4c does not contain the filler, but the other portion of the sealing resin 7 (portion on the upper surface 2a of the wiring board 2, on the upper surface of the heat sink 4c and on the semiconductor chip 5) contains the filler.

Further, in the present embodiment, in the molding process in the step S7b, in order to prevent the resin material, which flows between the inner wall of the through-hole 3 of the wiring board 21c and the side surface (side wall) 10a of the heat sink 4c, from overflowing to the lower surface 21a side of the wiring board 21c and adhering to the land 18, a shape of the solder resist layer 19 formed on the lower surface 21b (that is, the lower surface 2b of the wiring board 2) of the wiring board 21c is devised as follows.

On the upper surface 2a and the lower surface 2b of the wiring board 2, the solder resist layer to expose the connecting terminal 17 and the land 18 is formed. In FIGS. 106, 107 and 109, the solder resist layer 19 formed on the lower surface 2b of the wiring board 2 is illustrated. Note that, although the solder resist layer is formed also on the upper surface 2a of the wiring board 2, the illustration thereof is omitted. Further, in the first and second embodiments, the illustrations of both of the solder resist layer formed on the upper surface 2a of the wiring board 2 and the solder resist layer formed on the lower surface 2b are omitted.

On the lower surface 2b of the wiring board 2, the solder resist layer 19 is formed in the hatched region in FIG. 109. A region 20 is a region in which the solder resist layer 19 is not formed on the lower surface 2b of the wiring board 2 and is a region in which the lower surface of the base material layer (base material layer 16) of the wiring board 2 is exposed.

As evident also from FIG. 109, though the solder resist layer 19 is formed on the lower surface 2b of the wiring board 2 in the present embodiment, the solder resist layer 19 of the lower surface 2b of the wiring board 2 includes a first solder resist portion 19a provided to surround the periphery of the through-hole 3 in the vicinity of the through-hole 3 and a second solder resist portion 19b located on the periphery (outer periphery) of the first solder resist portion 19a. Between the first solder resist portion 19a and the second solder resist portion 19b, a region (dam region) 20 in which the solder resist layer 19 is not formed and the base material layer (base material layer 16) of the wiring board 2 is exposed is present. Consequently, the first solder resist portion 19a and the second solder resist portion 19b are isolated with interposing the region 20 therebetween. The plurality of lands 18 provided on the lower surface 2b of the wiring board 2 are exposed from an opening formed in the second solder resist portion 19b. The second solder resist portion 19b has an opening for exposing the land 18, and a conductive pattern for the land 18 is exposed from this opening. The opening of the solder resistor layer 19 for exposing the land 18 is formed in the second solder resist portion 19b and is not formed in the first solder resist portion 19a.

The pattern shape of the solder resist layer 19 on the lower surface 2b of the wiring board 2 has been illustrated and described, but since the wiring board 21c cut in the step S10b becomes the wiring board 2, the pattern shape of the solder resist layer on the lower surface 21b of the wiring board 21c is also the same as the pattern shape of the solder resist layer 19 on the lower surface 2b of the wiring board 2.

In the molding process in the step S7b, the resin material (mold resin) which flows between the inner wall of the through-hole 3 of the wiring board 21c and the side surface (side wall) 10a of the heat sink 4c is likely to overflow to the lower surface 21b side of the wiring board 21c. For its prevention, in the present embodiment, since the region (dam region) 20 in which the solder resist layer 19 is not present and the base material layer (base material layer 16) of the wiring board 21 is exposed is provided between the first solder resist portion 19a and the second solder resist portion 19b, the resin material (mold resin) overflowed to the lower surface 21b side of the wiring board 21c from the gap between the through-hole 3 and the heat sink 4c can be prevented from spreading on the second solder resist portion 19b over the region 20. Hence, it is possible to prevent the resist material from adhering to the land 18 of the lower surface 21b of the wiring board 21c in the molding process in the step S7b, and the reliability of the connection between the land 18 and the solder ball 8 can be improved.

Further, in the present embodiment, a plurality of heat sinks 4c are joined by the joining portion 33a and the frame portion 32 until the cutting process in the step S10b is performed, and these heat sinks 4c are segmented into individual pieces in the step S10b. Therefore, in the semiconductor device 1c, the joining portion 33a of the frame 31a is left on the upper surface 2a of the wiring board 2 and sealed by the sealing resin 7 while being connected to the heat sink 4c, and a cut surface (end portion) of the joining portion 33a is exposed on the cut surface (that is, the side surface of the semiconductor device 1c) in the step S10b. In the first and second embodiments, the protruded portions 11 and 11a of the heat sinks 4 and 4a prevent the heat sinks 4 and 4a from falling off from the through-hole 3 of the wiring board 21, whereas the joining portion 33a has this function in the present embodiment. Consequently, in the semiconductor device 1c, the joining portion 33a integrally connected to the heat sink 4c has the same structure as the protruded portion 11a of the second embodiment except that the pin portion 13 is not formed and the joining portion 33a extends on the upper surface 2a of the wiring board 2 until reaching the side surface of the semiconductor device 1c. Therefore, in the semiconductor device 1c, the heat sink 4c is integrally provided with the joining portion 33a which is a protruded portion protruding to the outside (in the direction away from the center of the upper surface 9a) of the side surface 10 of the heat sink 4c in the peripheral edge portion (peripheral portion) of the upper surface 9a of the heat sink 4c, and this joining portion 33a is positioned (extended) on the upper surface 2a of the wiring board 2 outside the through-hole 3. More specifically, in the semiconductor device 1c, the heat sink 4c is integrally provided with the joining portion 33a, which protrudes to the upper surface 2a side of the wiring board 2 from the through-hole 3 and extends on the upper surface 2a of the wiring board 2 (extends until reaching the side surface of the wiring board 2), on the peripheral edge portion of the upper surface 9a of the heat sink 4c, and the lower surface of the joining portion 33a contacts to the upper surface 2a of the wiring board 2.

Since other structure of the semiconductor device 1c is almost the same as the semiconductor device 1 of the first embodiment, the description thereof will be omitted here.

Figure 110:
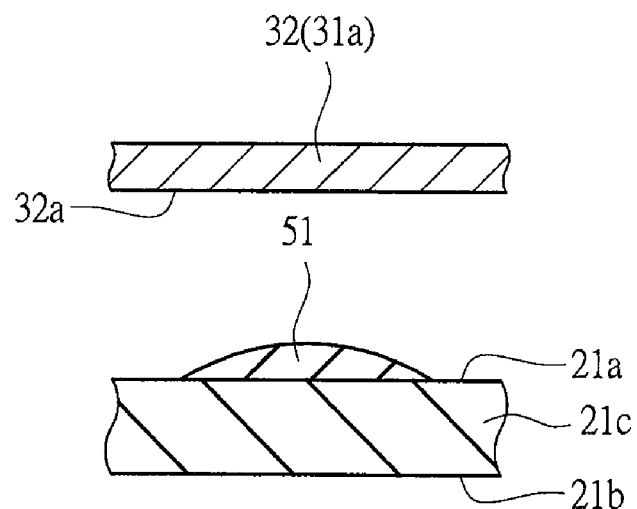
FIG. 110 is an explanatory drawing showing a technique of fixing the frame to the wiring board by using a bonding agent.
Figure 111:
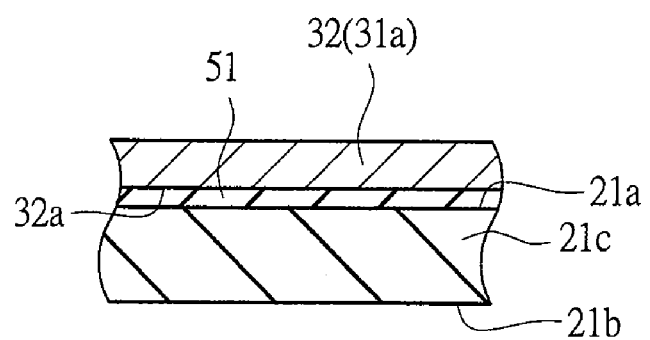
FIG. 111 is an explanatory drawing showing a technique of fixing the frame to the wiring board by using the boding agent.

In the manufacturing process described with reference to FIGS. 86 to 105, a technique for inserting the pin portion 13e provided in the frame 31a into the hole portion 15a provided in the wiring board 21c is used for fixing the frame 31a to the wiring board 21c in the step S5b. However, as another embodiment, the frame 31a can be fixed to the wiring board 21c by using the bonding agent in the step S5b. FIGS. 110 and 111 are explanatory drawings (cross-sectional views) showing a technique for fixing the frame 31a to the wiring board 21c by using the bonding agent, and they correspond to FIGS. 99 and 100, respectively.

When the frame 31a is fixed to the wiring board 21c by using the bonding agent, the pin portion 13e is not provided in the frame 31a, and the hole portion 15a is not provided in the wiring board 21c. Instead, in the step S5b, as shown in FIG. 110, a bonding agent 51 is coated (disposed) in advance on the upper surface 21a of the wiring board 21c, and then, the frame 31a is disposed on the upper surface 21a of the wiring board 21c so that the frame portion 32 of the frame 31a is positioned on the bonding agent. At this time, each heat sink 4c of the frame 31a is inserted into each through-hole 3 of the wiring board 21c from the upper surface 21a side of the wiring board 21c. More specifically, the bonding agent 51 is coated at the position on the upper surface 21a of the wiring board 21c on which the frame portion 32 overlaps when each heat sink 4c of the frame 31a is inserted into each through-hole 3 of the wiring board 21c. By this means, each heat sink 4c of the frame 31a is inserted into each through-hole 3 from the upper surface 21a side of the wiring board 21c, and at the same time, as shown in FIG. 111, the lower surface 32a of the frame portion 32 of the frame 31a is bonded to the upper surface 21a of the wiring board 21c through the bonding agent 51, so that the frame 31a is fixed to the wiring board 21c. As the bonding agent 51, a film type bonding agent such as a DAF (die attach film) can be also used.

In the manufacturing process described with reference to FIGS. 86 to 105, the pin portion 13e and the hole portion 15a are provided in the region not contained later in the semiconductor device 1c. However, as another embodiment, the pin portion 13e and the hole portion 15a can be provided in the region contained later inside the semiconductor device 1c, and the manufacturing process in this case will be described with reference to FIGS. 112 to 124.

Figure 112:
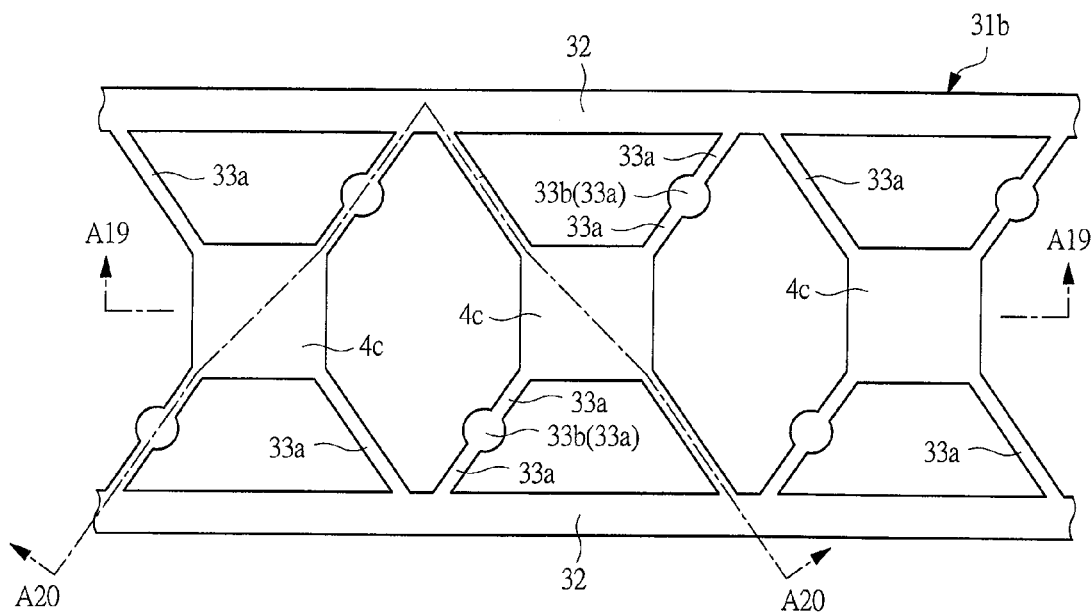
FIG. 112 is an upper surface view of a frame used in the manufacturing process of the semiconductor device according to another embodiment of the present invention.
Figure 113:
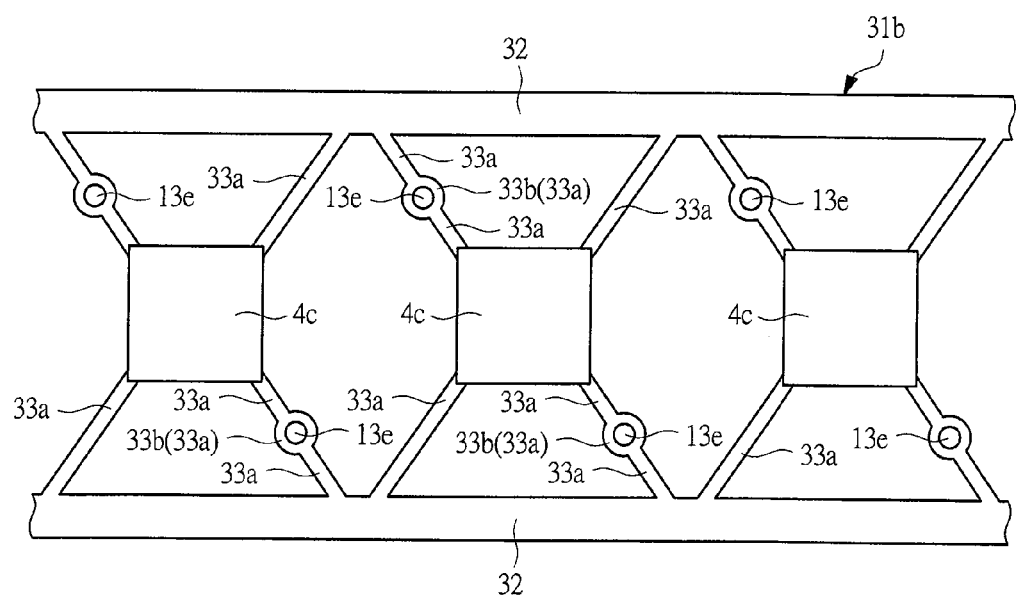
FIG. 113 is a lower surface view of the frame of FIG. 112.
Figure 114:
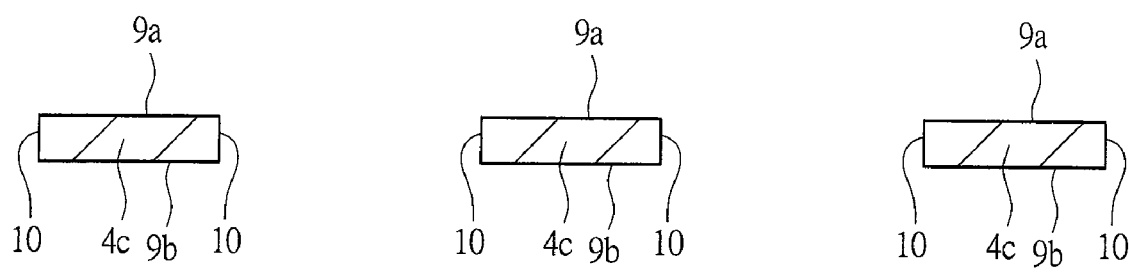
FIG. 114 is a cross-sectional view of the frame of FIG. 112.
Figure 115:
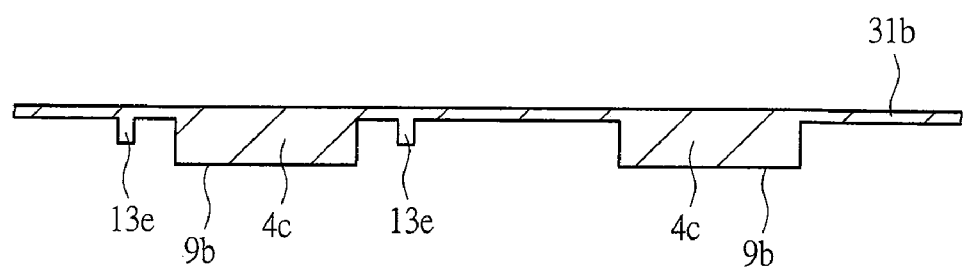
FIG. 115 is another cross-sectional view of the frame of FIG. 112.
Figure 116:
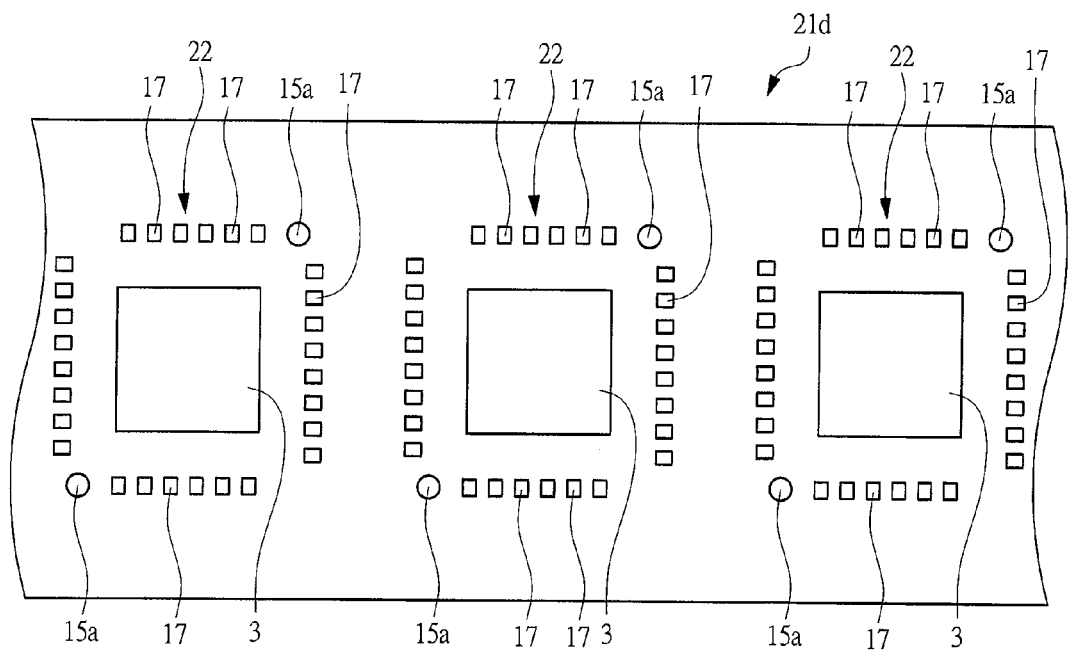
FIG. 116 is an upper surface view of the wiring board used in the manufacturing process of the semiconductor device according to another embodiment of the present invention.
Figure 117:
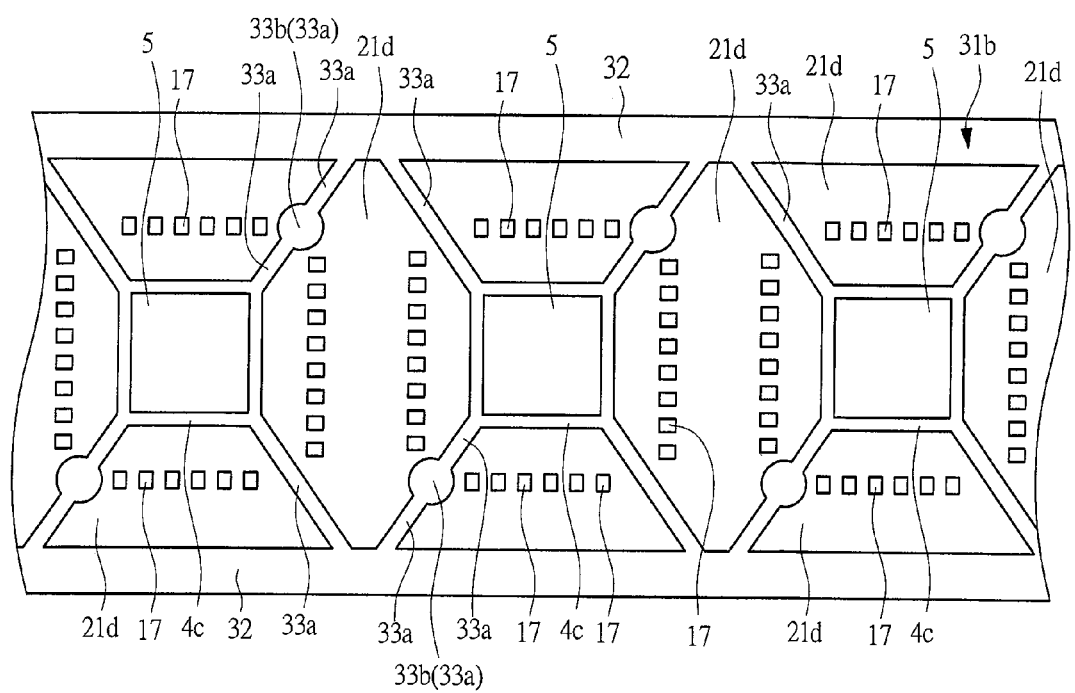
FIG. 117 is a plan view showing the manufacturing process of the semiconductor device according to another embodiment of the present invention.
Figure 118:
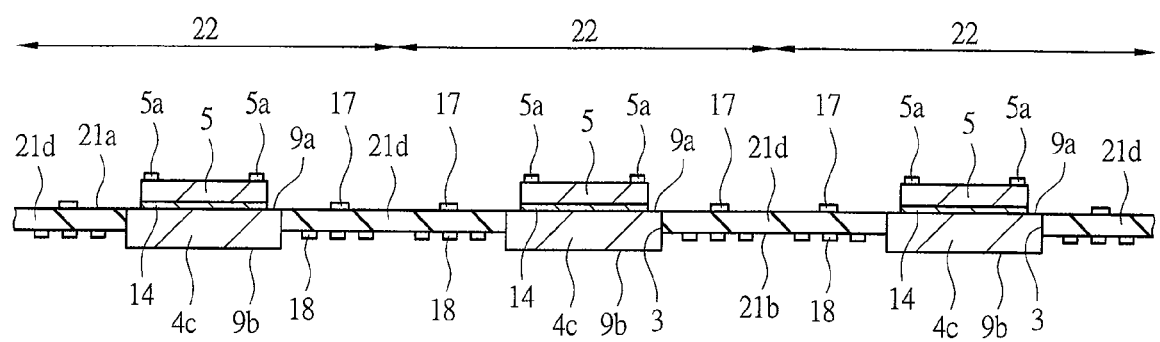
FIG. 118 is a cross-sectional view showing the same manufacturing process of the semiconductor device as FIG. 117.
Figure 119:
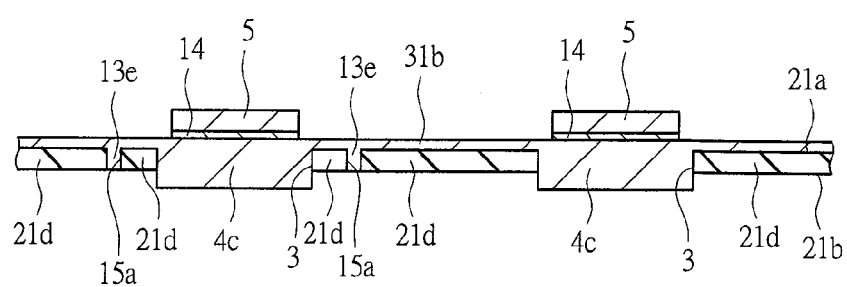
FIG. 119 is another cross-sectional view showing the same manufacturing process of the semiconductor device as FIG. 117.
Figure 120:
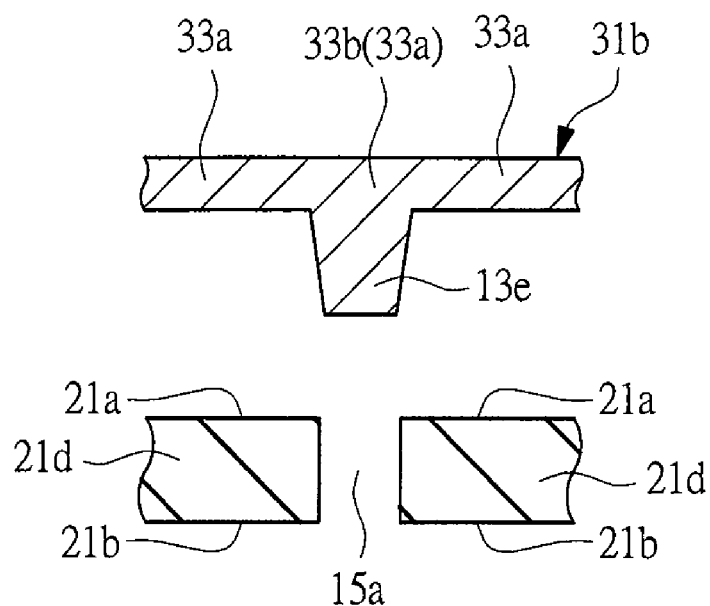
FIG. 120 is an explanatory drawing showing a technique of fixing the frame to the wiring board.
Figure 121:
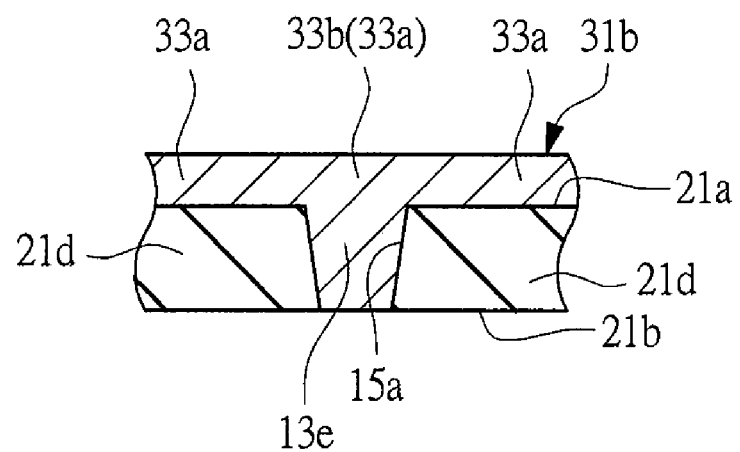
FIG. 121 is an explanatory drawing showing a technique of fixing the frame to the wiring board.
Figure 122:
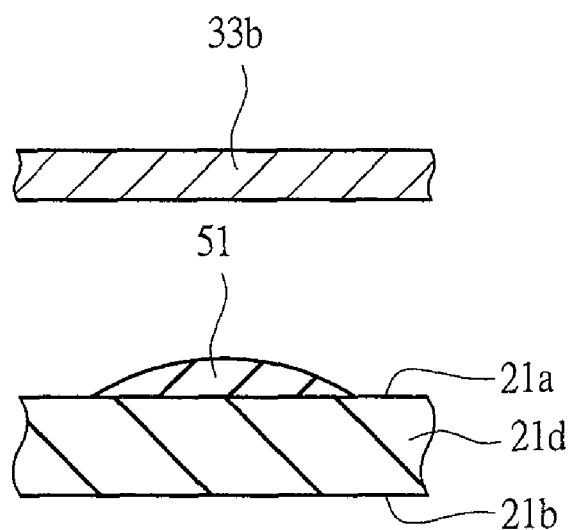
FIG. 122 is an explanatory drawing showing a technique of fixing the frame to the wiring board.
Figure 123:
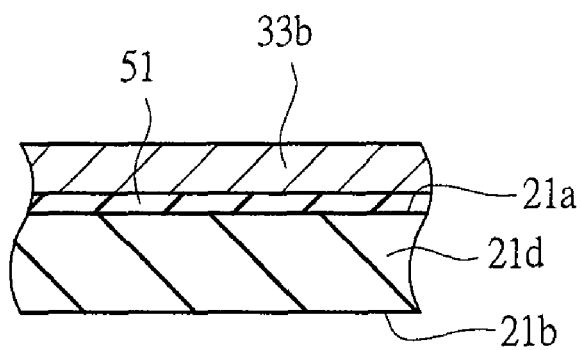
FIG. 123 is an explanatory drawing showing a technique of fixing the frame to the wiring board.
Figure 124:
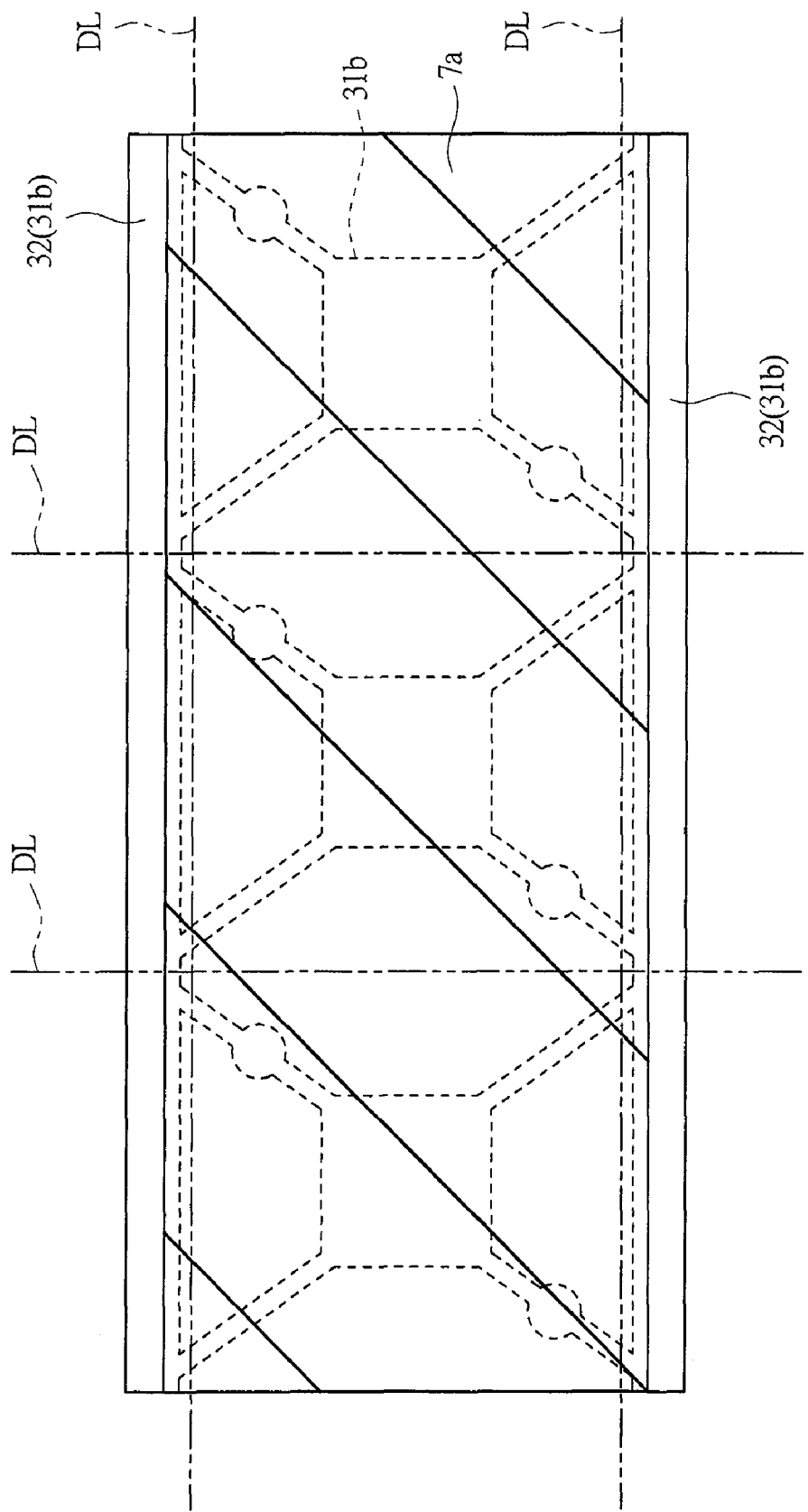
FIG. 124 is a plan view showing the manufacturing process of the semiconductor device subsequent to FIG. 117.

FIG. 112 is an upper surface view (plan view) of the frame 31b used in another manufacturing process of the present embodiment, FIG. 113 is a lower surface view (plan view) of the frame 31b of FIG. 112, and FIGS. 114 and 115 are cross-sectional views of the frame 31b of FIG. 112. The cross-section cut along the line A19-A19 of FIG. 112 corresponds to FIG. 114, and the cross-section cut along the line A20-A20 of FIG. 112 corresponds to FIG. 115. Also, FIG. 116 is an upper surface view (plan view) of the wiring board 21d used in another manufacturing process of the present embodiment, and it corresponds to FIG. 93. FIGS. 117 to 119 are a plan view (upper surface view) and cross-sectional view in another manufacturing process of the present embodiment, and FIG. 117 shows a planar region corresponding to FIGS. 112 and 116, and FIG. 118 shows the cross-section corresponding to FIG. 114, and FIG. 119 shows the cross-section corresponding to FIG. 115. FIGS. 120 and 121 are explanatory drawings (cross-sectional views) showing a technique for fixing the frame 31b to the wiring board 21d by using the pin portion 13e of the frame 31b, and FIGS. 122 and 123 are explanatory drawings (cross-sectional views) showing a technique for fixing the frame 31b to the wiring board 21d by using the bonding agent 51. FIG. 124 is a plan view (upper surface view) showing a state in which the sealing resin 7a is formed in another manufacturing process of the present embodiment, and it shows a planar region corresponding to FIG. 117. Also, although FIG. 124 is a plan view, hatching is applied to the sealing resin 7a for easy understanding, and an outer shape of the frame 31b located below the sealing resin 7a is shown by a dotted line. Further, a cutting position (cutting line, dicing line) DL of the cutting process in the step S10b is shown by the two-dot chain line in FIG. 124.

For the manufacture of the semiconductor device, the frame 31b in which a plurality of heat sinks 4c are joined as shown in FIGS. 112 to 115 is prepared in the step S2b. The frame 31b has the same structure as the frame 31a used in the manufacturing process described with reference to FIGS. 86 to 105 except that a wide portion (island portion) 33b is provided in the joining portion 33a and the pin portion 13e is provided on the lower surface of the wide portion 33b instead of the lower surface of the frame portion 32. The material of the frame 31b is the same as those of the frames 31 and 31a.

The wide portion 33b is provided in the midst of the joining portion 33a and is a portion in which the width of the joining portion 33a is locally widened. Consequently, the wide portion 33b can be also taken as a part of the joining portion 33a, and in the joining portion 33a, the width of the wide portion 33b is larger than the width of the region other than the wide portion 33b, and the pin portion 13e is integrally formed on the lower surface of this wide portion 33b. Also, it is not always necessary to provide the wide portion 33b and the pin portion 13e for all of the joining portions 33a, and the wide portion 33b and the pin portion 13e may be provided for at least one of the plurality (four in this case) of the joining portions 33a joined to each heat sink 4c. However, it is more preferable to provide the wide portion 33b and the pin portion 13e for two joining portions located in the diagonal direction with interposing the heat sink 4c therebetween of the four joining portions 33a joined to each heat sink 4c as shown in FIG. 112 because both the easiness of fixing of the frame 31b to the wiring board 21d and the strengthening of the fixing force can be satisfied. Although the frame 31a and the frame 31b are different in the position of the pin portion 13e, since the shape of the pin portion 13e is the same, the description thereof will be omitted here.

Further, in the step S1b, as shown in FIG. 116, the wiring board 21d for the manufacture of the semiconductor device is prepared. However, the wiring board 21d has the same structure as the wiring board 21c used in the manufacturing process described with reference to FIGS. 86 to 105 except that the position of the hole portion 15a is different. More specifically, as a result of the change of the position of the pin portion 13e between the frame 31a and the frame portion 31b, the position of the hole portion 15a is also changed between the wiring board 21c and the wiring board 21d. While the hole portion 15a is formed in an excess region outside the semiconductor device region 22 (region not contained in the semiconductor device 1c in the cutting process in the step S10b) in the wiring board 21c, the hole portion 15a is formed inside each semiconductor device region 22 in the wiring board 21d. The wiring board 21c and the wiring board 21d are different in the position of the hole portion 15a. However, since the shape of the hole portion 15a is the same, the description thereof will be omitted here.

After the frame 31b is prepared, the semiconductor chip 5 is bonded on the upper surface 9a of each heat sink 4c of the frame 31b through the bonding agent 14 in the step S3b. This process is the same as the manufacturing process described with reference to FIGS. 86 to 105.

Next, in the step S5b, the frame 31b is fixed to the wiring board 21d. FIGS. 117 to 119 show a state in which the frame 31b is fixed to the wiring board 21d.

The frame 31b is fixed to the wiring board 21d in the step S5b, but this process is the same as the manufacturing process described with reference to FIGS. 86 to 105 except for the positions of the pin portion 13e and the hole portion 15a for fixing the frame 31b and the wiring board 21d.

More specifically, in the step S5b, the frame 31b is positioned and disposed on the upper surface 21a of the wiring board 21d and each heat sink 4c of the frame 31b is inserted (plugged) into each through-hole 3 of the wiring board 21d from the upper surface 21a side of the wiring board 21d, and at the same time, each pin portion 13e of the frame 31b is inserted (plugged) into each hole portion 15a of the wiring board 21d. Since the frame portion 32 and the joining portion 33a are overlapped with the upper surface 21a of the wiring board 21d, the heat sink 4c does not fall off downward from the through-hole 3 of the wiring board 21d. The through-hole 3 and the hole portion 15a of the wiring board 21d are located at the position at which each pin portion 13e of the frame 31b is inserted into each hole portion 15a of the wiring board 21d when each heat sink 4c of the frame 31b is inserted into each through-hole 3 of the wiring board 21d.

A principle of fixing the frame 31b to the wiring board 21d is the same as the case where the frame 31a is fixed to the wiring board 21c. More specifically, as shown in FIG. 120, the pin portion 13e provided on the lower surface of the wide portion 33b of the joining portion 33a of the frame 31b is also tapered, and in the step S5b, as shown in FIGS. 120 and 121, the pin portion 13e of the frame 31b is inserted (pushed) into the hole portion 15a of the wiring board 21d, and the pin portion 13e of the frame 31b and the wiring board 21d can be caulked (fixed) by the tapered shape of the pin portion 13e. By this means, the frame 31b is fixed to the wiring board 21d.

While the case where a technique for inserting the pin portion 13e provided in the frame 31b into the hole portion 15a provided in the wiring board 21d is used for fixing the frame 31b to the wiring board 21d has been described, as another embodiment, the frame 31b can be fixed to the wiring board 21d by using the bonding agent in the step S5b. FIGS. 122 and 123 are explanatory drawings (cross-sectional views) showing a technique for fixing the frame 31b to the wiring board 21d by using the bonding agent.

When the frame 31b is fixed to the wiring board 21d by using the bonding agent, the pin portion 13e is not provided in the frame 31b, and the hole portion 15a is not provided in the wiring board 21d. Instead, in the step S5b, as shown in FIG. 122, the bonding agent 51 is coated (disposed) in advance on the upper surface 21a of the wiring board 21d, and then, the frame 31b is disposed on the upper surface 21a of the wiring board 21d so that the wide portion 33b of the joining portion 33a of the frame 31b is positioned on the bonding agent 51. At this time, each heat sink 4c of the frame 31b is inserted into each through-hole 3 of the wiring board 21d from the upper surface 21a side of the wiring board 21d. More specifically, the bonding agent 51 is coated at the position on the upper surface 21a of the wiring board 21d on which the wide portion 33b of the joining portion 33a of the frame 31b overlaps when each heat sink 4c of the frame 31b is inserted into each through-hole 3 of the wiring board 21d. By this means, each heat sink 4c of the frame 31b is inserted into each through-hole 3 from the upper surface 21a side of the wiring board 21d, and at the same time, as shown in FIG. 123, the lower surface of the wide portion 33b of the joining portion 33a of the frame 31b is bonded to the upper surface 21a of the wiring board 21d through the bonding agent 51, so that the frame 31b is fixed to the wiring board 21d.

The subsequent process is the same as the manufacturing process described with reference to FIGS. 86 to 105. More specifically, the wire bonding process in the step S6b, the molding process in the step S7b, the solder ball 8 connecting process in the step S8b, the marking process in the step S9b, and the cutting process in the step S10b are performed.

In this step S10b, the wiring board 21d, the frame 31b and the sealing resin 7a are cut along the cutting position (cutting line, dicing line) DL shown by the two-dot chain line in FIG. 124. However, in the manufacturing process described with reference to FIGS. 86 to 105, the pin portion 13e and the hole portion 15a are provided in the region (excess region) not contained later inside the semiconductor device 1c in the frame 31a and the wiring board 21c, but in this case, the pin portion 13e and the hole portion 15a are provided in the region (semiconductor device region 22) contained later inside the semiconductor device 1c in the frame 31b and the wiring board 21d. Therefore, as evident from FIG. 124 and FIGS. 125 and 126 to be described later, the wide portion 33b, the pin portion 13e and the hole portion 15a are contained in the manufactured semiconductor device 1c.

Figure 125:
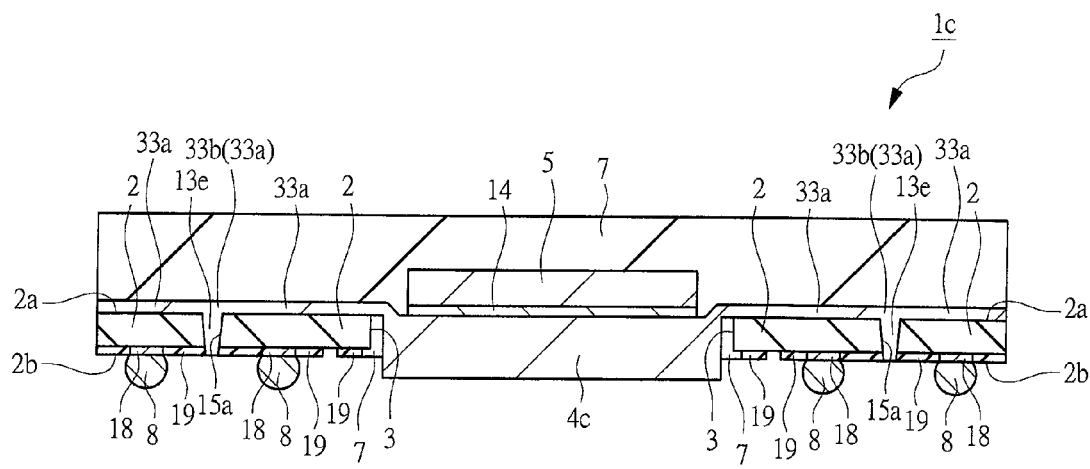
FIG. 125 is a cross-sectional view of a semiconductor device according to another embodiment of the present invention.
Figure 126:
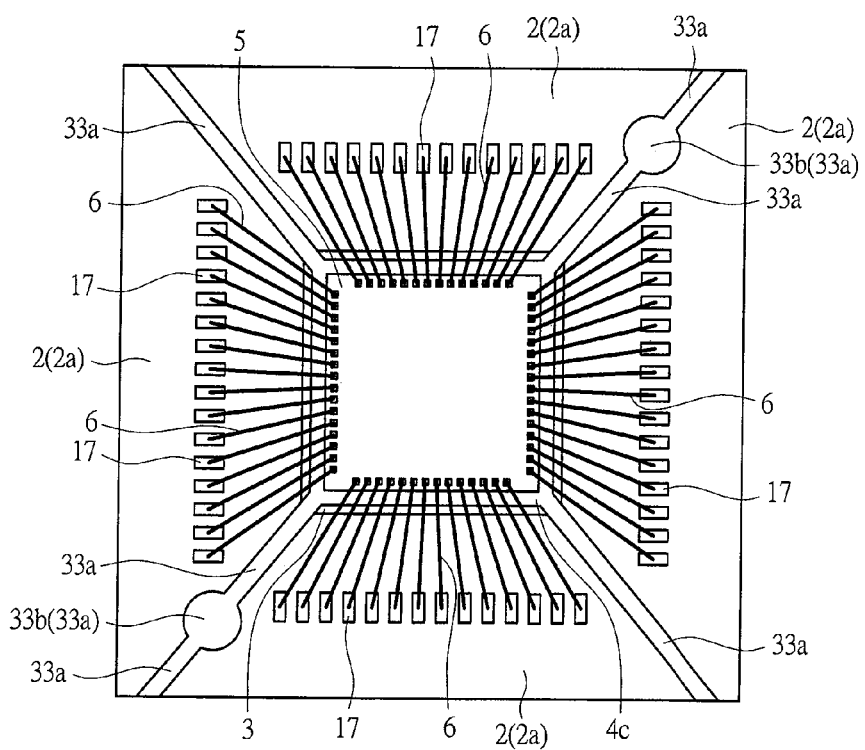
FIG. 126 is a perspective plan view of the semiconductor device of FIG. 125.

FIGS. 125 and 126 are a cross-sectional view and an upper surface perspective view (seen through the sealing resin 7) of the semiconductor device 1c manufactured by the manufacturing process described with reference to FIGS. 112 to 124, and they almost correspond to FIGS. 107 and 108, respectively. The semiconductor device 1c of FIGS. 125 and 126 manufactured by the manufacturing process described with reference to FIGS. 112 to 124 is different from the semiconductor device 1c of FIGS. 106 to 108 manufactured by the manufacturing process described with reference to FIGS. 86 to 105 in the following points. That is, in the semiconductor device of FIGS. 125 and 126, the hole portion 15a is present in the wiring board 2, the wide portion 33b is present in the joining portion 33a, and the pin portion 13e integrally formed on the lower surface of the wide portion 33b is inserted (disposed) inside the hole portion 15a of the wiring board 2. Further, when the frame 31b is fixed to the wiring board 21d through the bonding agent 51 as shown in FIGS. 122 and 123 without providing the pin portion 13e in the frame 31b, the wide portion 33b is present in the joining portion 33a in the semiconductor device of FIGS. 125 and 126, but the hole portion 15a is not present in the wiring board 2, and the wide portion 33b and the upper surface 2a of the wiring board 2 are bonded through the bonding agent 51. Further, in the wiring board 2 (that is, the wiring board 21d) of the semiconductor device of FIGS. 125 and 126, the hole portion 15a is disposed in such a manner to stay away from the connecting terminal 17 and the land 18.

For the improvement of the heat dissipation properties of the semiconductor device, it is preferable to increase the thickness of the heat sink 4c on which the semiconductor chip 5 is mounted, but the weight of the heat sink 4c increases as the thickness increases. Meanwhile, in the structure of the present embodiment, as described above, the plurality of heat sinks 4c mutually joined are inserted into the through-holes 3 from the upper surface 21a side of the wiring boards 21c and 21d, respectively, and the joining portion 33a is located on the upper surface 21a of the wiring boards 21c and 21d and the lower surface of the joining portion 33a contacts to the upper surface 21a of the wiring boards 21c and 21d, so that the joining portion 33a supports the weight of the heat sink 4c. Hence, even if the thickness of the heat sink 4c is increased and the heat sink 4c becomes heavy, the heat sink 4c is firmly supported by the joining portion 33a, and the heat sink 4c can be prevented from falling off from the wiring boards 21c and 21d. Consequently, the thickness of the heat sink 4c (thickness t1) can be increased and preferably made larger than the thickness of the wiring boards 21c and 21d (that is, the thickness t2 of the wiring board 2), so that the heat dissipation properties of the semiconductor device can be improved. Further, since the resin sealing process is performed in a state in which the joining portion 33a supporting the heat sink 4c is located on the upper surface 21a of the wiring boards 21c and 21d and the lower surface of the joining portion 33a contacts to the upper surface 21a of the wiring boards 21c and 21d, this state is maintained even in the manufactured semiconductor device 1c.

Further, in the fourth embodiment, the heat sink 4c is not segmented into individual pieces, and the frames 31a and 31b and the wiring boards 21c and 21d are integrally resin-sealed in the step S7b, and then, the sealing body is segmented into individual pieces by the cutting process in the step S10b. Therefore, as compared with the first and second embodiments, the cutting process (process corresponding to step S4) for the segmentation into individual pieces of the heat sink 4c can be omitted, and the manufacturing process can be simplified.

Further, in the fourth embodiment, by integrating the frame 31a and the wiring board 21c (or the frame 31b and the wiring board 21d), a process conveyance form can be made into a frame 31a (or frame 31b) support type. Therefore, regardless of the thickness of the wiring board 21c (or the wiring board 21d), it can be adapted to the case where the groove of a process conveyance system is constant. Further, the frame 31a (or frame 31b) retaining the heavy heat sink 4c is made as a conveyance system support, thereby preventing the falling off of the heat sink 4c more surely.

Further, in the manufacturing process and the structure shown in FIGS. 112 to 126, the bonding portion (bonding portion through the pin portion 13e or the bonding agent 51) between the joining portion 33a and the wiring board 21d remains inside the manufactured semiconductor device 1c, and therefore, also in the manufactured semiconductor device 1c, the supporting (retaining, fixing) of the heavy heat sink 4c can be strengthened without committing the bonding and supporting of the heat sink 4c and the wiring board 2 to only the curing fixation of the sealing resin 7.

Fifth Embodiment

In the fourth embodiment above, the frame 31b in which a plurality of heat sinks 4c are joined and the multiply-connected wiring board are fixed to manufacture the semiconductor devices. However, in the present embodiment, individually segmented wiring boards 2f are fixed to a frame 31c in which a plurality of heat sinks 4c are joined, thereby manufacturing the semiconductor devices.

Figure 127:
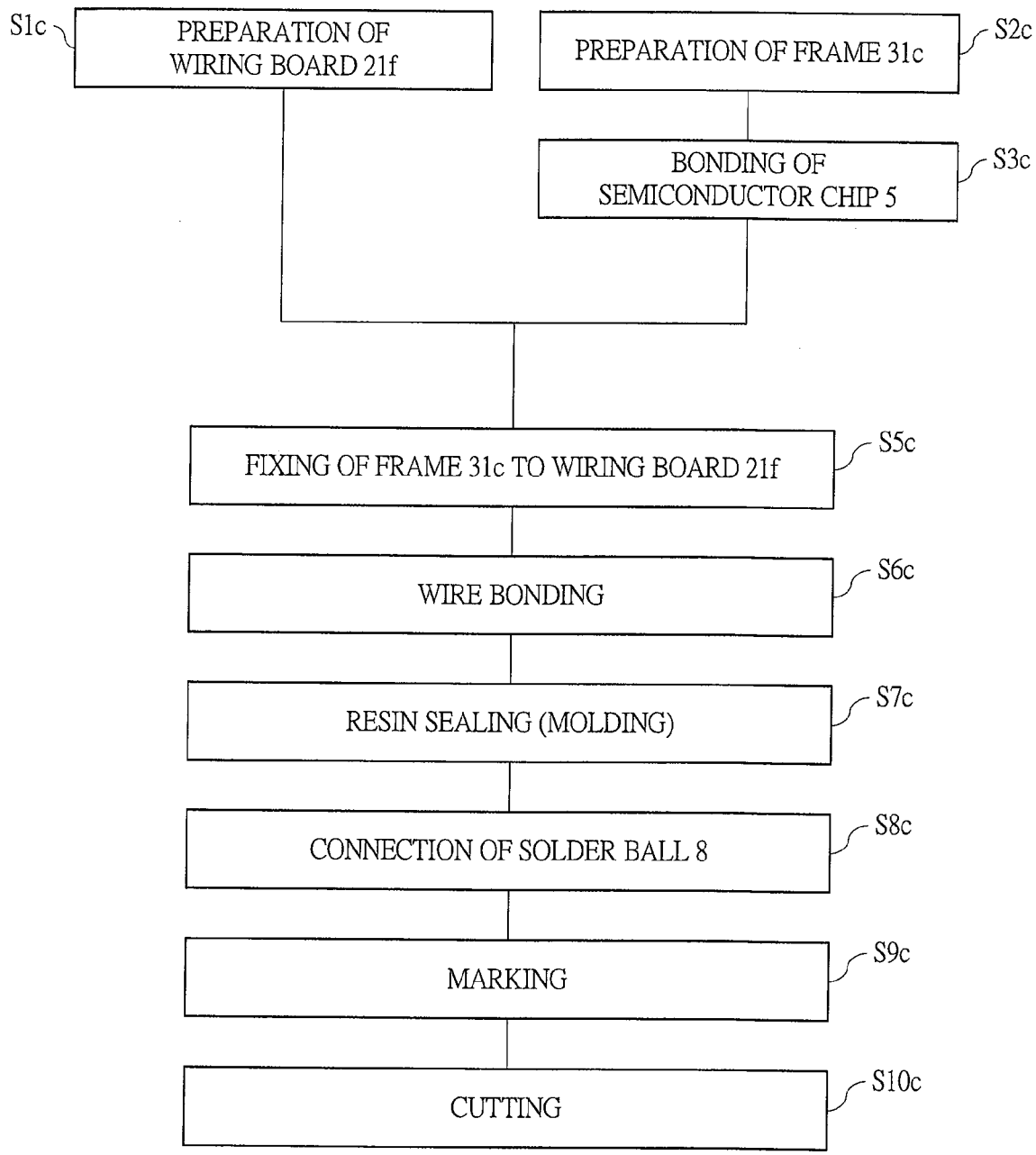
FIG. 127 is a process flowchart showing a manufacturing process of the semiconductor device according to another embodiment of the present invention.
Figure 128:
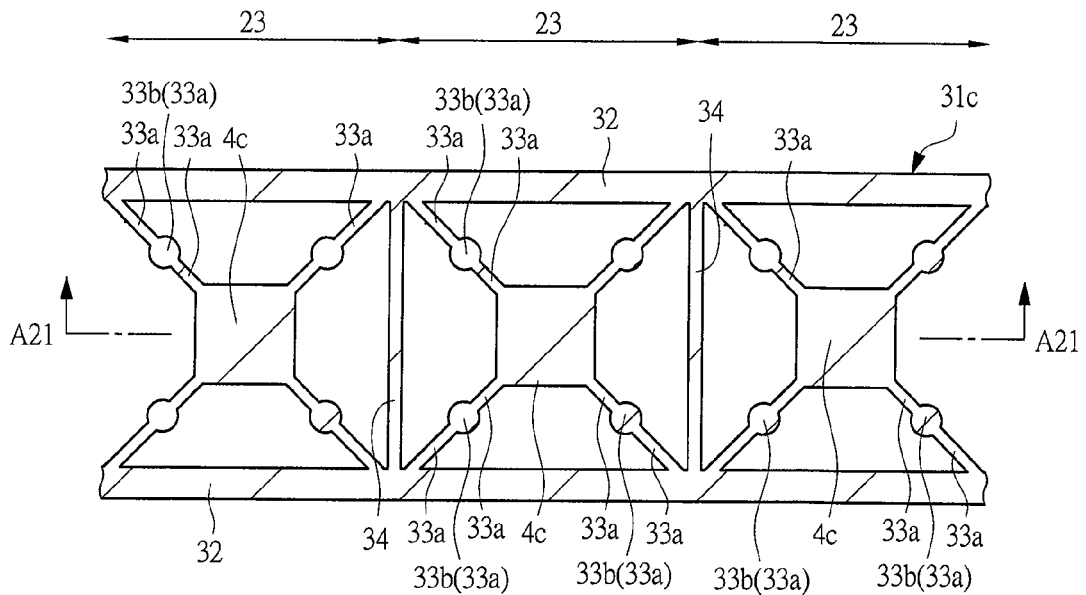
FIG. 128 is an upper surface view of a frame used in the manufacturing process of the semiconductor device according to another embodiment of the present invention.
Figure 129:
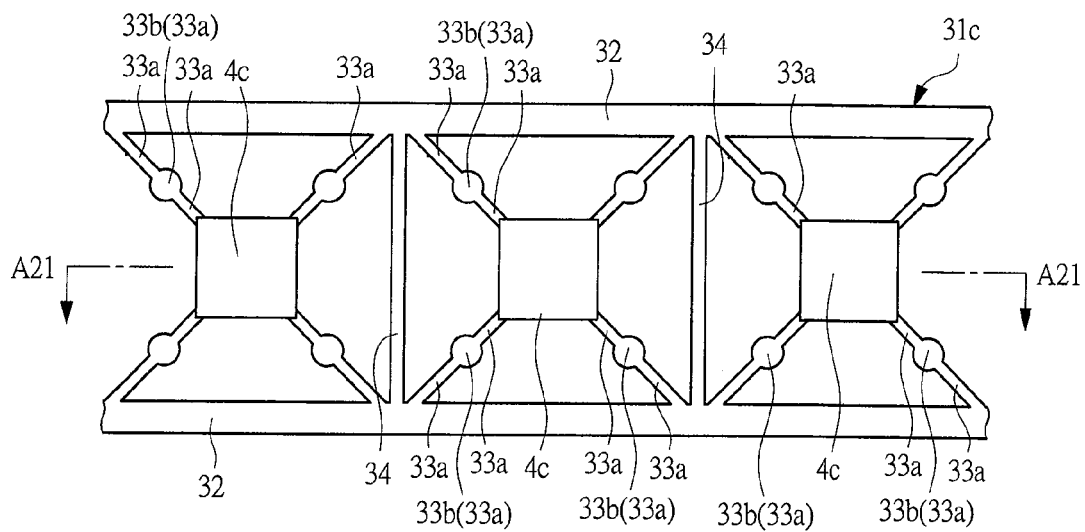
FIG. 129 is a lower surface view of the frame of FIG. 128.
Figure 130:
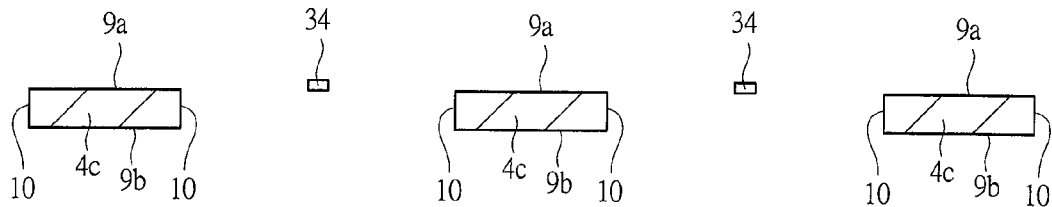
FIG. 130 is a cross-sectional view of the frame of FIG. 128.
Figure 131:
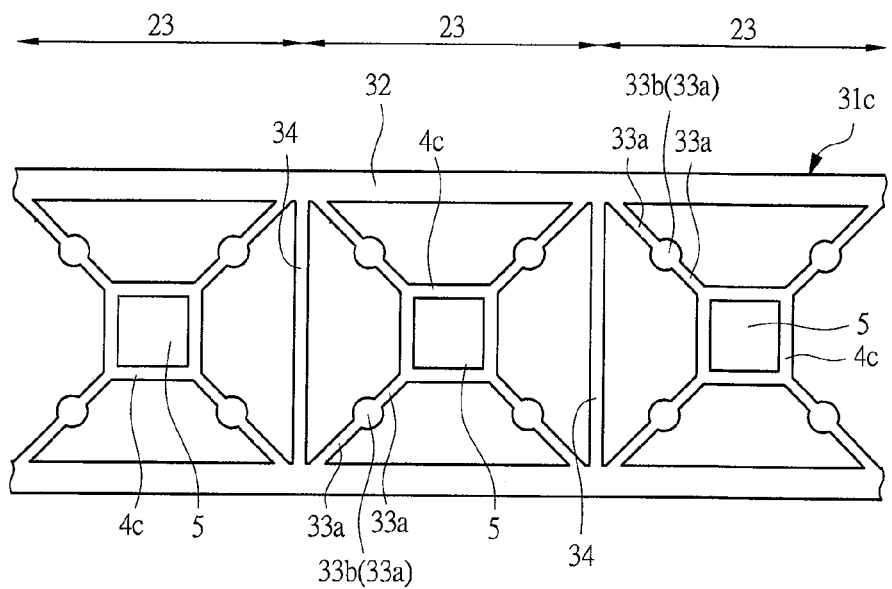
FIG. 131 is an upper surface view showing the manufacturing process of the semiconductor device according to another embodiment of the present invention.
Figure 132:
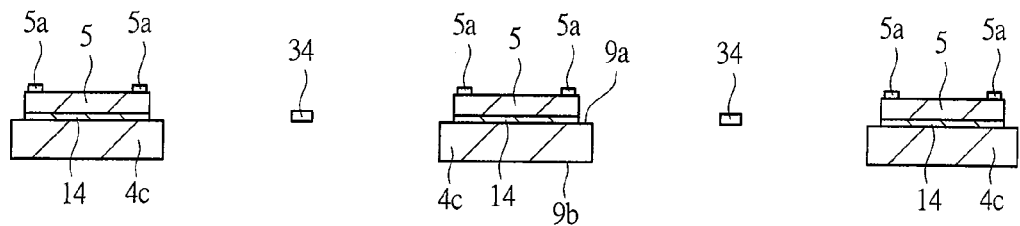
FIG. 132 is a cross-sectional view showing the same manufacturing process of the semiconductor device as FIG. 131.
Figure 133:
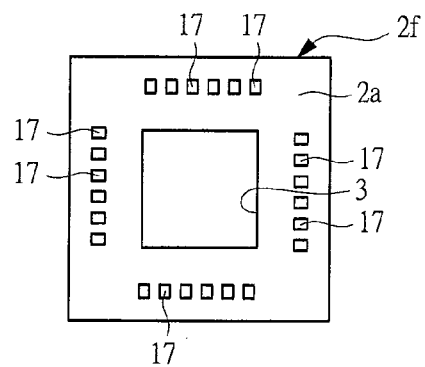
FIG. 133 is an upper surface view of the wiring board used in the manufacturing process of the semiconductor device according to another embodiment of the present invention.
Figure 134:
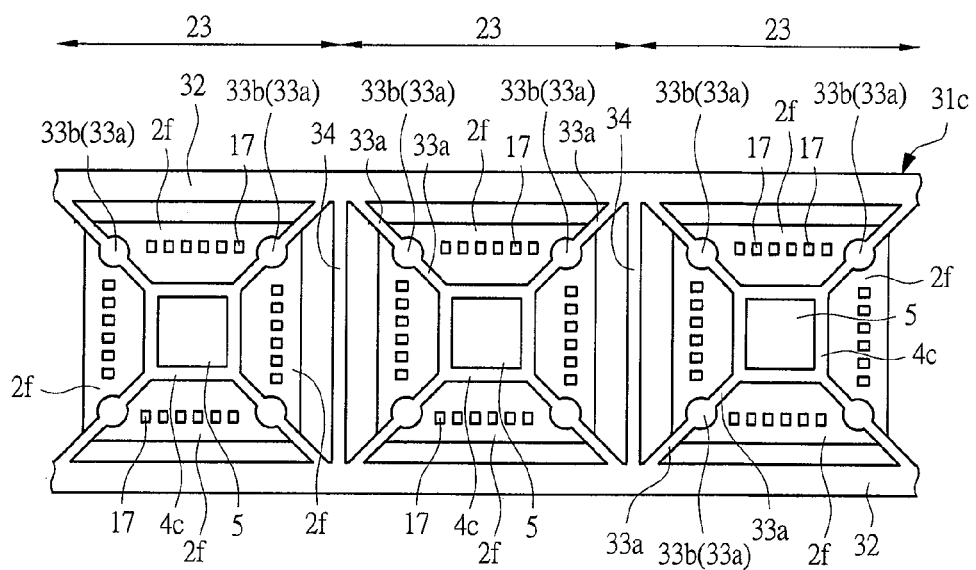
FIG. 134 is an upper surface view showing the manufacturing process of the semiconductor device subsequent to FIG. 131.
Figure 135:
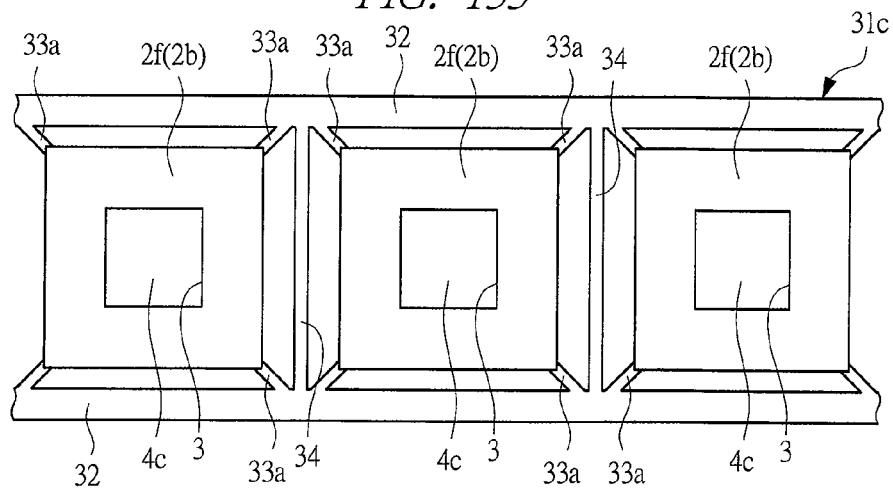
FIG. 135 is a lower surface view showing the same manufacturing process of the semiconductor device as FIG. 134.
Figure 136:
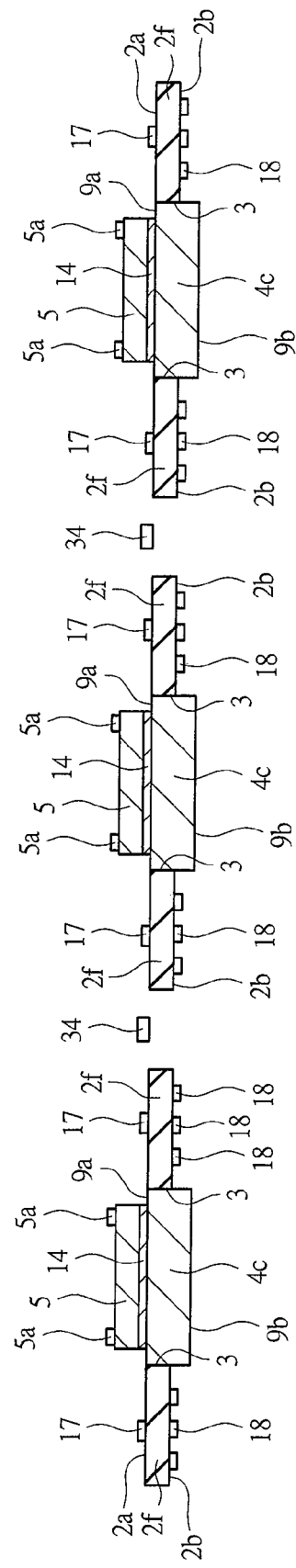
FIG. 136 is a cross-sectional view showing the same manufacturing process of the semiconductor device as FIG. 134.
Figure 141:
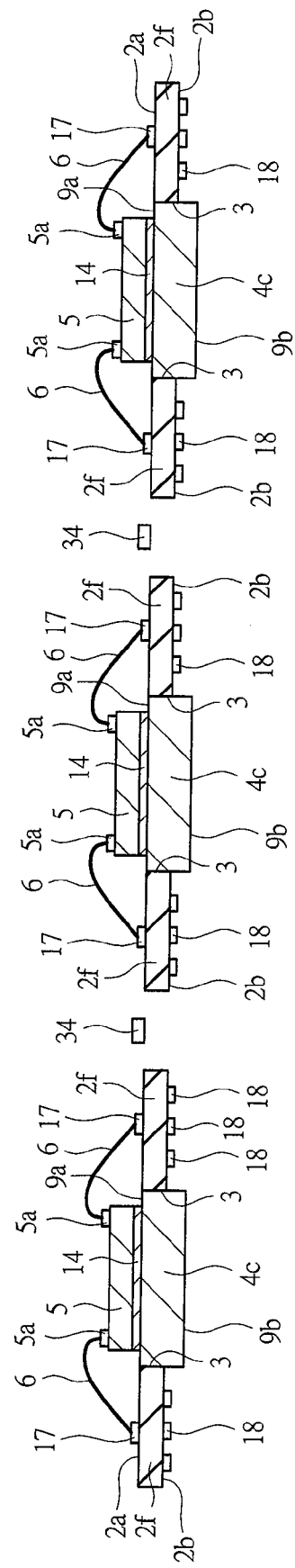
FIG. 141 is a cross-sectional view showing the manufacturing process of the semiconductor device subsequent to FIG. 136.
Figure 142:
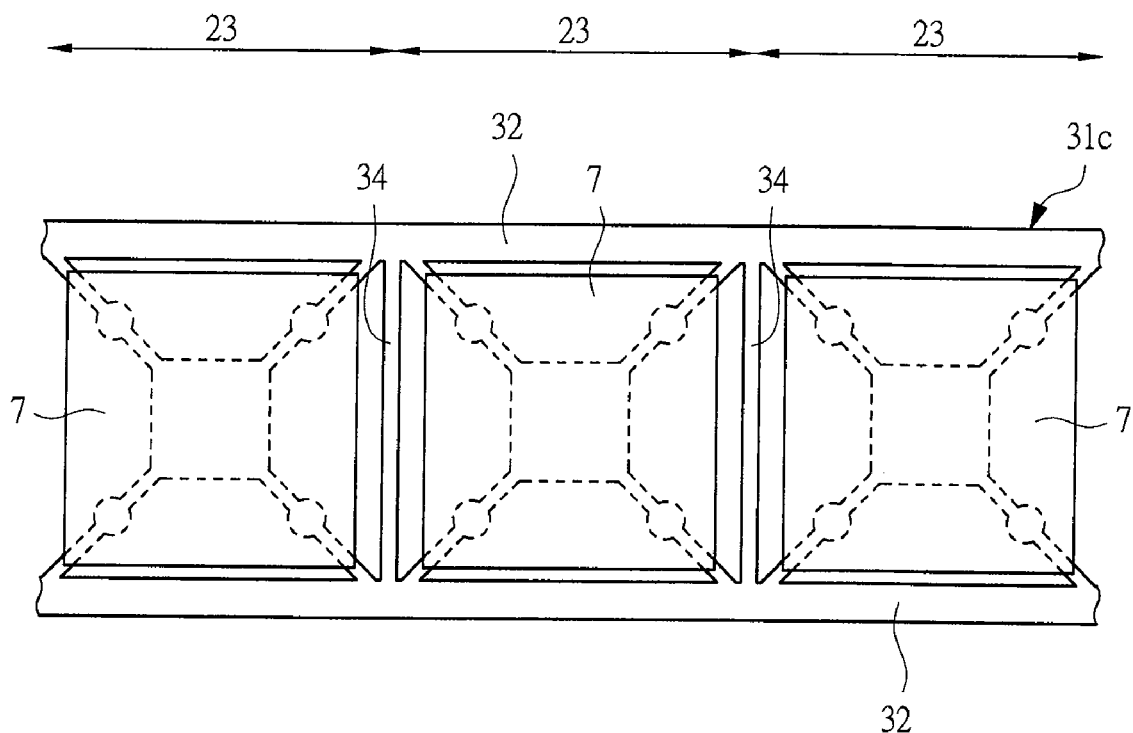
FIG. 142 is an upper surface view showing the manufacturing process of the semiconductor device subsequent to FIG. 141.
Figure 143:
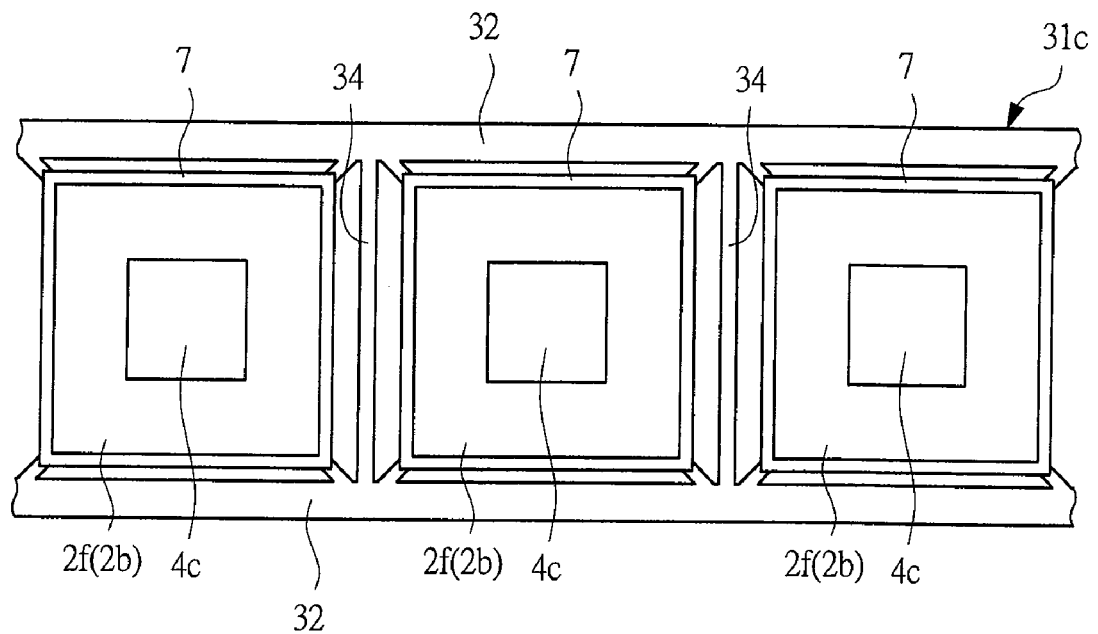
FIG. 143 is a lower surface view showing the same manufacturing process of the semiconductor device as FIG. 142.
Figure 144:
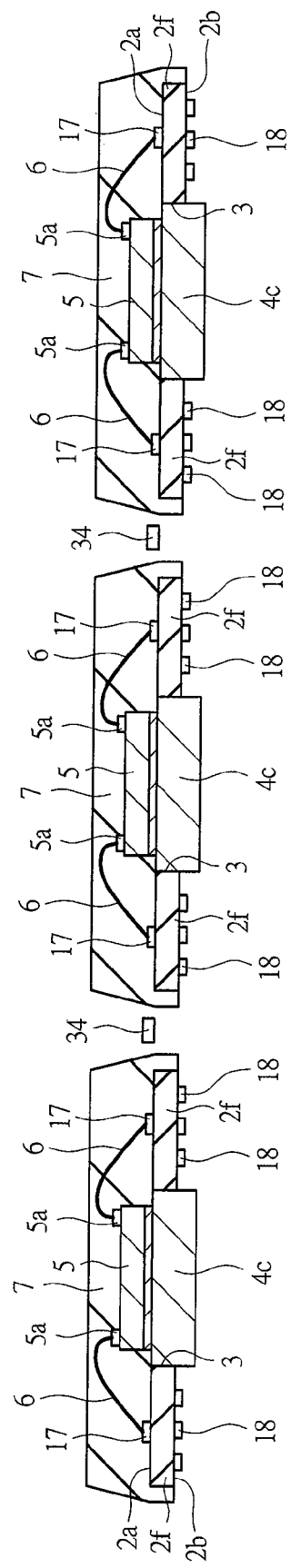
FIG. 144 is a cross-sectional view showing the same manufacturing process of the semiconductor device as FIG. 142.
Figure 145:
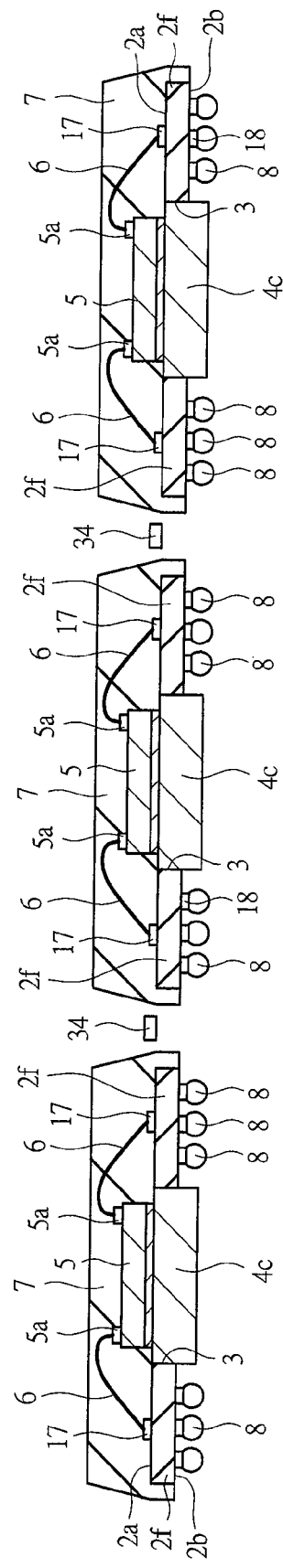
FIG. 145 is a cross-sectional view showing the manufacturing process of the semiconductor device subsequent to FIG. 144.

FIG. 127 is a process flowchart showing a manufacturing process of the semiconductor device of the present embodiment. FIG. 128 is an upper surface view (plan view) of the frame 31c used for the manufacture of the semiconductor device of the present embodiment, FIG. 129 is an lower surface view (plan view) of the frame 31c, and FIG. 130 is a cross-sectional view of the frame 31c. The cross-section cut along the line A21-A21 of FIGS. 128 and 129 corresponds to FIG. 130. Although FIG. 128 is a plan view, hatching is applied to the frame 31c so as to make a shape of the frame 31c easily understood. Further, FIGS. 131 and 132 are a plan view (upper surface view) and a cross-sectional view in the manufacturing process of the semiconductor device of the present embodiment, and FIG. 131 shows a planar region corresponding to FIG. 128 and FIG. 132 shows the cross-section corresponding to FIG. 130. FIG. 133 is an upper surface view (plan view) of the wiring board 2f used for the manufacture of the semiconductor device of the present embodiment. FIGS. 134 to 136 are plan views (upper surface view and lower surface view) and a cross-sectional view in the manufacturing process of the semiconductor device of the present embodiment, and FIG. 134 which is the upper surface view shows the planar region corresponding to FIGS. 128 and 131, FIG. 135 which is the lower surface view shows the planar region corresponding to FIG. 129, and FIG. 136 which is the cross-sectional view shows the cross-section corresponding to FIG. 132. FIGS. 137 to 140 are explanatory drawings (cross-sectional views) for explaining a technique for fixing the wiring board 2f to the frame 31c. Also, FIGS. 141 to 145 are plan views (upper surface view and lower surface view) and cross-sectional views in the manufacturing process of the semiconductor device of the present embodiment. FIG. 141 is a cross-sectional view and shows the cross-section corresponding to FIG. 136. FIG. 142 which is the upper surface view, FIG. 143 which is the lower surface view, and FIG. 144 which is the cross-sectional view show the same process stage (process stage after FIG. 141), and FIG. 142 shows the same planar region as FIG. 134, FIG. 143 shows the same planar region as FIG. 135, and FIG. 144 shows the cross-section corresponding to FIGS. 136 and 141. Note that, in FIG. 142, an outer shape of the frame 31c located below the sealing resin 7 is shown by a dotted line for easy understanding. Also, FIG. 145 is a cross-sectional view of the process stage after FIG. 144 and shows the cross-section corresponding to FIG. 144.

For the manufacture of the semiconductor device, as shown in FIGS. 128 to 130, the frame 31c in which a plurality of heat sinks 4c are joined is prepared (step S2c).

The structure of the frame 31c is almost the same as the frame 31b of the fourth embodiment expect the following points. That is, in the frame 31c, a joining portion 34 for mutually joining the frame portions 32 is provided to reinforce the frame 31c. Further, in the frame 31c, the wide portion (island portion) 33b similar to that of the frame 31b is provided for each joining portion 33a for joining the heat sink 4c and the frame portion 32. Further, in the frame 31c, the pin portion 13e is not provided on the lower surface of the wide portion 33b. Except for these, the frame 31c has the same structure as the frame 31b of the fourth embodiment, and the material of the frame 31c is also the same as the frames 31, 31a and 31b.

Similar to the frames 31a and 31b of the fourth embodiment, the frame 31c has a structure in which a plurality of unit regions (unit frame region, semiconductor region) 23 are disposed (joined) in a row. This unit region 23 is a region used for manufacturing one semiconductor device (semiconductor device 1e to be described later) and has one heat sink 4c and four joining portions 33a joined to the heat sink 4c.

Further, it is not always necessary to provide the wide portion 33b for all of the joining portions 33a in the frame 31c, and the wide portion 33b may be provided for at least one of the plurality (four in this case) of the joining portions 33a joined to each heat sink 4c. For example, like in the frame 31b of the fourth embodiment, the wide portion 33b may be provided for two joining portions located in a diagonal direction with interposing the heat sink 4c therebetween of the four joining portions 33a connected to each heat sink 4c. However, in the present embodiment, as described later, it is necessary to fix one individually segmented wiring board 2f to each unit region (one heat sink 4c and four joining portions 33a joined thereto) of the frame 31c. Therefore, it is more preferable that the wide portion 33b is provided for all the four joining portions 33a connected to each heat sink 4c as shown in FIGS. 128 and 129 because the wiring board 2f can be precisely and stably fixed to each unit region of the frame 31c.

After the frame 31c is prepared, as shown in FIGS. 131 and 132, the semiconductor chip 5 is bonded on the upper surface 9a of each heat sink 4c of the frame 31c through the bonding agent 14 (step S3c). Since the bonding process of the semiconductor chip 5 in the step S3c can be performed in the same manner as the bonding process of the semiconductor chip 5 in the step S3, the detailed description thereof will be omitted here.

Further, as shown in FIG. 133, the wiring board 2f is prepared (step S1c). Although this wiring board 2f almost corresponds to the one obtained by separating the wiring board 21d used in the fourth embodiment into the semiconductor device region 22, the hole portion 15a is not formed in the wiring board 2f. More specifically, this wiring board 2f is not the multiply-connected wiring board, and one semiconductor device is manufactured from one wiring board 2f. The wiring board 2f has the same structure as the wiring board 2 in the semiconductor device 1c of FIGS. 106 to 108 of the fourth embodiment except for the shape of the solder resist layer 19 to be described later. Consequently, the through-hole 3 is formed in the wiring board 2f, a plurality of connecting terminals 17 and the wirings connected thereto are formed on the upper surface 2a of the wiring board 2f, and a plurality of lands 18 are formed on the lower surface 2b of the wiring board 2f.

Next, as shown in FIGS. 134 to 136, the wiring board 2f is fixed to the frame 31c (step S5c). Before performing this step S5c, it is necessary to prepare the wiring board 2f in the step S1c. Therefore, the preparation of the wiring board 2f in the step S1c can be performed before the step S2c, simultaneously with the step S2c, before the step S3c and after the step S2c, simultaneously with the step S3c or before the step S5c and after the step S3c.

The multiply-connected wiring boards 21c and 21d are fixed to the multiply-connected frames 31a and 31b in the fourth embodiment, but in the present embodiment, a plurality of wiring boards 2f are fixed to the frame 31c in which a plurality of heat sinks 4c are joined in the step S5c. The wiring board 2f is fixed to each of the plurality of unit regions 23 of the frame 31c.

More specifically, in the step S5c, the plurality of wiring boards 2f are disposed side by side and the frame 31c is positioned and disposed thereon, so that each heat sink 4c of the frame 31c is inserted (plugged) into each through-hole 3 of the wiring board 2f from the upper surface 2a side of the wiring board 2f, and at the same time, the wiring board 2f is fixed to the frame 31c.

Figure 137:
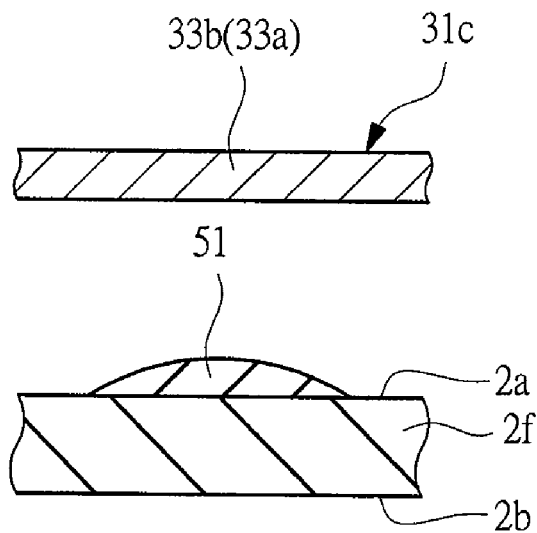
FIG. 137 is an explanatory drawing showing a technique of fixing the frame to the wiring board.
Figure 138:
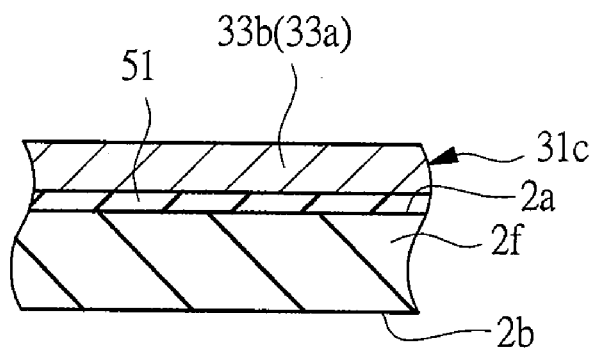
FIG. 138 is an explanatory drawing showing a technique of fixing the frame to the wiring board.

Here, the frame 31c and the wiring board 2f are fixed by the bonding agent. FIGS. 137 and 138 are explanatory drawings (cross-sectional views) showing a technique for fixing the frame 31c to the wiring board 2f by using the bonding agent.

In the step S5c, before the heat sink 4c of the frame 31c is interested into the through-hole 3 of the wiring board 2f, as shown in FIG. 137, the bonding agent 51 is coated (disposed) in advance on the upper surface 2a of the wiring board 2f, and then, the frame 31c is disposed on the upper surface 2a of the wiring board 2f so that the wide portion 33b of the joining portion 33a of the frame 31c is positioned on the bonding agent 51. At this time, each heat sink 4c of the frame 31c is inserted into each through-hole 3 of the plurality of wiring boards 2f from the upper surface 2a side of the wiring board 2f. More specifically, the bonding agent 51 is coated at the position on the upper surface 2a of each wiring board 21f on which the wide portion 33b of the joining portion 33a of the frame 31c overlaps when each heat sink 4c of the frame 31c is inserted into the through-hole 3 of each wiring board 21f. By this means, each heat sink 4c of the frame 31c is inserted into the through-hole 3 of each wiring board 2f from the upper surface 2a side of the wiring board 2f, and at the same time, as shown in FIG. 138, the lower surface of the wide portion 33b of the joining portion 33a of the frame 31 is bonded to the upper surface 2a of the wiring board 2f through the bonding agent 51, so that the wiring board 2f is fixed to the frame 31c. More specifically, in each unit region 23 of the frame 31c, the lower surface of the wide portion 33b of the joining portion 33a is bonded and fixed to the upper surface 2a of the wiring board 2f through the bonding agent 51. As the bonding agent 51, a film type bonding agent such as a DAF (die attach film) can be also used.

As described above, each heat sink 4c in the frame 31c has the joining portion 33a protruding to the outside (in the direction away from the center of the upper surface 9a) from the side surface of each heat sink 4c in the peripheral edge portion of the upper surface 9a of each heat sink 4c, and in the step S5c, each heat sink 4c is disposed inside the through-hole 3 of the wiring board 2f so that this joining portion 33a is located on the upper surface 2a of the wiring board 2f outside the through-hole 3 and the lower surface of the joining portion 33a contacts to the upper surface 2a of the wiring board 2f.

Figure 139:
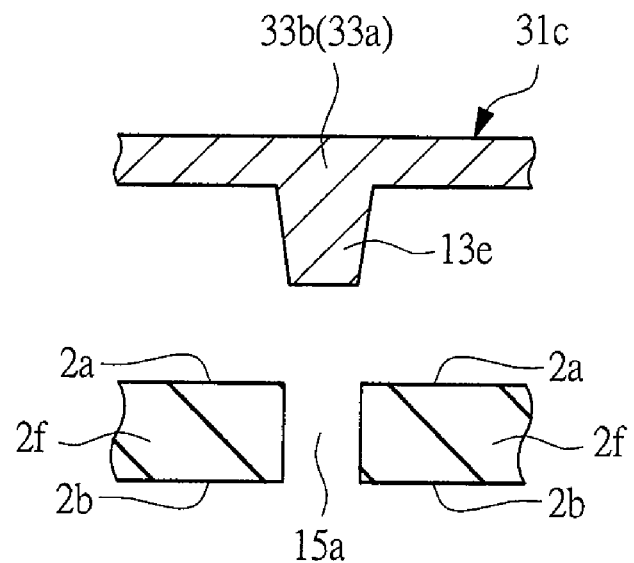
FIG. 139 is an explanatory drawing showing a technique of fixing the frame to the wiring board.
Figure 140:
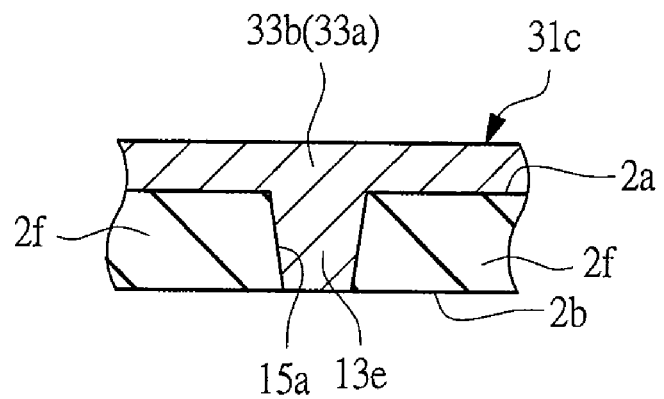
FIG. 140 is an explanatory drawing showing a technique of fixing the frame to the wiring board.

The case where the bonding agent 51 is used to fix the frame 31c and the wiring board 2f in the step S5c has been described, but as another embodiment, in the step S5c, a technique for inserting the pin portion 13e provided in the frame 31c into the hole portion 15a provided in the wiring board 2f can be also used, and FIGS. 139 and 140 are the explanatory drawings thereof (cross-sectional views). This principle is the same as the technique described with reference to FIGS. 120 and 121 in the fourth embodiment. More specifically, like in the frame 31b and the wiring board 21d of the fourth embodiment, the pin portion 13e is formed in advance on the lower surface of the wide portion 33b also in the frame 31c, and the hole portion 15a is formed in advance in the wiring board 2f. Then, in the step S5c, the pin portion 13e (pin portion 13e having a tapered shape) provided on the lower surface of the wide portion 33b of the joining portion 33a of the frame 31c as shown in FIG. 139 is inserted (pushed) into the hole portion 15a of the wiring board 2f as shown in FIG. 140, and the pin portion 13e of the frame 31c and the wiring board 2f can be caulked (fixed) by the tapered shape of the pin portion 13e. By this means, the frame 31c and the wiring board 2f are fixed.

Further, the step S3c (bonding process of the semiconductor chip 5) can also be performed after the step S5c (process of fixing the frame 31c and the wiring board 2f) and before the step S6c (wire bonding process) to be described later.

After the plurality of wiring boards 2f are fixed to the frame 31c in the step S5c, as shown in FIG. 141, a wire bonding process is performed, so that each electrode 5a of the semiconductor chip 5 and the connecting terminal 17 formed on the wiring board 2f corresponding to the electrode 5a are electrically connected through the bonding wire 6 (step S6c). More specifically, the plurality of connecting terminals 17 on the upper surface 21a of each wiring board 2f and the plurality of electrodes 5a of the semiconductor chip 5 bonded (mounted) on the heat sink 4c disposed inside the through-hole 3 of the wiring board 2f are electrically connected through the plurality of bonding wires 6, respectively.

After the wire bonding process, as shown in FIGS. 142 to 144, the resin sealing by the molding process (for example, the transfer-molding process) is performed to form the sealing resin 7 (sealing portion), and the semiconductor chip 5 and the bonding wire 6 are sealed (resin-sealed) by the sealing resin 7 (step S7c).

In the present embodiment, as shown in FIGS. 142 to 144, in the molding process in the step S7c, the individual sealing for individually sealing each unit region 23 of the frame 31c by the sealing resin 7 is performed. More specifically, in each unit region 23 of the frame 31c, the sealing resin 7 is formed on the upper surface 2a of the wiring board 2f so as to cover the semiconductor chip 5 and the bonding wire 6. In this case, the sealing resin 7 is formed for each unit region 23 of the frame 31c, and is not integrally formed for the adjacent unit regions 23. The sealing resin 7 is made of, for example, a resin material such as a thermosetting resin material and can contain the filler and the like. For example, the sealing resin can be formed by using the epoxy resin and the like containing the filler. For example, the sealing resin material is injected into a cavity of the metal mold in which the frame 31c to which the wiring board 2f is fixed is disposed, and this sealing resin material is hardened by heating, so that the sealing resin 7 can be formed.

In the present embodiment, as described later, the sealing resin 7 is formed so as to cover not only the upper surface 2a of the wiring board 2f but also the side surface of the wiring board 2f. Further, the sealing resin 7 is formed so that the frame portion 32 of the frame 31 is located outside the sealing resin 7.

After the frame 31c and the plurality of wiring boards 2f are fixed in the step S5c, a state in which the upper surface 2a of the wiring board 2f is directed upward without turning the frame 31c upside down is preferably maintained until the molding process in the step S7c is performed. More specifically, after fixing the frame 31c to the plurality of wiring boards 2f in the step S5c, the wiring board 2f has the upper surface 2a directed upward (that is, the upper surface of the frame 31c is also directed upward) so that the lower surface 2b thereof is not directed upward until the molding process in the step S7c is performed. As a result, the falling off of the frame 31c from the wiring board 2f before the sealing resin 7 is formed can be prevented more precisely. By forming the sealing resin 7, the frame 31c and the wiring board 2f are solidly bonded by the sealing resin 7, and therefore, after forming the sealing resin 7, the wiring board 2f may be directed to any direction (lower surface 2b of the wiring board 2f may be directed upward).

Next, as shown in FIG. 145, the solder balls 8 are connected (bonded) to the lands 18 of the lower surface 2b of each wiring board 2f (step S8c). Then, marking is performed as needed, and a mark such as a product number and the like is applied onto the front surface of the sealing resin 7 (step S9c). Since the connecting process of the solder ball 8 in the step S8c and the marking process in the step S9c can be performed in the same manner as the connecting process of the solder ball 8 in the step S8 and the marking process in the step S9 of the first embodiment, the detailed description thereof will be omitted here. The marking process in the step S9c may be performed after the connecting process of the solder ball 8 in the step S8c is performed, or the connecting process of the solder ball 8 in the step S8c may be performed after the marking process in the step S9c is performed. Alternatively, if not needed, the marking process in the step S9c may be omitted.

Next, the frame 31c is cut (step S10c). More specifically, the portion protruding from the side surface of the sealing resin 7 of the frame 31c is cut and removed.

Figure 146:
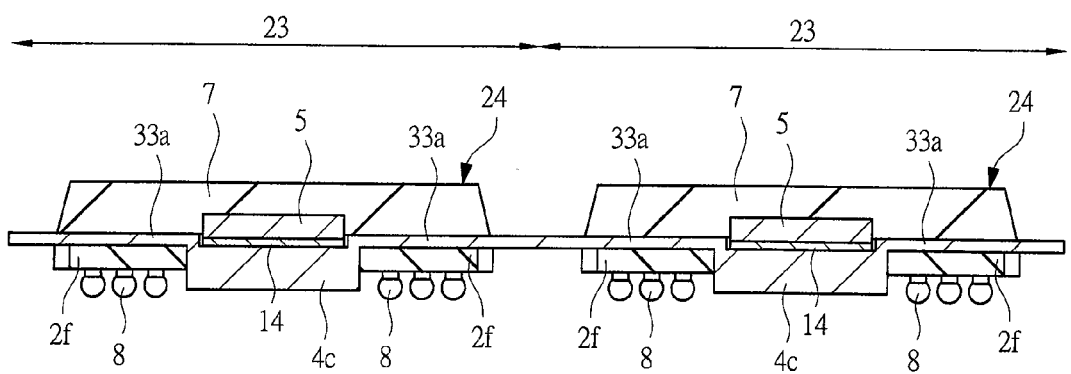
FIG. 146 is an explanatory drawing showing a process of cutting the frame.
Figure 147:
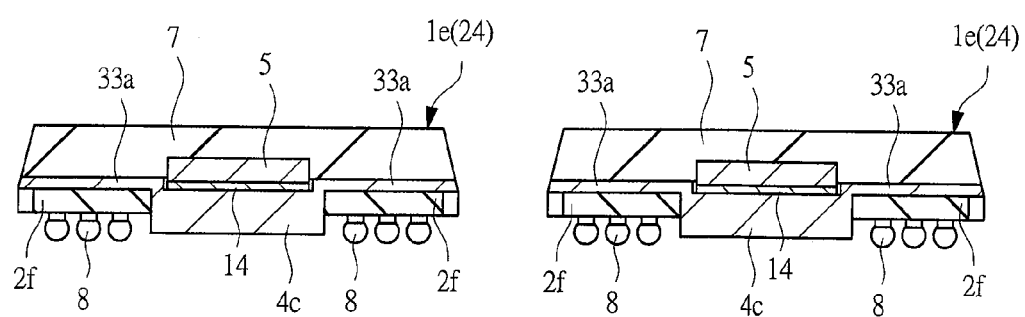
FIG. 147 is an explanatory drawing showing a process of cutting the frame.

FIGS. 146 and 147 are explanatory drawings (cross-sectional views) of the cutting process of the frame 31c, and FIG. 146 is a cross-sectional view showing the state before the cutting process in the step S10c and FIG. 147 is a cross-sectional view showing the state after the cutting process in the step S10c, in which the cross-sections along the joining portion 33a of the frame 31c are illustrated.

Before the cutting process in the step S10c, as shown in FIG. 146, the sealing bodies 24 (structure sealing the wiring board 5, the heat sink 4 and the semiconductor chip 5 by the sealing resin 7) of the adjacent unit regions 23 are joined by a part of the frame 31c (joining portion 33a and frame portion 32). In the cutting process in the step S10c, the frame 31c outside the sealing body 24 (portion of the joining portion 33a not sealed by the sealing resin 7, the frame portion 32 and the jointing portion 34) is cut and removed. By this means, the individually segmented sealing body 24 as shown in FIG. 147, that is, the semiconductor device 1e is obtained (manufactured).

By performing the cutting and the individual segmentation in this manner, the semiconductor device 1e of the present embodiment is manufactured.

Figure 148:
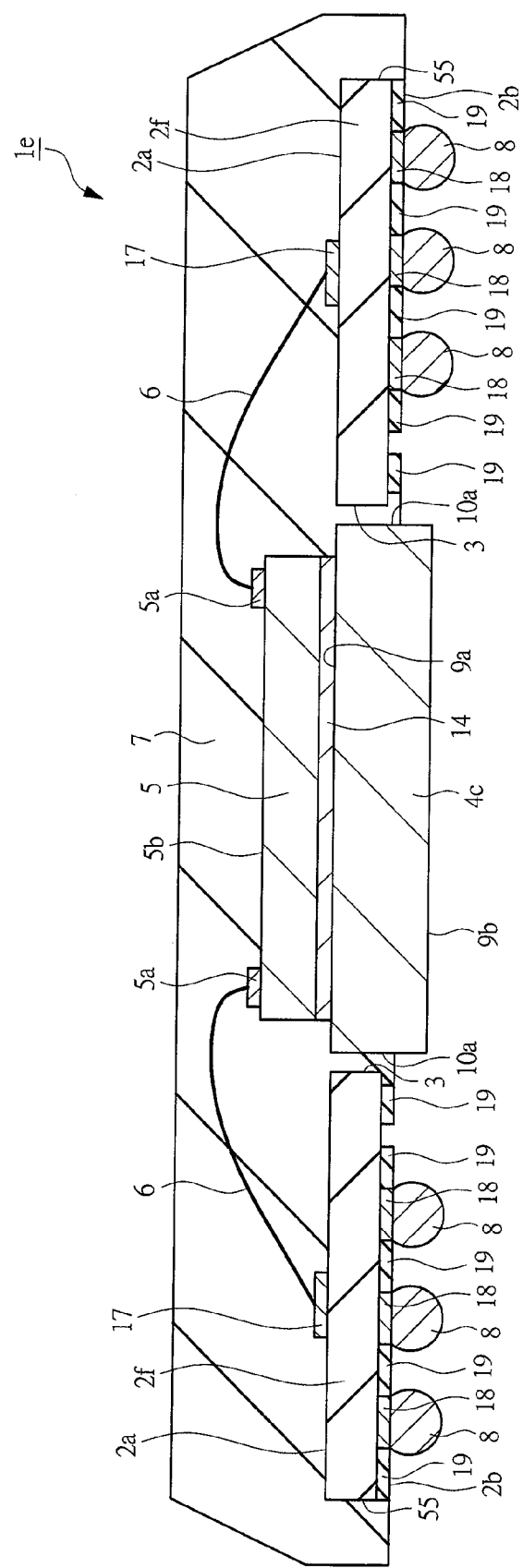
FIG. 148 is a cross-sectional view of a semiconductor device according to another embodiment of the present invention.
Figure 149:
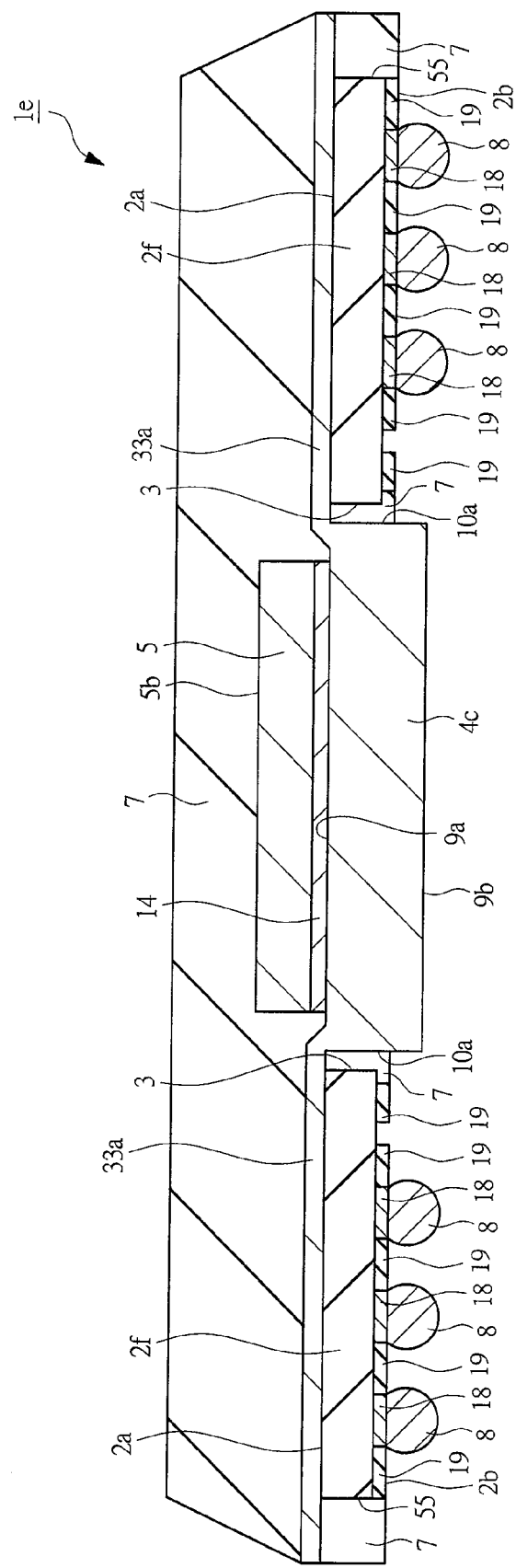
FIG. 149 is another cross-sectional view of the semiconductor device of FIG. 148.
Figure 150:
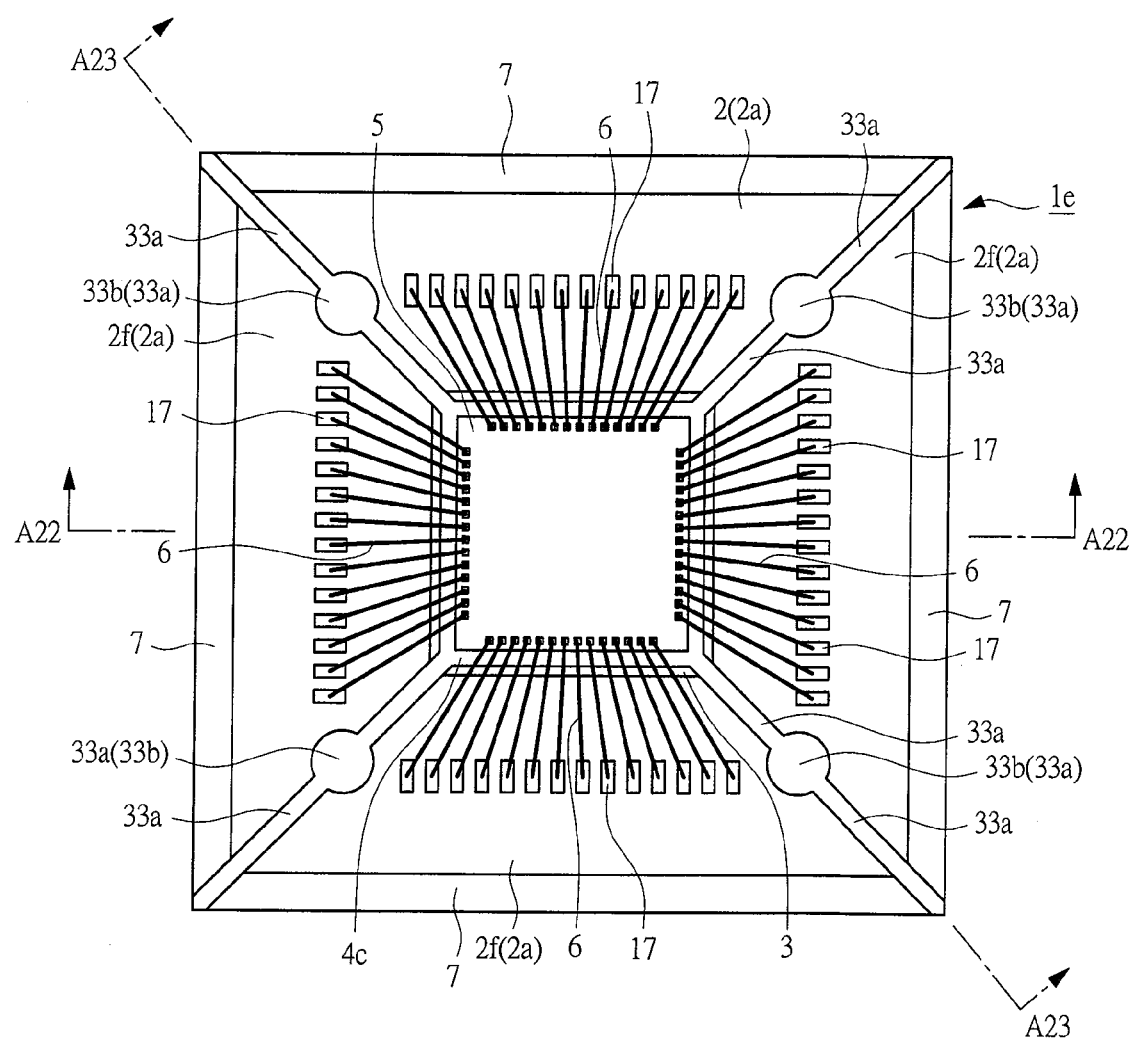
FIG. 150 is a perspective plan view of the semiconductor device of FIG. 148.
Figure 151:
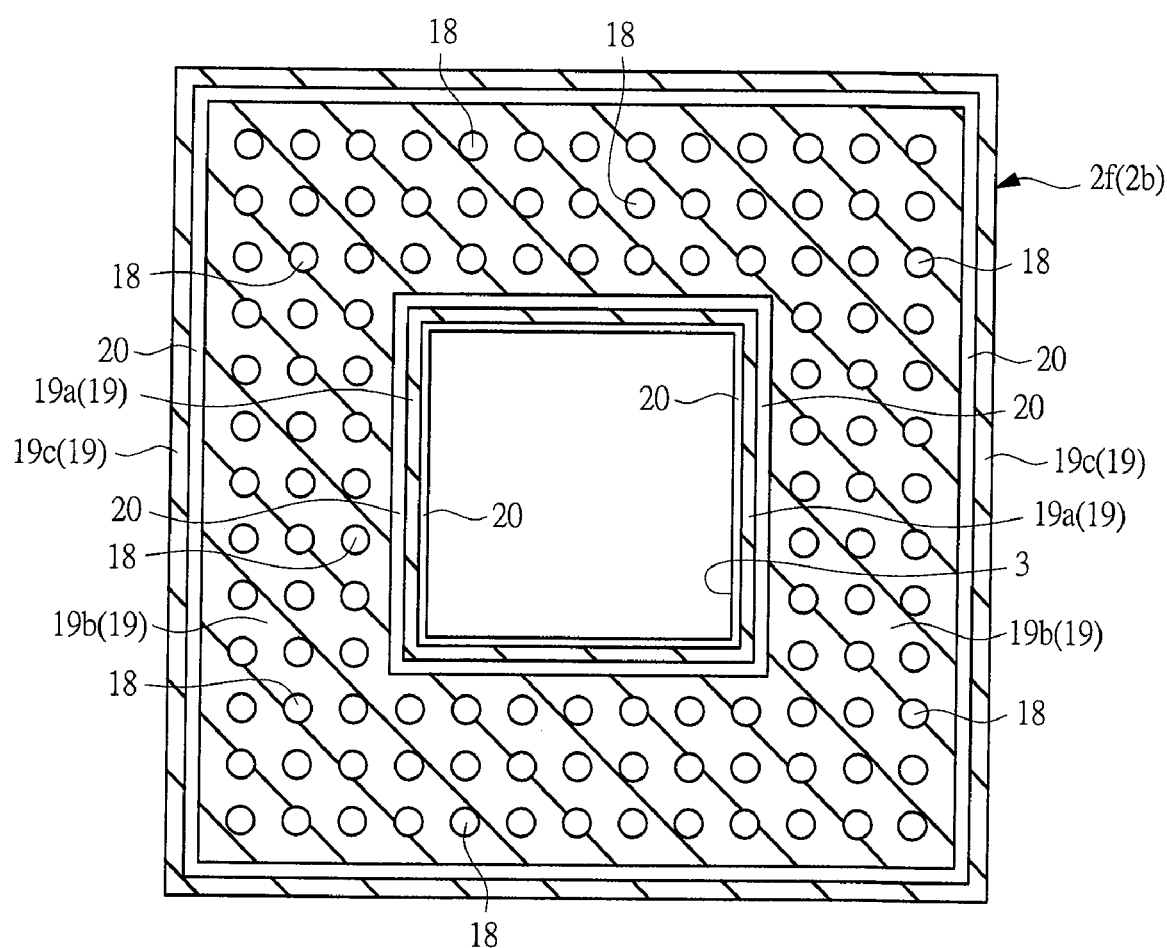
FIG. 151 is a lower surface view of the wiring board in the semiconductor device of FIG. 148.

FIGS. 148 and 149 are cross-sectional views (side cross-sectional views) of the semiconductor device 1e of the present embodiment, and FIG. 150 is a perspective plan view (upper surface view) of the semiconductor device 1e when the sealing resin 7 is seen through. FIG. 151 is a lower surface view of the wiring board 2f used in the semiconductor device 1e of the present embodiment. FIGS. 148 to 150 correspond to FIGS. 106 to 109 of the fourth embodiment, respectively. The cross-section cut along the line A22-A22 of FIG. 150 almost corresponds to FIG. 148, and the cross-section cut along the line A23-A23 of FIG. 150 almost corresponds to FIG. 149. Further, though FIG. 151 is plan view, hatching is applied to the solder resist layer 19 so that the planar shape (pattern) of the solder resist layer 19 on the lower surface 2b of the wiring board 2f is easily understood.

A structure of the semiconductor device 1e will be described in relation to the difference from the semiconductor device 1c of FIGS. 106 to 108 of the fourth embodiment.

In the semiconductor device 1e shown in FIGS. 148 to 150, the wide portion 33 is present in the joining portion 33a, and the lower surface of the wide portion 33b is bonded to the upper surface 2a of the wiring board 2f through the bonding agent 51 (illustration thereof is omitted in FIG. 149). Further, the sealing resin 7 is formed so as to cover not only the upper surface 2a of the wiring board 2f but also a side surface 55 of the wiring board 2f. In the semiconductor device 1c of FIGS. 106 to 108 of the fourth embodiment, the side surface of the wiring board 2 and the side surface of the sealing resin 7 are flush with each other, and the joining portion 33a connected to the heat sink 4c extends on the upper surface 2a of the wiring board 2 until reaching the side surface of the sealing resin 7. In contrast to this, in the semiconductor device 1e of the present embodiment, since not only the upper surface 2a of the wiring board 2f but also the side surface 55 thereof is covered by the sealing resin 7 (that is, not exposed), the joining portion 33a connected to the heat sink 4c extends on the upper surface 2a of the wiring board 2f, and further extends in the sealing resin 7 over an end portion of the upper surface 2a of the wiring board 2f until reaching the side surface of the sealing resin 7. Further, when the frame 31c and the wiring board 2f are fixed by a technique described with reference to FIGS. 139 and 140, the hole portion 15a is formed in the wiring board 2f like in FIG. 125, and the pin portion 13e integrally provided on the lower surface of the wide portion 33b is inserted (disposed) into the hole portion 15a. Further, a shape of the solder resist layer 19 formed on the lower surface 2b of the wiring board 2f is devised as follows. Except for this, the structure of the semiconductor device 1e of the present embodiment is the same as the semiconductor device 1c of FIGS. 106 to 108 of the fourth embodiment, and therefore, the description thereof will be omitted here.

Next, the shape of the solder resist layer 19 on the lower surface 2b of the wiring board 2f will be described with reference to FIG. 151. Although the solder resist layer exposing the connecting terminal 17 and the land 18 is formed on the upper surface 2a and the lower surface 2b of the wiring board 2f, hereinafter, an illustration and a description of the solder resist layer 19 formed on the lower surface 2b of the wiring board 2f will be made, whereas an illustration and a description of the solder resist layer formed on the upper surface 2a of the wiring board 2f will be omitted.

In the structure of the present embodiment, not only the upper surface 2a of the wiring board 2f but also the side surface 55 of the wiring board 2f is covered by the sealing resin 7, and therefore, a gap is present between the side surface 55 of the wiring board 2f and a metal mold in the molding process in the step S7c. Hence, the resin material invades between the metal mold and the lower surface 2b of the wiring board 2f, and a resin burr is formed on the lower surface 2b of the wiring board 2f, so that the resin is easily adhered to the land 18. Therefore, the shape of the solder resist layer 19 formed on the lower surface 2b of the wiring board 2f is made as shown in FIG. 151.

On the lower surface 2b of the wiring board 2f, the solder resist layer 19 is formed in the hatched region in FIG. 151. The region 20 is a region in which the solder resist layer 19 is not formed on the lower surface 2b of the wiring board 2f, and is a region in which the lower surface of the base material layer (base material layer 16) of the wiring board 2f is exposed.

Also in the present embodiment, the solder resist layer 19 is formed on the lower surface 2b of the wiring board 2f. In the present embodiment, as shown in FIG. 151, the solder resist layer 19 of the lower surface 2b of the wiring board 2f includes a first solder resist portion 19a provided in the vicinity of the through-hole 3 so as to surround the periphery of the through-hole 3, a second solder resist portion 19b located in the periphery (outer periphery) of the first solder resist portion 19a, and a third solder resist portion 19c located further in the periphery (outer periphery) of the second solder resist portion 19b. More specifically, the first solder resist portion 19a is formed in the periphery of the through-hole 3, the third solder resist portion 19c is formed in the peripheral edge portion of the lower surface 2b of the wiring board 2f, and the second solder resist portion 19b is formed between the first solder resist portion 19a and the third solder resist portion 19c.

Between the first solder resist portion 19a and the second solder resist portion 19b, there is the region (dam region) 20 in which the solder resist layer 19 is not formed and the base material layer (base material layer 16) of the wiring board 2f is exposed. Consequently, the first solder resist portion 19a and the second solder resist portion 19b are isolated with interposing the region 20 therebetween. Further, between the second solder resist portion 19b and the third solder resist portion 19c, there is the region (dam region) 20 in which the solder resist layer 19 is not formed and the base material layer (base material layer 16) of the wiring board 2f is exposed. Consequently, the second solder resist portion 19b and the third solder resist portion 19c are isolated with interposing the region 20 therebetween.

The plurality of lands 18 provided on the lower surface 2b of the wiring board 2f are exposed from the openings formed in the second solder resist portion 19b. The second solder resist portion 19b has the openings for exposing the lands 18, and a conductive pattern for the land 18 is exposed from the opening. The opening of the solder resist layer 19 for exposing the land 18 is formed in the second solder resist portion 19b, and is not formed in the first solder resist portion 19a and the third solder resist portion 19c.

In the molding process in the step S7c, as described in the fourth embodiment, the resin material (mold resin) flowing between the inner wall of the through-hole 3 of the wiring board 2f and the side surface (side wall) 10a of the heat sink 4c is likely to overflow to the lower surface 2b side of the wiring board 2f. For its prevention, in the present embodiment, the region (dam region) 20 in which no solder resist layer 19 is present and the base material layer (base material layer 16) of the wiring board 2f is exposed is provided between the first solder resist portion 19a and the second solder resist portion 19b, so that the resin material (mold resin) overflowing to the lower surface 2b side of the wiring board 2f from the gap between the through-hole 3 and the heat sink 4c can be prevented from spreading up to the second solder resist portion 19b over the region 20.

Further, in the structure of the present embodiment, since the side surface 55 of the wiring board 2f is also covered by the sealing resin 7, the resin material is likely to invade between the metal mold and the lower surface 2b of the wiring 2f in the molding process in the step S7c.

For its prevention, in the present embodiment, the region (dam region) 20 in which no solder resist layer 19 is present and the base material layer (base material layer 16) of the wiring board 2f is exposed is provided between the third solder resist portion 19c and the second solder resist portion 19b. By this means, the resin material (mold resin) intending to invade between the metal mold and the lower surface 2b of the wiring board 2f from an external end portion (lower end of the side surface 55) of the lower surface 2b of the wiring board 2f can be prevented from spreading up to the second solder resist portion 19b over the region 20 between the third solder resist portion 19c and the second solder resist portion 19b.

Therefore, it is possible to prevent the resin material from adhering to the land 18 of the lower surface 2b of the wiring board 2f in the molding process in the step S7c, and the reliability of the connection between the land 18 and the solder ball 8 can be improved.

For the improvement of the heat dissipation properties of the semiconductor device, it is preferable to increase the thickness of the heat sink 4c on which the semiconductor chip 5 is mounted, but the weight of the heat sink 4c increases as the thickness increases. Meanwhile, in the structure of the present embodiment, as described above, the plurality of heat sinks 4c mutually joined are inserted into the through-holes 3 of the wiring boards 2f from the upper surface 2a side of the wiring board 2f, respectively, and the joining portion 33a is located on the upper surface 2a of each wiring board 2f and the lower surface of the joining portion 33a contacts to the upper surface 2a of the wiring board 2f, so that the joining portion 33a supports the weight of the heat sink 4c. Hence, even if the thickness of the heat sink 4c is increased and the heat sink 4c becomes heavy, the heat sink 4c is firmly supported by the joining portion 33a, and the heat sink 4c can be prevented from falling off from the wiring board 2f. Consequently, the thickness of the heat sink 4c (thickness t1) can be increased and preferably made larger than the thickness of the wiring board 2f (that is, the thickness t2 of the wiring board 2), so that the heat dissipation properties of the semiconductor device can be improved. Further, since the resin sealing process is performed in a state in which the joining portion 33a supporting the heat sink 4c is located on the upper surface 2a of the wiring board 2f and the lower surface of the joining portion 33a contacts to the upper surface 2a of the wiring board 2f, this state is maintained even in the manufactured semiconductor device 1e.

Further, since the individually segmented (individualized) wiring board 2f is used in the fifth embodiment, it is possible to use only the non-defective wiring board 2f. Ordinarily, according to the nature of the processing of the wiring board, in the multiply-connected wiring board in which a plurality of unit board regions (equivalent to the semiconductor device regions 22) are disposed (connected) in a row or plural rows, the plurality of unit board regions constituting the multiply-connected wiring board are not always constituted of only the non-defective products, and the case where the unit board region having a defect is present in the plurality of unit board regions constituting the multiply-connected wiring board occurs frequently. In such a case, when the semiconductor device is manufactured by using the multiply-connected wiring board, a series of processing must be performed for the plurality of unit board regions including the unit board region having a defect, and the semiconductor device manufactured from the unit board region having a defect has to be eliminated after the manufacture of the semiconductor devices, so that the processing materials are wasted. However, in the present embodiment, since the individually segmented (individualized) wiring boards 2f are used, the wiring board having a defect is removed in advance and only the wiring board 2f having no defect can be attached to the frame 31c in which the plurality of heat sinks 4c are joined, so that the processing material can be efficiently used.

Further, also in the present embodiment, the bonding portion (bonding portion through the pin portion 13e or the bonding agent 51) between the joining portion 33a and the wiring board 2f remains inside the manufactured semiconductor device 1e like in the manufacturing process and the structure shown in FIGS. 112 to 126 of the fourth embodiment. Hence, also in the manufactured semiconductor device 1e, the support (retaining, fixing) of the heavy heat sink 4c can be strengthened without committing the bonding and supporting of the heat sink 4c and the wiring board 2f to only the curing fixation of the sealing resin 7.

Sixth Embodiment

Figure 152:
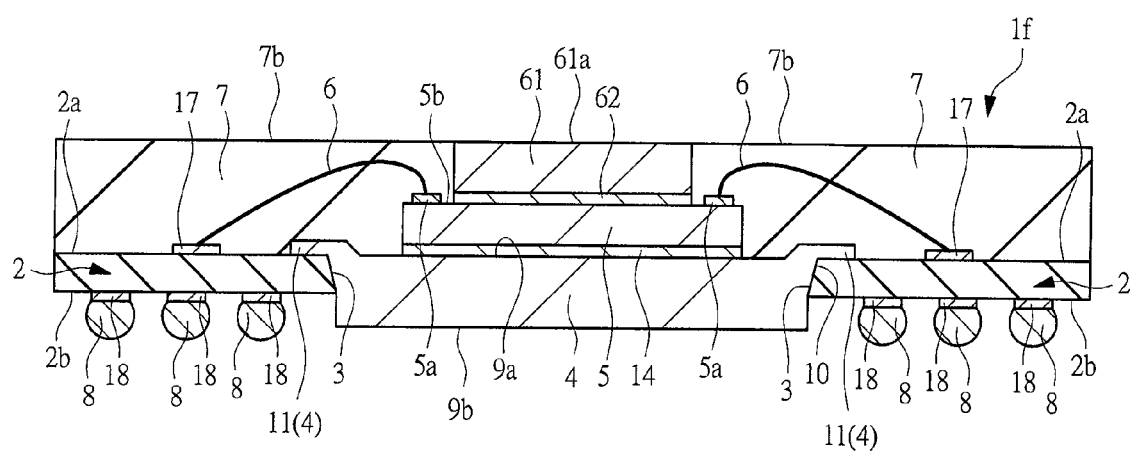
FIG. 152 is a cross-sectional view of a semiconductor device according to another embodiment of the present invention.

FIG. 152 is a cross-sectional view (side cross-sectional view) of a semiconductor device 1f of the sixth embodiment, and it corresponds to FIG. 1 of the first embodiment.

The semiconductor device 1f of the present embodiment has almost the same structure as the semiconductor device 1 of the first embodiment except that a heat sink (Heat Spreader) 61 is mounted on a front surface 5b of the semiconductor chip 5 through a bonding agent 62 and an upper surface 61a of the heat sink 61 is exposed from an upper surface 7b of the sealing resin 7, and therefore, the description thereof will be omitted and the difference from the semiconductor device 1 of the first embodiment will be mainly described.

In the semiconductor device 1f of the present embodiment, the heat sink 61 is mounted (disposed, bonded) on the front surface 5b of the semiconductor chip 5 mounted (disposed) on the heat sink 4 through the bonding agent (adhering material) 62. Hence, the semiconductor chip 5 is vertically sandwiched between the heat sink 61 and the heat sink 4. The heat sink 61 is disposed on an inner region with respect to the electrode 5a on the front surface 5b of the semiconductor chip 5 so that the heat sink 61 does not contact to the electrode 5a of the semiconductor chip 5 and the bonding wire 6. For example, if a planar shape of the semiconductor chip 5 is a rectangular shape, the planar shape of the heat sink 61 can be made into a rectangular shape smaller than the semiconductor chip 5. As the bonding agent 62, a bonding agent having high heat conductivity is preferably used, and for example, solder and a conductive paste material (the paste material preferable as a conductive paste material is silver paste) and the like can be used.

The upper surface 61a of the heat sink 61 is exposed from the upper surface 7b of the sealing resin 7, and this upper surface 61a is a surface (main surface) opposite to the side opposing to the front surface 5b of the semiconductor chip 5.

The heat sink 61 is a member for dissipating the heat generated in the semiconductor chip 5 and preferably has high heat conductivity, and it is necessary that the heat conductivity (heat conductivity coefficient) of the heat sink is higher than at least the heat conductivity (heat conductivity coefficient) of the sealing resin 7. Since conductive materials (particularly metal materials) are also high in heat conductivity, the heat sink 61 is preferably made of a conductive material and is more preferably formed of a metal material. It is more preferable that a metal material such as copper (Cu) or copper (Cu) alloy whose main component is copper (Cu) is used for the heat sink 61 because high heat conductivity of the heat sink 61 can be obtained and the processing thereof (formation of the heat sink 61) is easy. Further, it is more preferable that the heat sink 61 is made of the same material as the heat sink 4, and by this means, the heat sink 61 and the heat sink 4 sandwiching the semiconductor chip 5 come to have the same heat expansion coefficient. Thus, the heat stress acting on the semiconductor chip 5 can be reduced, so that the reliability of the semiconductor device can be more improved. Therefore, it is most preferable that both the heat sink 61 and the heat sink 4 are formed of copper (Cu) or copper (Cu) alloy.

In the semiconductor device 1f of the present embodiment, the heat generated in the semiconductor chip 5 is transmitted to the heat sink 4 through the bonding agent 14 and dissipated to the outside of the semiconductor device 1 from the portion of the heat sink 4 (lower portion of the heat sink 4) exposed on the lower surface (lower surface 2a of the wiring board 2) side of the semiconductor device 1 like in the semiconductor device 1 of the first embodiment. Further, in the semiconductor device 1f of the present embodiment, the heat generated in the semiconductor chip 5 is transmitted also to the heat sink 61 through the bonding agent 62, and the heat is dissipated to the outside of the semiconductor device 1f from the portion of the heat sink 61 (upper surface 61a of the heat sink 61) exposed from the upper surface 7b of the sealing resin 7. As described above, the semiconductor device 1f of the present embodiment can dissipate the heat from both below and above, and therefore, the heat dissipation properties can be further improved.

Next, the manufacturing method of the semiconductor device 1f of the present embodiment will be described with reference to the drawings. FIGS. 153 to 158 are cross-sectional views in the manufacturing process of the semiconductor device 1f of the present embodiment.

Figure 153:
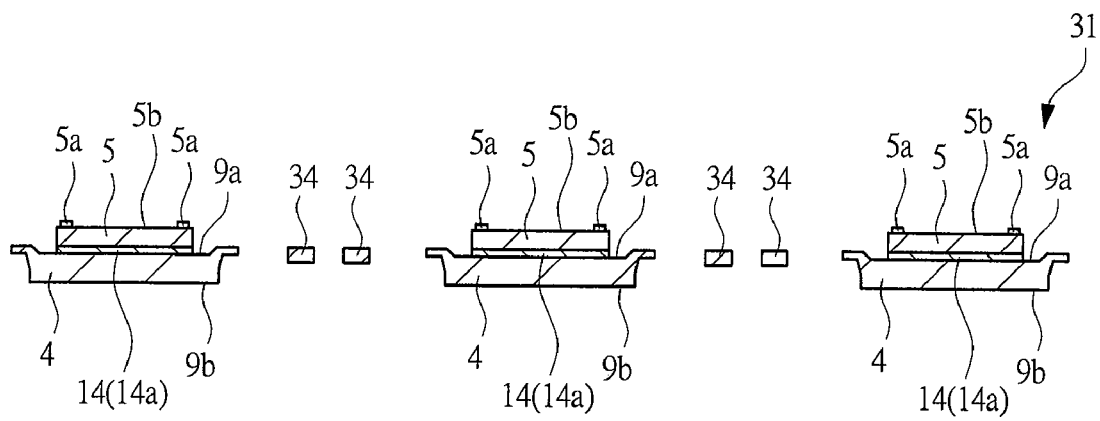
FIG. 153 is a cross-sectional view showing the manufacturing process of the semiconductor device according to another embodiment of the present invention.

The structure of FIG. 153 similar to that of FIG. 16 is obtained in the same manner as the first embodiment. Since the process up to this stage (up to the step S3) is the same as the first embodiment, the description thereof will be omitted. Since FIG. 153 is a cross-sectional view of the same region as FIG. 16, each of the heat sinks 4 is not segmented, but is integrated as the frame 31 at the stage of FIG. 153.

Figure 154:
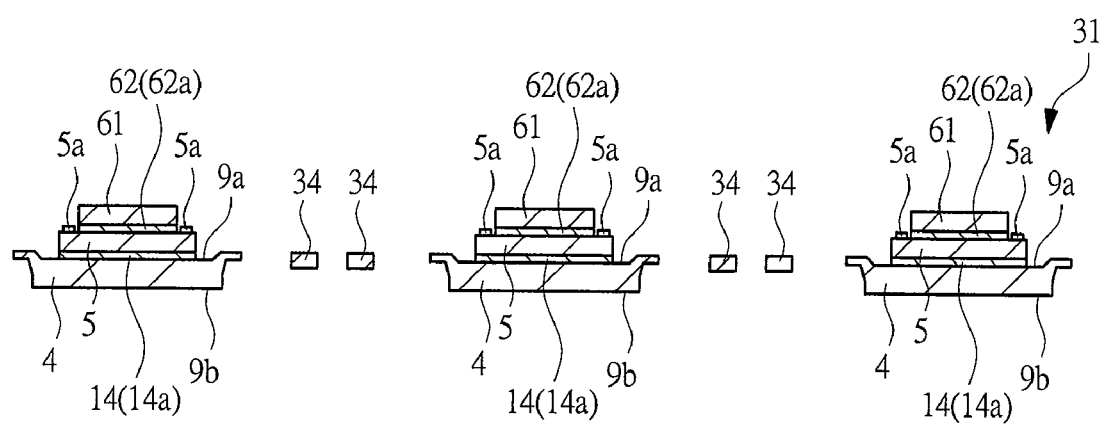
FIG. 154 is a cross-sectional view showing the manufacturing process of the semiconductor device subsequent to FIG. 153.

After the structure of FIG. 153 is obtained, solder (solder paste) 62a is coated on the front surface 5b of each semiconductor chip 5 mounted on each heat sink 4 of the frame 31 through a nozzle (not shown), and then, as shown in FIG. 154, the heat sink 61 is mounted on the front surface 5b of each semiconductor chip 5 through the solder 62a. In place of the paste-like solder 62a, a sheet-like solder may be supplied on the front surface 5b of the semiconductor chip 5 by using the printing method and the transfer method. Then, by performing a solder reflow process (heat treatment), the heat sink 61 can be bonded and fixed on the front surface 5b of each semiconductor chip 5 through the solder 62a (bonding agent 62). The molten and solidified solder 62a by this solder reflow becomes the bonding agent 62. Further, at the time of the solder reflow, not only the solder 62a but also the solder 14a can be melted and re-solidified.

High melting point solder similar to the solder 14a is preferably used for the solder 62a, and the solder having a melting point at least higher than the melting point of the solder used for an external terminal (in this case, solder ball 8) formed on the land 18 later is preferably used as the solder 62a. By this means, even when the solder ball 8 is melt in the connecting process of the solder ball 8 in the step S8 and the mounting process of the completed semiconductor device 1f (process of mounting the semiconductor device 1f on the wiring board 41), the solder 62a (that is, the bonding agent 62 made of the solder 62a) for bonding the semiconductor chip 5 and the heat sink 61 can be prevented from melting. Accordingly, the bonding reliability of the semiconductor chip 5 and the heat sink 62 can be improved, and the heat conductivity from the semiconductor chip 5 to the heat sink 62 is improved, so that the heat dissipation properties of the semiconductor device 1f can be improved.

The subsequent process is almost the same as the first embodiment (steps S4 to S10).

Figure 155:
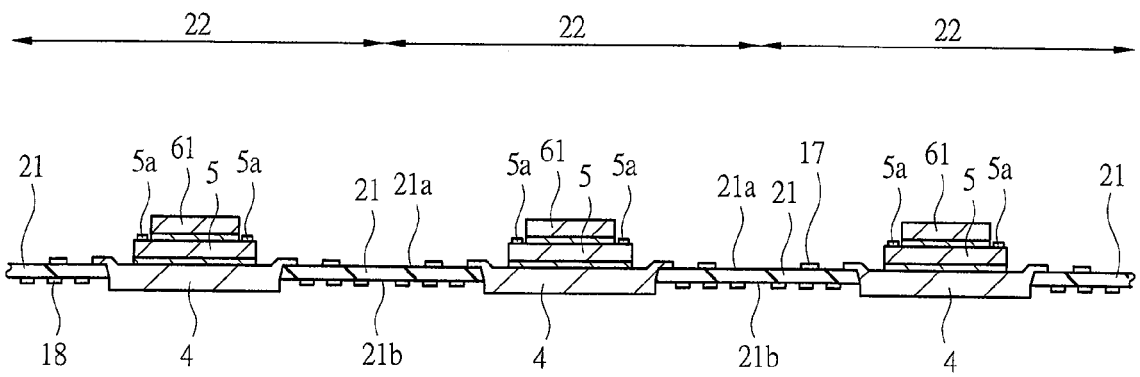
FIG. 155 is a cross-sectional view showing the manufacturing process of the semiconductor device subsequent to FIG. 154.

More specifically, after the individual segmentation of the heat sink 4 in the step S4 is performed in the same manner as the first embodiment, the step S5 is performed in the same manner as the first embodiment, and as shown in FIG. 155, the heat sink 4 mounted with the semiconductor chip 5 having the heat sink 61 mounted thereon is disposed inside the through-hole 3 of each semiconductor device region 22 of the wiring board 21. Since step S5 has been described in detail in the first embodiment, the description thereof will be omitted here.

Figure 156:
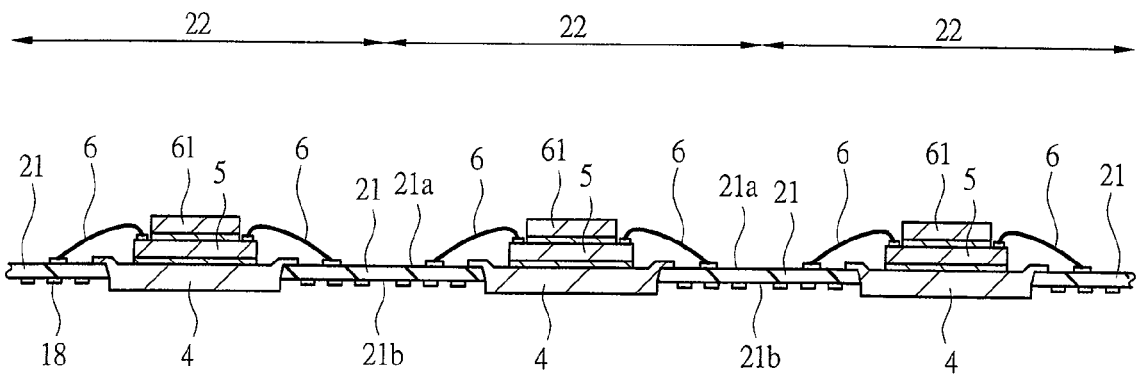
FIG. 156 is a cross-sectional view showing the manufacturing process of the semiconductor device subsequent to FIG. 155.

Next, the wire bonding process in the step S6 is performed in the same manner as the first embodiment, and as shown in FIG. 156, each electrode 5a of the semiconductor chip 5 and the corresponding connecting terminal 17 formed on the wiring board 21 are electrically connected through the bonding wire 6.

Figure 157:
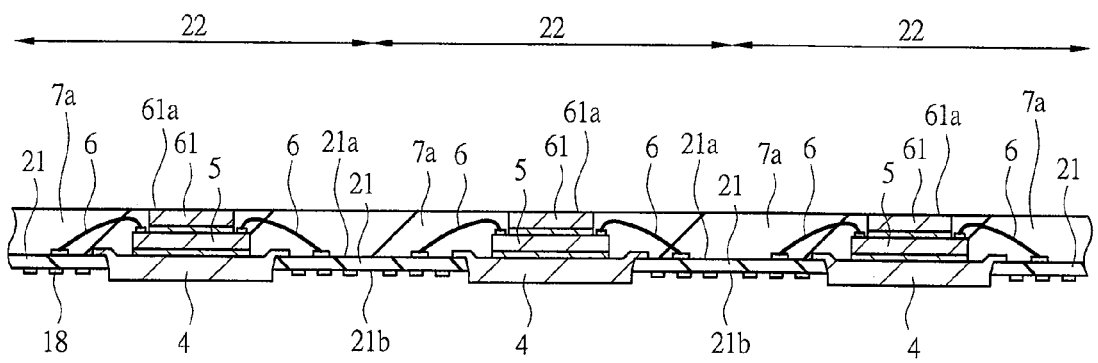
FIG. 157 is a cross-sectional view showing the manufacturing process of the semiconductor device subsequent to FIG. 156.

Next, the molding process in the step S7 is performed in the same manner as the first embodiment, and as shown in FIG. 157, the sealing resin 7a is formed and the semiconductor chip 5, the bonding wire 6 and the heat sink 61 are sealed (resin-sealed) by the sealing resin 7a. At this time, the sealing resin 7a is formed so that the upper surface 61a of the heat sink 61 is exposed from the upper surface of the sealing resin 7a, and this is the difference between the present embodiment and the first embodiment.

Figure 158:
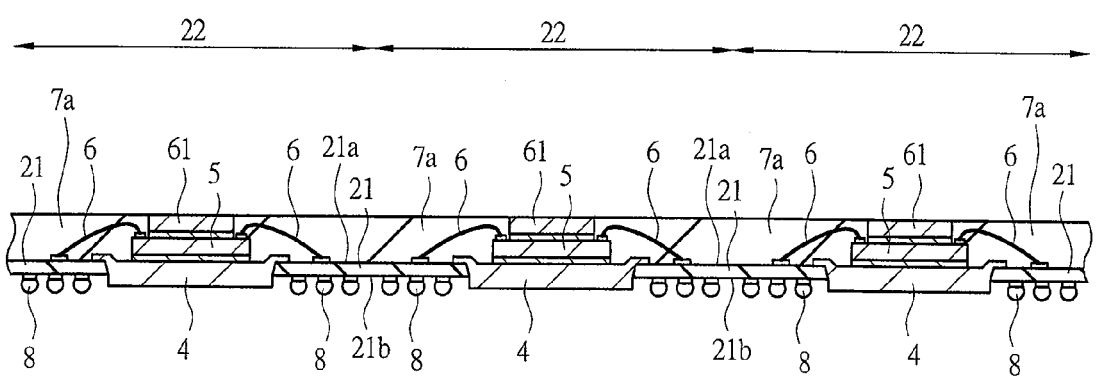
FIG. 158 is a cross-sectional view showing the manufacturing process of the semiconductor device subsequent to FIG. 157.

Next, the connecting process of the solder ball in the step S8 is performed in the same manner as the first embodiment, and as shown in FIG. 158, the solder ball 8 is connected (bonded) to the land 18 of the lower surface 21b of the wiring board 21.

Thereafter, the marking process in the step S9 and the cutting process in the step S10 are performed in the same manner as the first embodiment, and the wiring board 21 and the sealing resin 7a formed thereon are cut (diced) and separated (divided) into each semiconductor device region 22. By this means, the semiconductor device 1f as shown in FIG. 152 can be manufactured.

In the manufacturing process of FIGS. 153 to 158, before the heat sink 4 is disposed inside the through-hole 3 of the wiring board 21 in the process of FIG. 155 (corresponding to step S5), the semiconductor chip 5 is bonded on the heat sink 4 and the heat sink 61 is bonded on the semiconductor chip 5 in the process of FIG. 153 (corresponding to step S3) and the process of FIG. 154. Hence, there is an advantage that a high temperature heat treatment can be performed as the heat treatment for bonding the heat sink 4 and the semiconductor chip 5 and for bonding the semiconductor chip 5 and the heat sink 61 without regard to the heat resistance of the wiring board 21. When the high temperature heat treatment is performed as the heat treatment for bonding the semiconductor chip 5 to the heat sink 4 and for bonding the heat sink 61 to the semiconductor chip 5, for example, when the solders 14a and 62a having a melting point higher than that of the solder used for the external terminal (in this case, solder ball 8) formed on the land 18 are used, it is preferable to apply the manufacturing process described with reference to FIGS. 153 to 158 because the wiring board 21 is not damaged at the time of high temperature heat treatment (solder reflow). Further, if the solder is used as the bonding agent 62, the heat conductivity of the bonding agent 62 becomes high as compared with the case of using the silver paste, and therefore, the heat transmission from the semiconductor chip 5 to the heat sink 61 is more increased, so that the heat dissipation properties of the semiconductor device 1f can be more improved.

As another embodiment of the manufacturing process of the semiconductor device 1f, the heat sink 61 can be bonded on the front surface 5b of the semiconductor chip 5 after the process up to the wire bonding process in the step S6 is performed in the same manner as the first embodiment. Then, after the molding process and the connecting process of the solder ball are performed in the same manner as the process of FIG. 157 and the process of FIG. 158, the marking process in the step S9 and the cutting process in the step S10 may be performed.

When the process of bonding the heat sink 61 on the front surface 5b of the semiconductor chip 5 is performed after the wire bonding process in the step S6, since the wire bonding is performed in a state in which the heat sink 61 is not provided, the heat sink 61 does not hinder a capillary motion of the wire bonding apparatus even if the planar shape of the heat sink 61 is made larger. Hence, there is an advantage that the dimension (planar shape) of the heat sink 61 can be made large. Further, when the process of bonding the heat sink 61 on the front surface 5b of the semiconductor chip 5 is performed after the wire bonding process in the step S6, it is preferable that the heat sink 61 is bonded to the semiconductor chip 5 by using a conductive paste type bonding agent such as the silver paste because the temperature of thermosetting heat treatment of this conductive paste type bonding agent is not so high as the temperature by which the wiring board 21 is damaged.

Figure 159:
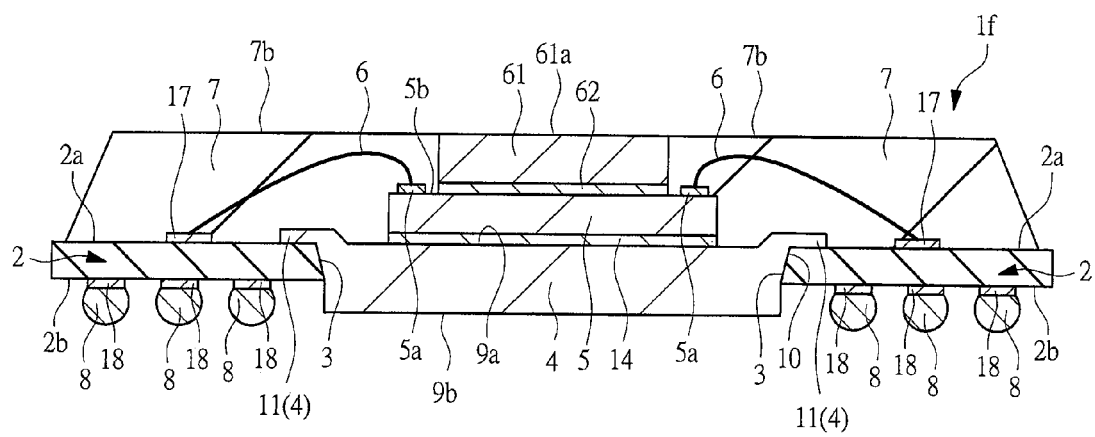
FIG. 159 is a cross-sectional view of a semiconductor device according to another embodiment of the present invention.

Further, also in the present embodiment, an individual sealing (divided sealing) as shown in FIG. 27 can also be performed in the molding process of FIG. 157. FIG. 159 is a cross-sectional view (side cross-sectional view) of the semiconductor device 1*f* in the case when the individual sealing is performed. The semiconductor device 1*f* of FIG. 159 has almost the same structure as the semiconductor device 1*f* of FIG. 152 except that the sealing resin 7 is not formed on the peripheral edge portion of the upper surface 2*a* of the wiring board 2 and the sealing resin 7 is formed on the region other than the peripheral edge portion of the upper surface 2*a* of the wiring board 2, and therefore, the description thereof will be omitted.

Figure 160:
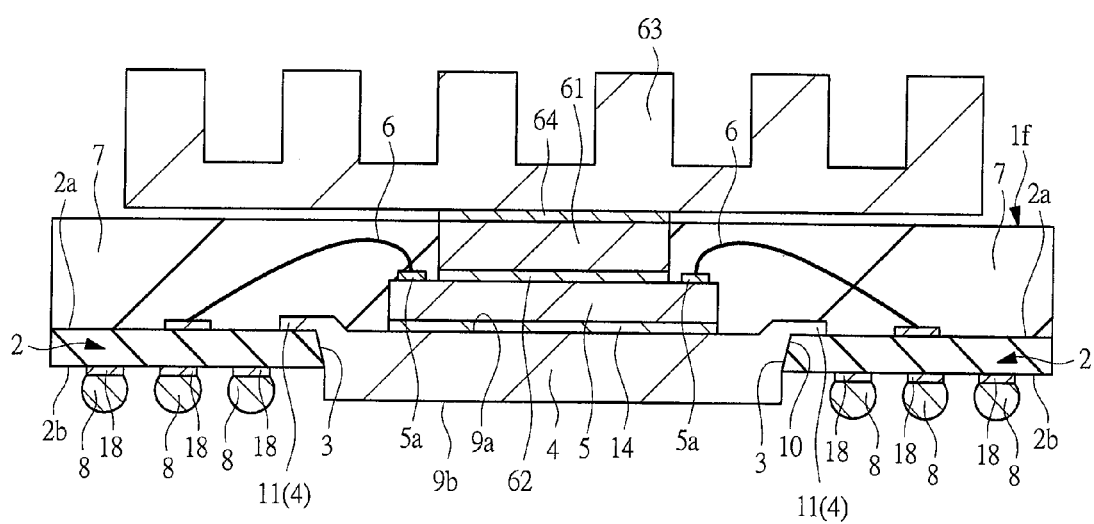
FIG. 160 is a cross-sectional view showing a state in which a heat dissipation fin is mounted on the upper surface of the semiconductor device of FIG. 152.
Figure 161:
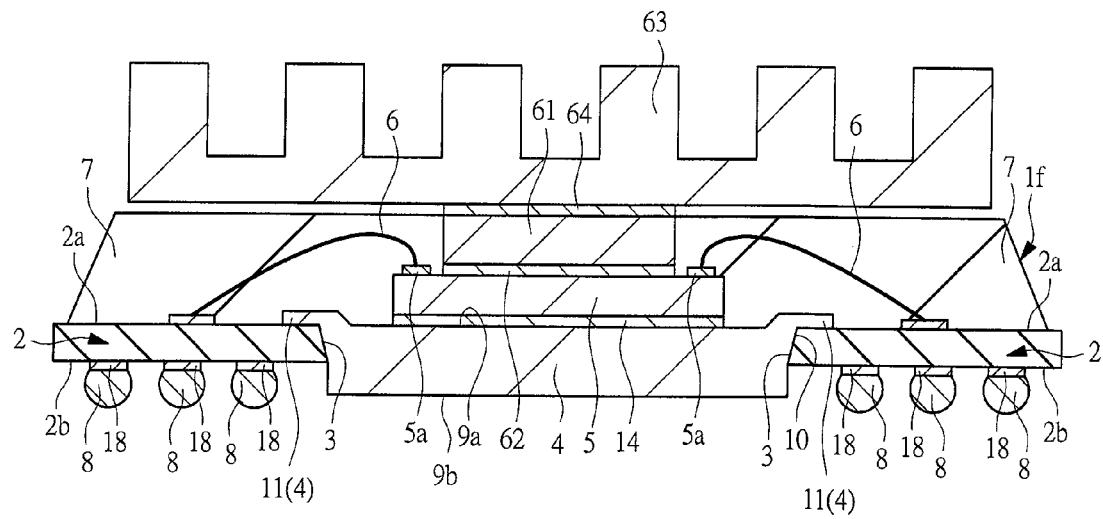
FIG. 161 is a cross-sectional view showing a state in which a heat dissipation fin is mounted on the upper surface of the semiconductor device of FIG. 159.

FIG. 160 is a cross-sectional view (side cross-sectional view) showing a state in which a heat dissipation fin 63 is mounted further on the upper surface of the semiconductor device 1*f* of FIG. 152, and FIG. 161 is a cross-sectional view (side cross-sectional view) showing a state in which the heat dissipation fin 63 is mounted further on the upper surface of the semiconductor device 1*f* of FIG. 159.

As shown in FIGS. 160 and 161, the heat dissipation fin (heat sink) 63 is mounted (disposed) on the upper surface of the semiconductor device 1*f*. The upper surface of the semiconductor device 1*f* is formed of the upper surface 7*b* of the sealing resin 7 and the upper surface 61*a* of the heat sink 61. The heat dissipation fin 63 is required to be overlapped at least with a part of the upper surface 61*a* of the heat sink 61 when seen planarly, and it is more preferable if the heat dissipation fin 63 encloses the upper surface 61*a* of the heat sink 61 when seen planarly.

The heat dissipation fin 63 is attached to the upper surface 61*a* of the heat sink 61 exposed from the upper surface 7*b* of the sealing resin 7. Specifically, (the lower surface of) the heat dissipation fin 63 is bonded and fixed to the upper surface 61*a* of the heat sink 61 through the bonding agent 64 made of, for example, solder. For dissipating the heat generated in the semiconductor chip 5 from the heat dissipation fin 63 through the heat sink 61, it is not necessary to bond the upper surface 7*b* of the sealing resin 7 to the heat dissipation fin 63, but the upper surface 61*a* of the heat sink 61 is required to be bonded to the heat dissipation fin 63. As the bonding agent 64 for bonding the heat dissipation fin 63 and the heat sink 61, the bonding agent having high conductivity (conductive bonding agent) is preferably used, and the solder is preferable. As another embodiment, the heat dissipation fin 63 can be also bonded and fixed to the upper surface 61*a* of the heat sink 61 through a heat conductive bonding sheet (not shown) and the like having high heat conductivity. In this case, the heat dissipation fin 63 can be bonded and fixed to both of the upper surface 61*a* of the heat sink 61 and the upper surface 7*b* of the sealing resin 7 through the heat conductive bonding sheet.

The heat dissipation fin 63 is a member for dissipating the heat of the semiconductor device 1*f* (heat generated in the semiconductor chip 5) and preferably has high heat conductivity, and the heat conductivity (heat conductivity coefficient) of the heat dissipation fin 63 is required to be at least higher than the heat conductivity (heat conductivity coefficient) of the sealing resin 7. Since conductive materials (particularly metal materials) are also high in heat conductivity, the heat dissipation fin 63 is preferably made of a conductive material and is more preferably formed of a metal material. It is more preferable that a metal material such as copper (Cu) or copper (Cu) alloy whose main component is copper (Cu) is used for the heat sink 61 because high heat conductivity of the heat dissipation fin 63 can be obtained and the processing thereof is easy. Further, it is more preferable that the heat dissipation fin 63 is made of the same material as the heat sink 61, and by this means, the heat dissipation fin 63 and the heat sink 61 come to have the same heat expansion coefficient, and thus, a heat stress can be reduced. Therefore, it is most preferable that the heat dissipation fin 63, the heat sink 61 and the heat sink 4 are formed of copper (Cu) or copper (Cu) alloy.

When the heat dissipation fin 63 is further attached to the upper surface of the semiconductor device 1*f* as shown in FIG. 160 or FIG. 161, the heat transmitted also to the heat sink 61 from the semiconductor chip 5 through the bonding agent can be dissipated from the heat dissipation fin 63, and therefore, the heat dissipation properties can be further improved.

The present embodiment can be applied to any one of the first to fifth embodiments. More specifically, in any of the semiconductor devices (semiconductor devices 1, 1*a*, 1*b*, 1*b*1, 1*c* and 1*e*) shown in the first to fifth embodiments, the heat sink 61 can be mounted on the front surface 5*b* of the semiconductor chip 5 through the bonding agent 62 and the upper surface 61*a* of the heat sink 61 can be exposed from the upper surface 7*b* of the sealing resin 7 by applying the present embodiment. Further, the heat dissipation fin 63 can be further attached to the upper surface of the semiconductor device. Also, in any of the manufacturing processes of the semiconductor device shown in the first to fifth embodiments, the heat sink 61 can be mounted on the front surface 5*b* of the semiconductor chip 5 through the bonding agent 62 and the sealing resins 7 and 7*a* can be formed so that the upper surface 61*a* of the heat sink 61 is exposed by applying the present embodiment. By doing so, a heat dissipation path can be secured not only to the lower side but also to the upper side of the semiconductor chip 5, and therefore, the heat dissipation properties of the semiconductor device can be further improved.

Figure 162:
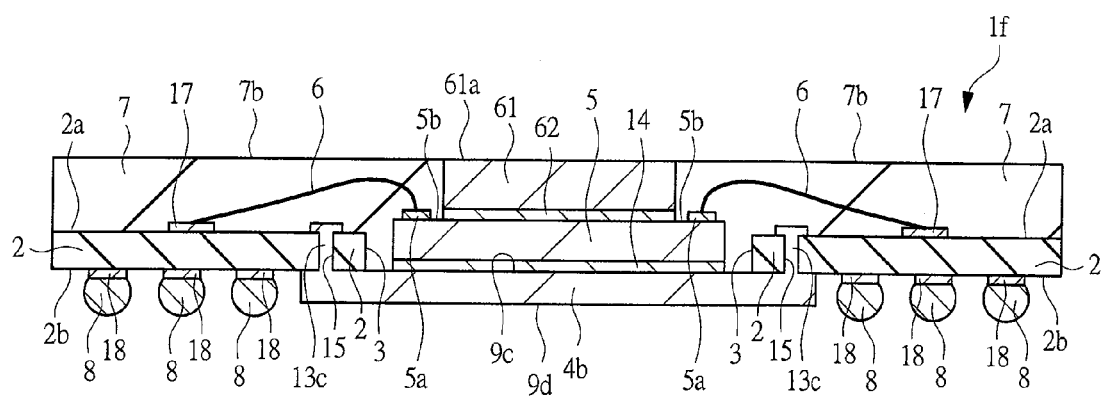
FIG. 162 is a cross-sectional view of a semiconductor device according to another embodiment of the present invention.

As an example, the case where the present embodiment is applied to the semiconductor device 1*b* of the third embodiment is shown in FIG. 162. The semiconductor device shown in FIG. 162 has almost the same structure as the semiconductor device 1*b* of FIG. 72 of the third embodiment except that the heat sink 61 is mounted on the front surface 5*b* of the semiconductor chip 5 through the bonding agent 62 and the upper surface 61*a* of the heat sink 61 is exposed from the upper surface 7*b* of the sealing resin 7. The semiconductor device of FIG. 162 can secure the heat dissipation path not only to the lower side but also to the upper side of the semiconductor chip 5 by providing the heat sink 61, and therefore, the heat dissipation properties can be further improved as compared with the semiconductor device 1*b* of FIG. 72 of the third embodiment.

Seventh Embodiment

Figure 163:
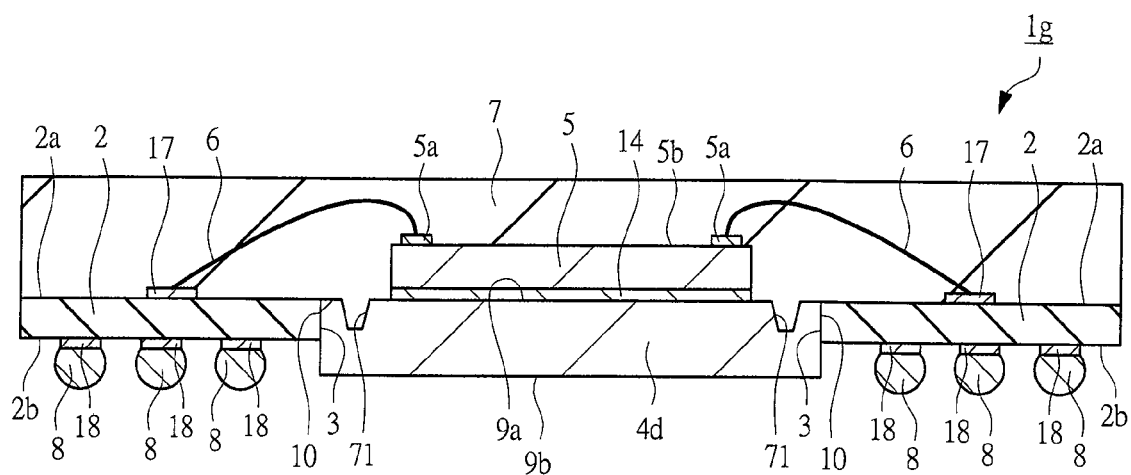
FIG. 163 is a cross-sectional view of a semiconductor device according to another embodiment of the present invention.

FIG. 163 is a cross-sectional view (side cross-sectional view) of a semiconductor device 1*g* of the seventh embodiment.

The semiconductor device 1*g* of the present embodiment is the same as the first embodiment in that a heat sink 4*d* (corresponding to the heat sink 4) is caulked inside the through-hole 3 of the wiring board 2 and fixed to the wiring board 2. However, unlike the first embodiment, the side surface (surface between the upper surface 9*a* and the lower surface 9*b*) 10 of the heat sink 4*d* is not inclined and is a surface almost vertical to the upper surface 9*a* (or the lower surface 9*b*).

Further, in the semiconductor device 1g, a groove 71 is formed in a part (upper surface 9a in the present embodiment) of the heat sink 4d along each side of the heat sink 4d whose planar shape is rectangular (square in the present embodiment). This groove 71 is used in the following manner. That is, when the semiconductor device 1g is manufactured, this groove 71 is hit (pressed, crushed) by a jig (jig 73 to be described later) so that a part of the heat sink 4d is expanded in a horizontal direction inside the through-hole 3 of the wiring board 2 and the heat sink 4d is fixed to the wiring board 2. Since the adhesion of the side surface 10 of the heat sink 4d and the inner wall surface of the through-hole 3 of the wiring board 2 is improved as described above, the heat sink 4d can be fixed to the wiring board 2.

For the further improvement of the adhesion, also in the present embodiment, if the protruded portion 11 is formed in the peripheral edge portion of the upper surface 9a of the heat sink 4d like in the first embodiment, a trouble of the heat sink 4d falling off from the wiring board 2 can be prevented even when the thickness of the heat sink 4d is increased so as to improve the heat dissipation properties and the weight of the heat sink 4d is increased.

Figure 164:
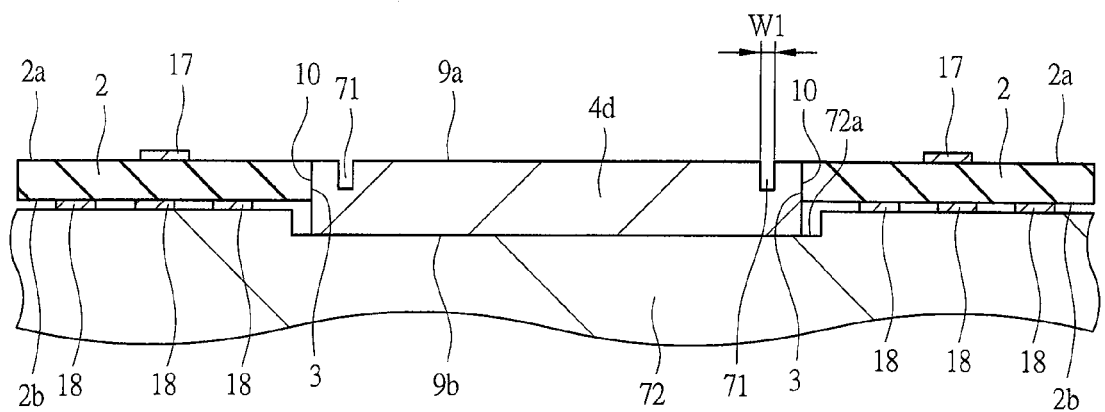
FIG. 164 is a cross-sectional view showing a technique of caulking (fixing) the heat sink according to another embodiment of the present invention to the wiring board.
Figure 165:
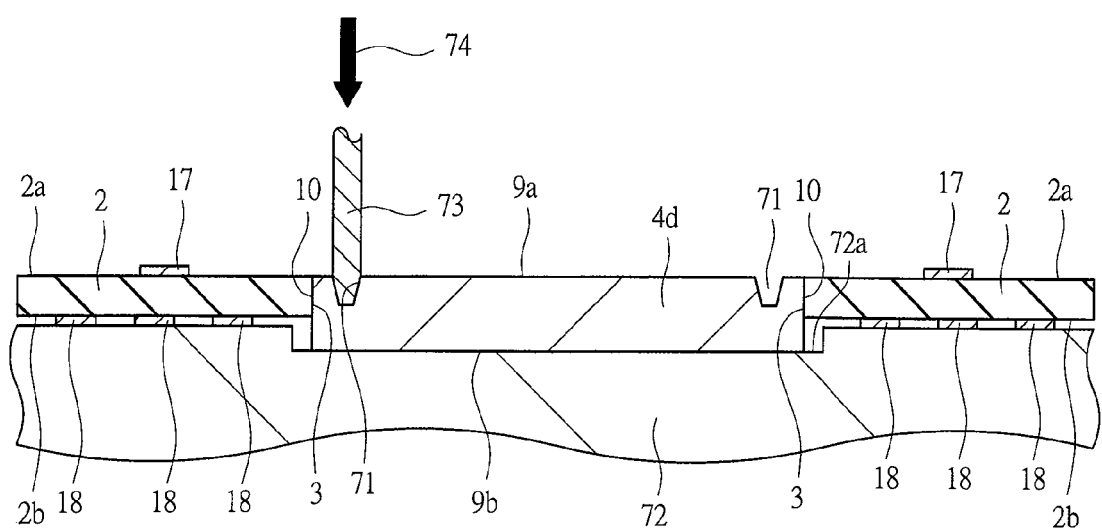
FIG. 165 is a cross-sectional view showing a technique of caulking (fixing) the heat sink to the wiring board subsequent to FIG. 164.

Next, a caulking method (fixing method) of the heat sink 4d of the present embodiment will be described with reference to the drawings. FIGS. 164 and 165 are cross-sectional views (explanatory drawings) showing a technique of caulking (fixing) the heat sink 4d in the present embodiment to the wiring board 2.

First, as shown in FIG. 164, the heat sink 4d is disposed inside the through-hole 3 of the wiring board 2. At this time, since the protruded portion 11 is not formed in the peripheral edge portion of the upper surface 9a of the heat sink 4d as shown in FIG. 164, the wiring board 2 is disposed on a stage 72, and then, the heat sink 4d individually segmented and obtained in advance is disposed inside the through-hole 3 of the wiring board 2 as shown in FIG. 164 in the same manner as the above-described embodiments.

Here, as described above, the heat sink 4d is made thicker than the wiring board 2 so that the heat sink 4d can also be electrically connected to a mother board (specifically, the board side terminal 42a of the wiring board 41) when the completed semiconductor device 1g is mounted on the mother board (corresponding to the wiring board 41). Therefore, it is preferable to form a groove (recess) 72a at a position corresponding to the heat sink 4d in the stage 72.

Further, the external dimension of the heat sink 4d is preferably smaller than a size of the internal dimension of the through-hole 3 of the wiring board 2. This is for the purpose of suppressing the trouble that a part of the heat sink 4d contacts to the wiring board 2 and a crack is formed in the wiring board 2 at the time of inserting the heat sink 4d into the through-hole 3. However, if the heat sink 4d can be inserted into the through-hole 3 so that the heat sink 4d does not contact to the wiring board 2, the heat sink 4d having the same size as the inner dimension of the through-hole 3 may be used.

Next, as shown in FIG. 165, the jig 73 having a top end portion larger than a width (opening area on the upper surface 9a side of the heat sink 4d) W1 of the groove 71 is caused to descend toward the groove 71 in the direction (that is, the direction toward the lower surface 9b of the heat sink 4d from the upper surface 9a of the heat sink 4d) shown by an arrow mark 74 of FIG. 165, thereby hitting this groove 71. By this means, a part of the heat sink 4d is expanded in the horizontal direction by a cubic volume by which the groove 71 is crushed (pushed and expanded) by the jig 73, and the side surface 10 of the heat sink 4d can be adhered to the inner wall surface of the through-hole 3 of the wiring board 2. Therefore, the heat sink 4d and the wiring board 2 can be caulked, and the heat sink 4d can be fixed to the wiring board 2.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the cases where the lower portion of each of the heat sinks 4, 4a, 4b, 4c and 4d (including the lower surface 9b) protrudes from the lower surface 2b of the wiring board 2 have been described in the first to seventh embodiments, but this is not restrictive, and the structure in which the lower portion does not protrude from the lower surface 2b of the wiring board 2 and is flush with this lower surface 2b is also possible. However, when the heat sinks 4, 4a, 4b, 4c and 4d do not protrude from the lower surface 2b of the wiring board 2, the thicknesses of the heat sinks 4, 4a, 4b, 4c and 4d become smaller as compared with the first to seventh embodiments, and moreover, since the electrical connection between the entire surface of the heat sinks 4, 4a, 4b, 4c and 4d exposed from the lower surface 2b of the wiring board 2 and the mounting board (equivalent to the wiring board 41) becomes difficult, the heat dissipation effect is decreased as compared with the cases shown in the first to seventh embodiments.

Further, for example, the structure in which the heat sink 4 (or the heat sink 4a or 4b) obtained by performing individual segmentation is disposed inside the through-hole 3 of the wiring board 21 has been described in the first to third embodiments, but a plurality of heat sinks 4 (or a plurality of heat sinks 4a or 4b) in a state of being fixed to the lead frame may be disposed and fixed inside the plurality of through-holes 3 of the wiring board 21, respectively, and then, the separation of the wiring board 21 and the lead frame may be performed at the same time.

Further, for example, the structure in which the groove 71 is formed on the upper surface 9a of the heat sink 4d and the inside of this groove 71 is hit by the jig has been described in the seventh embodiment, but the heat sink 4d may be expanded in the horizontal direction by directly hitting the upper surface 9a of the heat sink 4d by the jig without forming the groove 71.

The present invention is suitably applied to the semiconductor device of a semiconductor package configuration and the manufacturing method thereof.

What is claimed is:
1. A semiconductor device, comprising:
a board having a first main surface, a plurality of connecting terminals formed on the first main surface, a second main surface opposite to the first main surface, a plurality of lands formed on the second main surface, a plurality of first through-holes each reaching to one of the first and second main surfaces from the other, and a second through-hole reaching to one of the first and second main surfaces from the other and arranged between the first through-holes;
a heat sink having an upper surface, a plurality of pins formed on the upper surface, and a lower surface opposite to the upper surface, and disposed on the second main surface of the board such that the upper surface of the heat sink faces the second main surface of the board and such that the pins are arranged inside of the first through-holes, respectively;
a semiconductor chip having a plurality of electrodes, and mounted on a part of the upper surface of the heat sink, which is exposed from the second through-hole;

a plurality of wires electrically connected the electrodes of the semiconductor chip with the connecting terminals of the board; and a plurality of external terminals formed on the lands, respectively.

2. The semiconductor device according to claim 1, wherein a thickness of the heat sink is larger than that of the board.

3. The semiconductor device according to claim 2, wherein in a cross-section view, a width of an end portion of each of the pins protruded from the first main surface is larger than that of each of the pins.

4. The semiconductor device according to claim 3, wherein an intermediate member is arranged between the end portion of each of the pins and the first main surface of the board.

5. The semiconductor device according to claim 4, wherein the first main surface of the board, the semiconductor chip and the wires are sealed with a sealing portion.

\* \* \* \* \*